US012733398B2

(12) United States Patent
Lee et al.

(10) Patent No.: US 12,733,398 B2
(45) Date of Patent: *Sep. 8, 2026

(54) COMPOUND FOR ORGANIC ELECTRONIC ELEMENT, ORGANIC ELECTRONIC ELEMENT USING THE SAME, AND AN ELECTRONIC DEVICE THEREOF

(71) Applicant: DUK SAN NEOLUX CO., LTD., Cheonan-si (KR)

(72) Inventors: Yun Suk Lee, Cheonan-si (KR); Jong Gwang Park, Cheonan-si (KR); Min Ji Jo, Cheonan-si (KR); Jung Hwan Park, Cheonan-si (KR); Bum Sung Lee, Cheonan-si (KR)

(73) Assignee: DUK SAN NEOLUX CO., LTD., Cheonan-si (KR)

( * ) Notice: Subject to any disclaimer, the term of this patent is extended or adjusted under 35 U.S.C. 154(b) by 1033 days.

This patent is subject to a terminal disclaimer.

(21) Appl. No.: 17/309,571

(22) PCT Filed: Nov. 18, 2019

(86) PCT No.: PCT/KR2019/015735

§ 371 (c)(1),
(2) Date: Jun. 5, 2021

(87) PCT Pub. No.: WO2020/116816

PCT Pub. Date: Jun. 11, 2020

(65) Prior Publication Data

US 2022/0029104 A1 Jan. 27, 2022

(30) Foreign Application Priority Data

Dec. 6, 2018 (KR) ........................ 10-2018-0156305

(51) Int. Cl.
*H10K 85/60* (2023.01)
*H10K 50/11* (2023.01)
(Continued)

(52) U.S. Cl.
CPC ......... *H10K 85/654* (2023.02); *H10K 85/624* (2023.02); *H10K 85/626* (2023.02);
(Continued)

(58) Field of Classification Search
CPC .... H10K 50/11; H10K 85/615; H10K 85/624; H10K 85/626; H10K 85/631;
(Continued)

(56) References Cited

U.S. PATENT DOCUMENTS

2006/0103298 A1* 5/2006 Lee ........................ H10K 50/11 313/506
2017/0125697 A1* 5/2017 Cho .................. H10K 85/6572
(Continued)

FOREIGN PATENT DOCUMENTS

CN 106749132 A 5/2017
CN 106946859 A 7/2017
(Continued)

OTHER PUBLICATIONS

WO-2019231272-A1 machine translation (Year: 2019).*
Korean Office Action for corresponding KR 10-2018-0156305, issued Oct. 23, 2023, 15 pages.

*Primary Examiner* — Elizabeth M. Dahlburg
(74) *Attorney, Agent, or Firm* — Vorys, Sater, Seymour and Pease LLP; Mih Suhn Koh

(57) ABSTRACT

Provided is the compound represented by Formula 1, an organic electric element including a first electrode, a second electrode, and an organic material layer formed between the first electrode and the second electrode, and electronic device thereof, and by comprising the compound repre-
(Continued)

sented by Formula 1 and compound represented by Formula 2 in the organic material layer, the driving voltage of the organic electronic element can be lowered, and the luminous efficiency and life time of the organic electronic element can be improved.

22 Claims, 1 Drawing Sheet

(51) Int. Cl.
*H10K 101/00* (2023.01)
*H10K 101/10* (2023.01)

(52) U.S. Cl.
CPC ......... *H10K 85/633* (2023.02); *H10K 85/636* (2023.02); *H10K 85/6572* (2023.02); *H10K 85/6574* (2023.02); *H10K 85/6576* (2023.02); *H10K 50/11* (2023.02); *H10K 2101/10* (2023.02); *H10K 2101/90* (2023.02)

(58) Field of Classification Search
CPC .. H10K 85/633; H10K 85/636; H10K 85/654; H10K 85/6572; H10K 85/6574; H10K 85/6576; H01L 2101/10; H01L 2101/90; H01L 51/0067; H01L 51/0073; H01L 51/0074; H01L 2151/5384; Y02E 10/549
See application file for complete search history.

(56) References Cited

U.S. PATENT DOCUMENTS

| | | | | |
|---|---|---|---|---|
| 2018/0123051 | A1* | 5/2018 | Lee | C07D 401/04 |
| 2020/0168804 | A1* | 5/2020 | Song | C07D 405/04 |
| 2022/0085300 | A1* | 3/2022 | Kim | C07D 409/14 |

FOREIGN PATENT DOCUMENTS

| | | | | |
|---|---|---|---|---|
| CN | 108003865 A | | 5/2018 | |
| KR | 10-2012-0104067 A | | 9/2012 | |
| KR | 10-2016-0030003 A | | 3/2016 | |
| KR | 10-2016-0055556 A | | 5/2016 | |
| KR | 10-1789998 B1 | | 10/2017 | |
| KR | 10-2018-0022574 A | | 3/2018 | |
| KR | 10-1857632 B1 | | 5/2018 | |
| WO | WO-2017160089 A1 | * | 9/2017 | C07D 209/56 |
| WO | WO-2019231272 A1 | * | 12/2019 | C07D 307/91 |

* cited by examiner

COMPOUND FOR ORGANIC ELECTRONIC ELEMENT, ORGANIC ELECTRONIC ELEMENT USING THE SAME, AND AN ELECTRONIC DEVICE THEREOF

CROSS-REFERENCE TO RELATED APPLICATION

This patent application claims priority from and the benefit under 35 U.S.C. § 119 to § 121, and § 365 of Korean Patent Application No. 10-2018-0156305, filed on Dec. 6, 2018 which is hereby incorporated by reference for all purposes as if fully set forth herein. Further, this application claims the benefit of priority in countries other than U.S., which is hereby incorporated by reference herein.

BACKGROUND

Technical Field

The present invention relates to compounds for organic electric elements, organic electric elements comprising the same, and electronic devices thereof.

Background Art

In general, an organic light emitting phenomenon refers to a phenomenon in which electric energy is converted into light energy of an organic material. An organic electric element utilizing the organic light emitting phenomenon usually has a structure including an anode, a cathode, and an organic material layer interposed therebetween. In many cases, the organic material layer has a multi-layered structure having respectively different materials in order to improve efficiency and stability of an organic electric element, and for example, may comprise a hole injection layer, a hole transport layer, a light emitting layer, an electron transport layer, an electron injection layer, or the like.

Materials used as an organic material layer in an organic electric element may be classified into a light emitting material and a charge transport material, for example, a hole injection material, a hole transport material, an electron transport material, an electron injection material, and the like according to its function. Further, the light emitting material may be divided into a high molecular weight type and a low molecular weight type according to its molecular weight, and may also be divided into a fluorescent material derived from excited singlet states of electron and a phosphorescent material derived from excited triplet states of electron according to its light emitting mechanism. Further, the light emitting material may be divided into blue, green, and red light emitting material and yellow and orange light emitting material required for better natural color reproduction according to its light emitting color.

Meanwhile, when only one material is used as a light emitting material, there occur problems of shift of a maximum luminescence wavelength to a longer wavelength due to intermolecular interactions and lowering of the efficiency of a corresponding element due to deterioration in color purity or a reduction in luminous efficiency. On account of this, a host/dopant system may be used as the light emitting material in order to enhance the color purity and increase the luminous efficiency through energy transfer. This is based on the principle that if a small amount of dopant having a smaller energy band gap than a host forming a light emitting layer is mixed in the light emitting layer, then excitons generated in the light emitting layer are transported to the dopant, thus emitting light with high efficiency. With regard to this, since the wavelength of the host is shifted to the wavelength band of the dopant, light having a desired wavelength can be obtained according the type of the dopant.

Currently, the power consumption is required more than more as size of display becomes larger and larger in the portable display market. Therefore, the power consumption is very important factor in the portable display with a limited power source of the battery, and efficiency and life span issues must also be solved.

Efficiency, life span, driving voltage, and the like are correlated with each other. If efficiency is increased, then driving voltage is relatively lowered, and the crystallization of an organic material due to Joule heating generated during operation is reduced as driving voltage is lowered. As a result, life span tends to increase. However, efficiency cannot be maximized only by simply improving the organic material layer. This is because long life span and high efficiency can be simultaneously achieved when an optimal combination of energy levels and $T_1$ values, inherent material properties (mobility, interfacial properties, etc.), and the like among the respective layers included in the organic material layer is given.

Therefore, there is a need to develop a light emitting material that has high thermal stability and can efficiently a charge balance in the light-emitting layer. That is, in order to allow an organic electric element to fully exhibit excellent features, it should be prerequisite to support a material constituting an organic material layer in the element, for example, a hole injection material, a hole transport material, a light emitting material, an electron transport material, an electron injection material, or the like, by a stable and efficient material. However, the stable and efficient material of organic material layer for an organic electronic element has not been fully developed yet, in particular, it is strongly required to develop host material of the light emitting layer.

OBJECT, TECHNICAL SOLUTION AND EFFECTS OF THE INVENTION

The present invention is to provide compound lowering a driving voltage, improving luminous efficiency and lifetime of the element, an organic electric element comprising the same, and an electronic device thereof.

In an aspect of the present invention, the present invention provides the compound represented by the following formula, organic electric elements comprising the same, and electronic devices thereof.

<Formula 1>

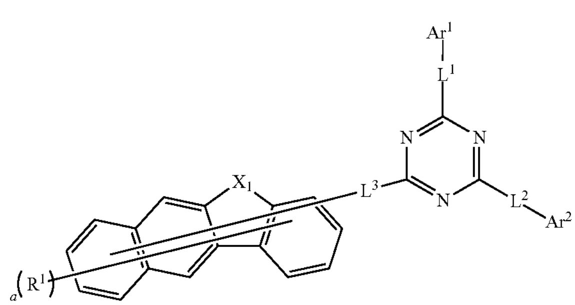

In another aspect of the present invention, the present invention provides an organic electric element comprising compound represented by Formula 1 and compound represented by Formula 2 in a light emitting layer, and an electronic device thereof.

<Formula 2>

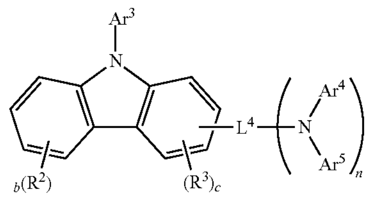

By using the compound according to embodiment of the present invention, a driving voltage of element can be lowered and the luminous efficiency and lifetime of the element can be also significantly improved.

DETAILED DESCRIPTION

Figure 1:
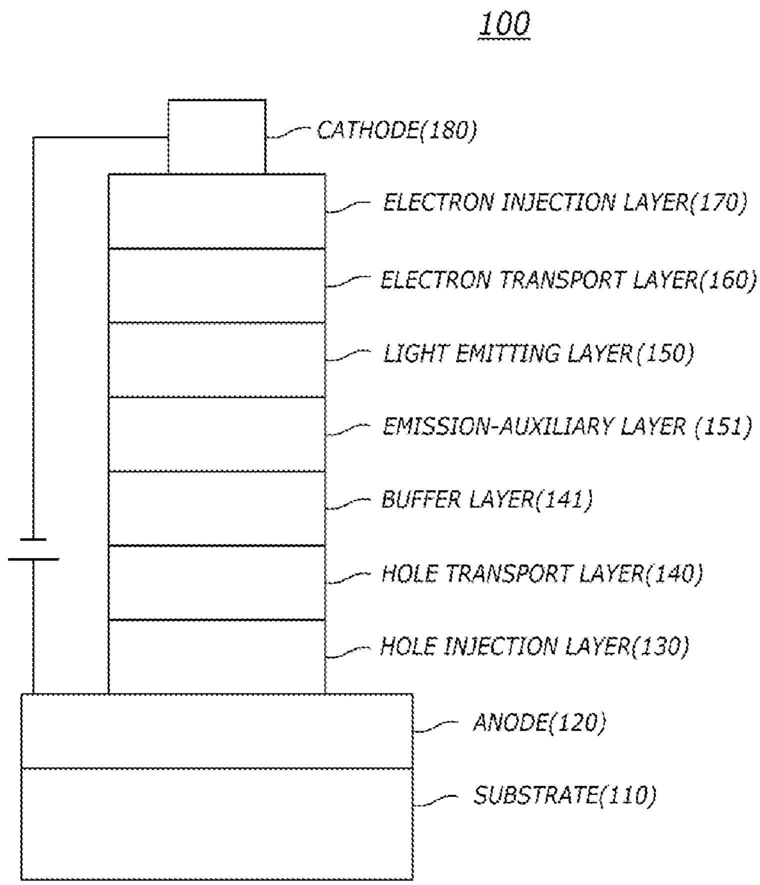
FIG. 1 illustrates an example of an organic electroluminescent element according to the present invention: 100 is an organic electric element, 110 is a substrate, 120 is a first electrode, 130 is a hole injection layer, 140 is a hole transport layer, 141 is a buffer layer, 150 is a light emitting layer, 151 is an emission-auxiliary layer, 160 is an electron transport layer, 170 is an electron injection layer, and 180 is a second electrode.
Figure 2:
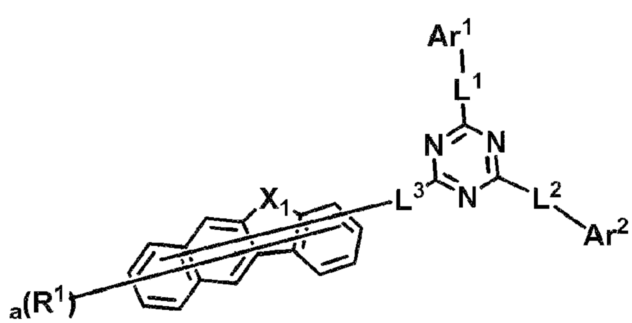
FIG. 2 illustrates Formula according to an aspect of the present invention

Unless otherwise stated, the term "aryl group" or "arylene group" as used herein has, but not limited to, 6 to 60 carbon atoms. The aryl group or arylene group in the present invention may comprise a monocyclic ring, ring assemblies, a fused polycyclic system, spiro-compounds and the like. In addition, unless otherwise stated, a fluorenyl group may be comprised in an aryl group and a fluorenylene group may be comprised in an arylene group.

Unless otherwise stated, the term "fluorenyl group" or "fluorenylene group" as used herein means univalent or bivalent functional group in which R, R' and R" are all hydrogen in the following structure, "substituted fluorenyl group" or "substituted fluorenylene group" means that at least any one of R, R' and R" is a substituent other than hydrogen, and the case where R and R' are bonded to each other to form the spiro compound together with the carbon bonded to them is comprised.

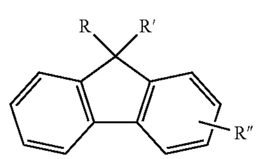

The term "spiro-compound" as used herein has a spiro union which means union having one atom as the only common member of two rings. The common atom is designated as 'spiro atom'. The compounds are defined as 'monospiro-', 'dispiro-' or 'trispiro' depending on the number of spiro atoms in one compound.

The term "heterocyclic group" used in the specification comprises a non-aromatic ring as well as an aromatic ring like "heteroaryl group" or "heteroarylene group". Unless otherwise stated, the term "heterocyclic group" means, but not limited to, a ring containing one or more heteroatoms and having 2 to 60 carbon atoms. Unless otherwise stated, the term "heteroatom" as used herein refers to N, O, S, P or Si and it may comprise compound comprising a heteroatom group such as $SO_2$, P═O, etc., as the following compounds instead of carbon forming a ring. The heterocyclic group means a monocyclic, ring assemblies, a fused polycyclic system or spiro compound containing a heteroatom.

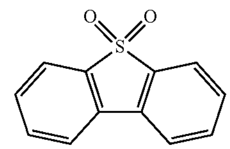 [SMILES: O=S1(=O)c2ccccc2-c2ccccc21]

The term "aliphatic ring group" as used herein refers to a cyclic hydrocarbon except for aromatic hydrocarbons, and comprises a monocyclic ring, ring assemblies, a fused polycyclic system, spiro compounds, and the like, and unless otherwise specified, it means a ring of 3 to 60 carbon atoms, but not limited thereto. For example, a fused ring formed by benzene being an aromatic ring with cyclohexane being a non-aromatic ring corresponds to aliphatic ring group.

In this specification, a 'group name' corresponding to an aryl group, an arylene group, a heterocyclic group, and the like exemplified for each symbol and its substituent may be written in the name of functional group reflecting the valence, and may also be described as the name of a parent compound. For example, in the case of phenanthrene which is a kind of aryl group, it may be described by distinguishing valence such as 'phenanthryl (group)' when it is 'monovalent group', and 'phenanthrylene (group)' when it is 'divalent group', and regardless of its valence, it may also be described as 'phenanthrene' which is a parent compound name. Similarly, in the case of pyrimidine, it may be described as 'pyrimidine' regardless of its valence, and it may also be described as the name of corresponding functional group such as pyrimidinyl (group) when it is 'monovalent group', and 'pyrimidinylene (group)' when it is 'divalent group'.

In addition, in the present specification, the numbers and alphabets indicating a position may be omitted when describing a compound name or a substituent name, For example, pyrido[4,3-d]pyrimidine, benzopuro[2,3-d] pyrimidine and 9,9-dimethyl-9H-fluorene can be described as pyridopyrimidine, benzofurropyrimidine and dimethylfluorene, respectively. Therefore, both benzo[g]quinoxaline and benzo[f] quinoxaline can be described as benzoquinoxaline.

In addition, unless otherwise expressed, where any formula of the present invention is represented by the following formula, the substituent according to the index may be defined as follows.

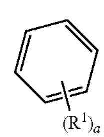

In the above formula, where a is an integer of zero, the substituent $R^1$ is absent, that is, hydrogen atoms are bonded to all the carbon constituting the benzene ring. Here, chemical formulas or compounds may be written described by omitting the indication of hydrogen bonded to carbon. In addition, one substituent $R^1$ is bonded to any carbon of the carbons forming the benzene ring when "a" is an integer of 1. Similarly, where "a" is an integer of 2 or 3, for example, as in the following formulas, substituents $R^1$s may be bonded to the carbon of the benzene ring. Also, where "a" is an integer of 4 to 6, substituents $R^1$s are bonded to the carbon of the benzene ring in a similar manner. Further, where "a" is an integer of 2 or more, $R^1$s may be the same or different from each other.

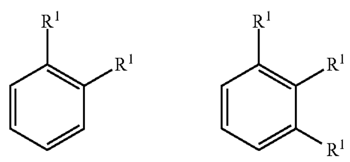

(a = 2) (a = 3)

In addition, unless otherwise specified in the present specification, the ring formed by bonding between adjacent groups may be selected from the group consisting of a $C_6$-$C_{60}$ aromatic ring group, a fluorenyl group, a $C_2$-$C_{60}$ heterocyclic group containing at least one heteroatom selected from the group consisting of O, N, S, Si, and P, a $C_3$-$C_{60}$ aliphatic ring, a fused ring of a $C_3$-$C_{60}$ aliphatic ring with a $C_6$-$C_{60}$ aromatic ring group and a combination thereof.

In addition, unless otherwise specified in the present specification, an aryl group may be a $C_6$-$C_{60}$ aryl group, preferably, a $C_6$-$C_{30}$ aryl group, more preferably, a $C_6$-$C_{18}$ aryl group, and a heterocyclic group may be a $C_2$-$C_{60}$ heterocyclic group, preferably a $C_2$-$C_{30}$ heterocyclic group, more preferably a $C_2$-$C_{18}$ heterocyclic group, more preferably a $C_2$-$C_{12}$ heterocyclic group containing at least one heteroatom selected from the group consisting of O, N, S, Si, and P.

Hereinafter, a laminated structure of the organic electric element comprising the compound of the present invention will be described with reference to FIG. 1.

In the following description of the present invention, a detailed description of known configurations and functions incorporated herein will be omitted when it may make the subject matter of the present invention rather unclear.

In addition, it will be understood that when an element such as a layer, film, region or substrate is referred to as being "on" or "over" another element, it can be directly on the other element or intervening elements may also be present. In contrast, when an element is referred to as being "directly on" another element, there are no intervening elements present.

FIG. 1 illustrates an example of an organic electric element according to an embodiment of the present invention.

Referring to the FIG. 1, an organic electric element 100 according to an embodiment of the present invention includes a first electrode 120 formed on a substrate 110, a second electrode 180, and an organic material layer formed between the first electrode 120 and the second electrode 180 and comprising the compound of the present invention. Here, the first electrode 120 may be an anode (positive electrode), and the second electrode 180 may be a cathode (negative electrode). In the case of an inverted organic electroluminescent element, the first electrode may be a cathode, and the second electrode may be an anode.

The organic material layer may include a hole injection layer 130, a hole transport layer 140, a light emitting layer 150, an electron transport layer 160, and an electron injection layer 170 stacked in sequence on the first electrode 120. Here, at least one layer of the organic material layer may be omitted, or a hole blocking layer, an electron blocking layer, an emission-auxiliary layer 151, an electron transport-auxiliary layer, a buffer layer 141, etc. may be further included in the organic material layer, and the electron transport layer 160 or the like may serve as a hole blocking layer.

In addition, although not shown, the organic electric element according to an embodiment of the present invention may further include a protective layer or a layer for improving luminous efficiency. The layer for improving luminous efficiency may be formed on one side of sides of the first electrode or one side of sides of the second electrode, wherein the one side is not facing the organic material layer.

The inventive compound employed in the organic material layer may be used as a material of a hole injection layer 130, a hole transport layer 140, an emission-auxiliary layer 151, an electron transport-auxiliary layer, an electron transport layer 160 or an electron injection layer 170, as host or dopant of a light emitting layer 150, or as a material of a layer for improving luminous efficiency. Preferably, compound represented by Formula 1 of the present invention or a mixture of compound represented by Formula 1 and compound represented by Formula 2 can be used as host of a light emitting layer.

On the other hand, even if the core is same or similar, the band gap, the electrical characteristics, the interface characteristics and the like may be different depending on which substituent is bonded at which position. Therefore, there is a need to study the selection of the core and the combination of the core and the sub-substituent bonded to the core. In particular, long life span and high efficiency can be simultaneously achieved when the optimal combination of energy levels and $T_1$ values, inherent material properties (mobility, interfacial properties, etc.) and the like among the respective layers of an organic material layer is achieved.

Therefore, the energy level and $T_1$ value between the respective layers of the organic material layer, inherent material properties (mobility, interfacial properties, etc.) and the like can be optimized by using compound represented by Formula 1 or a mixture of compound represented by Formula 1 and compound represented by Formula 2 as host of a light emitting layer in the present invention.

The organic electric element according to an embodiment of the present invention may be manufactured using various deposition methods. The organic electric element according to an embodiment of the present invention may be manufactured using a PVD (physical vapor deposition) method or CVD (chemical vapor deposition) method. For example, the organic electric element may be manufactured by depositing a metal, a conductive metal oxide, or alloy on the substrate to form the anode 120, forming the organic material layer including the hole injection layer 130, the hole transport layer 140, the light emitting layer 150, the electron transport layer 160, and the electron injection layer 170 thereon, and then depositing a material which can be used as the cathode 180, thereon. In addition, an emitting auxiliary layer 151 may be formed between a hole transport layer 140 and a light emitting layer 150, and an electron transport-auxiliary layer may be formed between a light emitting layer 150 and an electron transport layer 160.

In addition, the organic material layer may be manufactured in such a manner that a smaller number of layers are formed using various polymer materials by a soluble process or solvent process, for example, spin coating, nozzle printing, inkjet printing, slot coating, dip coating, roll-to-roll, doctor blading, screen printing, or thermal transfer, instead of deposition. Since the organic material layer according to the present invention may be formed in various ways, the scope of protection of the present invention is not limited by a method of forming the organic material layer.

The organic electric element according to an embodiment of the present invention may be of a top emission type, a bottom emission type, or a dual emission type depending on the material used.

In addition, the organic electric element according to the present invention may be selected from group consisting of an organic electroluminescent element, an organic solar cell, an organic photo conductor, an organic transistor, an element for monochromatic illumination and an element quantum dot display.

Another embodiment of the present invention provides an electronic device including a display device which includes the above described organic electric element, and a control unit for controlling the display device. Here, the electronic device may be a wired/wireless communication terminal which is currently used or will be used in the future, and covers all kinds of electronic devices including a mobile communication terminal such as a cellular phone, a personal digital assistant (PDA), an electric dictionary, a point-to-multipoint (PMP), a remote controller, a navigation unit, a game player, various kinds of TVs, various kinds of computers and so on.

Hereinafter, the compound according to an aspect of the present invention will be described.

Compound according to one aspect of the present invention may be represented by Formula 1.

<Formula 1>

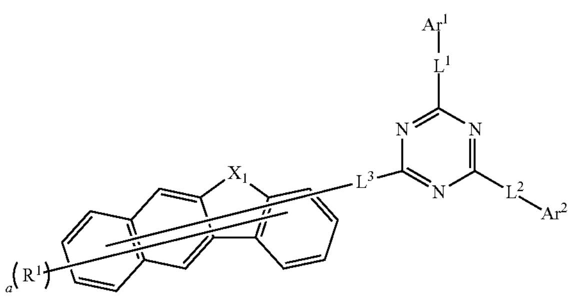

In formula 1, each of symbols may be defined as follows.

$X_1$ is O or S.

$Ar^1$ and $Ar^2$ are each independently selected from the group consisting of a $C_6$-$C_{18}$ aryl group, a fluorenyl group, a $C_2$-$C_{18}$ heterocyclic group comprising at least one heteroatom selected from the group consisting of O, N, S, Si and P, a $C_3$-$C_{60}$ aliphatic ring, a fused ring of a $C_3$-$C_{60}$ aliphatic ring with a $C_6$-$C_{60}$ aromatic ring, a $C_1$-$C_{50}$ alkyl group, a $C_2$-$C_{20}$ alkenyl group, a $C_2$-$C_{20}$ alkynyl group, a $C_1$-$C_{30}$ alkoxyl group and a $C_6$-$C_{30}$ aryloxy group.

Preferably, $Ar^1$ and $Ar^2$ are each independently selected from the group consisting of a $C_6$-$C_{18}$ aryl group, a fluorenyl group, a $C_2$-$C_{16}$ heterocyclic group comprising at least one heteroatom selected from the group consisting of O, N, S, Si and P, a $C_3$-$C_{60}$ aliphatic ring, a fused ring of a $C_3$-$C_{60}$ aliphatic ring with a $C_6$-$C_{60}$ aromatic ring, a $C_1$-$C_{50}$ alkyl group, a $C_2$-$C_{20}$ alkenyl group, a $C_2$-$C_{20}$ alkynyl group, a $C_1$-$C_{30}$ alkoxyl group and a $C_6$-$C_{30}$ aryloxy group.

Where $Ar^1$ and $Ar^2$ are each an aryl group, the aryl group may be phenyl, biphenyl, naphthyl, terphenyl, phenanthrene, pyrene, triphenylene, anthracene and the like. Where $Ar^1$ and $Ar^2$ are each a heterocyclic group, the heterocyclic group may be dibenzothiophene, dibenzofuran, carbazole, phenylcarbazole, benzonaphthofuran, benzonaphthothiophene and the like.

Where $Ar^1$ and $Ar^2$ are each a fluorenyl group, the fluorenyl group may be 9,9-diphenylfluorene, 9,9-dimethylfluorene and the like. Where $Ar^1$ and $Ar^2$ are each aliphatic ring, the aliphatic ring may be preferably a $C_3$-$C_{30}$ aliphatic ring, more preferably, a $C_3$-$C_{12}$ aliphatic ring, for example, cyclohexane, cyclohexylcyclohexane, or the like. Where $Ar^1$ and $Ar^2$ are each an alkyl group, the alkyl group may be preferably a $C_2$-$C_{10}$ alkyl group, for example, methyl, t-butyl and the like. Where $Ar^1$ and $Ar^2$ are each an alkenyl group, the alkenyl group may be preferably a $C_2$-$C_{10}$ alkenyl group, for example, ethene, propene and the like.

$L^1$ to $L^3$ are each independently selected from the group consisting of a single bond, a $C_6$-$C_{60}$ arylene group, a fluorenylene group, a $C_2$-$C_{60}$ heterocyclic group comprising at least one heteroatom selected from the group consisting of O, N, S, Si and P, a $C_3$-$C_{60}$ aliphatic ring, and a fused ring of a $C_3$-$C_{60}$ aliphatic ring with a $C_6$-$C_{60}$ aromatic ring.

Where $L^1$ to $L^3$ are each an arylene group, the arylene group may be preferably a $C_6$-$C_{30}$ arylene group, more preferably a $C_6$-$C_{18}$ arylene group, for example, phenyl, biphenyl, naphthyl, terphenyl and the like. Where $L^1$ to $L^3$ are each a heterocyclic group, the heterocyclic group may be preferably a $C_2$-$C_{30}$ heterocyclic group, more preferably a $C_2$-$C_{18}$ heterocyclic group, for example, carbazole, phenylcarbazole, dibenzofuran, dibenzothiophene and the like.

$R^1$ is selected from the group consisting of hydrogen, deuterium, halogen, a cyano group, a $C_6$-$C_{60}$ aryl group, a fluorenyl group, a $C_2$-$C_{60}$ heterocyclic group comprising at least one heteroatom selected from the group consisting of O, N, S, Si and P, a $C_3$-$C_{60}$ aliphatic ring, a fused ring of a $C_3$-$C_{60}$ aliphatic ring with a $C_6$-$C_{60}$ aromatic ring, a $C_1$-$C_{50}$ alkyl group, a $C_2$-$C_{20}$ alkenyl group, a $C_2$-$C_{20}$ alkynyl group, a $C_1$-$C_{30}$ alkoxyl group, a $C_6$-$C_{30}$ aryloxy group and -L'-N$(R_a)(R_b)$, and adjacent groups may be bonded to each other to form a ring, a is an integer of 0-9, and where a is an integer of 2 or more, each of a plurality of $R^1$s are the same as or different from each other.

The ring formed by bonding between neighboring $R^1$s may be a $C_6$-$C_{60}$ aromatic ring group, a fluorenyl group, a $C_2$-$C_{60}$ heterocyclic group containing at least one heteroatom of O, N, S, Si and P, a $C_3$-$C_{60}$ aliphatic ring or a fused ring of a $C_3$-$C_{60}$ aliphatic ring with a $C_6$-$C_{60}$ aromatic ring and the like. Where an aromatic ring is formed by bonding between neighboring $R^1$s, the aromatic ring may be preferably a $C_6$-$C_{30}$ aromatic ring group, more preferably, a $C_6$-$C_{14}$ aromatic ring group, for example, benzene, naphthalene, phenanthrene or the like.

Where $R^1$ is an aryl group, the aryl group may be preferably a $C_6$-$C_{30}$ aryl group, more preferably a $C_6$-$C_{18}$ aryl group, for example, phenyl, naphthyl, biphenyl, terphenyl, phenanthrene, and the like.

L' is selected from the group consisting of a single bond, a $C_6$-$C_{60}$ arylene group, a fluorenylene group, a $C_2$-$C_{60}$ heterocyclic group comprising at least one heteroatom selected from the group consisting of O, N, S, Si and P, a $C_3$-$C_{60}$ aliphatic ring, and a fused ring of a $C_3$-$C_{60}$ aliphatic ring with a $C_6$-$C_{60}$ aromatic ring.

$R_a$ and $R_b$ are each independently selected from the group consisting of a $C_6$-$C_{60}$ aryl group, a fluorenyl group, a $C_2$-$C_{60}$ heterocyclic group comprising at least one heteroatom selected from the group consisting of O, N, S, Si and P, a $C_3$-$C_{60}$ aliphatic ring, and a fused ring of a $C_3$-$C_{60}$ aliphatic ring with a $C_6$-$C_{60}$ aromatic ring.

Formula 1 may be represented by one of the following Formulas.

<Formula 1-A>

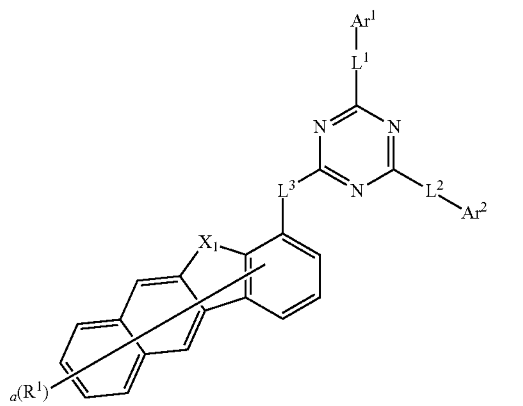

<Formula 1-B>

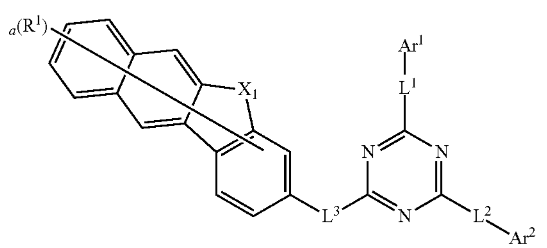

<Formula 1-C>

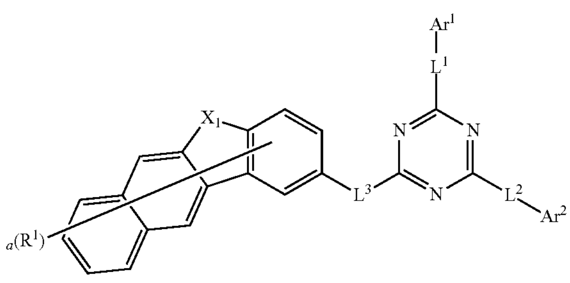

<Formula 1-D>

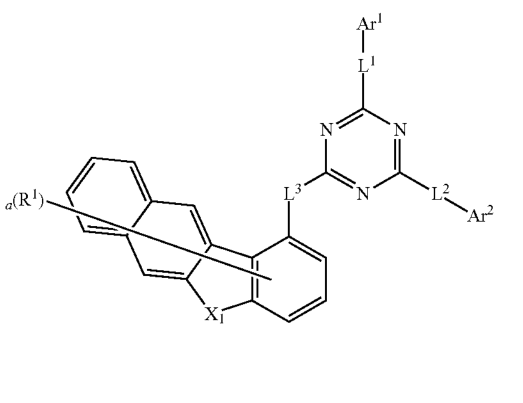

-continued

<Formula 1-E>

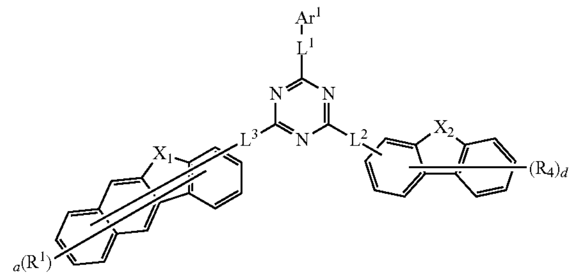

<Formula 1-F>

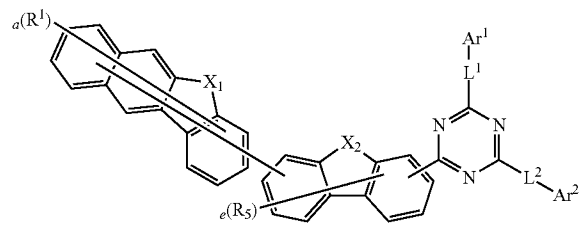

<Formula 1-G>

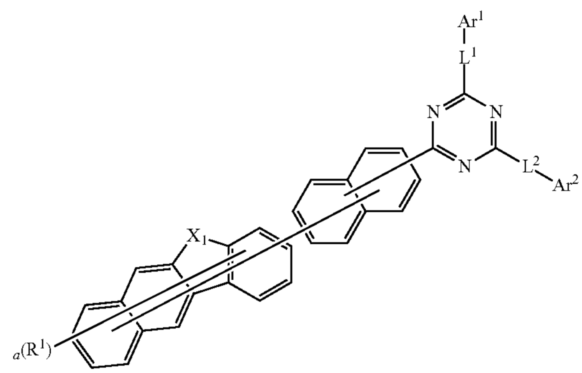

In Formulas 1-A to 1-G, each of symbols may be defined as follows.

$Ar^1$, $Ar^2$, $L^1$-$L^3$, $X_1$, $R^1$ and a are the same as defined for Formula 1. Preferably, in Formula 1-F and 1-G, $Ar^1$ and $Ar^2$ are different from each other, and preferably $Ar^1$ and $Ar^2$ may be independently an aryl group, more preferably naphthyl.

$X_2$ and $X_3$ are each independently O or S.

$R_4$ and $R_5$ are each independently selected from the group consisting of hydrogen, deuterium, halogen, a cyano group, a nitro group, a $C_6$-$C_{20}$ aryl group, a fluorenyl group, a $C_2$-$C_{20}$ heterocyclic group comprising at least one heteroatom selected from the group consisting of O, N, S, Si and P, a $C_3$-$C_{20}$ aliphatic ring, a ring of a $C_3$-$C_{20}$ aliphatic ring with a $C_6$-$C_{20}$ aromatic ring, a $C_1$-$C_{20}$ alkyl group, a $C_2$-$C_{20}$ alkenyl group, a $C_2$-$C_{20}$ alkynyl group, a $C_1$-$C_{20}$ alkoxyl group, a $C_6$-$C_{20}$ aryloxy group and $-L^a-N(R_a)(R_b)$, and adjacent groups may be linked to each other to form a ring.

The ring formed by bonding between neighboring groups may be a $C_6$-$C_{60}$ aromatic ring group, a fluorenyl group, a $C_2$-$C_{60}$ heterocyclic group containing at least one heteroatom of O, N, S, Si and P, a $C_3$-$C_{60}$ aliphatic ring or a fused ring of a $C_3$-$C_{60}$ aliphatic ring with a $C_6$-$C_{60}$ aromatic ring and the like. Where an aromatic ring is formed by bonding between neighboring $R_4$s or neighboring $R_5$s, the aromatic ring may be preferably a $C_6$-$C_{30}$ aromatic ring group, more preferably, a $C_6$-$C_{14}$ aromatic ring group, for example, benzene, naphthalene, phenanthrene or the like.

d is an integer of 0-7, e is an integer of 0-6, and where each of these is an integer of 2 or more, each of a plurality of $R_4$s and each of a plurality of $R_5$s are the same as or different from each other.

$L^a$ is selected from the group consisting of a single bond, a $C_6$-$C_{20}$ arylene group, a fluorenylene group, a $C_2$-$C_{20}$ heterocyclic group comprising at least one heteroatom selected from the group consisting of O, N, S, Si and P, a $C_3$-$C_{20}$ aliphatic ring, and a combination thereof.

$R_a$ and $R_b$ are each independently selected from the group consisting of a $C_6$-$C_{20}$ aryl group, a fluorenyl group, a $C_2$-$C_{20}$ heterocyclic group comprising at least one heteroatom selected from the group consisting of O, N, S, Si and P, a $C_3$-$C_{20}$ aliphatic ring, and a combination thereof.

Formula 1-F may be represented by one of the following Formulas.

<Formula 1-F-1>

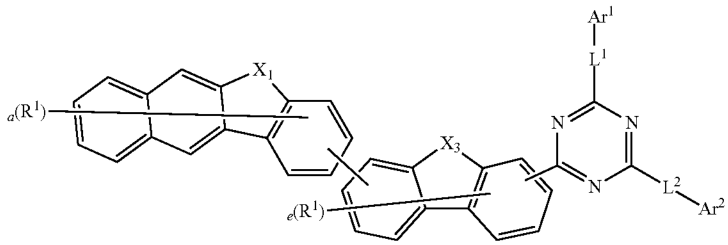

<Formula 1-F-2>

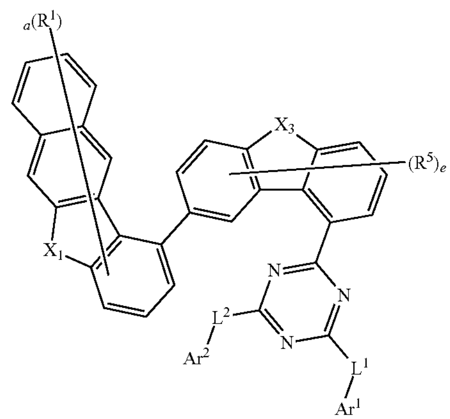

In Formulas 1-F-1 and 1-F-2, $X_1$, $X_3$, $Ar^1$, $Ar^2$, $L^2$, $R^1$, $R^5$, a and e are the same as defined for Formula 1-F.

Formula 1-G may be represented by one of the following Formulas.

<Formula 1-G-1>

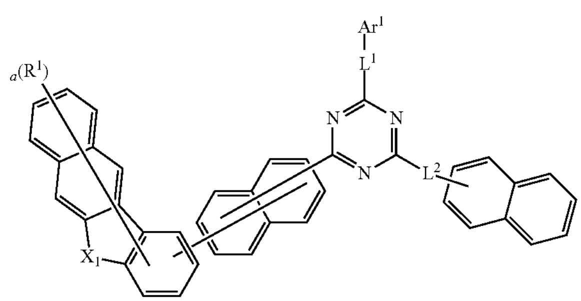

-continued

<Formula 1-G-2>

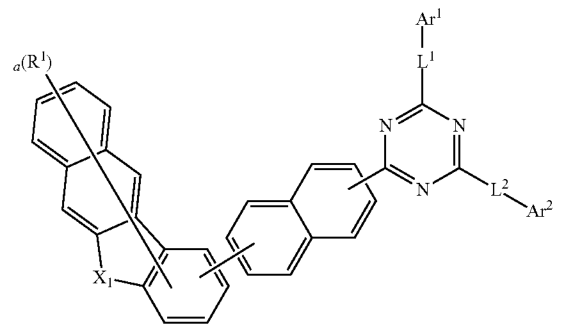

-continued

<Formula 1-G-3>

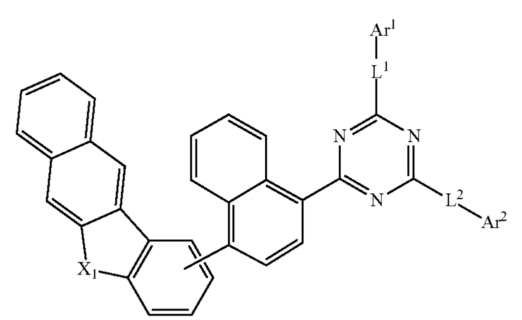

-continued

<Formula 1-G-4>

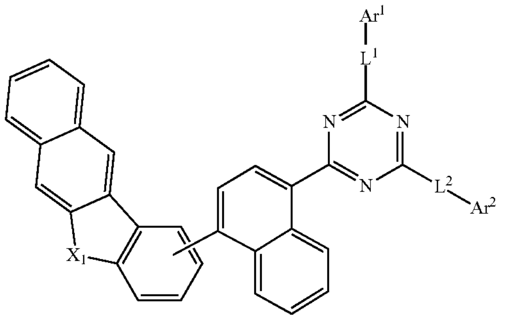

<Formula 1-G-5>

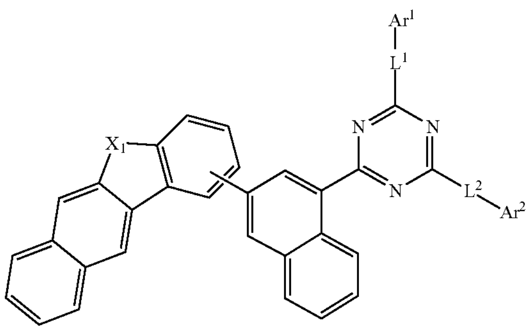

In Formulas 1-G-1 to 1-G-5, $X_1$, $Ar^1$, $Ar^2$, $L^1$, $L^2$, $R^1$ and a are the same as defined for Formula 1-G.

Preferably, each symbol in the above Formulas may be further substituted. For example, in Formula 1, Formula 1-A to Formula 1-G, Formula 1-F-1, Formula 1-F-2, Formula 1-G-1 to Formula 1-G-5, $Ar^1$, $Ar^2$, $L^1$-$L^3$, L', $L^a$, $R^1$, $R_4$, $R_5$, $R_a$, $R_b$, $R^a$, $R^b$ and the ring formed by bonding between adjacent groups may be each optionally substituted with one or more substituents selected from the group consisting of deuterium, halogen, a silane group unsubstituted or substituted with a $C_1$-$C_{20}$ alkyl group or a $C_6$-$C_{20}$ aryl group, a siloxane group, a boron group, a germanium group, a cyano group, a nitro group, a $C_1$-$C_{20}$ alkylthio group, a $C_1$-$C_{20}$ alkoxy group, a $C_6$-$C_{20}$ aryloxy group, a $C_1$-$C_{20}$ alkyl group, a $C_2$-$C_{20}$ alkenyl group, a $C_2$-$C_{20}$ alkynyl group, a $C_6$-$C_{20}$ aryl group, a $C_6$-$C_{20}$ aryl group substituted with deuterium, a fluorenyl group, a $C_2$-$C_{20}$ heterocyclic group containing at least one heteroatom of O, N, S, Si, and P, a $C_3$-$C_{20}$ aliphatic ring group, a $C_7$-$C_{20}$ arylalkyl group, $C_8$-$C_{20}$ arylalkenyl group and -$L^a$-N($R^a$)($R^b$).

In another aspect of the present invention, the present invention provides an organic electric element comprising a first electrode, a second electrode, and an organic material layer formed between the first electrode and the second electrode, wherein the organic material layer comprises compound represented by Formula 1, preferably, one of Formula 1-A to Formula 1-G, more preferably, compound represented by Formula 1-F and/or Formula 1-G is comprised in a light emitting layer of the organic material layer.

In another aspect of the present invention, the present invention provides an organic electric element comprising a first electrode, a second electrode, and an organic material layer formed between the first electrode and the second electrode, wherein the organic material layer comprises a phosphorescent light emitting layer, and the host of the phosphorescent light emitting layer comprises a first compound represented by Formula 1 and a second compound represented by Formula 2 below.

<Formula 2>

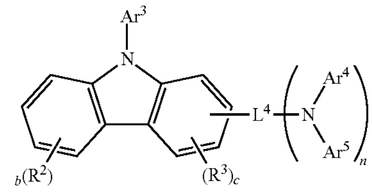

In Formula 2, each of symbols may be defined as follows.

$Ar^3$ to $Ar^5$ are each independently selected from the group consisting of a $C_6$-$C_{60}$ aryl group, a fluorenyl group, a $C_2$-$C_{60}$ heterocyclic group comprising at least one heteroatom selected from the group consisting of O, N, S, Si and P, a $C_3$-$C_{60}$ aliphatic ring, a fused ring of a $C_3$-$C_{60}$ aliphatic ring with a $C_6$-$C_{60}$ aromatic ring, a $C_1$-$C_{50}$ alkyl group, a $C_2$-$C_{20}$ alkenyl group, a $C_2$-$C_{20}$ alkynyl group, a $C_1$-$C_{30}$ alkoxyl group and a $C_6$-$C_{30}$ aryloxy group, and $Ar^4$ and $Ar^5$ may be bonded to each other to form a ring. Here, the formed ring is a hetero ring containing one or more N.

n is an integer of 0-3, and where n is an integer of 2 or more, each of a plurality of $Ar^4$s, and each of a plurality of $Ar^5$s are the same as or different from each other, Where $Ar^3$ to $Ar^5$ are each an aryl group, the aryl group may be preferably a $C_6$-$C_{30}$ aryl group, more preferably a $C_6$-$C_{18}$ aryl group, for example, phenyl, biphenyl, naphthyl, terphenyl, phenanthrene and the like. Where $Ar^3$ to $Ar^5$ are each a heterocyclic group, the heterocyclic group may be preferably a $C_2$-$C_{30}$ heterocyclic group, more preferably a $C_2$-$C_{18}$ heterocyclic group, for example, pyridine, pyrimidine, triazine, carbazole, phenylcarbazole, dibenzothiophene, dibenzofuran and the like. Where $Ar^3$ to $Ar^5$ are each a fluorenyl group, the fluorenyl group may be 9,9-dimethylfluorene, 9,9-diphenylfluorene, 9,9'-spirobifluorene and the like.

$L^4$ is selected from the group consisting of a single bond, a $C_6$-$C_{60}$ arylene group, a fluorenylene group, a $C_2$-$C_{60}$ heterocyclic group comprising at least one heteroatom selected from the group consisting of O, N, S, Si and P, a $C_3$-$C_{60}$ aliphatic ring, and a fused ring of a $C_3$-$C_{60}$ aliphatic ring with a $C_6$-$C_{60}$ aromatic ring, Where $L^4$ is an arylene group, the arylene group may be preferably a $C_6$-$C_{30}$ arylene group, more preferably a $C_6$-$C_{18}$ arylene group, for example, phenyl, biphenyl, naphthyl, terphenyl and the like. Where $L^4$ is a heterocyclic group, the heterocyclic group may be preferably a $C_2$-$C_{30}$ heterocyclic group, more preferably a $C_2$-$C_{18}$ heterocyclic group, more preferably a $C_2$-$C_{12}$ heterocyclic group, for example, pyridine, triazine, dibenzothiophene, dibenzofuran and the like. Where $L^4$ is a fluorenyl group, the fluorenyl group may be 9,9-dimethylfluorene, 9,9-diphenylfluorene, 9,9'-spirobifluorene and the like.

$R^2$ and $R^3$ are each independently selected from the group consisting of hydrogen, deuterium, halogen, a cyano group, a $C_6$-$C_{60}$ aryl group, a fluorenyl group, a $C_2$-$C_{60}$ heterocyclic group comprising at least one heteroatom selected from the group consisting of O, N, S, Si and P, a $C_3$-$C_{60}$ aliphatic ring, a fused ring of a $C_3$-$C_{60}$ aliphatic ring with a $C_6$-$C_{60}$ aromatic ring, a $C_1$-$C_{50}$ alkyl group, a $C_2$-$C_{20}$ alkenyl group, a $C_2$-$C_{20}$ alkynyl group, a $C_1$-$C_{30}$ alkoxyl group, a $C_6$-$C_{30}$ aryloxy group and -L'-N($R_a$)($R_b$), and adjacent groups may be bonded to each other to form a ring. Here, the ring formed by bonding between neighboring groups may be a $C_6$-$C_{60}$ aromatic ring group, a fluorenyl group, a $C_2$-$C_{60}$ heterocyclic group containing at least one heteroatom of O, N, S, Si and P, a $C_3$-$C_{60}$ aliphatic ring or a fused ring of a $C_3$-$C_{60}$ aliphatic ring with a $C_6$-$C_{60}$ aromatic ring and the like.

Where an aromatic ring is formed by bonding between neighboring $R^2$s or neighboring $R^3$s, the aromatic ring may be preferably a $C_6$-$C_{30}$ aromatic ring group, more preferably, a $C_6$-$C_{14}$ aromatic ring group, for example, benzene, naphthalene, phenanthrene or the like.

b is an integer of 0-4, c is an integer of 0-3, and where each of these is an integer of 2 or more, each of a plurality of $R^2$s, and each of a plurality of $R^3$s are the same as or different from each other, L' is selected from the group consisting of a single bond, a $C_6$-$C_{60}$ arylene group, a fluorenylene group, a $C_2$-$C_{60}$ heterocyclic group comprising at least one heteroatom selected from the group consisting of O, N, S, Si and P, a $C_3$-$C_{60}$ aliphatic ring, and a fused ring of a $C_3$-$C_{60}$ aliphatic ring with a $C_6$-$C_{60}$ aromatic ring.

$R_a$ and $R_b$ are each independently selected from the group consisting of a $C_6$-$C_{60}$ aryl group, a fluorenyl group, a $C_2$-$C_{60}$ heterocyclic group comprising at least one heteroatom selected from the group consisting of O, N, S, Si and P, a $C_3$-$C_{60}$ aliphatic ring, and a fused ring of a $C_3$-$C_{60}$ aliphatic ring with a $C_6$-$C_{60}$ aromatic ring.

Formula 2 may be represented by Formula 2-A or Formula 2-B.

<Formula 2-A>

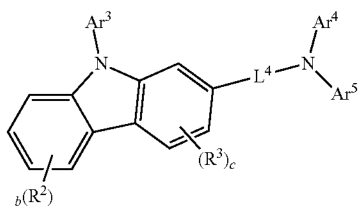

<Formula 2-B>

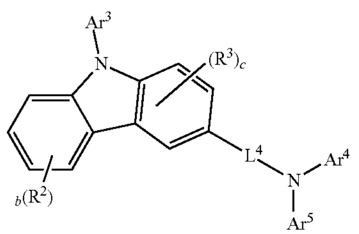

In Formulas 2-A and 2-B, wherein, $L^4$, $Ar^3$ to $Ar^5$, $R^2$, $R^3$, b and c are the same as defined for Formula 2.

In addition, Formula 2 may be represented by one of Formula 2-C to Formula 2-F.

<Formula 2-C>

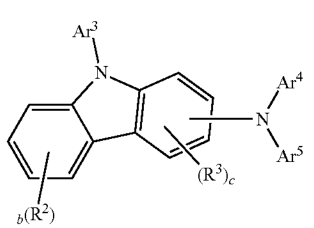

-continued

<Formula 2-D>

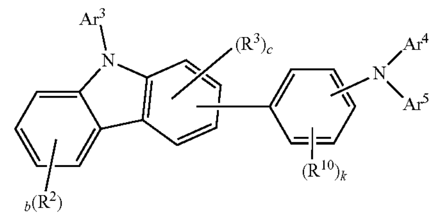

<Formula 2-E>

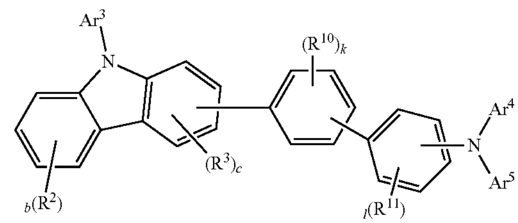

<Formula 2-F>

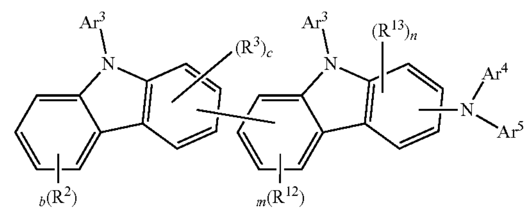

In Formulas 2-C to Formula 2-F, each symbol can be defined as follows.

$Ar^3$ to $Ar^5$, $R^2$, $R^3$, b and c are the same as defined for Formula 2.

$R^{10}$ to $R^{13}$ are each independently selected from the group consisting of hydrogen, deuterium, halogen, a $C_6$-$C_{20}$ aryl group, a fluorenyl group, a $C_2$-$C_{20}$ heterocyclic group comprising at least one heteroatom selected from the group consisting of O, N, S, Si and P, a $C_3$-$C_{20}$ aliphatic ring, a $C_1$-$C_{20}$ alkyl group, a $C_2$-$C_{20}$ alkenyl group, a $C_2$-$C_{20}$ alkynyl group, a $C_1$-$C_{20}$ alkoxyl group, a $C_6$-$C_{20}$ aryloxy group, $-L^a$-$N(R_a)(R_b)$ and a combination thereof, and adjacent groups may be linked to each other to form a ring.

The ring formed by bonding between neighboring groups may be a $C_6$-$C_{60}$ aromatic ring group, a fluorenyl group, a $C_2$-$C_{60}$ heterocyclic group containing at least one heteroatom of O, N, S, Si and P, a $C_3$-$C_{60}$ aliphatic ring or a fused ring of a $C_3$-$C_{60}$ aliphatic ring with a $C_6$-$C_{60}$ aromatic ring and the like.

Where an aromatic ring is formed by bonding between neighboring $R^{10}$s, $R^{11}$s, $R^{12}$s or neighboring $R^{13}$s, the aromatic ring may be preferably a $C_6$-$C_{30}$ aromatic ring group, more preferably, a $C_6$-$C_{14}$ aromatic ring group, for example, benzene, naphthalene, phenanthrene or the like.

k and l are each an integer of 0-4, n and m are each an integer of 0-3, and where each of these is an integer of 2 or more, each of a plurality of $R^{10}$, each of a plurality of $R^{11}$, each of a plurality of $R^{12}$, and each of a plurality of $R^{13}$ are the same as or different from each other.

V is $N(L^a$-$Ar^a)$, O, S or C(R')(R").

R' and R" are each independently selected from the group consisting of hydrogen, deuterium, halogen, a cyano group, a nitro group, a $C_6$-$C_{20}$ aryl group, a fluorenyl group, a $C_2$-$C_{20}$ heterocyclic group comprising at least one heteroatom selected from the group consisting of O, N, S, Si and P, a $C_3$-$C_{20}$ aliphatic ring, a fused ring of a $C_3$-$C_{20}$ aliphatic ring with a $C_6$-$C_{20}$ aromatic ring, a $C_1$-$C_{20}$ alkyl group, a $C_2$-$C_{20}$ alkenyl group, a $C_2$-$C_{20}$ alkynyl group, a $C_1$-$C_{20}$ alkoxyl group, a $C_6$-$C_{20}$ aryloxy group and $-L^a$-$N(R_a)(R_b)$, and R' and R" may be linked to each other to form a ring.

$Ar^a$ is selected from the group consisting of a $C_6$-$C_{20}$ aryl group, a fluorenyl group, a $C_2$-$C_{20}$ heterocyclic group comprising at least one heteroatom selected from the group consisting of O, N, S, Si and P, a $C_3$-$C_{20}$ aliphatic ring, and a combination thereof.

$L^a$ is selected from the group consisting of a single bond, a $C_6$-$C_{20}$ arylene group, a fluorenylene group, a $C_2$-$C_{20}$ heterocyclic group comprising at least one heteroatom selected from the group consisting of O, N, S, Si and P, a $C_3$-$C_{20}$ aliphatic ring, and a combination thereof.

$R^a$ and $R^b$ are each independently selected from the group consisting of a $C_6$-$C_{20}$ aryl group, a fluorenyl group, a $C_2$-$C_{20}$ heterocyclic group comprising at least one heteroatom selected from the group consisting of O, N, S, Si and P, a $C_3$-$C_{20}$ aliphatic ring, and a combination thereof.

Formula 2 may be represented by one of the following Formula 2-G to Formula 2-T.

<Formula 2-G>

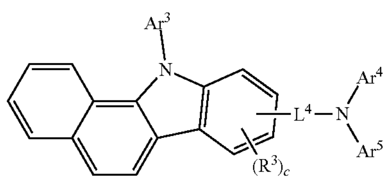

<Formula 2-H>

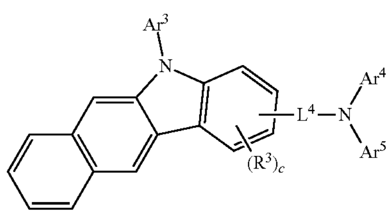

<Formula 2-I>

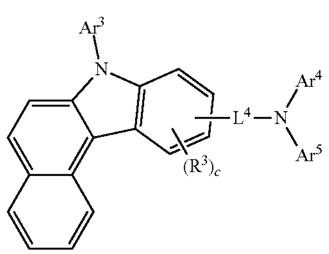

<Formula 2-J>

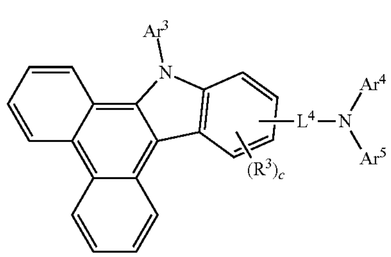

-continued

<Formula 2-K>

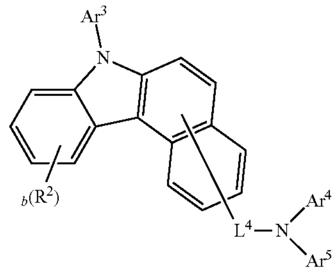

<Formula 2-L>

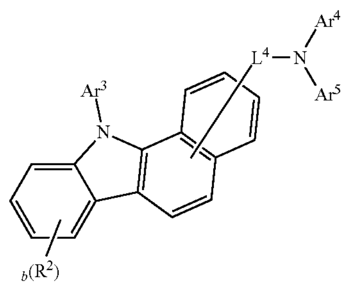

<Formula 2-M>

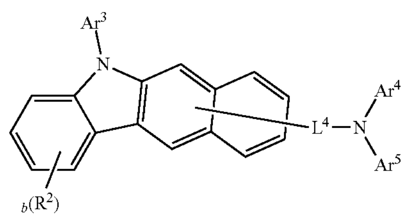

<Formula 2-N>

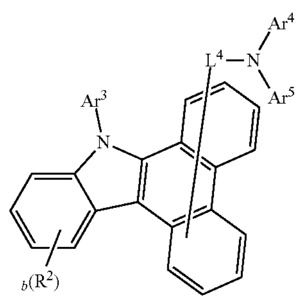

<Formula 2-O>

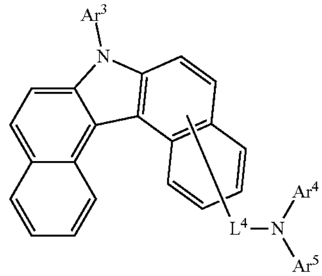

-continued

<Formula 2-P>

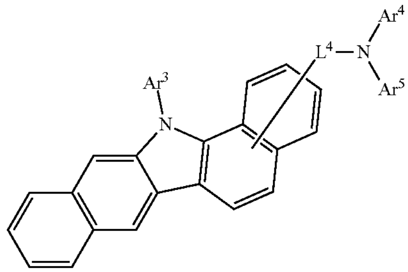

<Formula 2-Q>

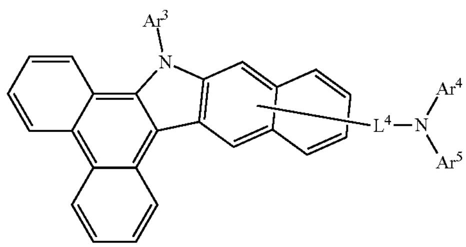

<Formula 2-R>

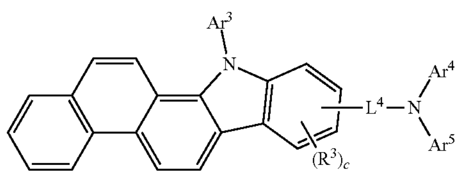

<Formula 2-S>

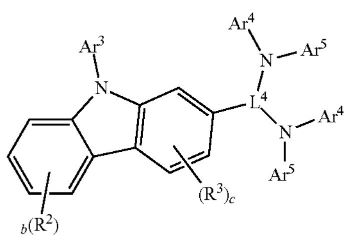

<Formula 2-T>

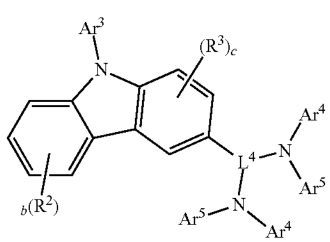

In Formulas 2-G to 2-T, $Ar^3$ to $Ar^5$, $L^4$, $R^2$, $R^3$, b and c are the same as defined for Formula 2.

Formula 2 may be represented by Formula 2-U.

<Formula 2-U>

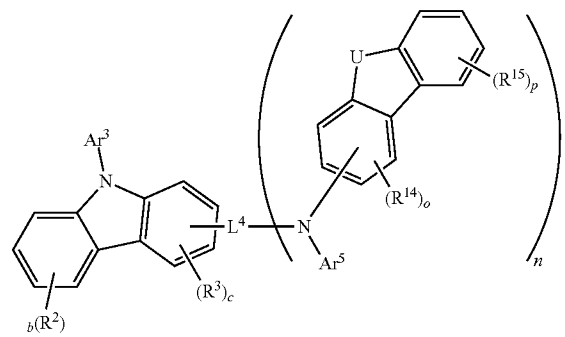

In Formula 2-U, each of symbols may be defined as follows.

$Ar^3$, $Ar^5$, $L^4$, $R^2$, $R^3$, b, c and n are the same as defined for Formula 2.

U is N-($L^a$-$Ar^a$), O, S or C(R')(R").

$R^{14}$ and $R^{15}$ are each independently selected from the group consisting of hydrogen, deuterium, halogen, a cyano group, a nitro group, a $C_6$-$C_{20}$ aryl group, a fluorenyl group, a $C_2$-$C_{20}$ heterocyclic group comprising at least one heteroatom selected from the group consisting of O, N, S, Si and P, a $C_3$-$C_{20}$ aliphatic ring, a fused ring of a $C_3$-$C_{20}$ aliphatic ring with a $C_6$-$C_{20}$ aromatic ring, a $C_1$-$C_{20}$ alkyl group, a $C_2$-$C_{20}$ alkenyl group, a $C_2$-$C_{20}$ alkynyl group, a $C_1$-$C_{20}$ alkoxyl group, a $C_6$-$C_{20}$ aryloxy group and -$L^a$-N($R_a$)($R_b$), and adjacent groups may be linked to each other to form a ring.

Where an aromatic ring is formed by bonding between neighboring $R^{14}$s or neighboring $R^{15}$s, the aromatic ring may be preferably a $C_6$-$C_{30}$ aromatic ring group, more preferably, a $C_6$-$C_{14}$ aromatic ring group, for example, benzene, naphthalene, phenanthrene or the like.

o is an integer of 0-3, p is an integer of 0-4, and where each of these is an integer of 2 or more, each of a plurality of $R^{14}$, and each of a plurality of $R^{15}$ are the same as or different from each other.

R' and R" are each independently selected from the group consisting of hydrogen, deuterium, halogen, a cyano group, a nitro group, a $C_6$-$C_{20}$ aryl group, a fluorenyl group, a $C_2$-$C_{20}$ heterocyclic group comprising at least one heteroatom selected from the group consisting of O, N, S, Si and P, a $C_3$-$C_{20}$ aliphatic ring, a fused ring of a $C_3$-$C_{20}$ aliphatic ring with a $C_6$-$C_{20}$ aromatic ring, a $C_1$-$C_{20}$ alkyl group, a $C_2$-$C_{20}$ alkenyl group, a $C_2$-$C_{20}$ alkynyl group, a $C_1$-$C_{20}$ alkoxyl group, a $C_6$-$C_{30}$ aryloxy group, and -$L^a$-N($R_a$)($R_b$), and R' and R" may be linked to each other to form a ring.

$Ar^a$ is selected from the group consisting of a $C_6$-$C_{20}$ aryl group, a fluorenyl group, a $C_2$-$C_{20}$ heterocyclic group comprising at least one heteroatom selected from the group consisting of O, N, S, Si and P, a $C_3$-$C_{20}$ aliphatic ring, and a combination thereof.

$L^a$ is selected from the group consisting of a single bond, a $C_6$-$C_{20}$ arylene group, a fluorenylene group, a $C_2$-$C_{20}$ heterocyclic group comprising at least one heteroatom selected from the group consisting of O, N, S, Si and P, a $C_3$-$C_{20}$ aliphatic ring, and a combination thereof.

$R^a$ and $R^b$ are each independently selected from the group consisting of a $C_6$-$C_{20}$ aryl group, a fluorenyl group, a $C_2$-$C_{20}$ heterocyclic group comprising at least one heteroatom selected from the group consisting of O, N, S, Si and P, a $C_3$-$C_{20}$ aliphatic ring, and a combination thereof.

Each symbol in Formula 2 and Formula 2-A to Formula 2-U may be further substituted. For example, $Ar^3$-$Ar^5$, $R^2$, $R^3$, $R^{10}$ to $R^{15}$, $L^4$, L', $L^a$, $Ar^a$, $R_a$, $R_b$, R', R", $R^a$, $R^b$ and the ring formed by bonding between adjacent groups may be each optionally substituted with one or more substituents selected from the group consisting of deuterium, halogen, a silane group unsubstituted or substituted with a $C_1$-$C_{20}$ alkyl group or a $C_6$-$C_{20}$ aryl group, a siloxane group, a boron group, a germanium group, a cyano group, a nitro group, a $C_1$-$C_{20}$ alkylthio group, a $C_1$-$C_{20}$ alkoxy group, a $C_6$-$C_{20}$ aryloxy group, a $C_1$-$C_{20}$ alkyl group, a $C_2$-$C_{20}$ alkenyl group, a $C_2$-$C_{20}$ alkynyl group, a $C_6$-$C_{20}$ aryl group, a $C_6$-$C_{20}$ aryl group substituted with deuterium, a fluorenyl group, a $C_2$-$C_{20}$ heterocyclic group containing at least one heteroatom of O, N, S, Si, and P, a $C_3$-$C_{20}$ aliphatic ring group, a $C_7$-$C_{20}$ arylalkyl group, $C_8$-$C_{20}$ arylalkenyl group and -$L^a$-N($R_a$)($R_b$).

Preferably, in Formulas 1 and 2, $L^1$ to $L^4$ may be each independently one of the following Formulas b-1 to b-13.

<Formula b-1>

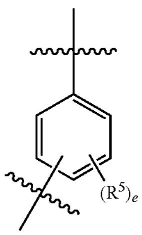

<Formula b-2>

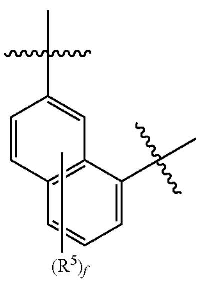

<Formula b-3>

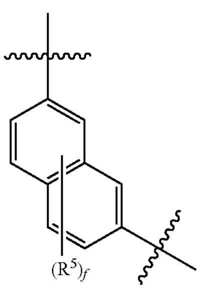

<Formula b-4>

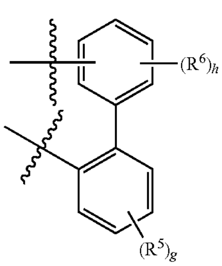

-continued

<Formula b-5>

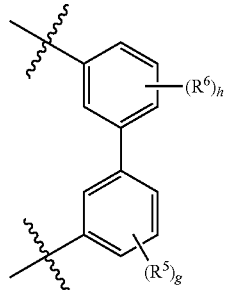

<Formula b-6>

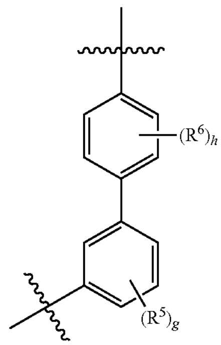

<Formula b-7>

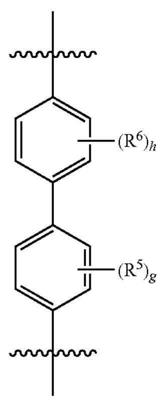

<Formula b-8>

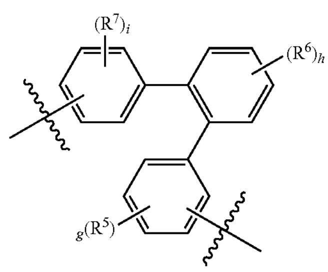

<Formula b-9>

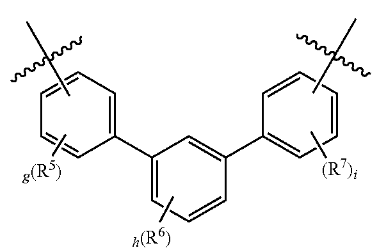

-continued

<Formula b-10>

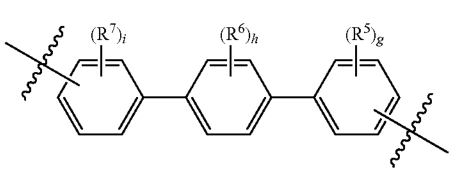

<Formula b-11>

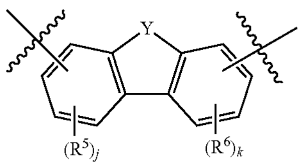

<Formula b-12>

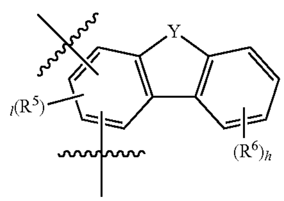

<Formula b-13>

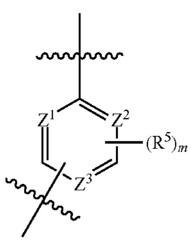

In Formulas b-1 to b-13, each of symbols may be defined as follows.

$R^5$ to $R^7$ are each independently selected from the group consisting of hydrogen, deuterium, halogen, a cyano group, a nitro group, a $C_6$-$C_{20}$ aryl group, a fluorenyl group, a $C_2$-$C_{20}$ heterocyclic group comprising at least one heteroatom selected from the group consisting of O, N, S, Si and P, a $C_3$-$C_{20}$ aliphatic ring, a fused ring of a $C_3$-$C_{20}$ aliphatic ring with a $C_6$-$C_{20}$ aromatic ring, a $C_1$-$C_{20}$ alkyl group, a $C_2$-$C_{20}$ alkenyl group, a $C_2$-$C_{20}$ alkynyl group, a $C_1$-$C_{20}$ alkoxyl group, a $C_6$-$C_{30}$ aryloxy group and $-L^a-N(R_a)(R_b)$, and adjacent groups may be bonded to each other to form a ring.

Where an aromatic ring is formed by bonding between neighboring $R^5$s, neighboring $R^6$s or neighboring $R^7$s, the aromatic ring may be preferably a $C_6$-$C_{30}$ aromatic ring group, more preferably, a $C_6$-$C_{14}$ aromatic ring group, for example, benzene, naphthalene, phenanthrene or the like.

Y is $N-(L^a-Ar^a)$, O, S or C(R')(R").

$Z^1$ to $Z^3$ are each independently C, C(R') or N, and at least one of $Z^1$ to $Z^3$ is N.

f is an integer of 0-6, e, g, h and i are each an integer of 0-4, j and k are each an integer of 0-3, l is an integer of 0-2, m is an integer of 0-3, and where each of these is an integer of 2 or more, each of a plurality of $R^5$, each of a plurality of $R^6$, and each of a plurality of $R^7$ are the same as or different from each other.

R' and R" are each independently selected from the group consisting of hydrogen, deuterium, halogen, a cyano group, a nitro group, a $C_6$-$C_{20}$ aryl group, a fluorenyl group, a $C_2$-$C_{20}$ heterocyclic group comprising at least one heteroatom selected from the group consisting of O, N, S, Si and P, a $C_3$-$C_{20}$ aliphatic ring, a fused ring of a $C_3$-$C_{20}$ aliphatic ring with a $C_6$-$C_{20}$ aromatic ring, a $C_1$-$C_{20}$ alkyl group, a $C_2$-$C_{20}$ alkenyl group, a $C_2$-$C_{20}$ alkynyl group, a $C_1$-$C_{20}$ alkoxyl group, a $C_6$-$C_{30}$ aryloxy group, and $-L^a-N(R_a)(R_b)$.

R' and R" in C(R')(R") may be linked to each other to form a ring, and adjacent R's in C(R') may be linked to each other to form a ring.

$Ar^a$ is selected from the group consisting of a $C_6$-$C_{20}$ aryl group, a fluorenyl group, a $C_2$-$C_{20}$ heterocyclic group comprising at least one heteroatom selected from the group consisting of O, N, S, Si and P, a $C_3$-$C_{20}$ aliphatic ring, and a combination thereof.

$L^a$ is selected from the group consisting of a single bond, a $C_6$-$C_{20}$ arylene group, a fluorenylene group, a $C_2$-$C_{20}$ heterocyclic group comprising at least one heteroatom selected from the group consisting of O, N, S, Si and P, a $C_3$-$C_{20}$ aliphatic ring, and a combination thereof.

$R_a$ and $R_b$ are each independently selected from the group consisting of a $C_6$-$C_{20}$ aryl group, a fluorenyl group, a $C_2$-$C_{20}$ heterocyclic group comprising at least one heteroatom selected from the group consisting of O, N, S, Si and P, a $C_3$-$C_{20}$ aliphatic ring, and a combination thereof.

$R^5$ to $R^7$, $L^a$, $Ar^a$, R', R", $R^a$, $R^b$ and the ring formed by bonding between adjacent groups may be each optionally substituted with one or more substituents selected from the group consisting of deuterium, halogen, a silane group unsubstituted or substituted with a $C_1$-$C_{20}$ alkyl group or a $C_6$-$C_{20}$ aryl group, a siloxane group, a boron group, a germanium group, a cyano group, a nitro group, a $C_1$-$C_{20}$ alkylthio group, a $C_1$-$C_{20}$ alkoxy group, a $C_6$-$C_{20}$ aryloxy group, a $C_1$-$C_{20}$ alkyl group, a $C_2$-$C_{20}$ alkenyl group, a $C_2$-$C_{20}$ alkynyl group, a $C_6$-$C_{20}$ aryl group, a $C_6$-$C_{20}$ aryl group substituted with deuterium, a fluorenyl group, a $C_2$-$C_{20}$ heterocyclic group containing at least one heteroatom of O, N, S, Si, and P, a $C_3$-$C_{20}$ aliphatic ring group, a $C_7$-$C_{20}$ arylalkyl group and $C_8$-$C_{20}$ arylalkenyl group.

Specifically, the compound represented by formula 1 may be one of the following compounds, but there is no limitation thereto.

1-1

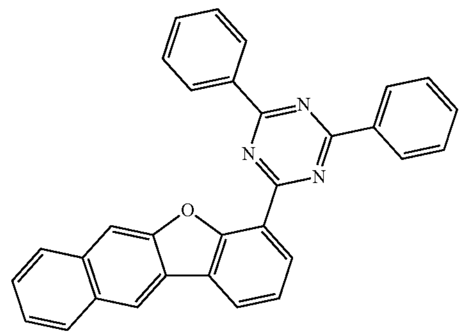

-continued
1-2
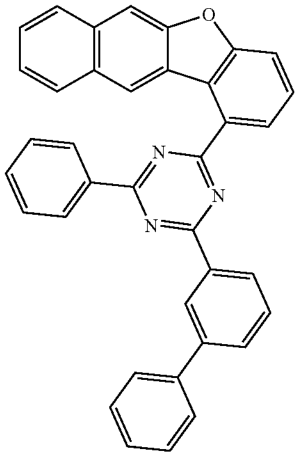
1-3
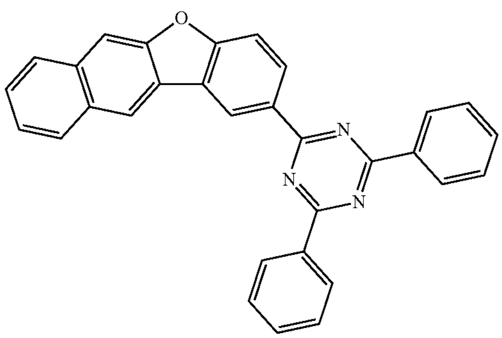
1-4
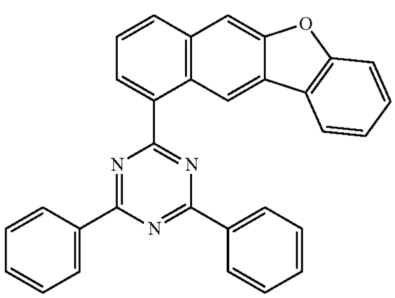
1-5
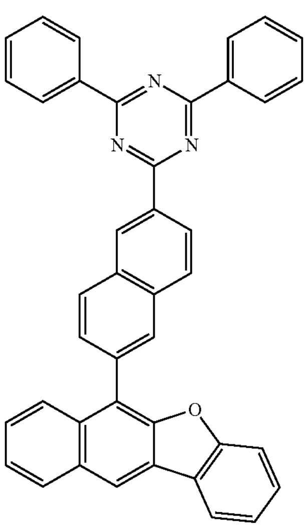
-continued
1-6
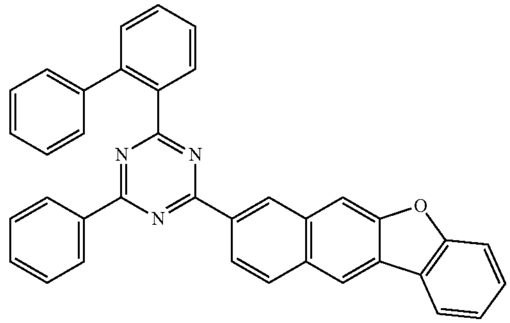
1-7
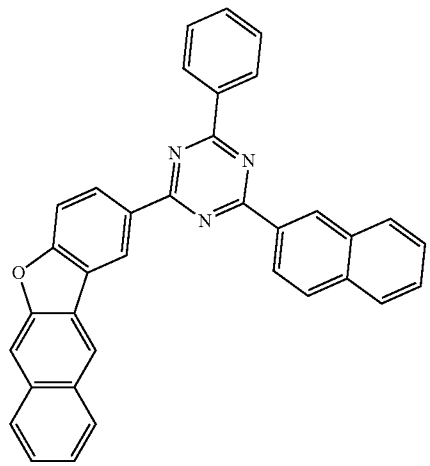
1-8
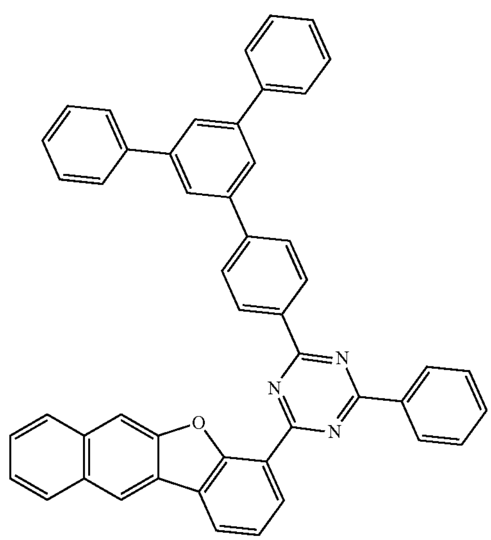

-continued
1-9
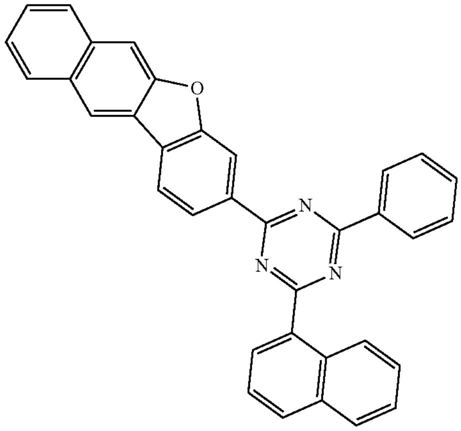
1-10
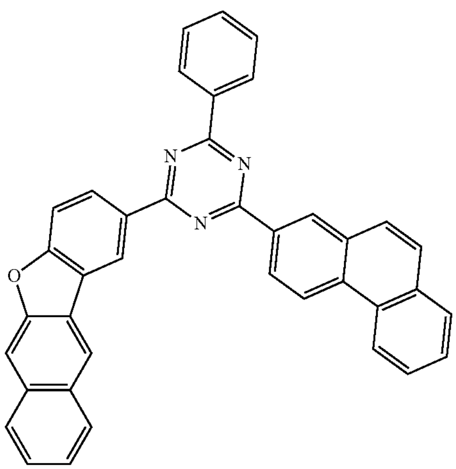
1-11
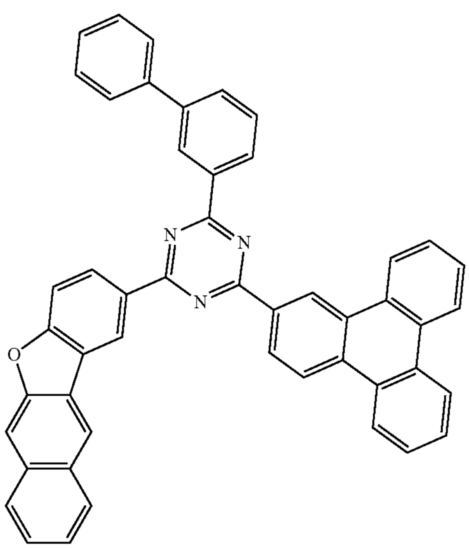
-continued
1-12
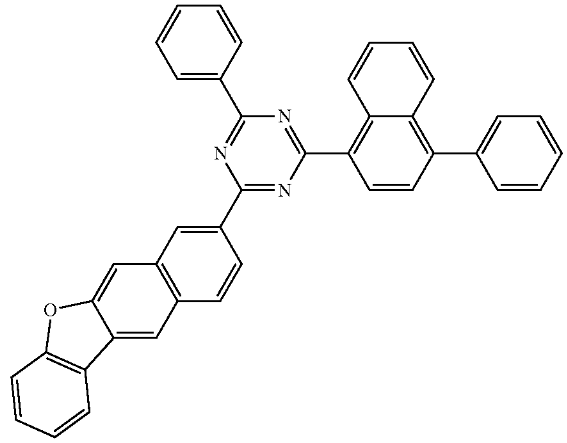
1-13
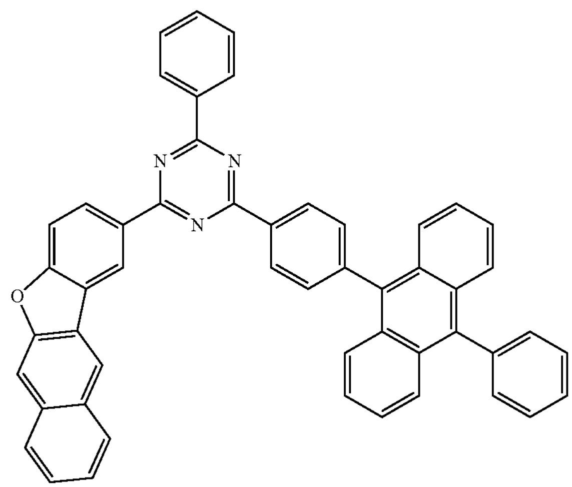
1-14
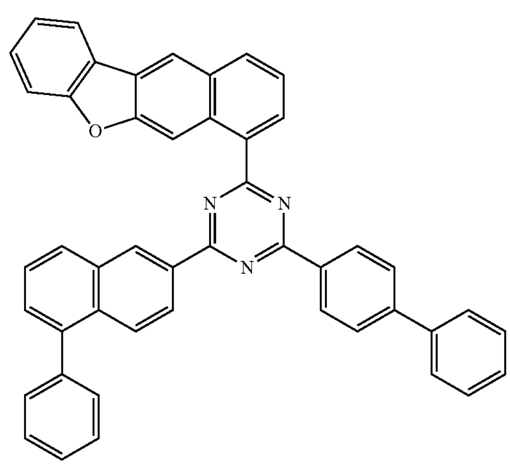

-continued
1-15
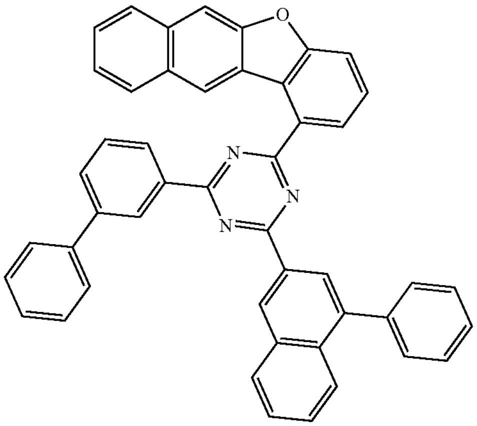
1-16
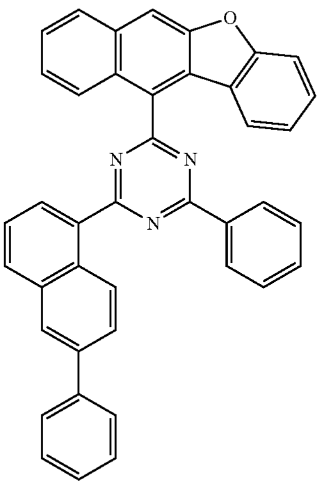
1-17
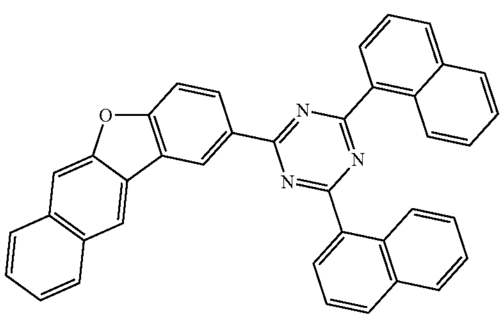
1-18
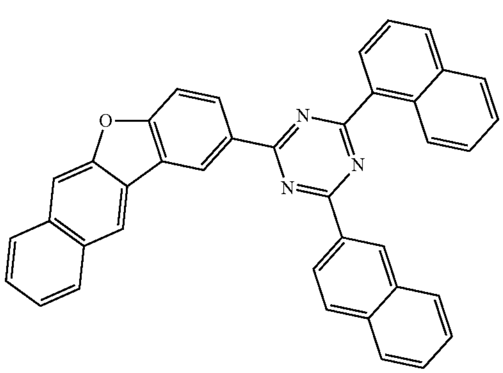
-continued
1-19
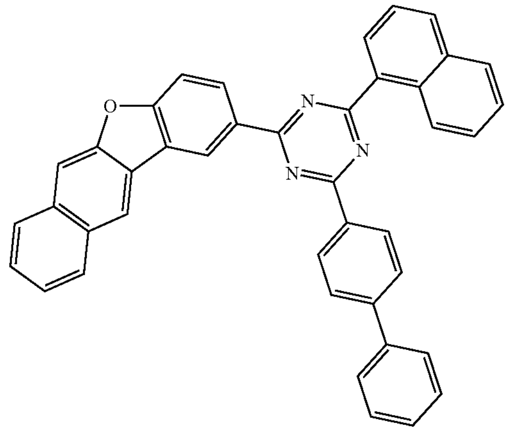
1-20
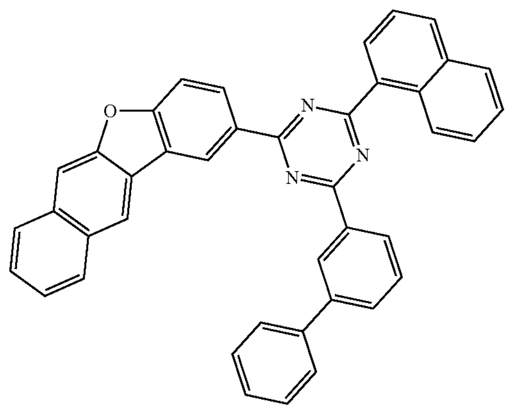
1-21
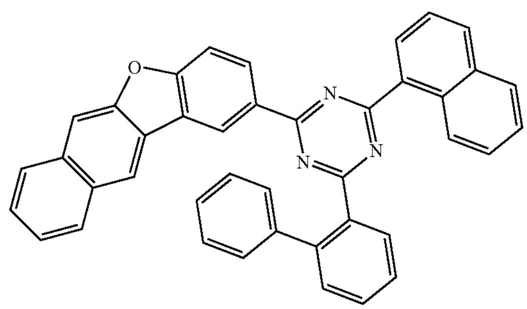
1-22
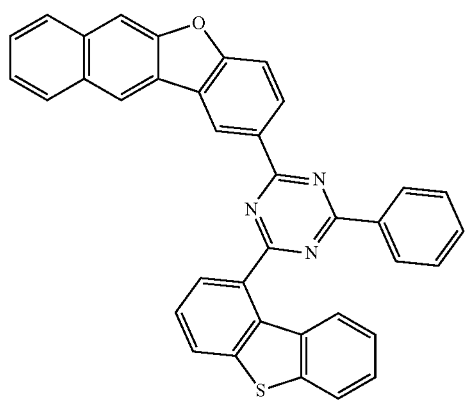

-continued
1-23
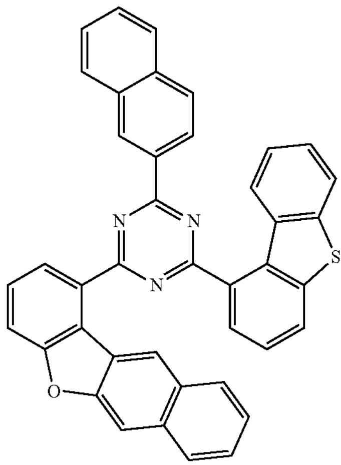
1-24
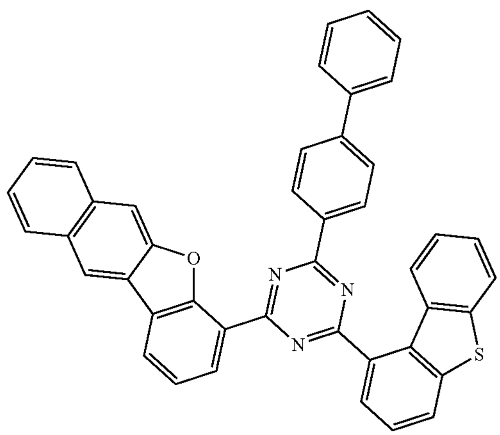
1-25
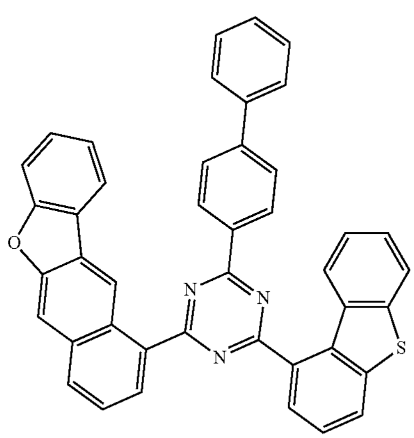
-continued
1-26
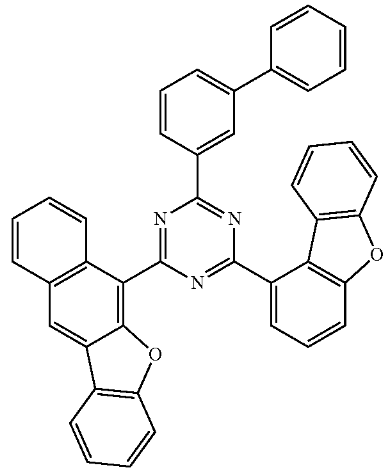
1-27
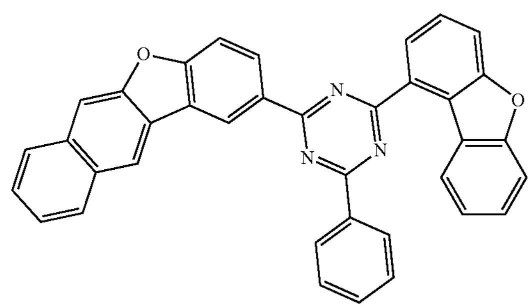
1-28
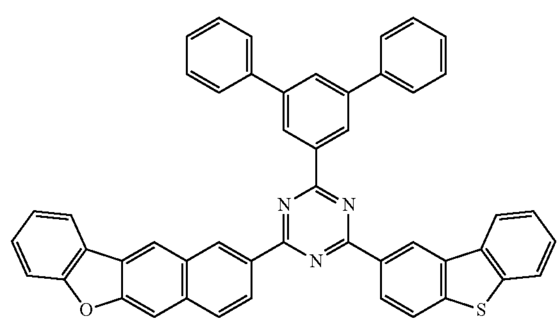

-continued
1-29
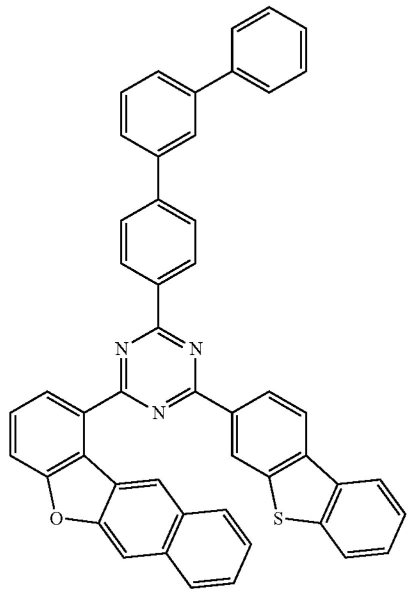
1-30
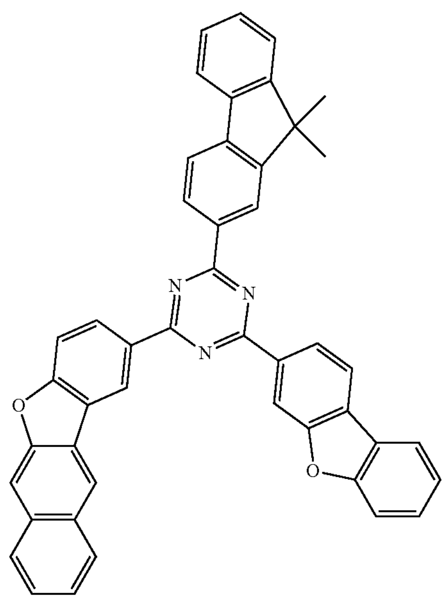
1-31
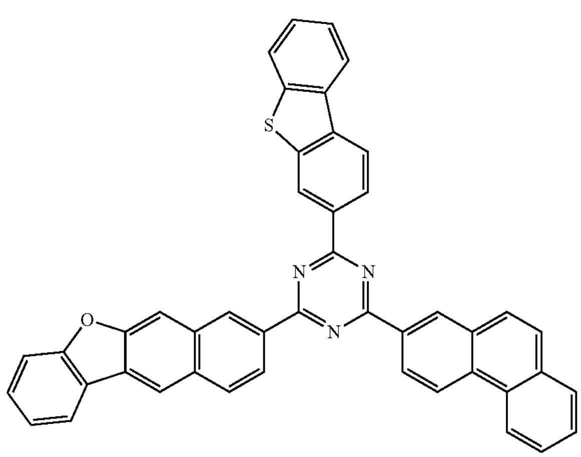
-continued
1-32
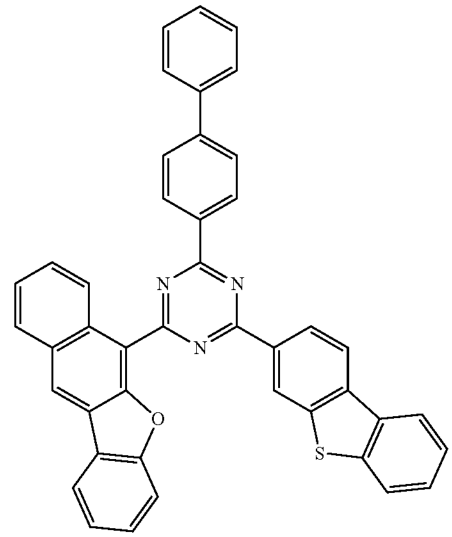
1-33
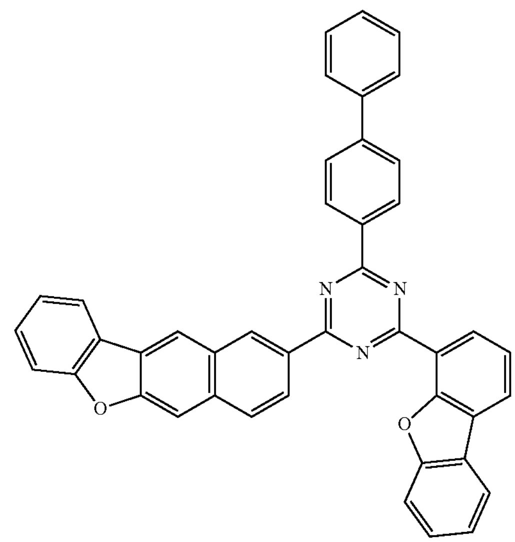
1-34
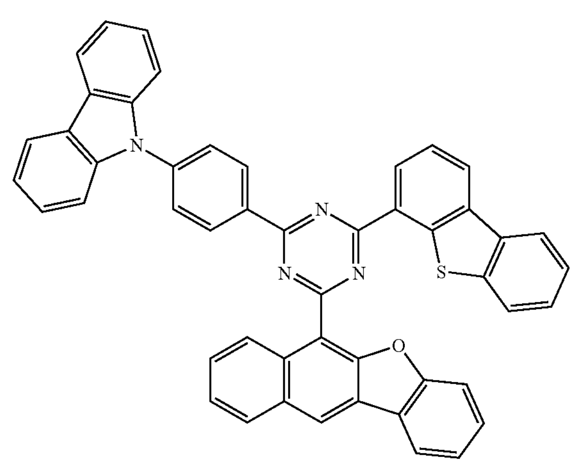

-continued
1-35
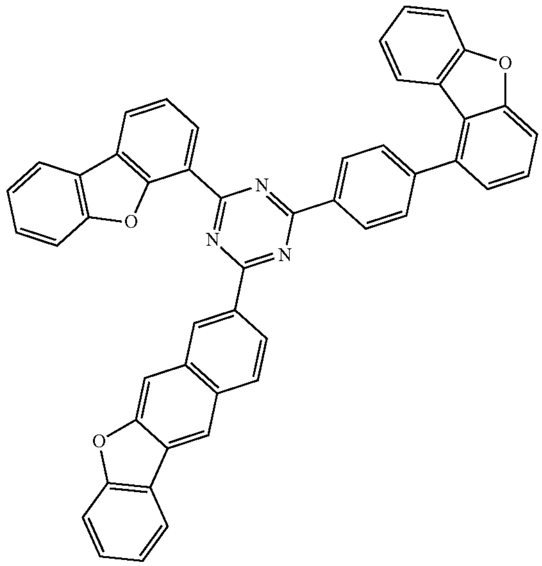
1-36
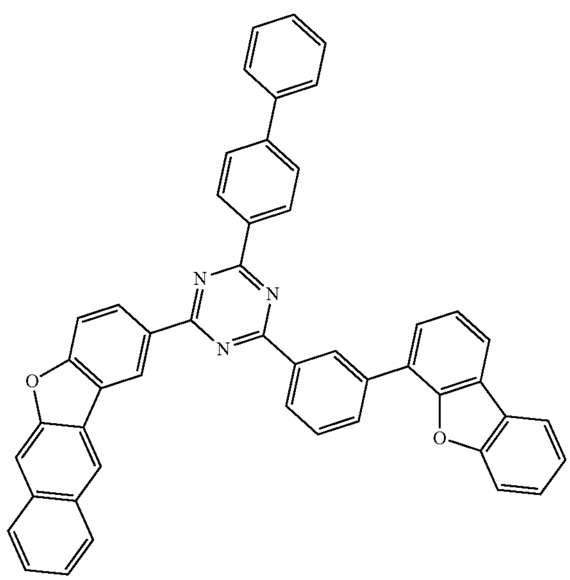
-continued
1-37
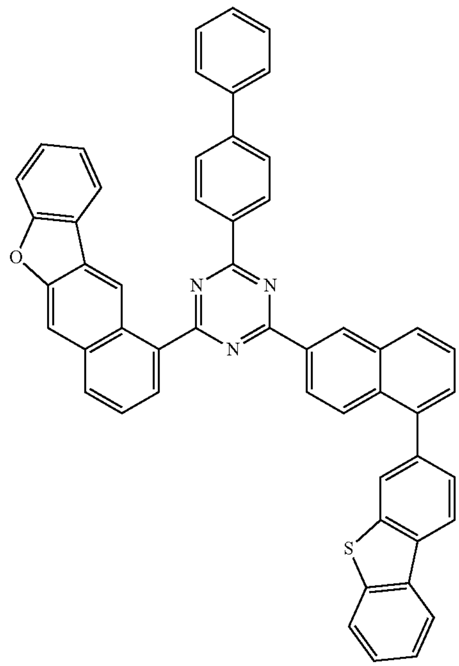
1-38
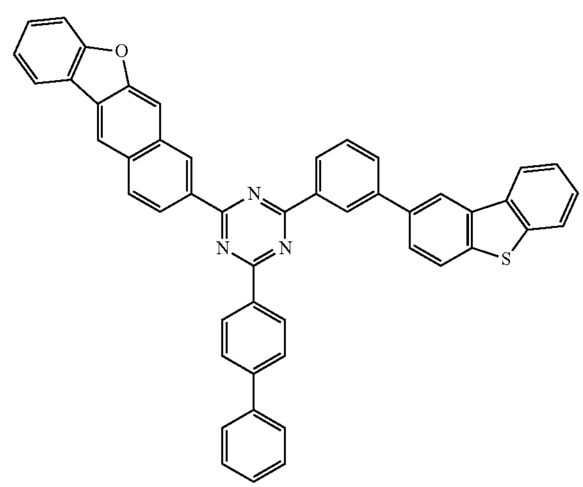

1-39
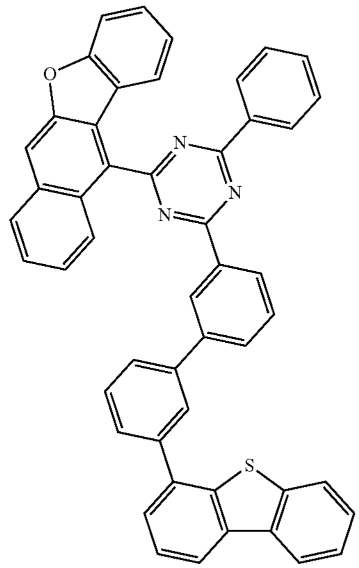
1-40
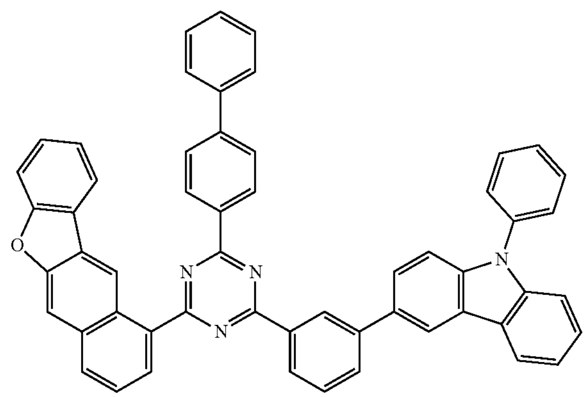
1-41
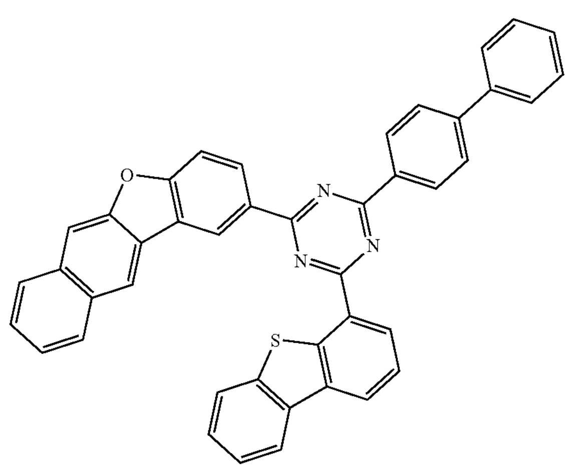
1-42
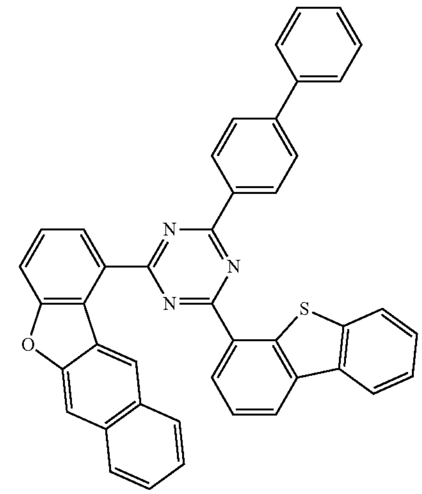
1-43
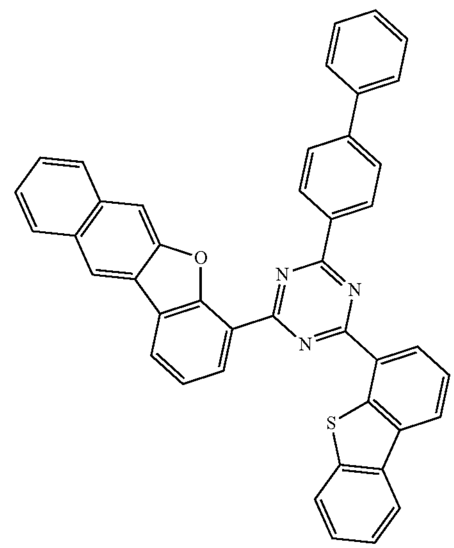
1-44
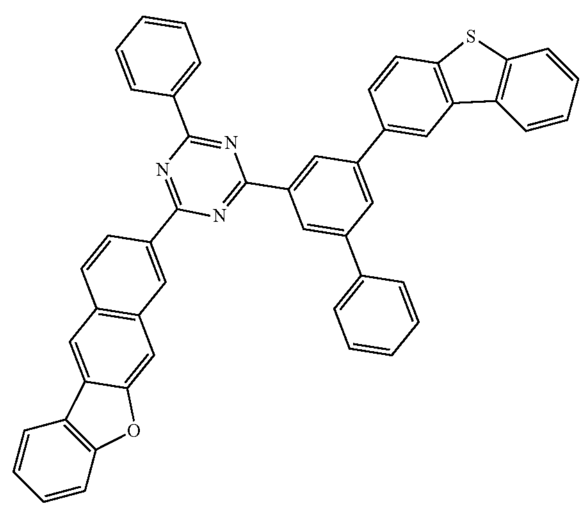

-continued
1-45
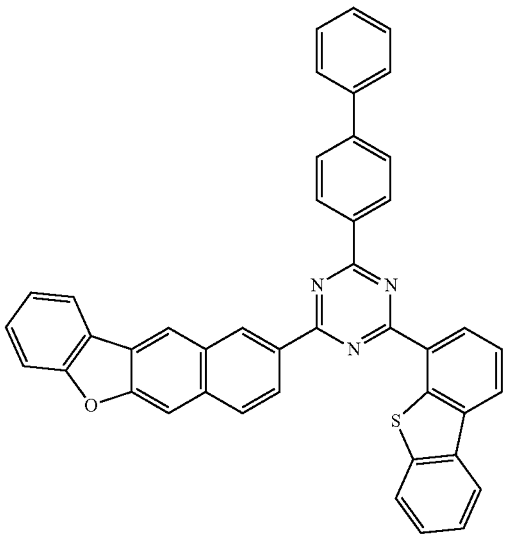
1-46
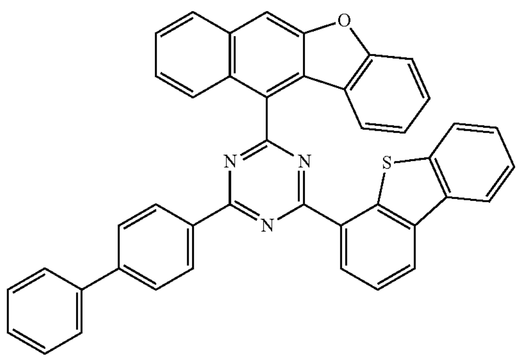
1-47
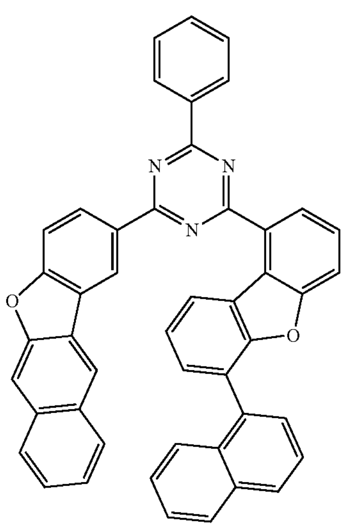
-continued
1-48
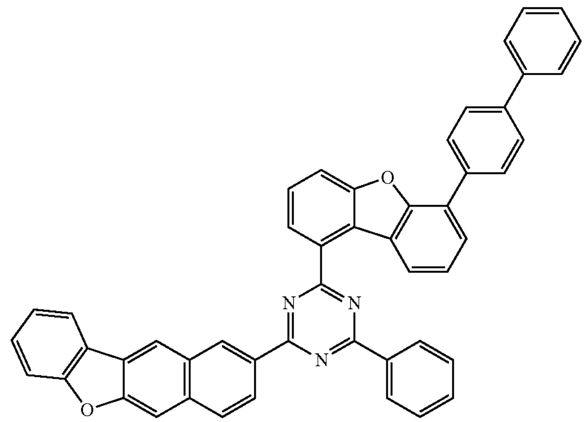
1-49
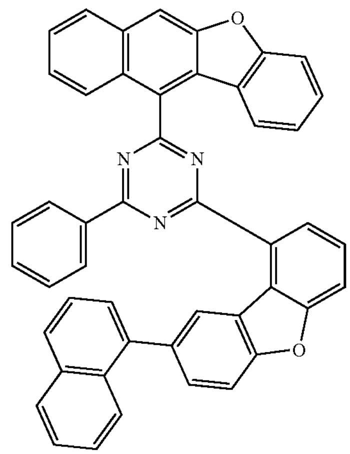
1-50
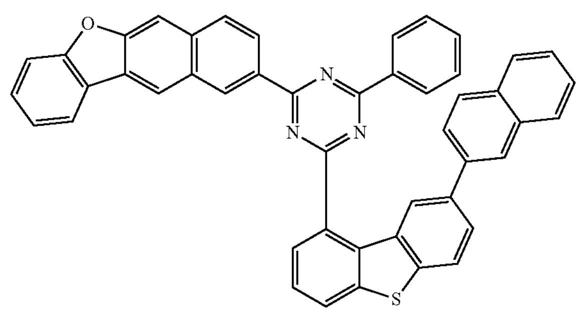
1-51
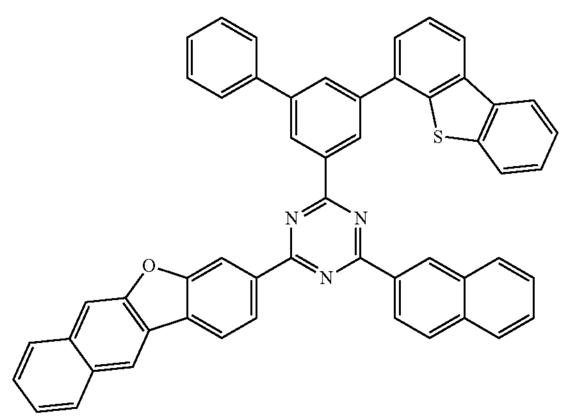

-continued
1-52
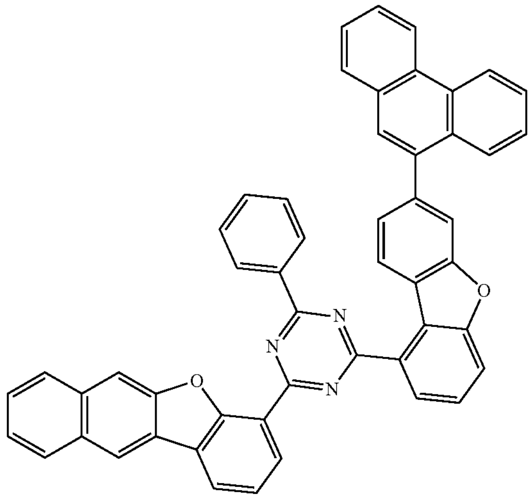
1-53
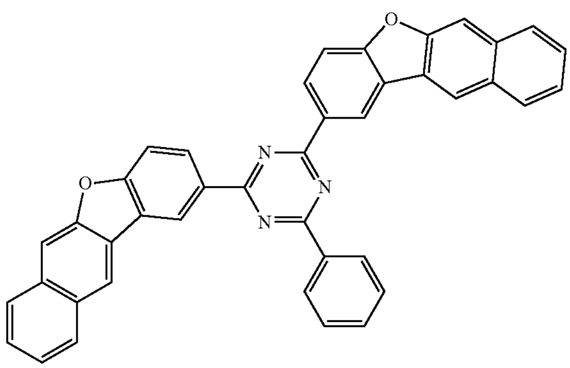
1-54
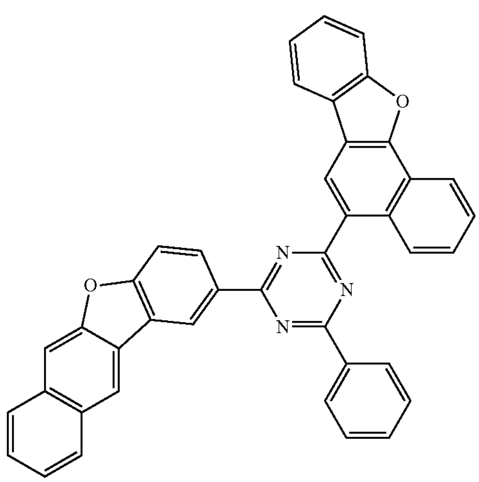
-continued
1-55
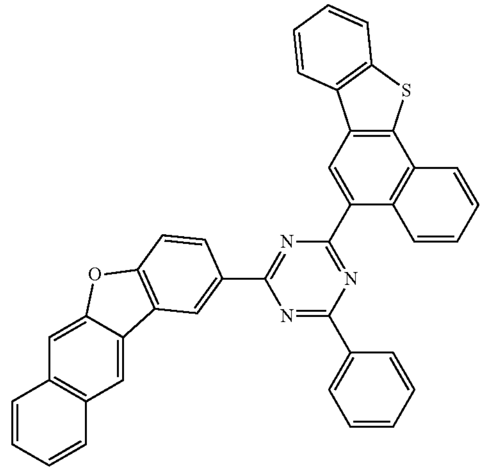
1-56
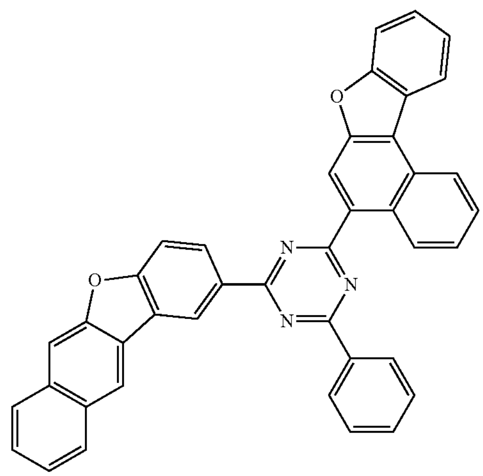
1-57
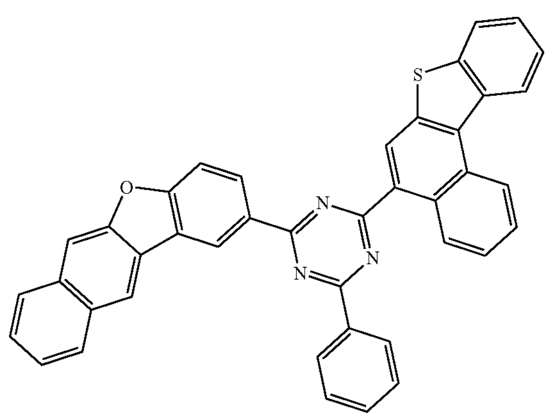

-continued
1-58
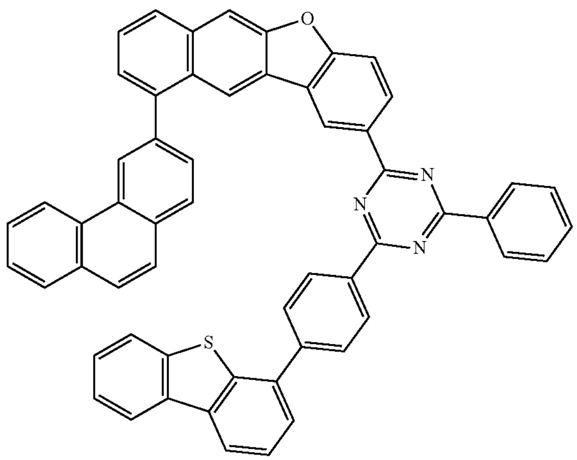
1-59
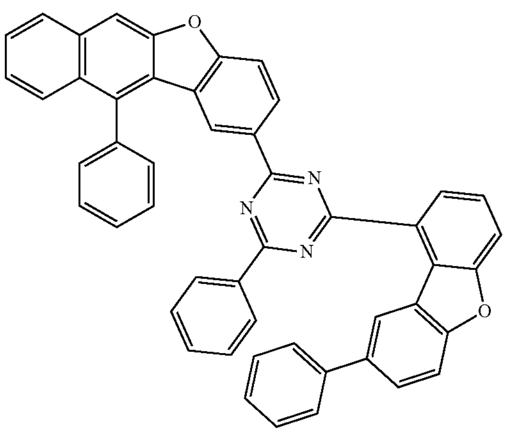
1-60
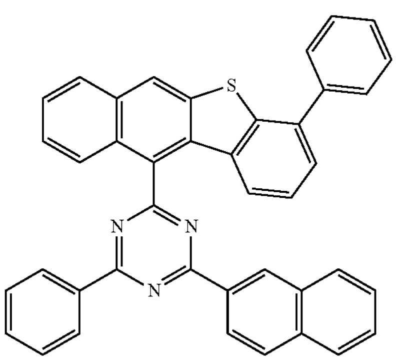
1-61
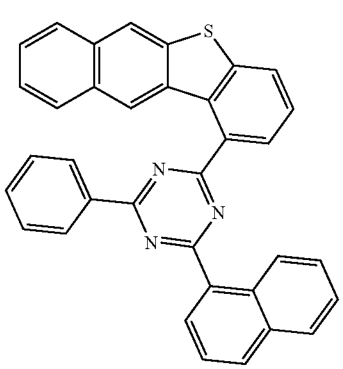
-continued
1-62
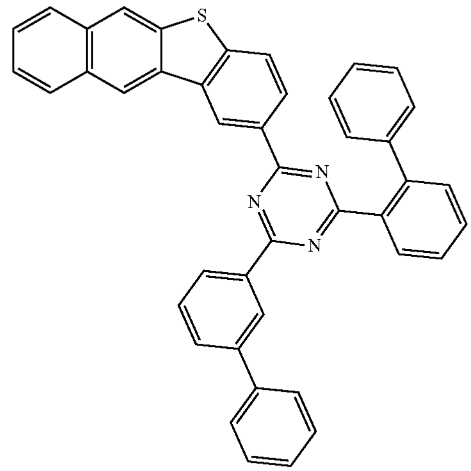
1-63
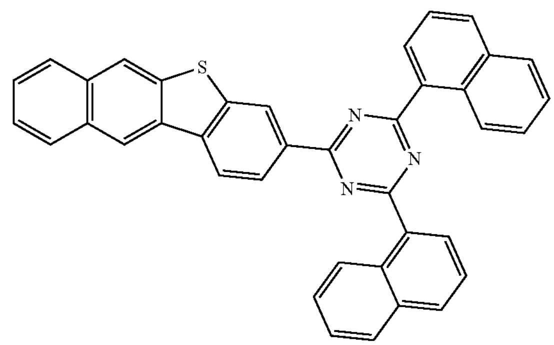
1-64
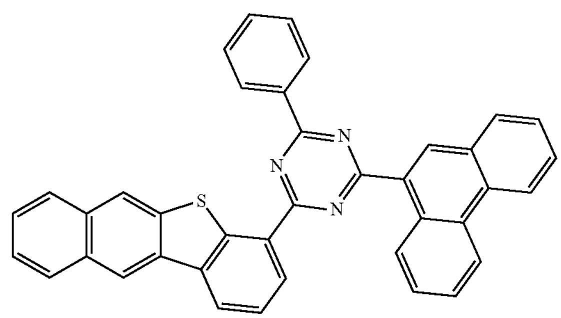
1-65
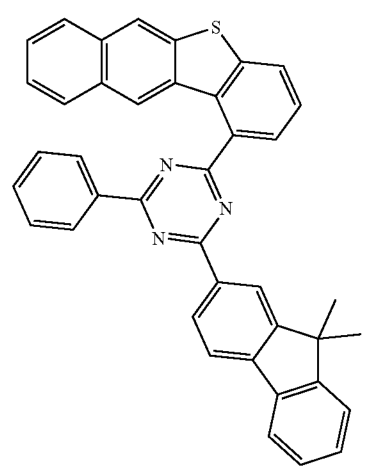

-continued
1-66
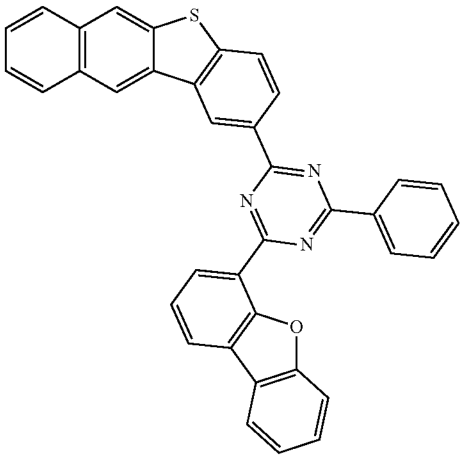
1-67
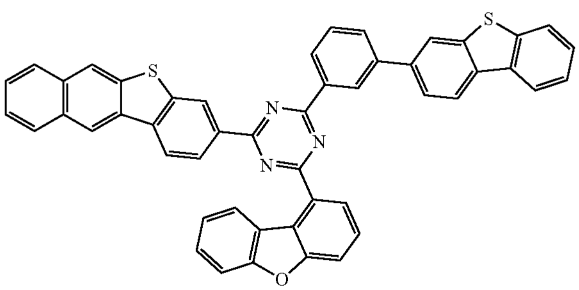
1-68
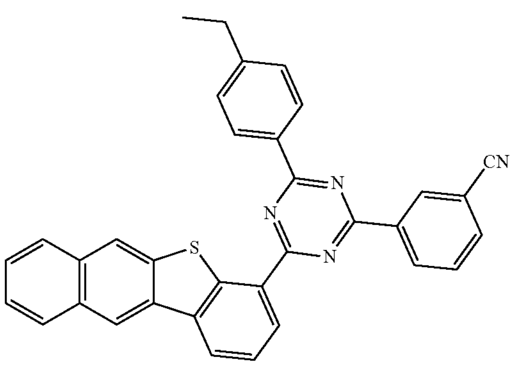
1-69
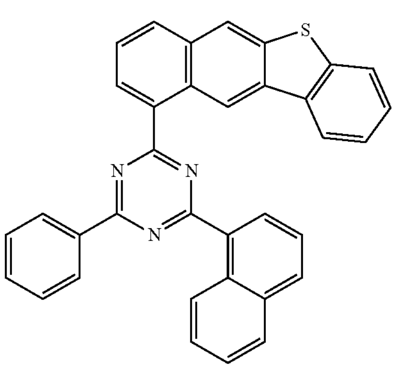
-continued
1-70
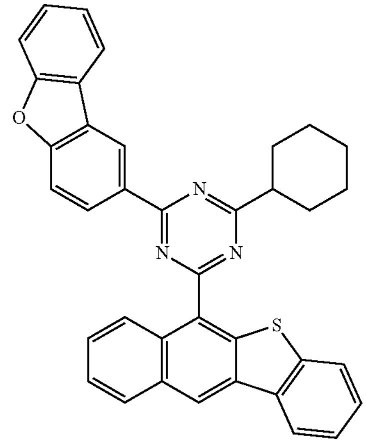
1-71
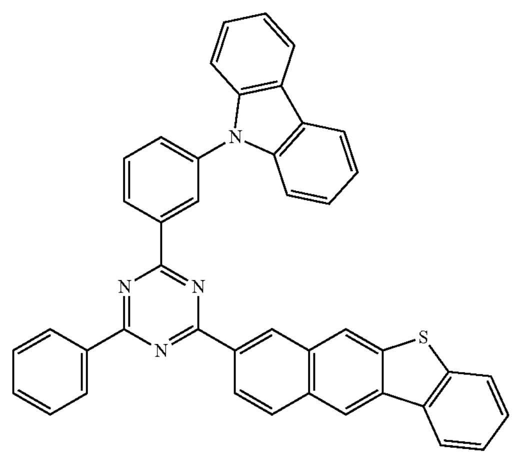
1-72
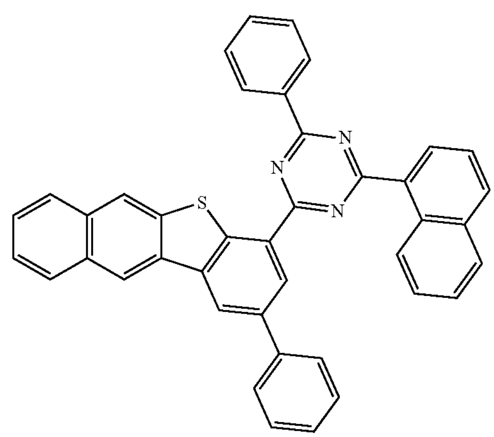

-continued
1-73
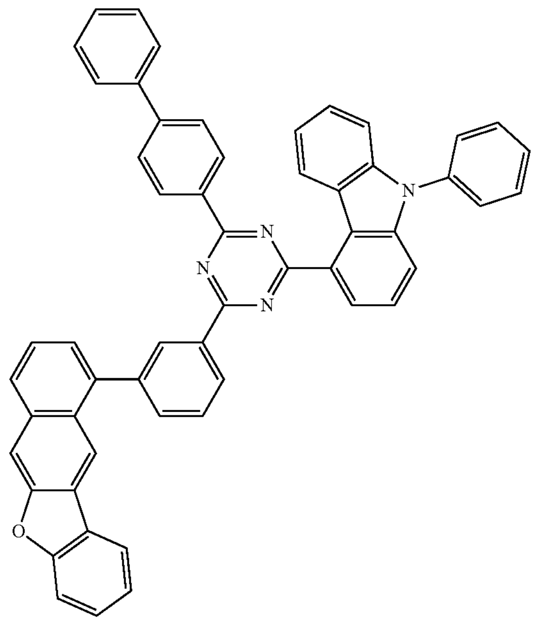
1-74
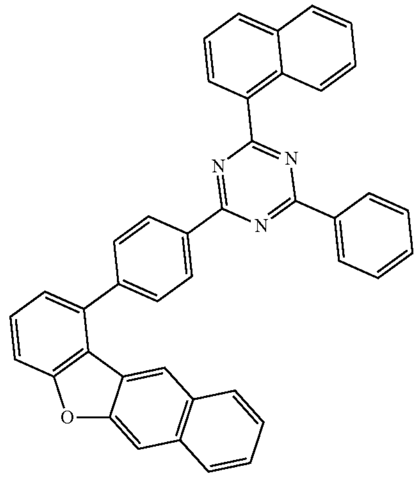
1-75
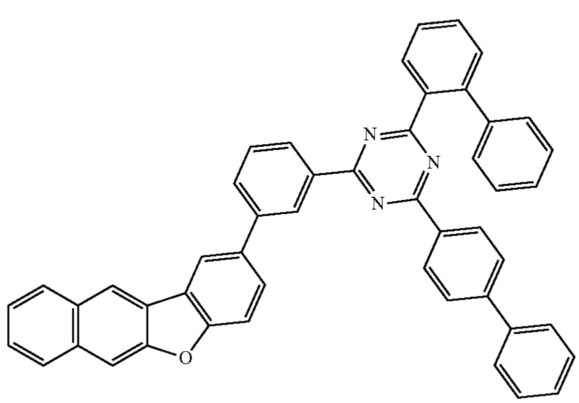
-continued
1-76
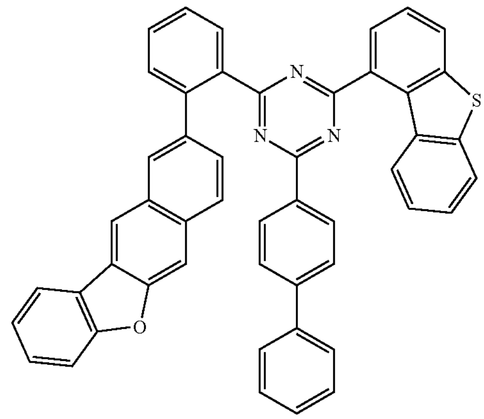
1-77
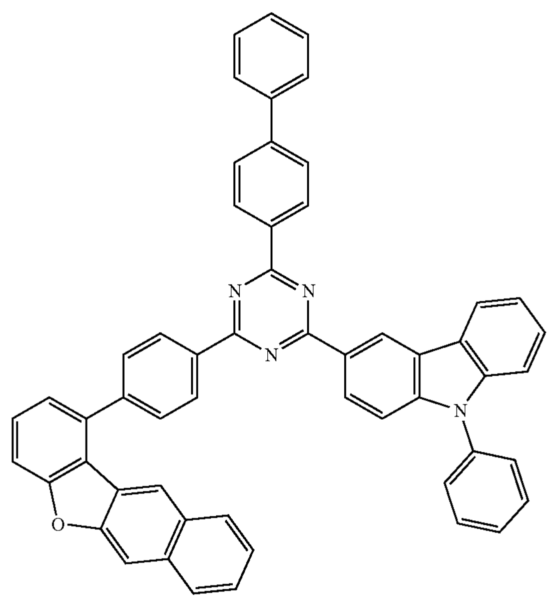
1-78
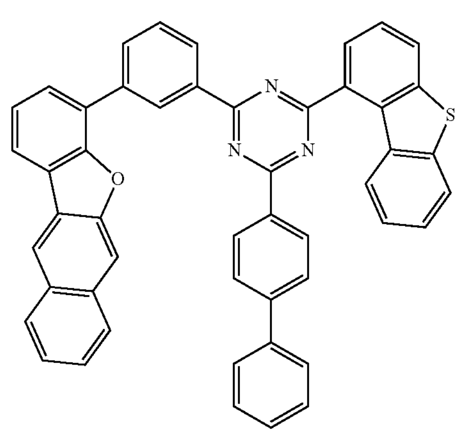

-continued
1-79
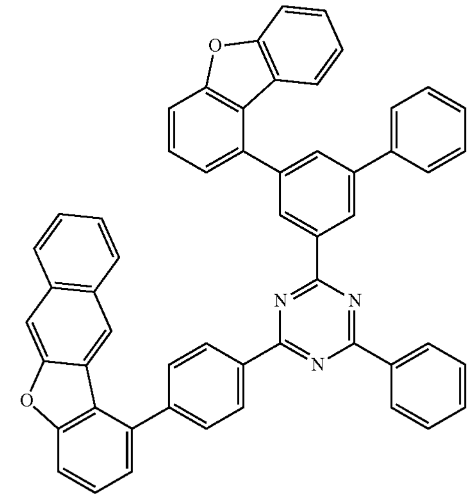
1-80
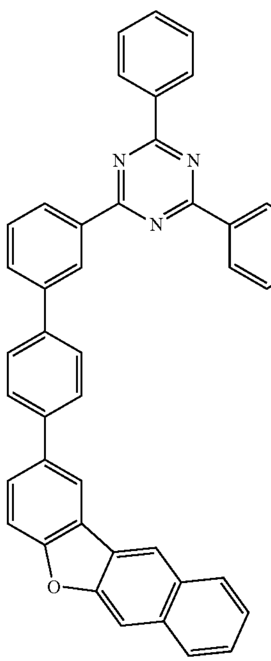
1-81
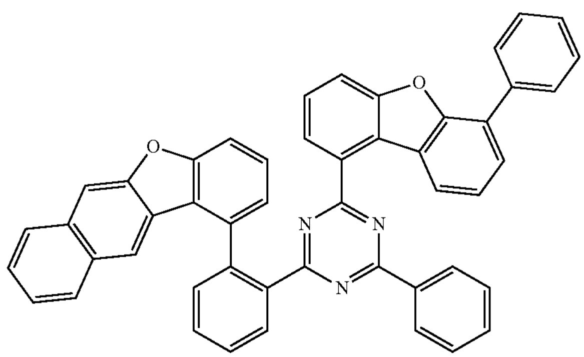
-continued
1-82
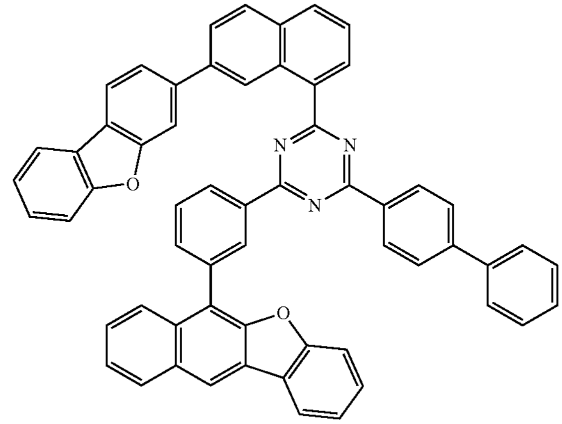
1-83
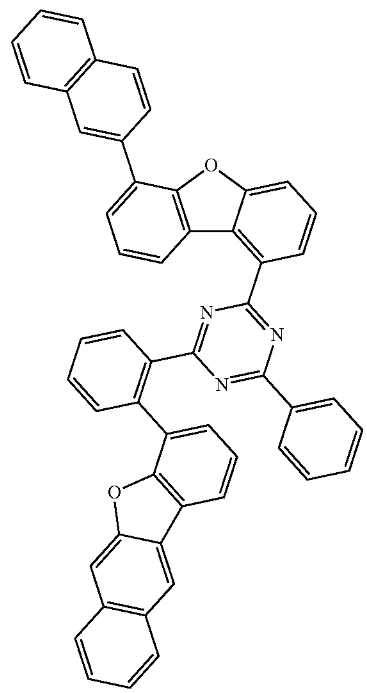
1-84
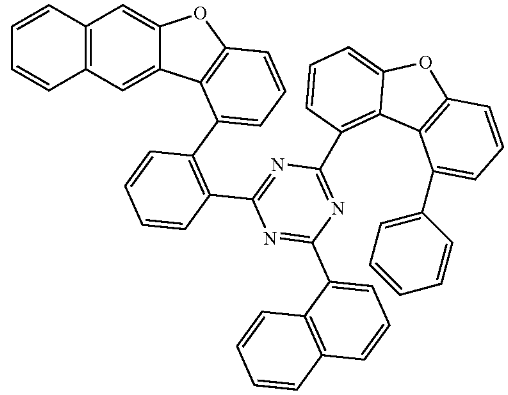

-continued
1-85
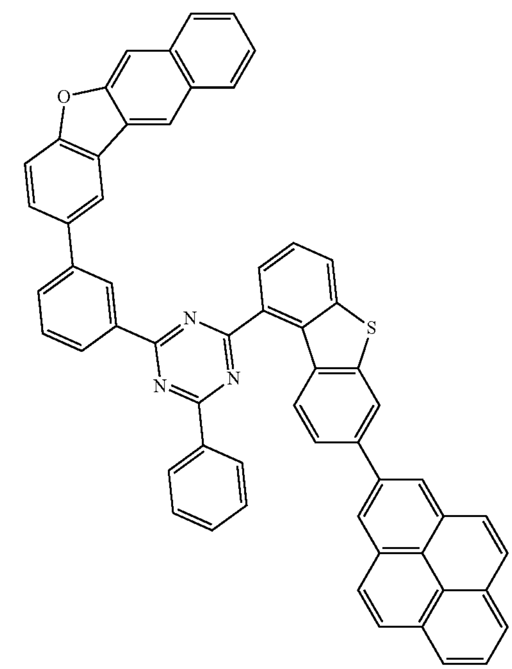
1-86
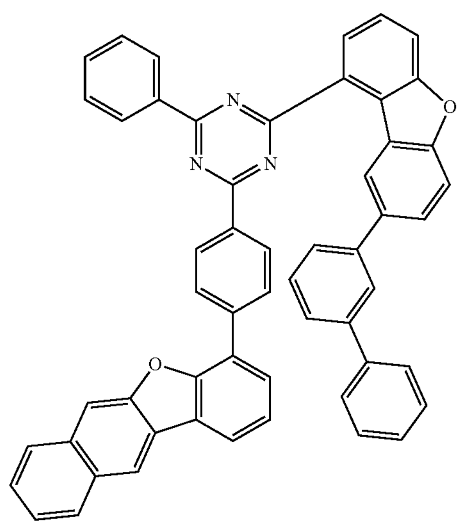
1-87
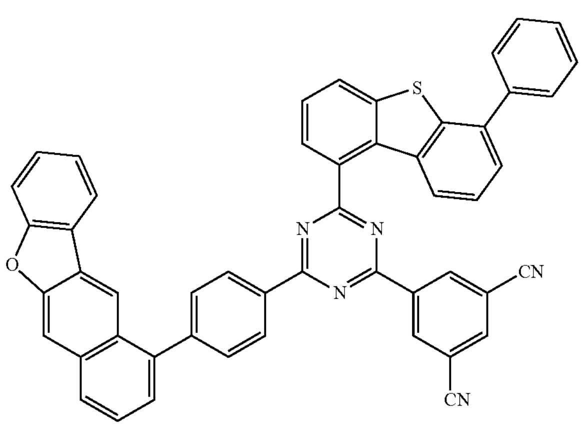
-continued
1-88
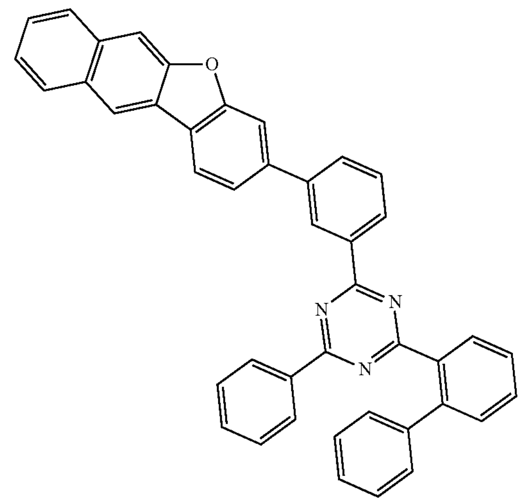
1-89
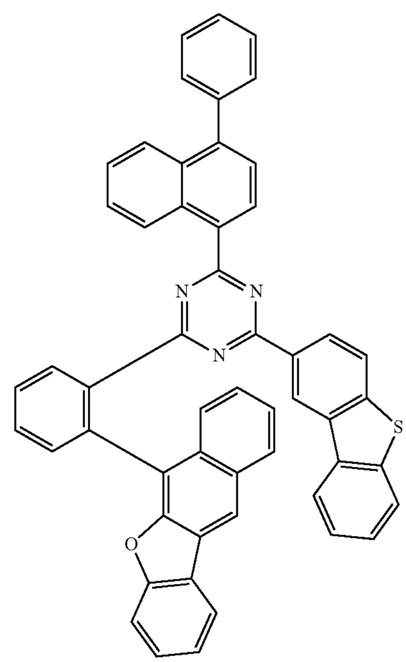

-continued
1-90
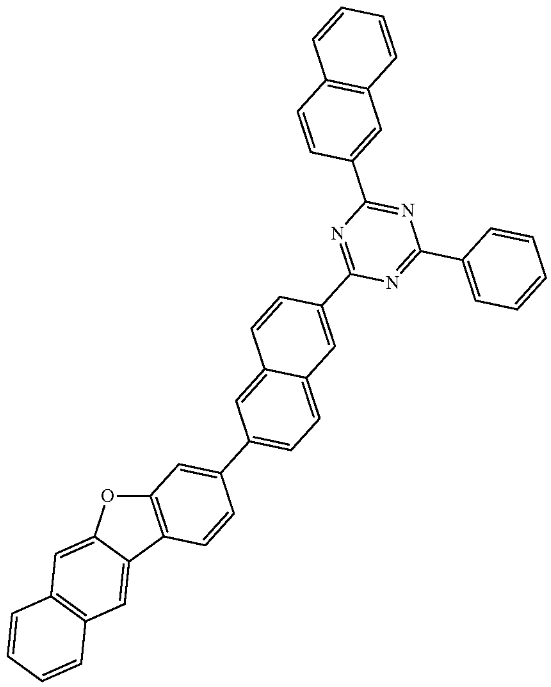
1-91
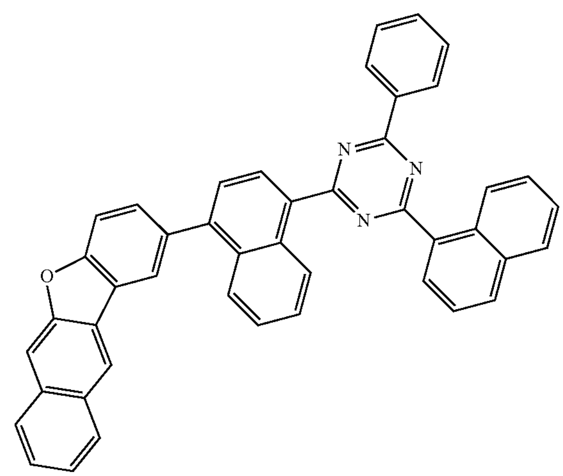
1-92
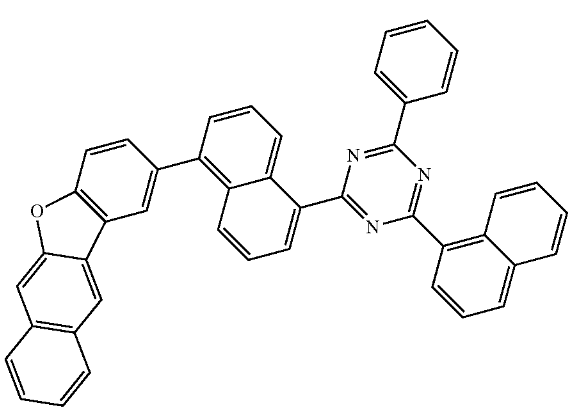
-continued
1-93
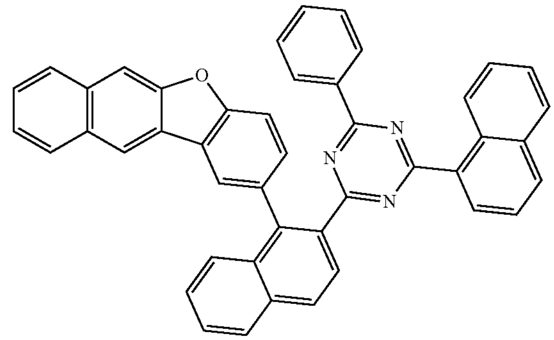
1-94
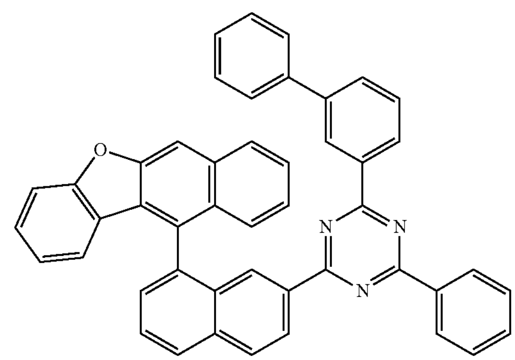
1-95
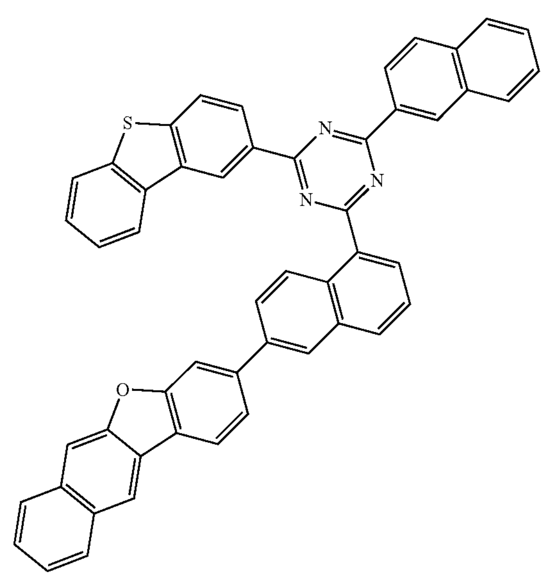

-continued
1-96
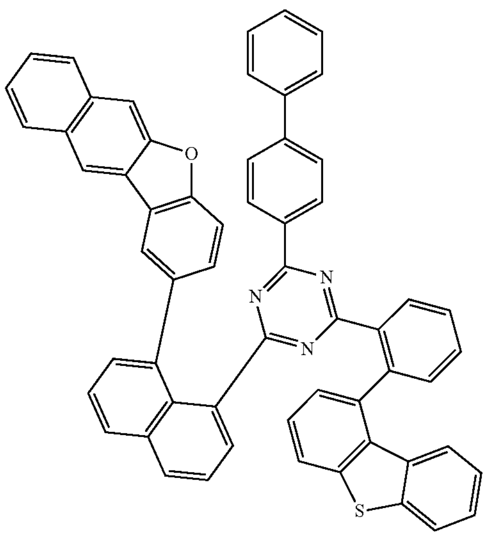
1-97
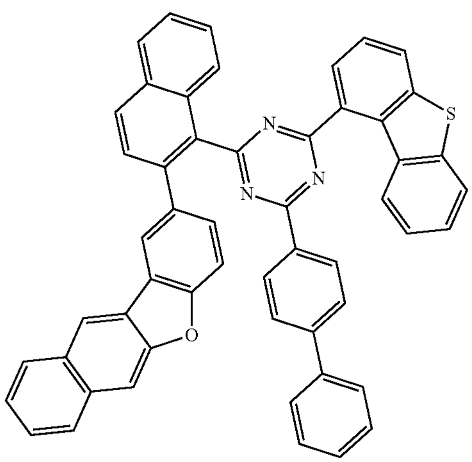
1-98
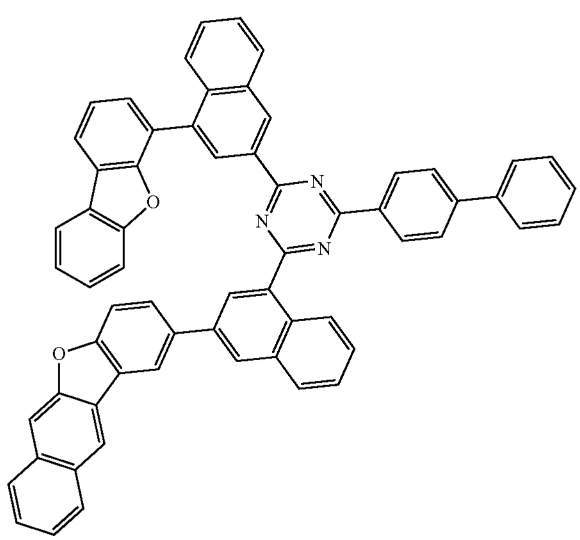
-continued
1-99
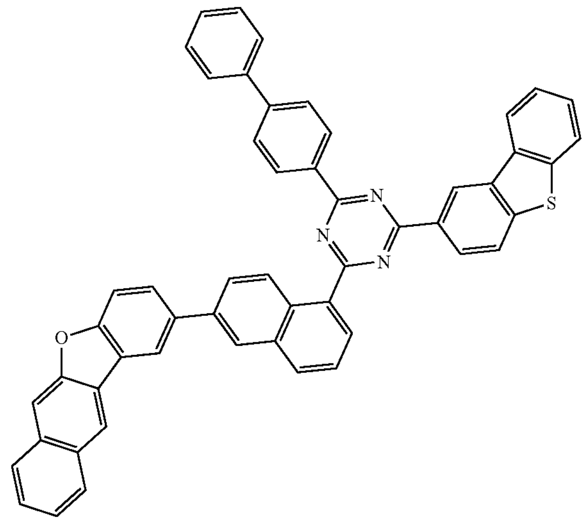
1-100
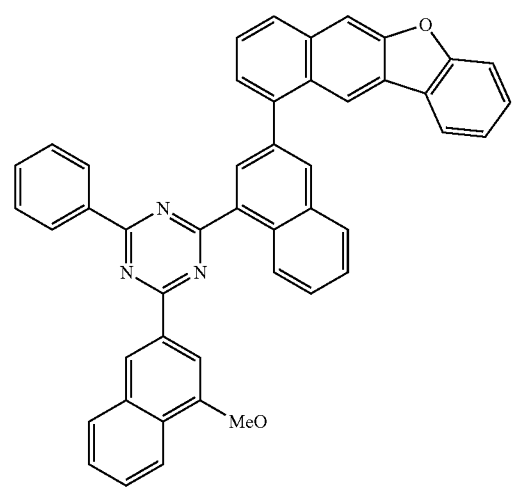
1-101
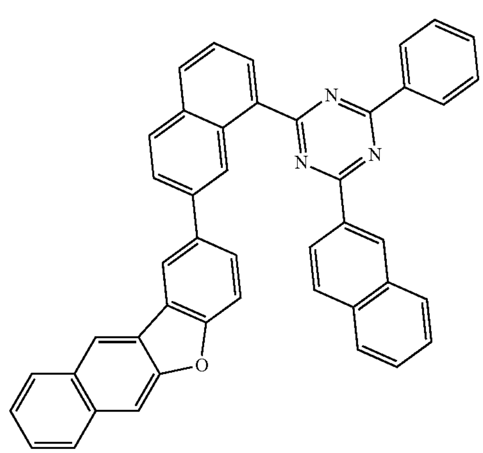

-continued
1-102
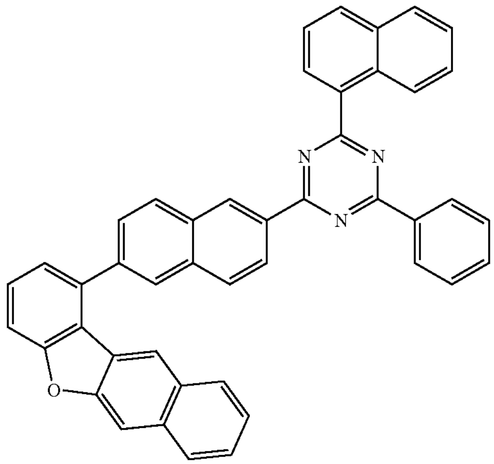
1-103
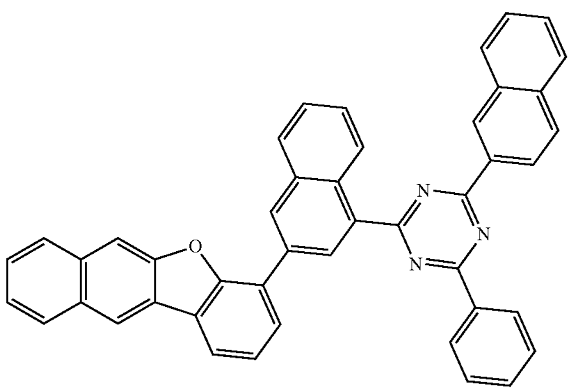
1-104
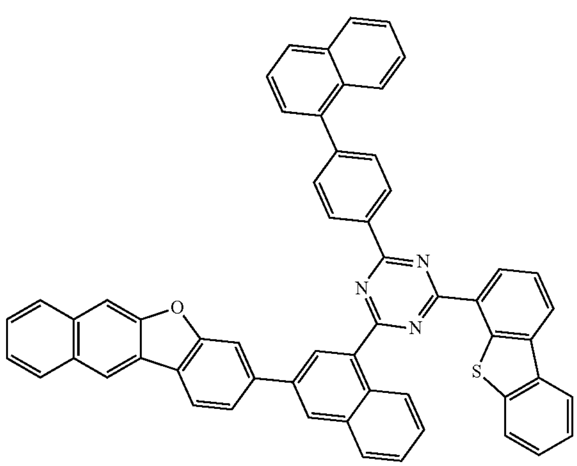
-continued
1-105
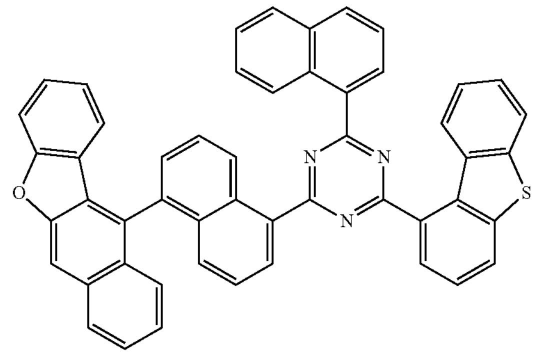
1-106
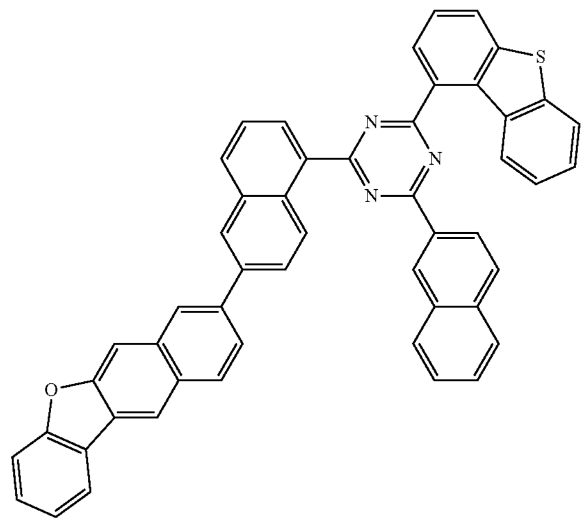
1-107
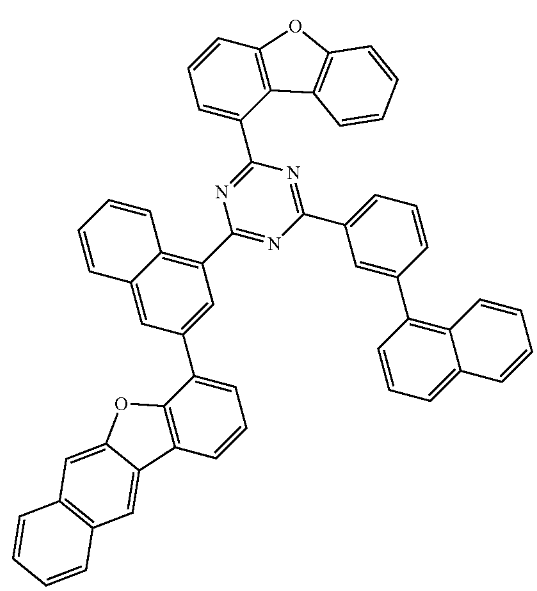

-continued
1-108
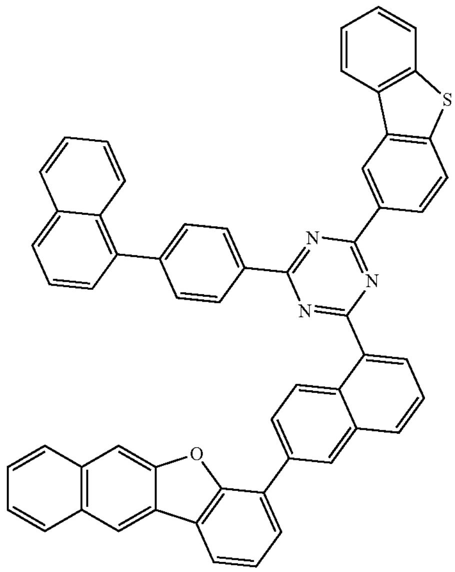
1-109
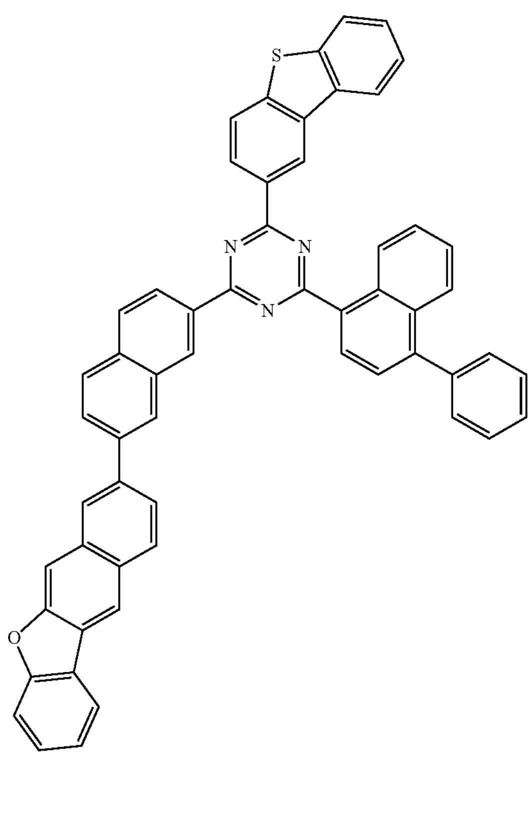
-continued
1-110
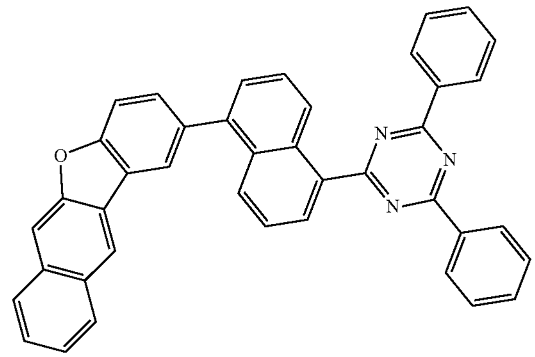
1-111
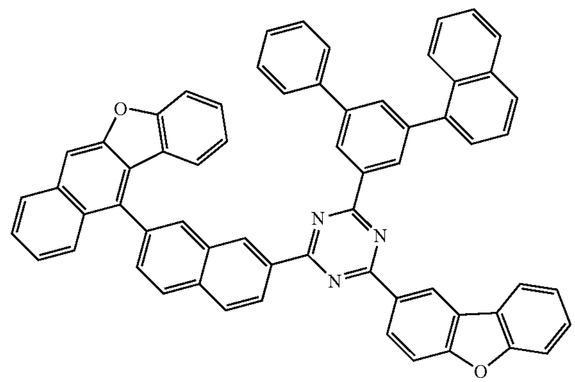
1-112
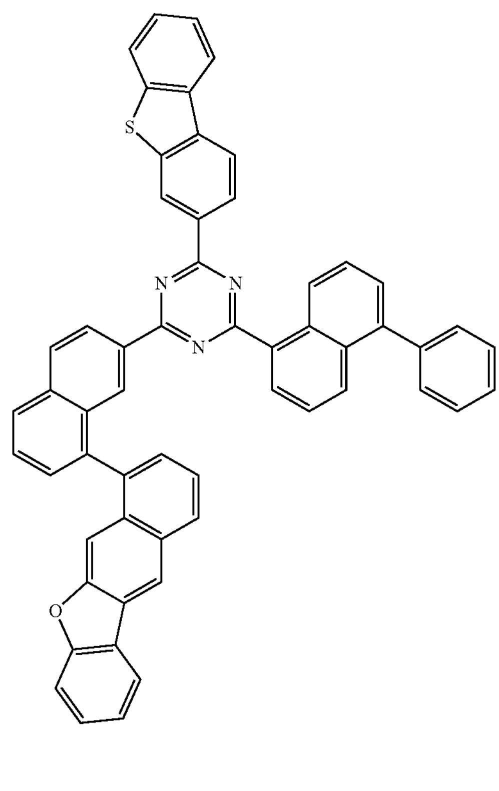

-continued
1-113
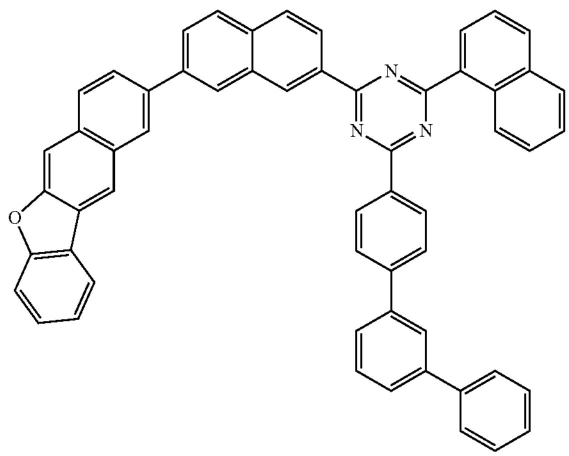
1-114
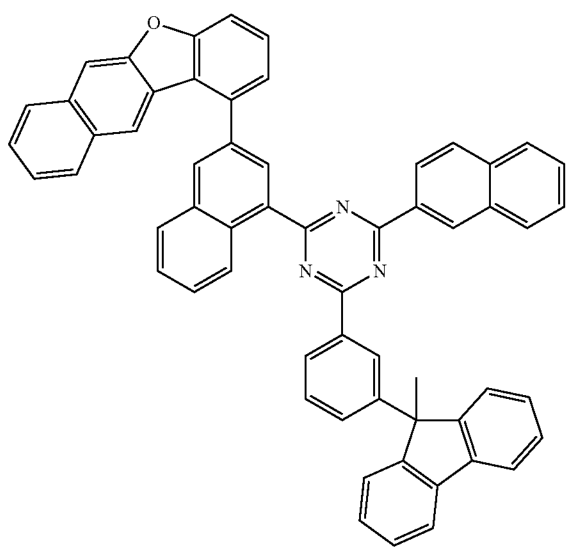
1-115
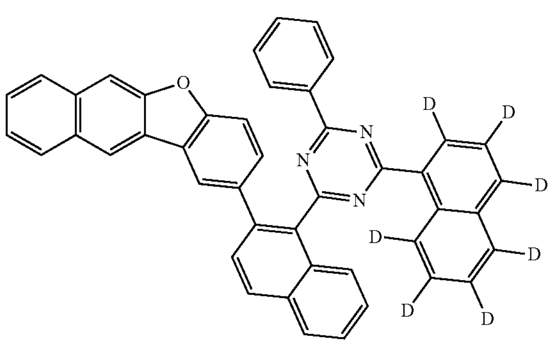
-continued
1-116
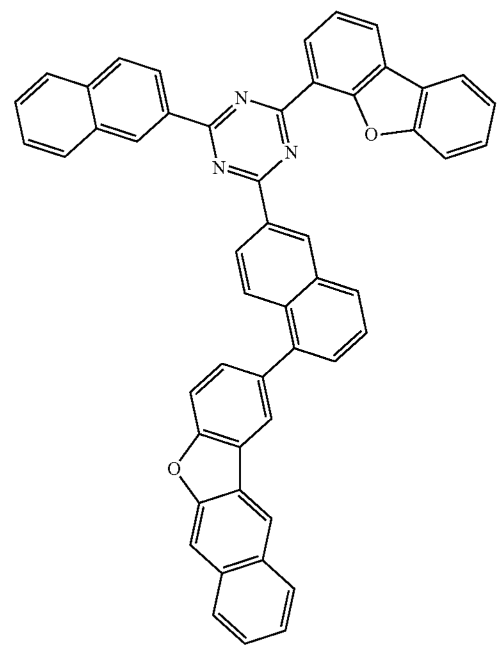
1-117
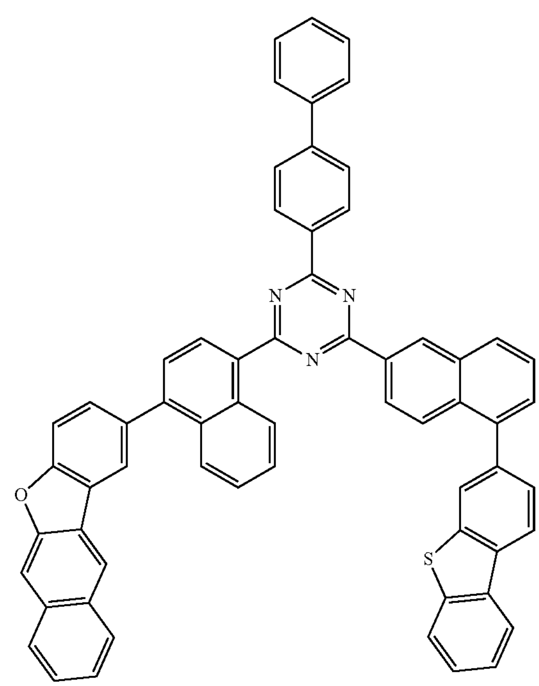

-continued
1-118
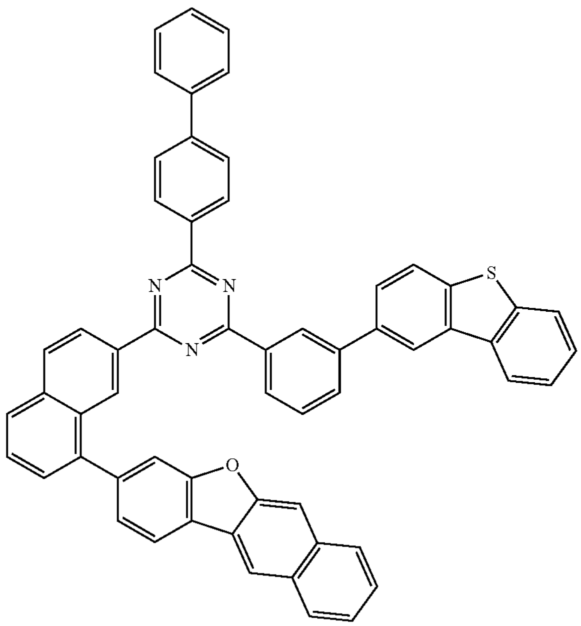
1-119
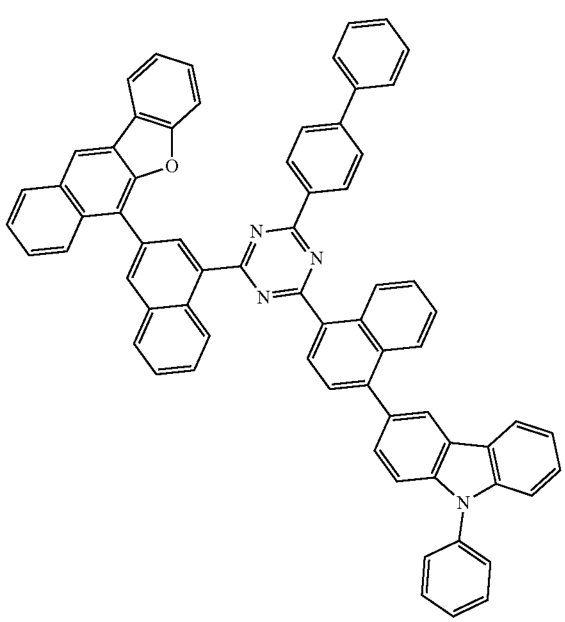
-continued
1-120
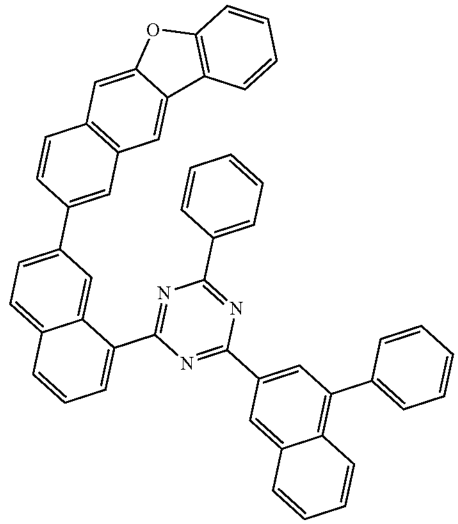
1-121
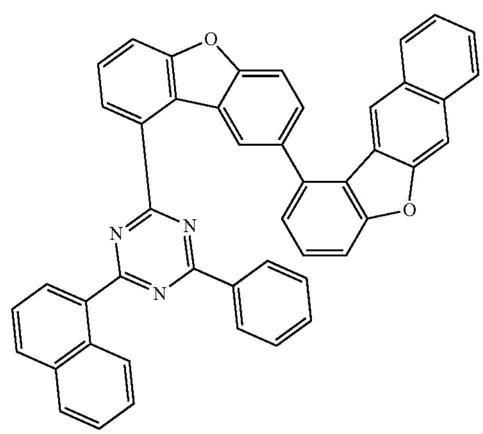
1-122
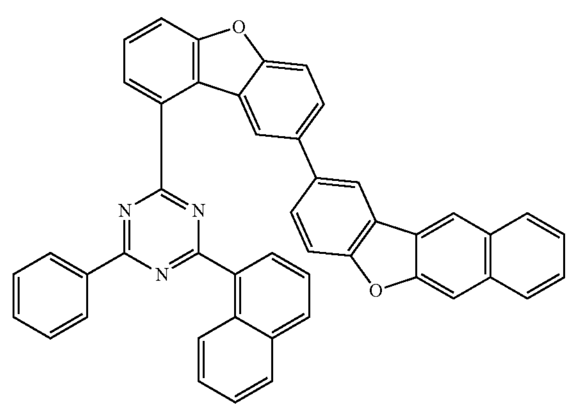

-continued
1-123
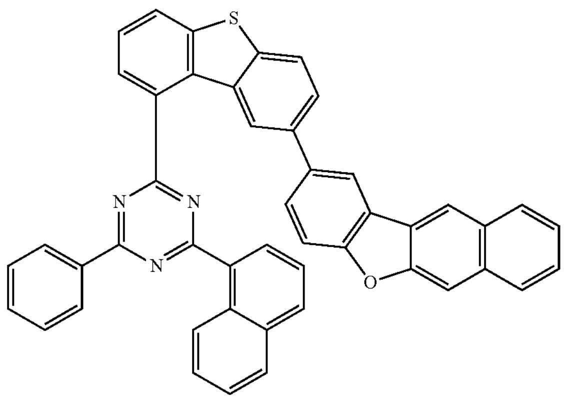
1-124
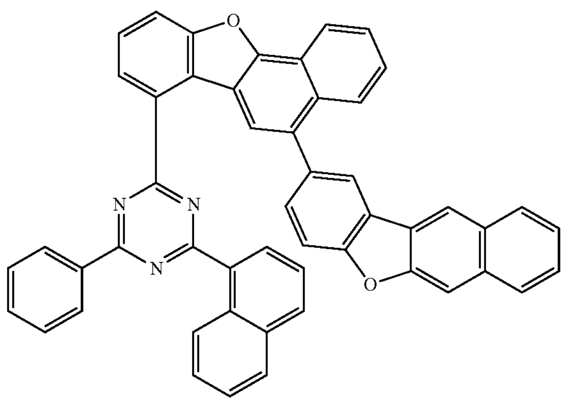
1-125
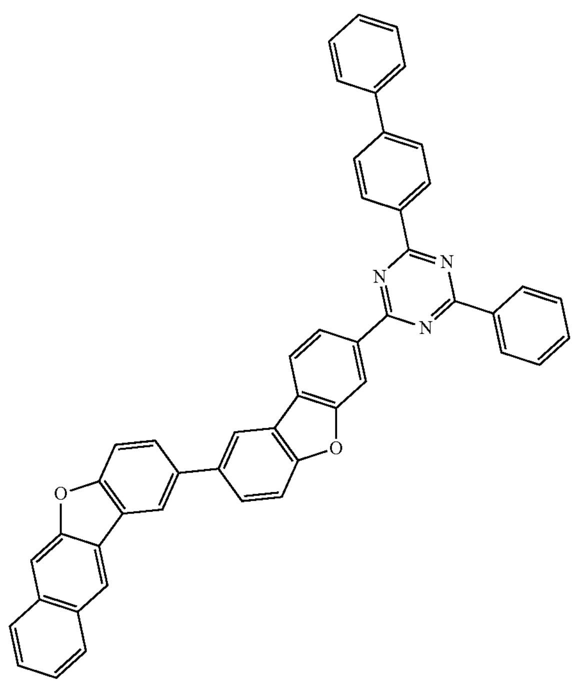
-continued
1-126
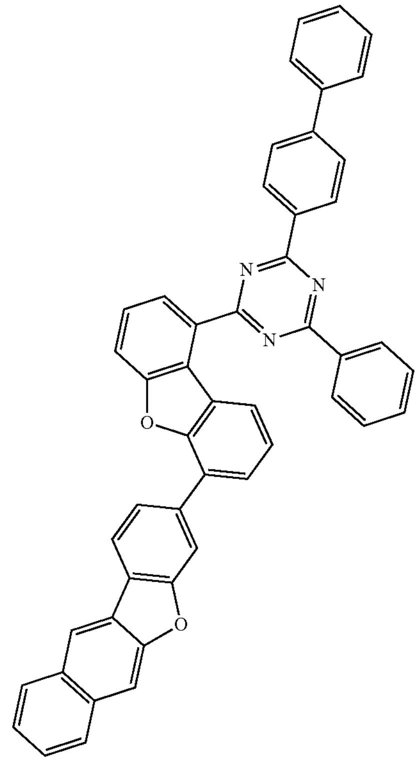
1-128
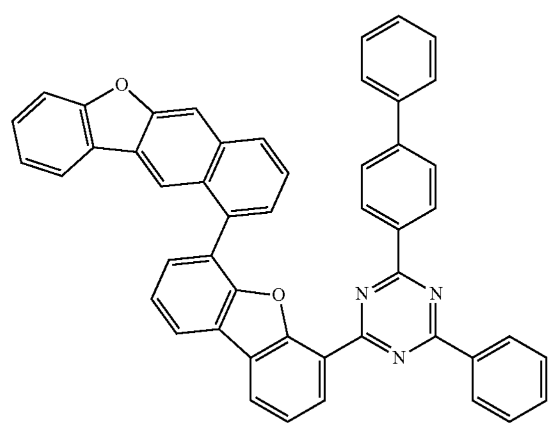

-continued
1-129
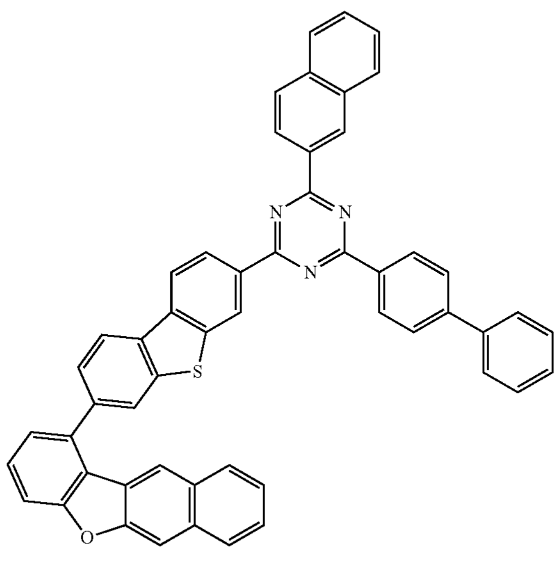
1-130
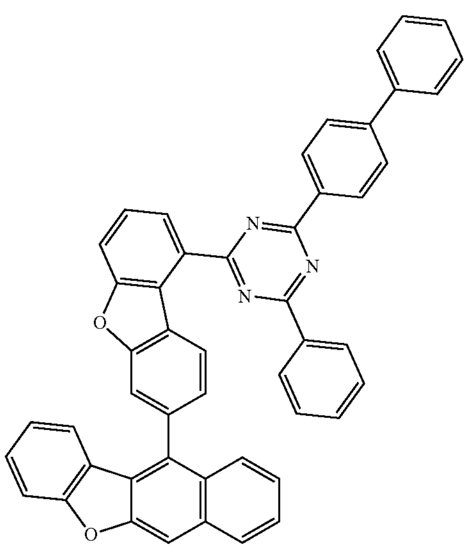
-continued
1-131
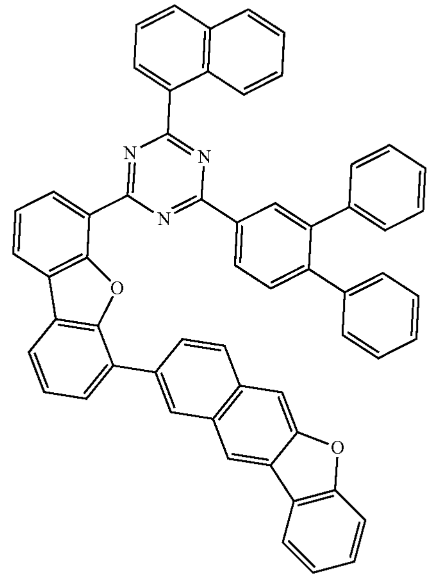
1-132
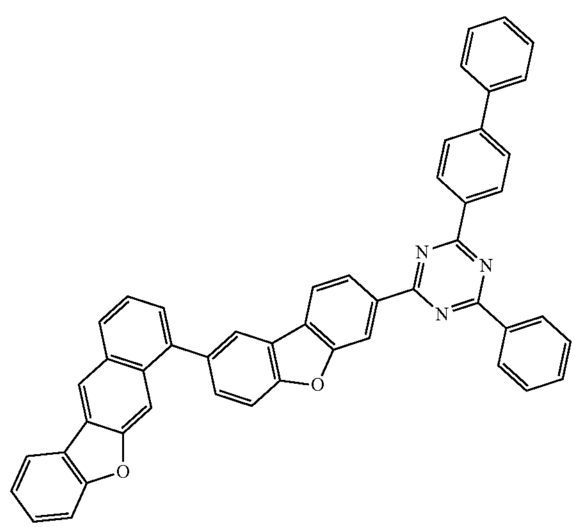

-continued
1-133
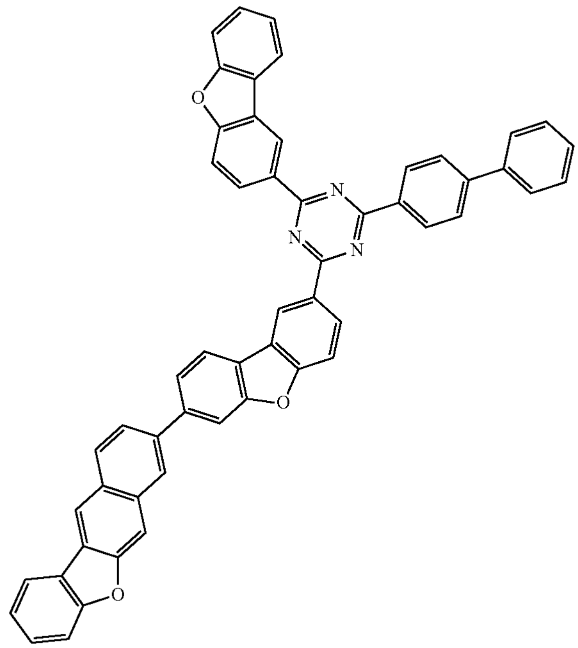
1-134
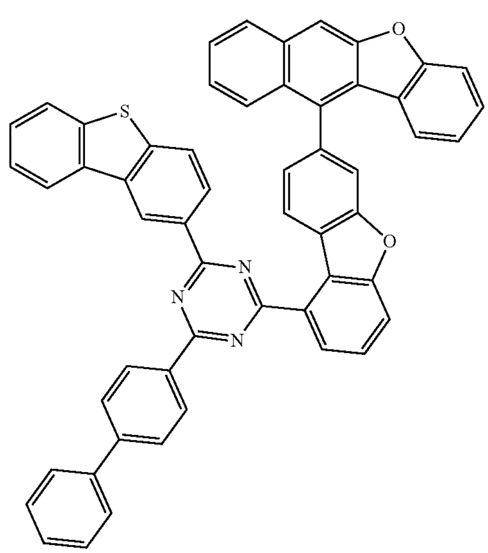
-continued
1-136
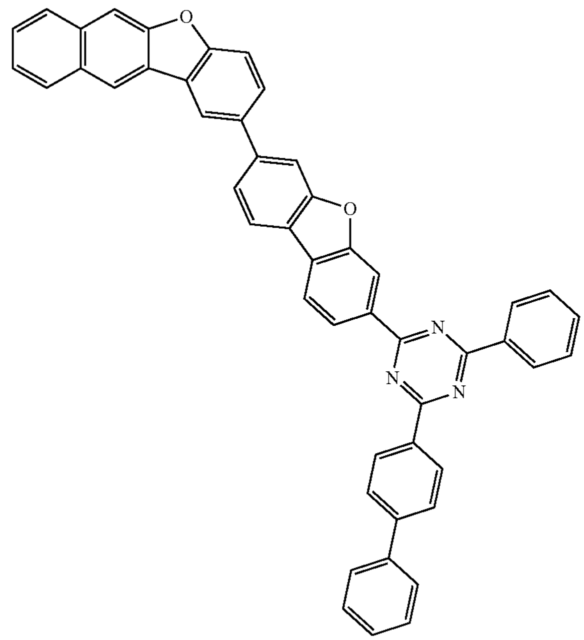
1-137
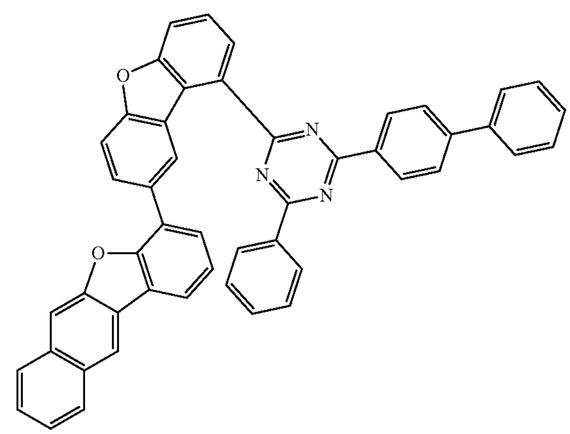
1-138
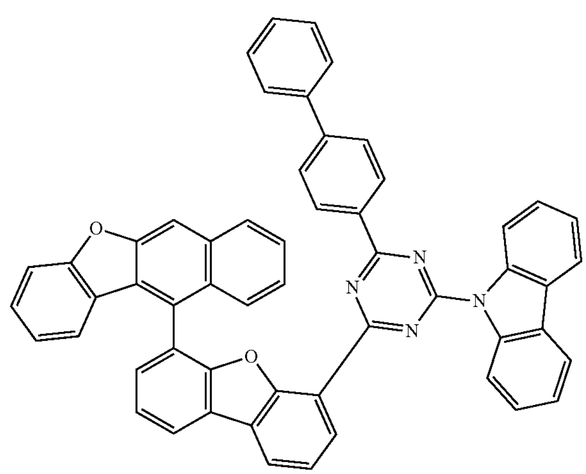

-continued
1-139
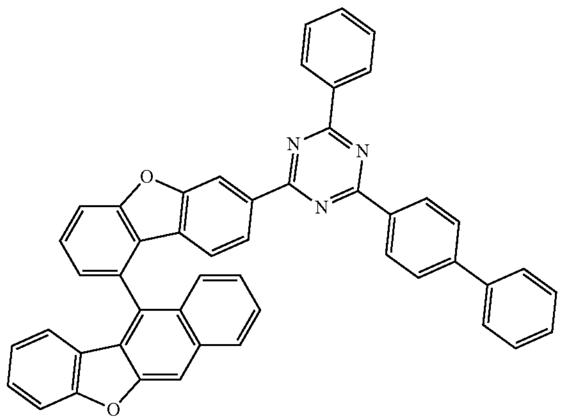
1-140
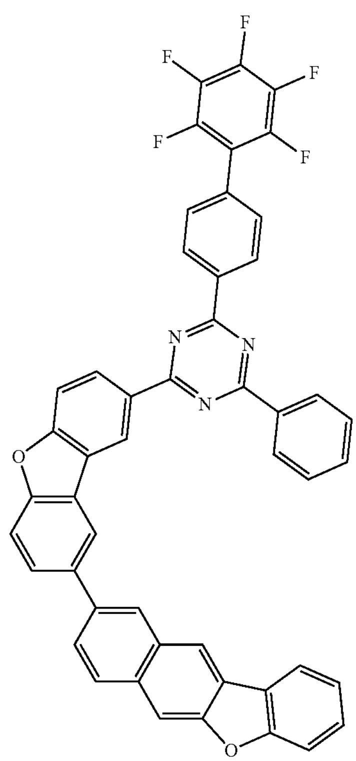
-continued
1-141
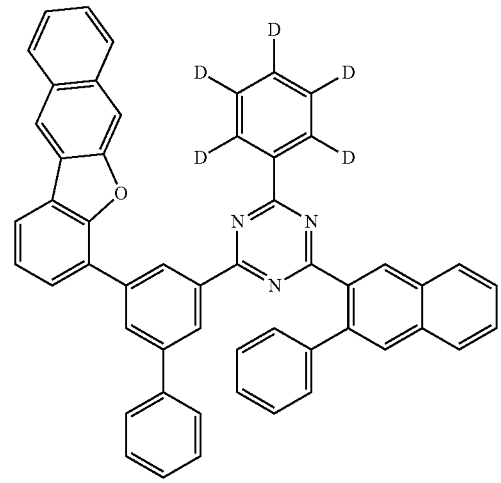
1-142
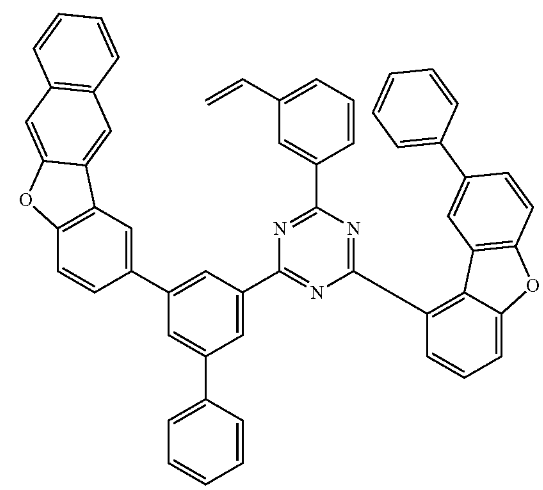
1-143
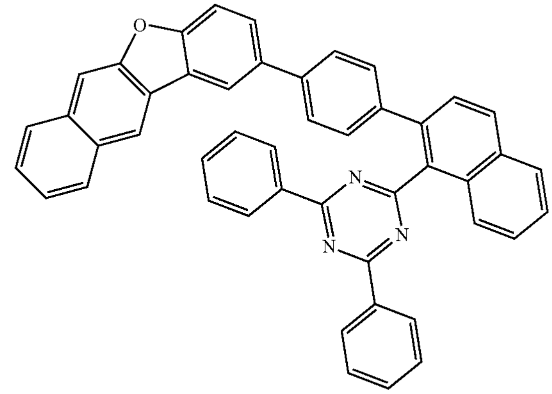

1-144
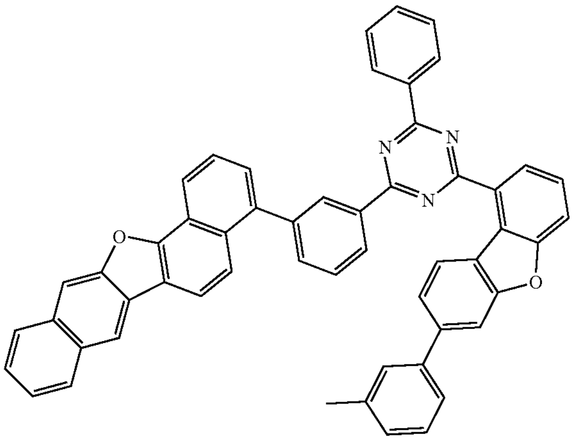
1-145
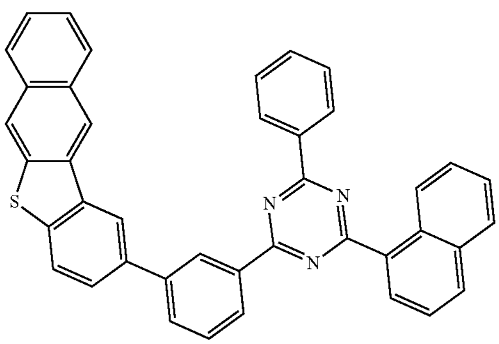
1-146
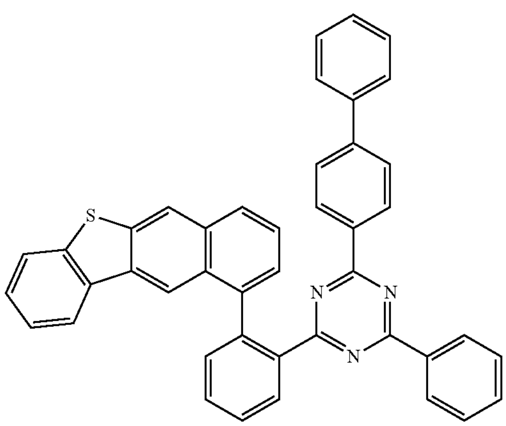
1-147
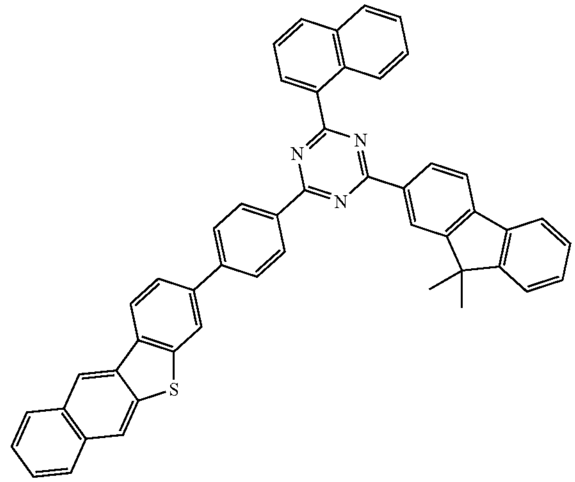
1-148
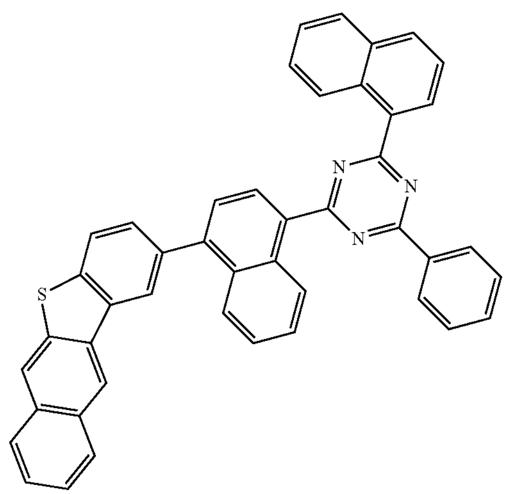
1-149
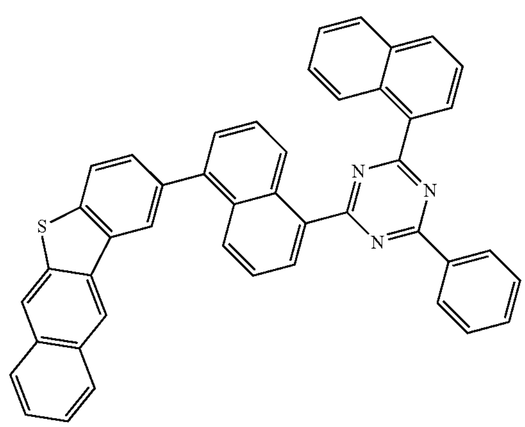

-continued
1-150
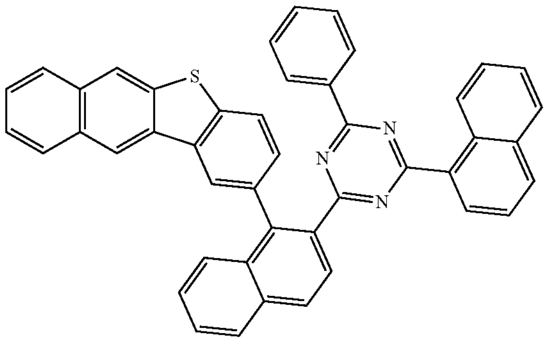
1-151
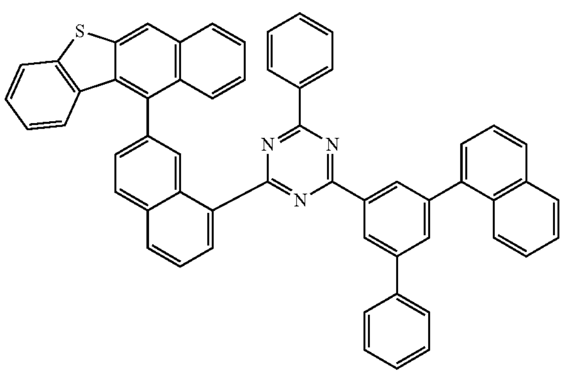
1-152
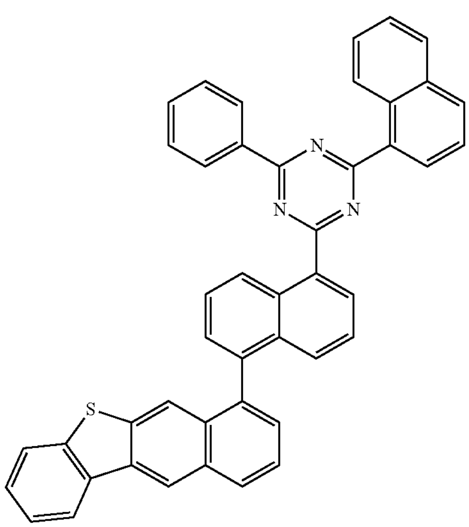
-continued
1-153
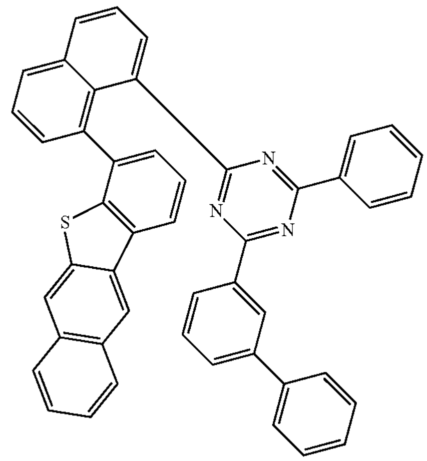
1-154
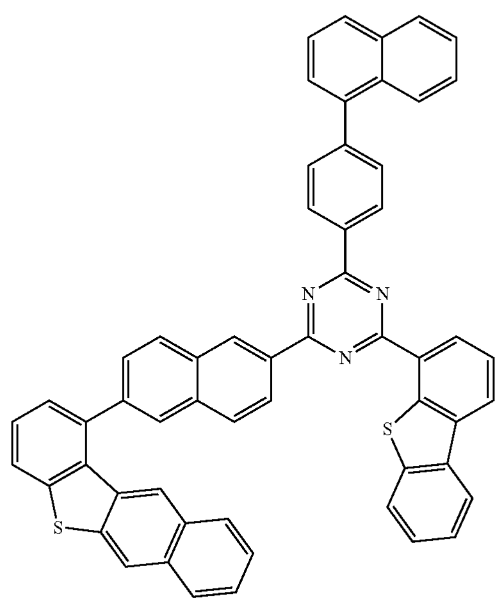

-continued
1-155
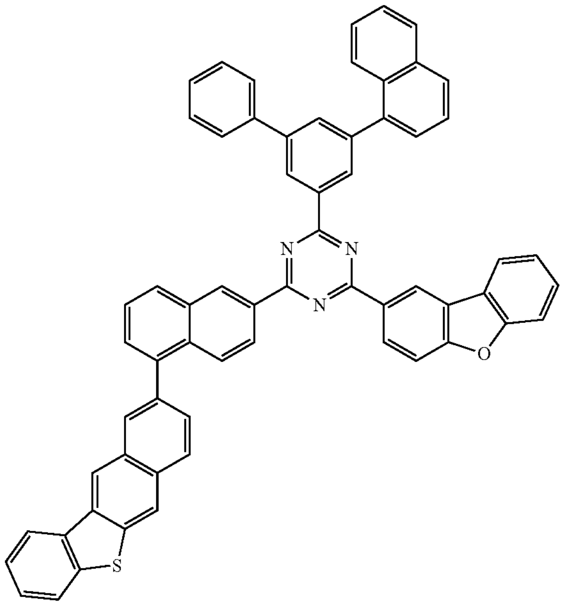
1-156
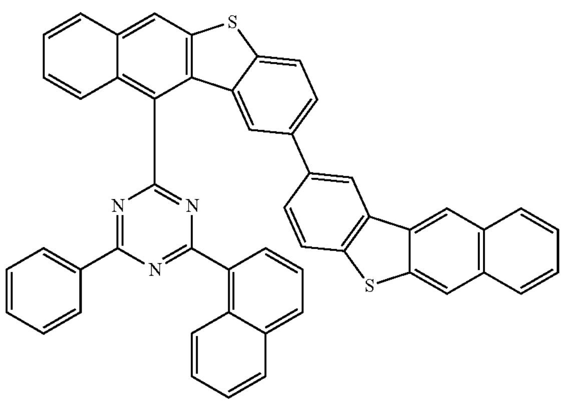
1-157
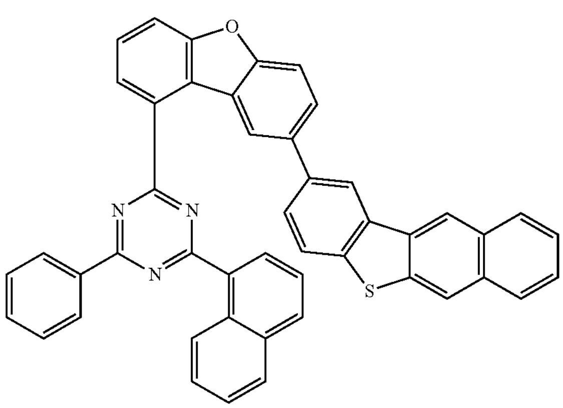
-continued
1-158
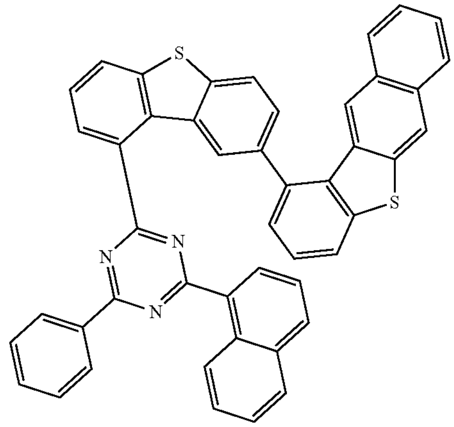
1-159
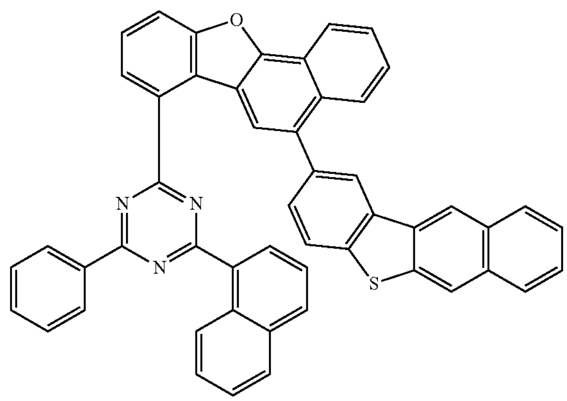
1-160
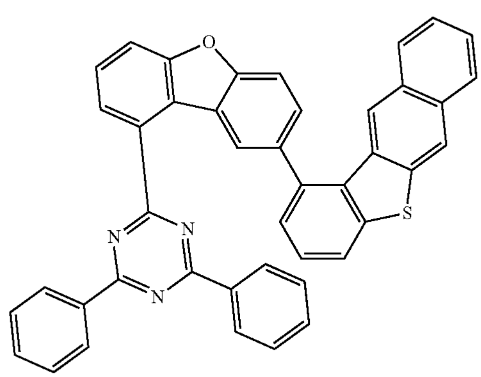

-continued
1-162
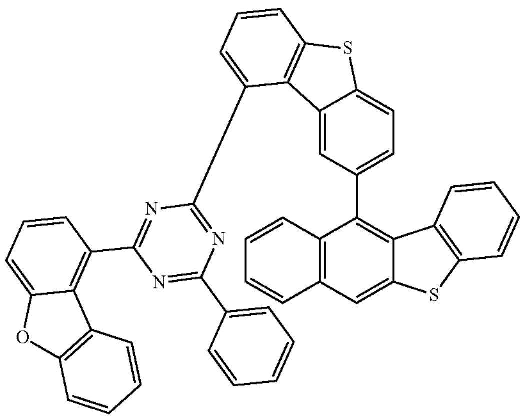
1-163
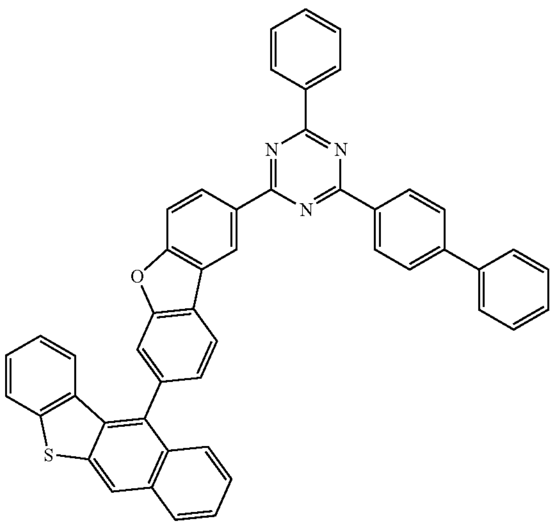
1-164
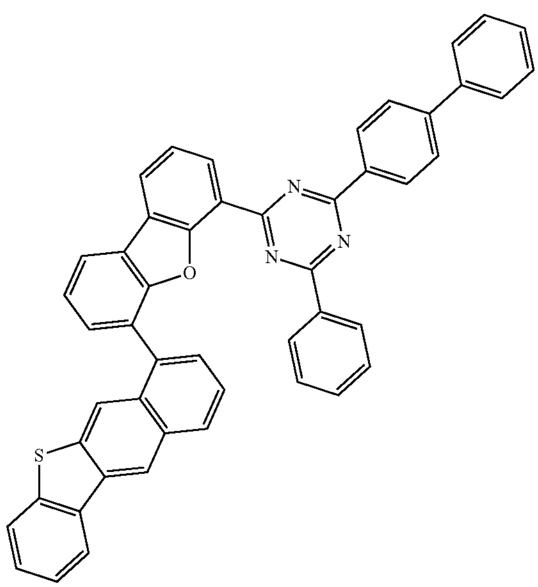
-continued
1-165
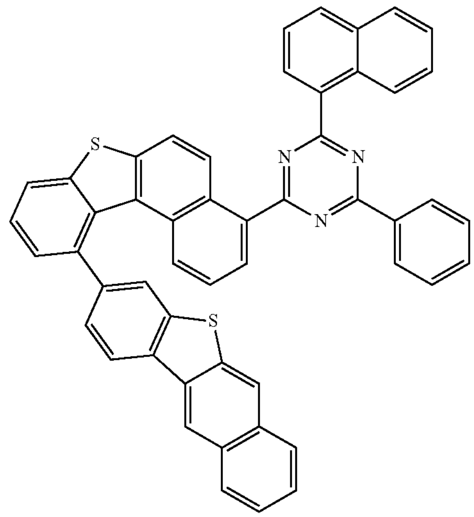
1-166
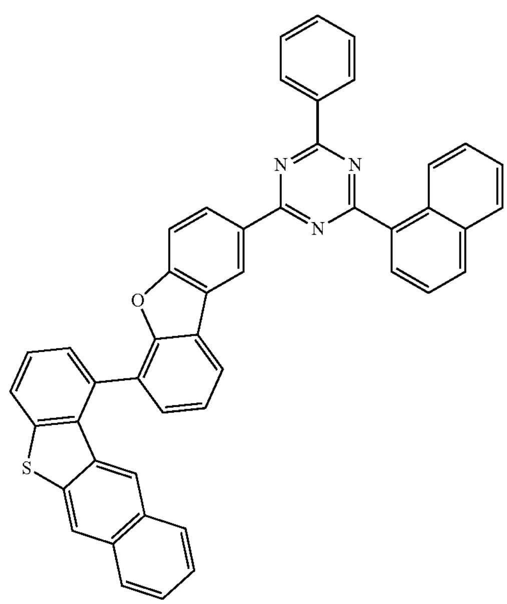

-continued
1-167
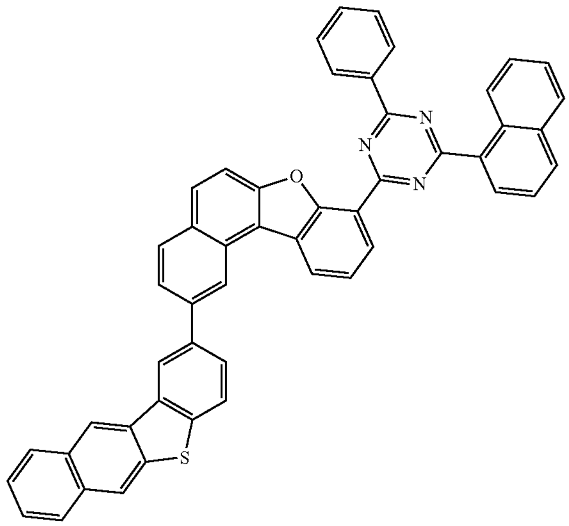
1-168
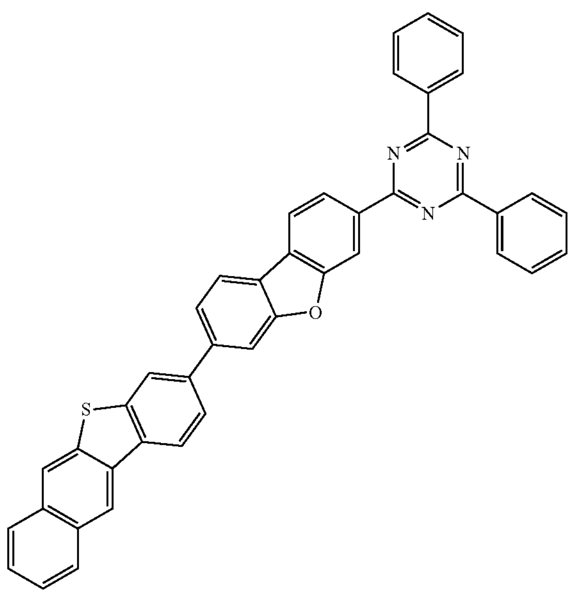
1-169
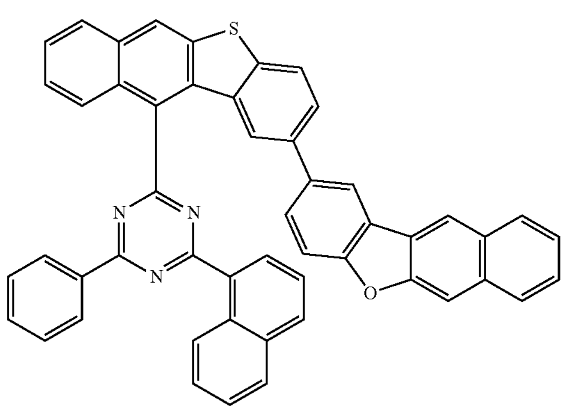
-continued
1-170
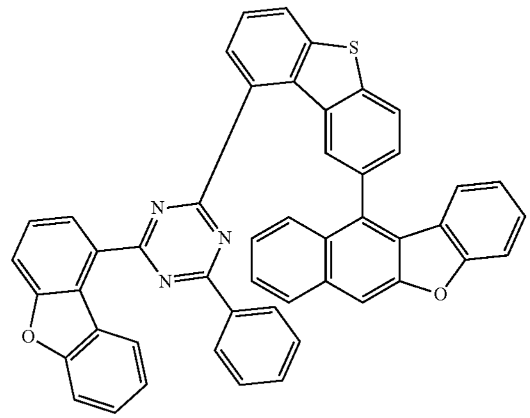
1-171
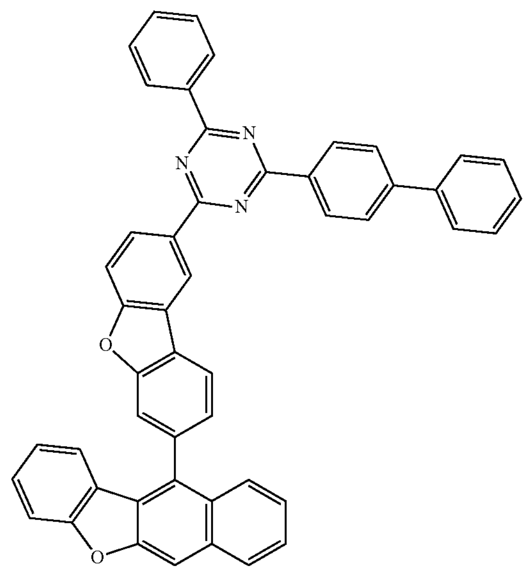
1-172
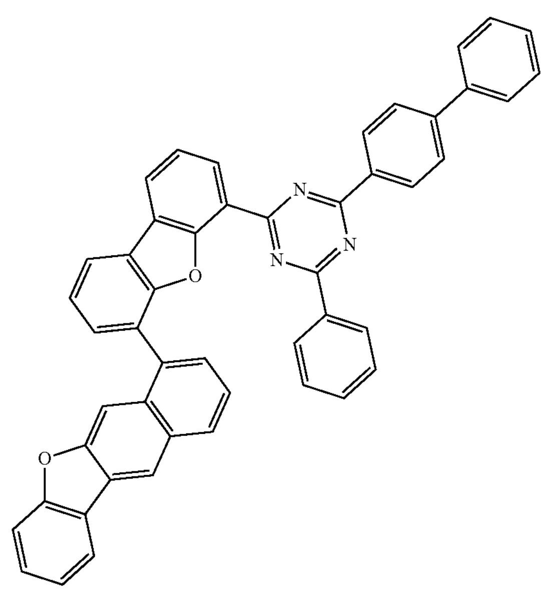

1-173
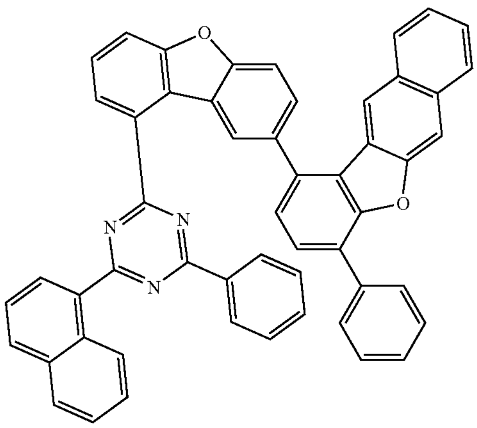
1-174
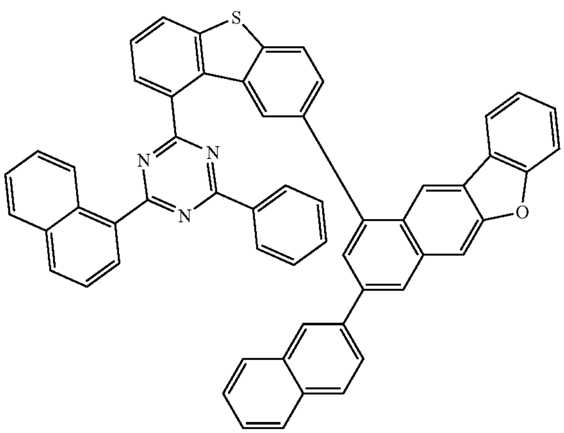
1-175
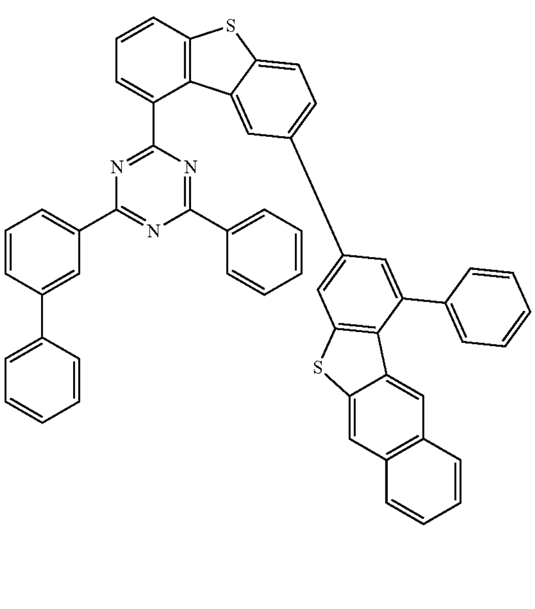
1-176
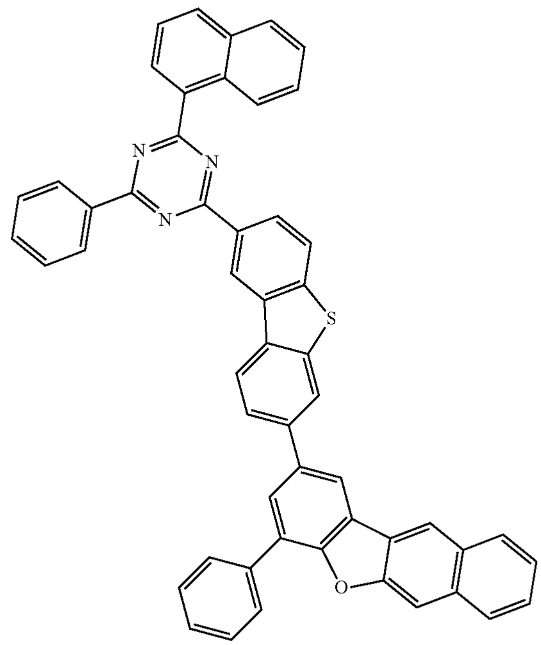
Specifically, the compound represented by formula 2 may be one of the following compounds, but there is no limitation thereto.
2-1
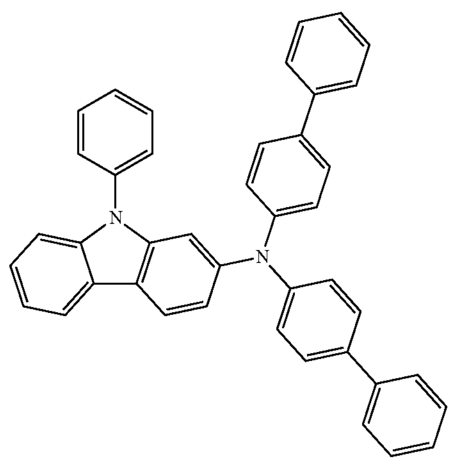
2-2
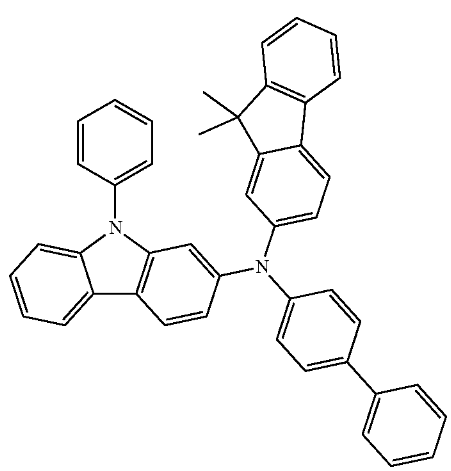

2-3
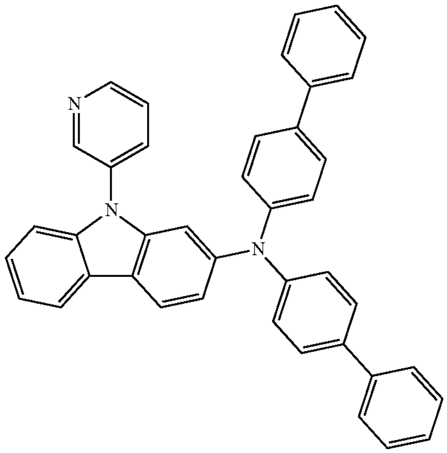
2-4
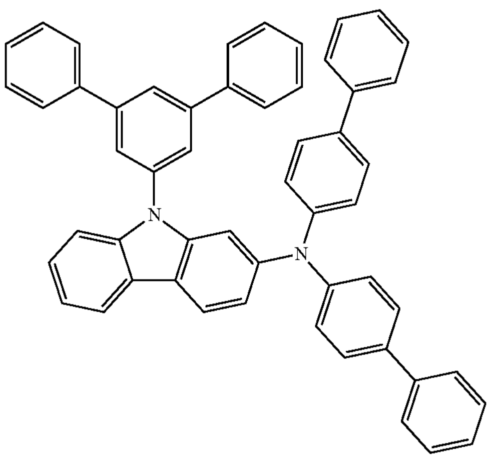
2-5
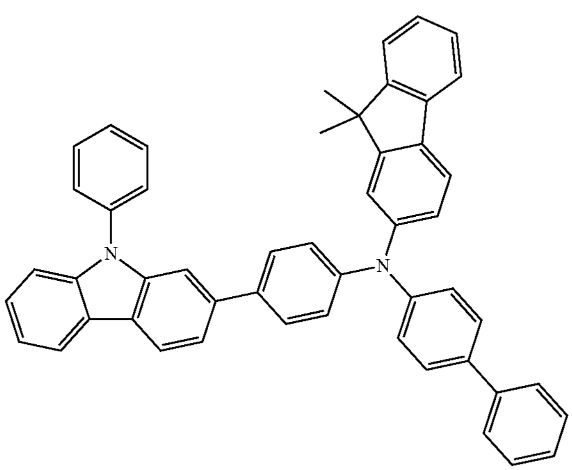
2-6
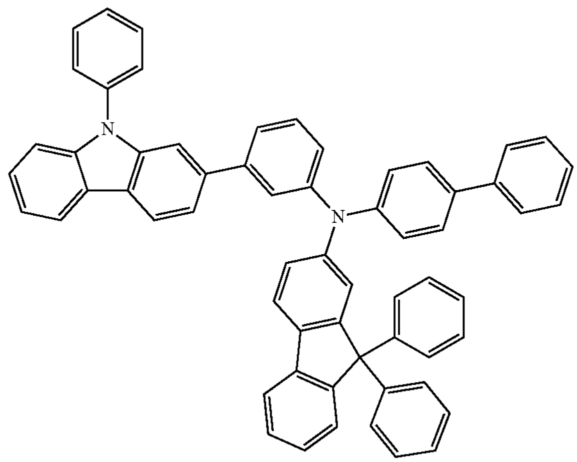
2-7
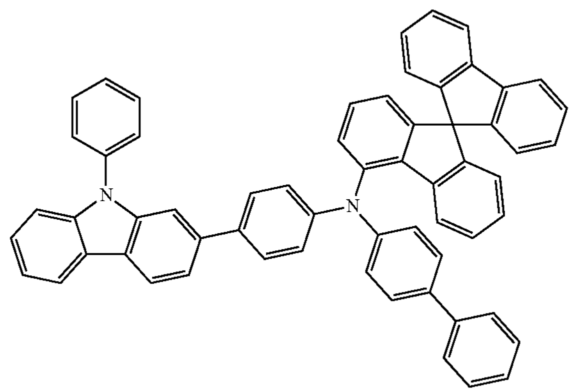
2-8
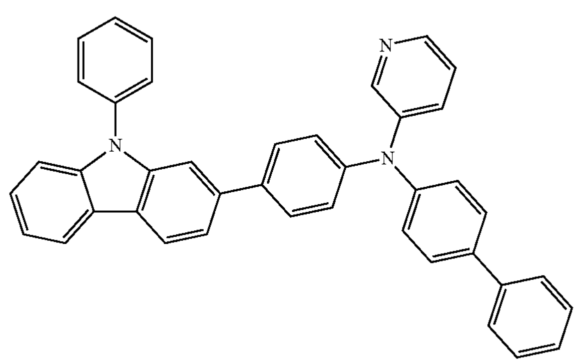

-continued
2-9
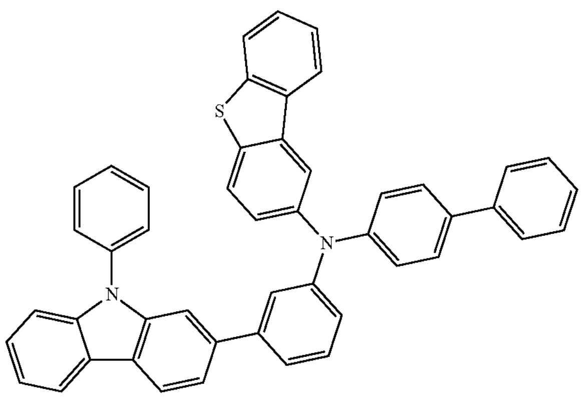
2-10
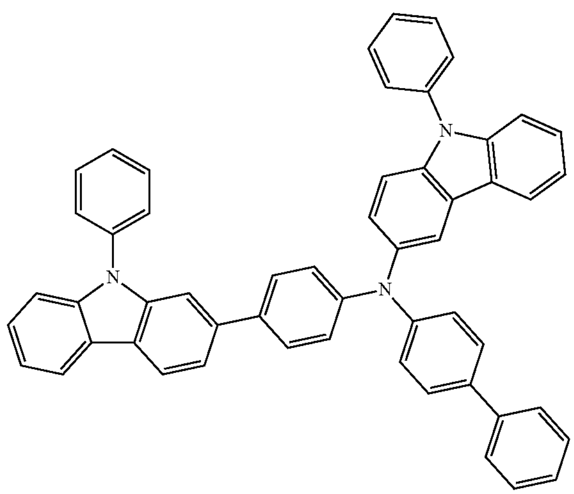
2-11
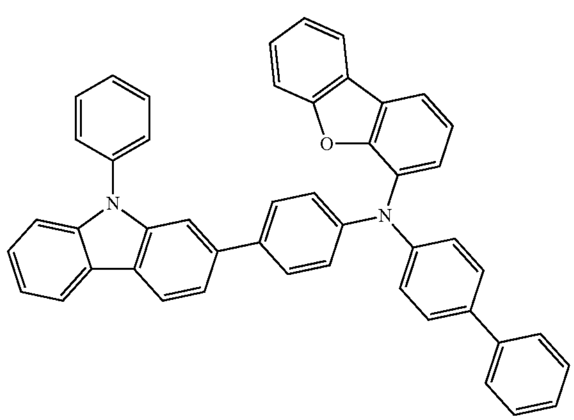
-continued
2-12
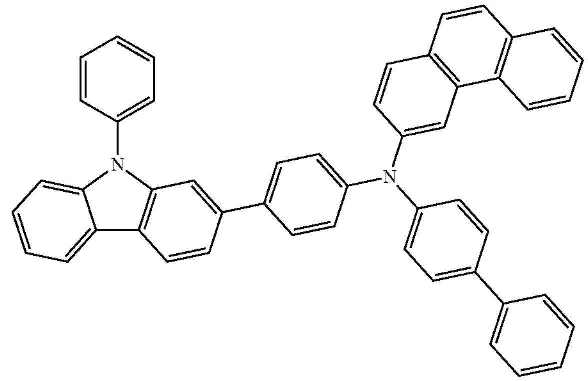
2-13
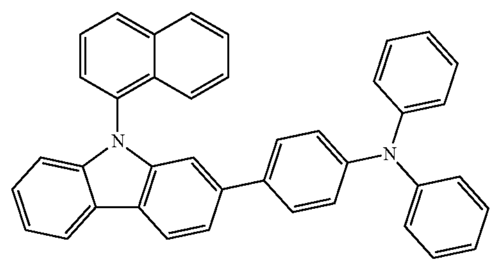
2-14
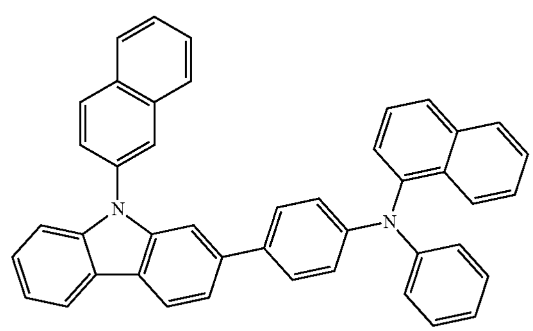
2-15
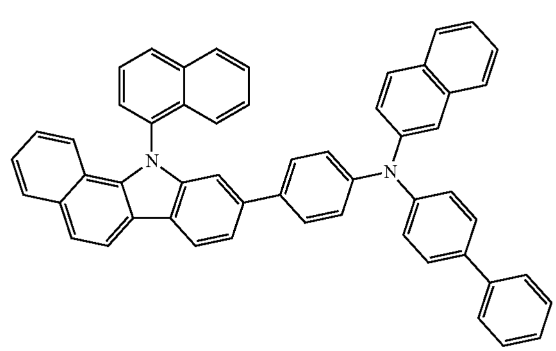

-continued
2-16
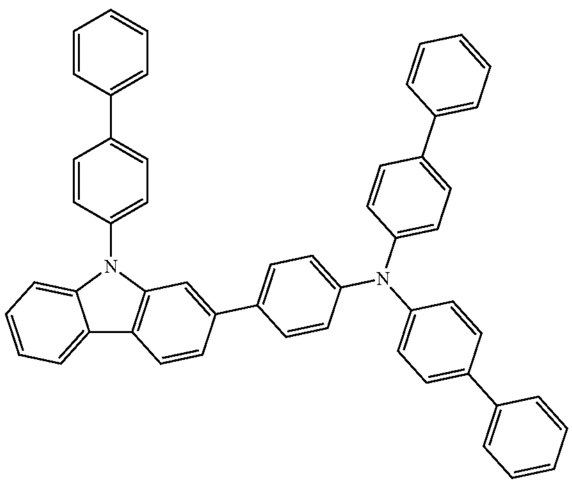
2-17
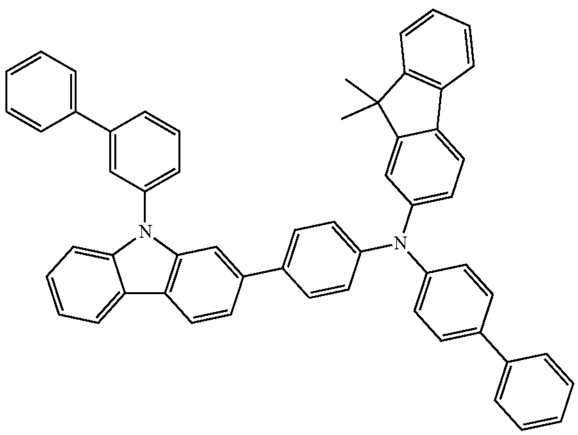
2-18
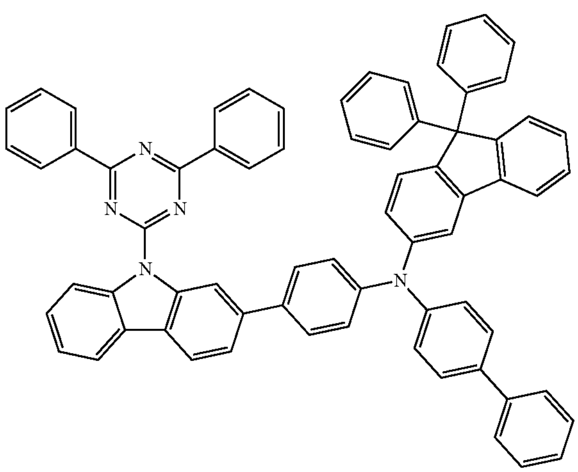
-continued
2-19
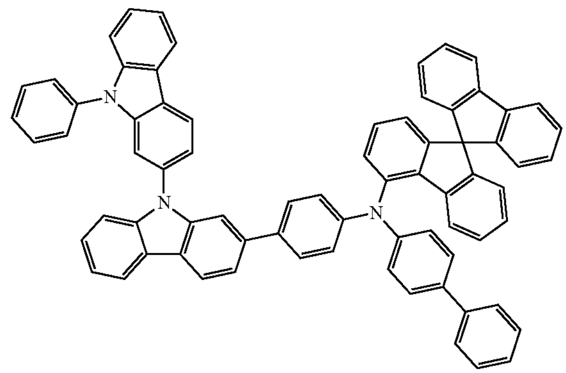
2-20
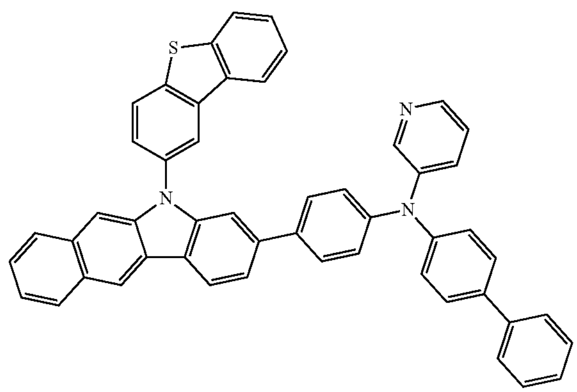
2-21
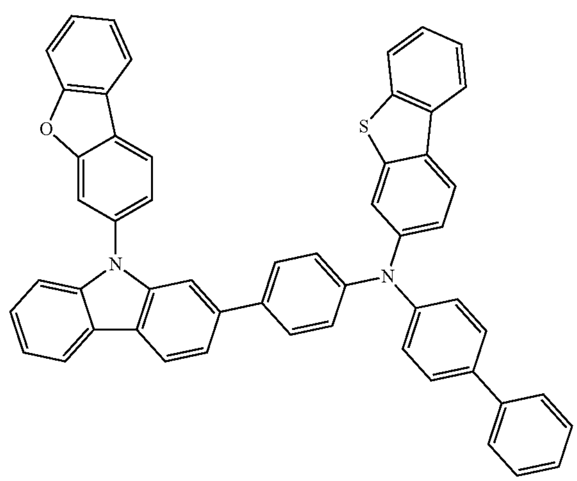

-continued
2-22
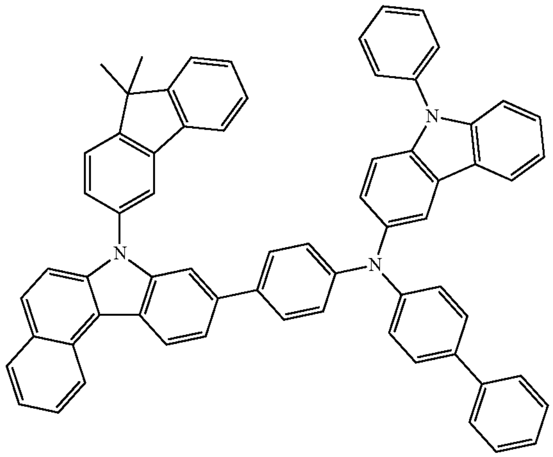
2-23
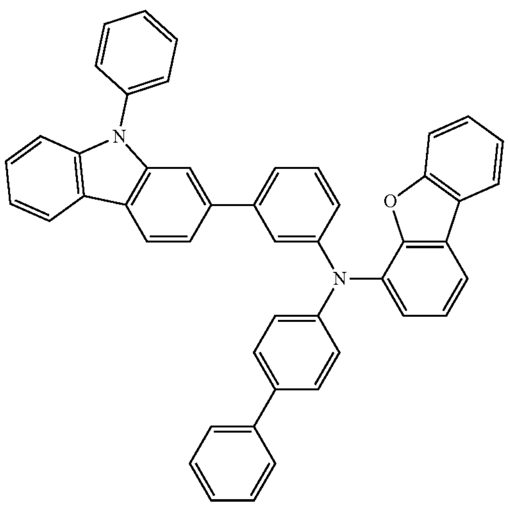
2-24
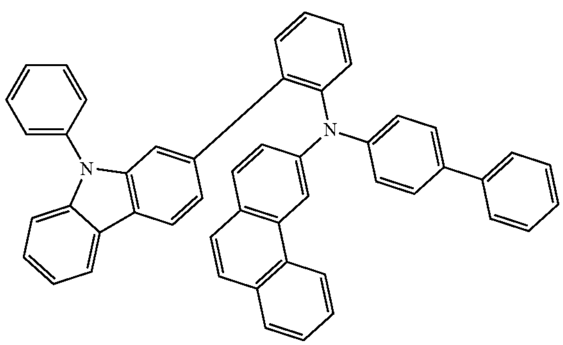
2-25
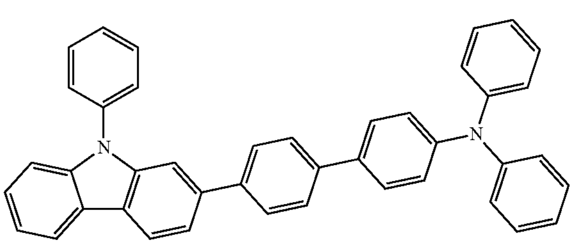
-continued
2-26
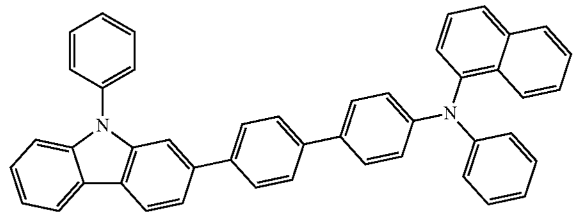
2-27
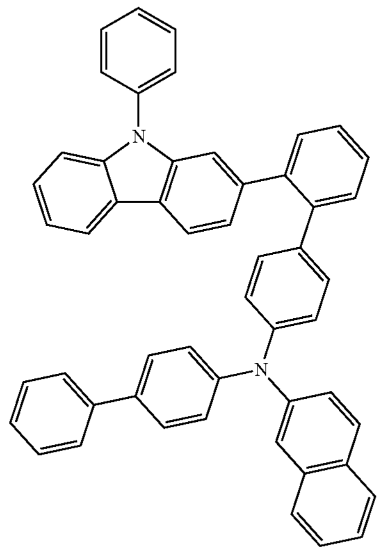
2-28
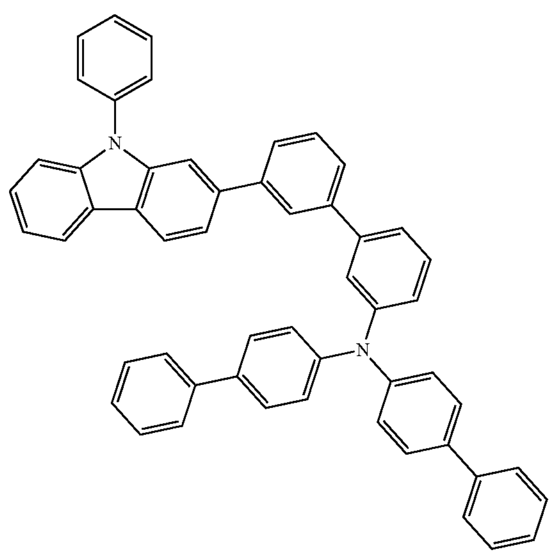

-continued
2-29
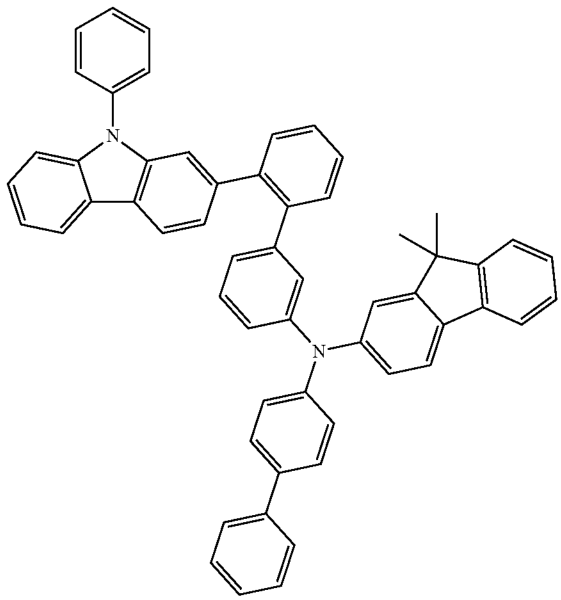
2-30
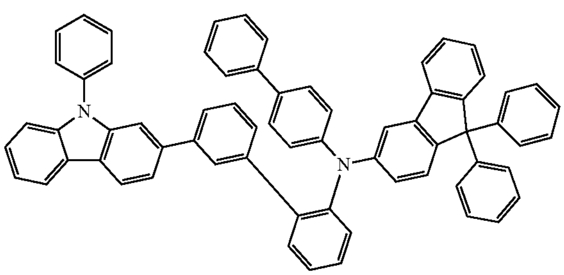
2-31
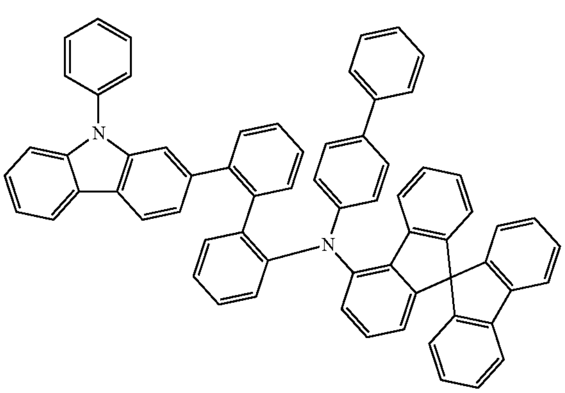
-continued
2-32
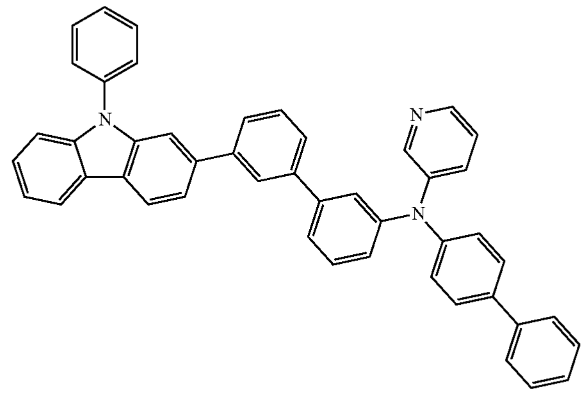
2-33
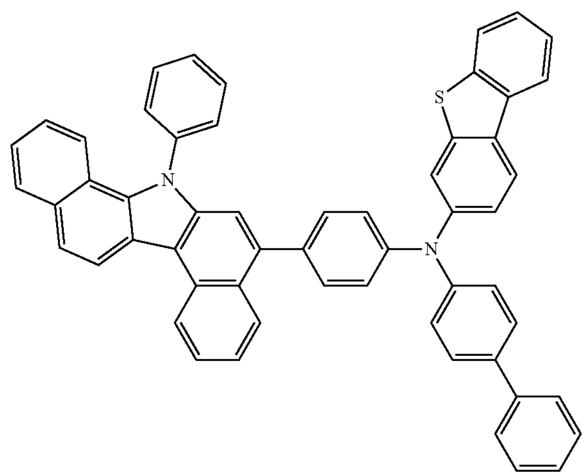
2-34
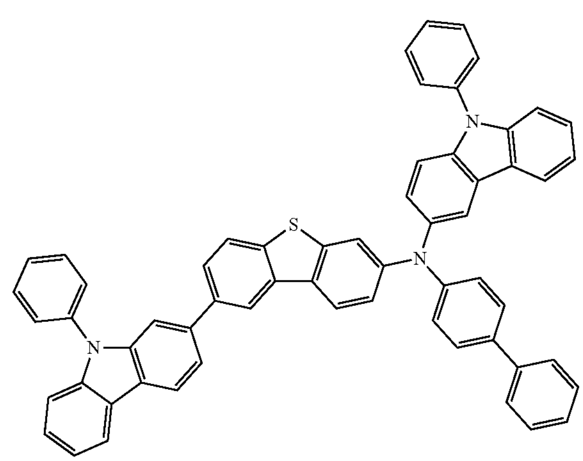

-continued
2-35
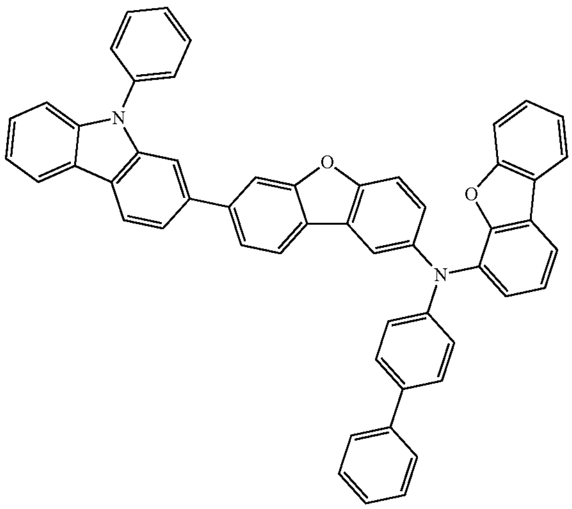
2-36
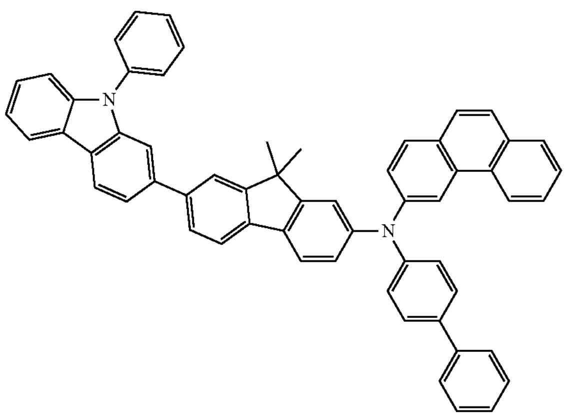
2-37
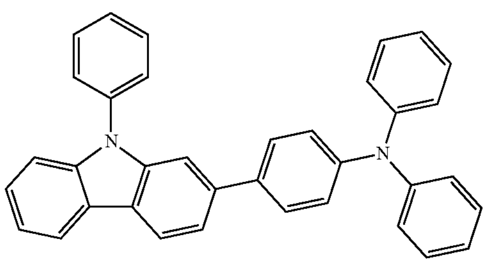
2-38
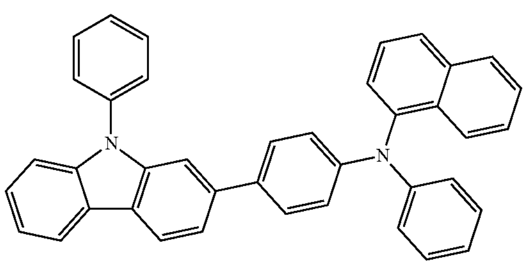
-continued
2-39
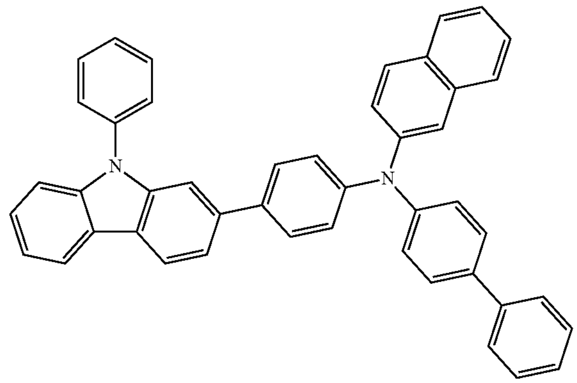
2-40
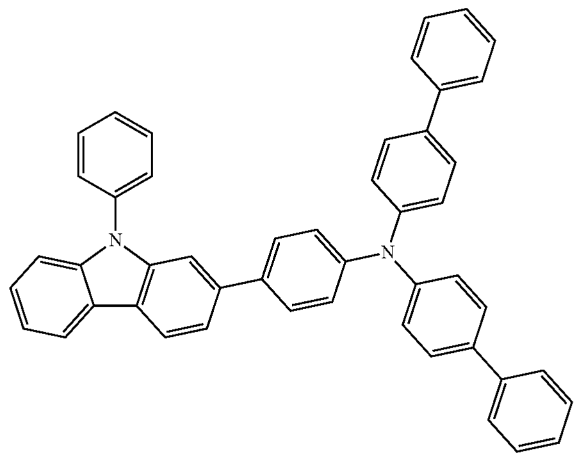
2-41
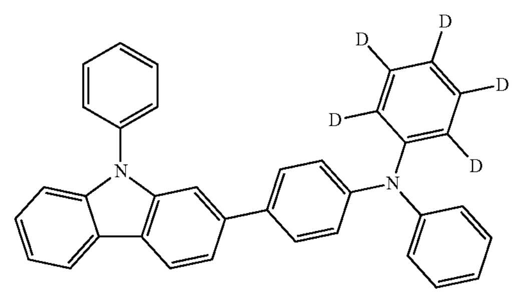
2-42
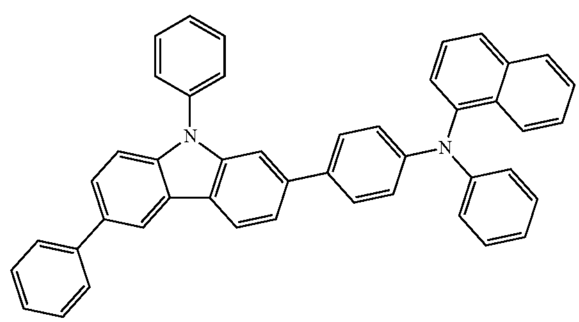

-continued
2-43
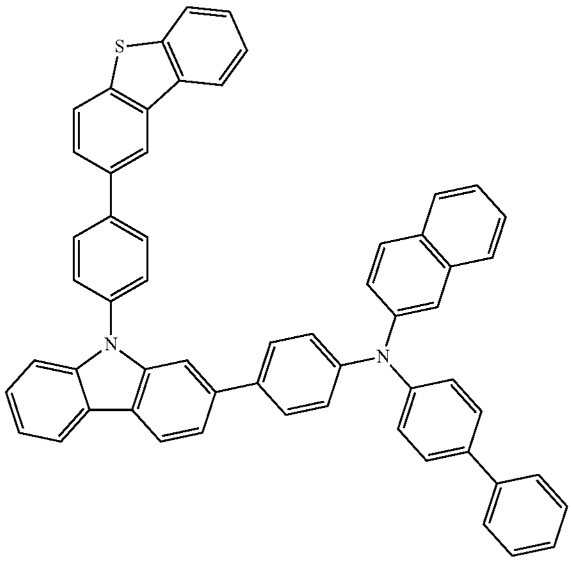
2-44
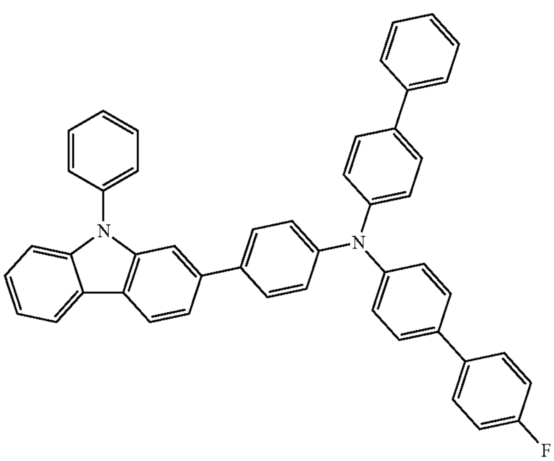
2-45
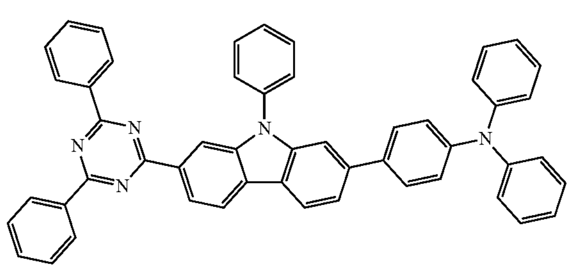
-continued
2-46
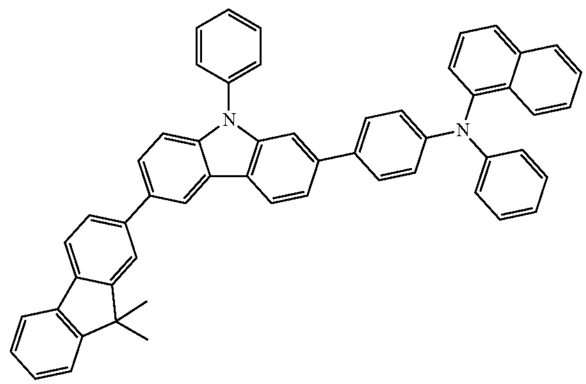
2-47
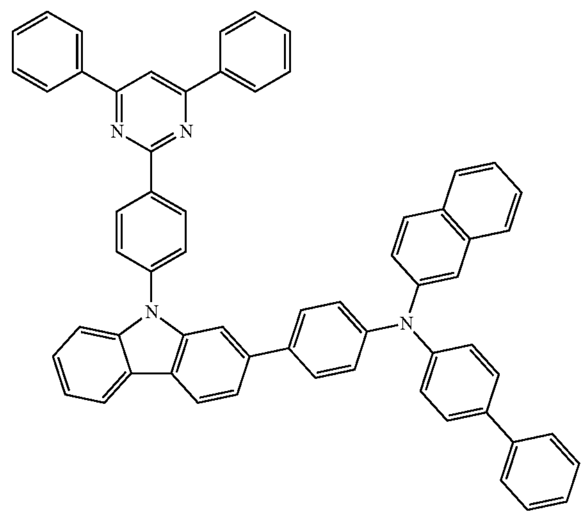
2-48
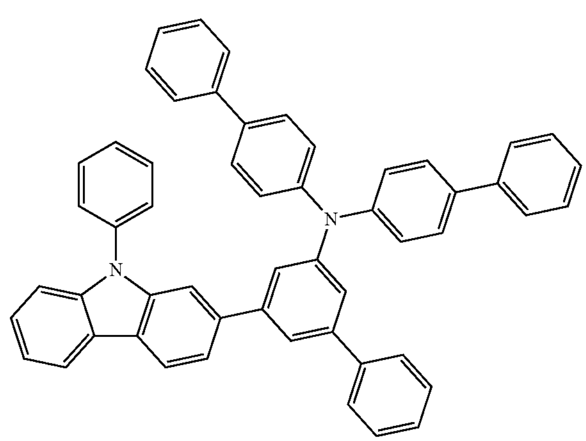

-continued
2-49
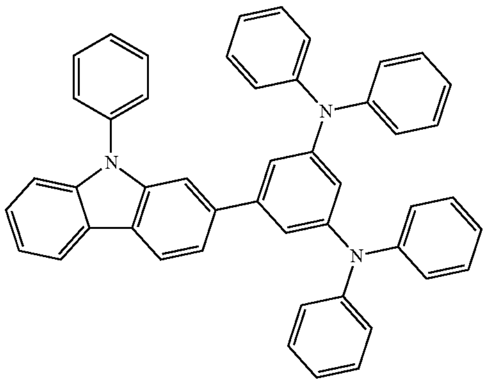
2-50
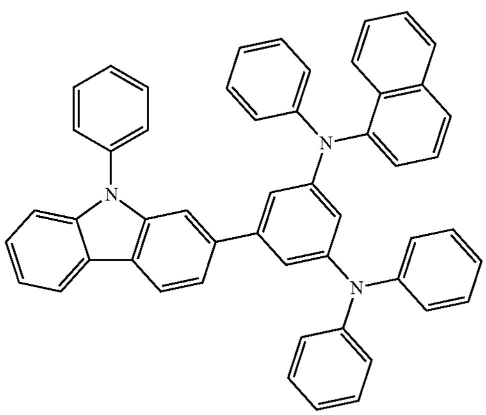
2-51
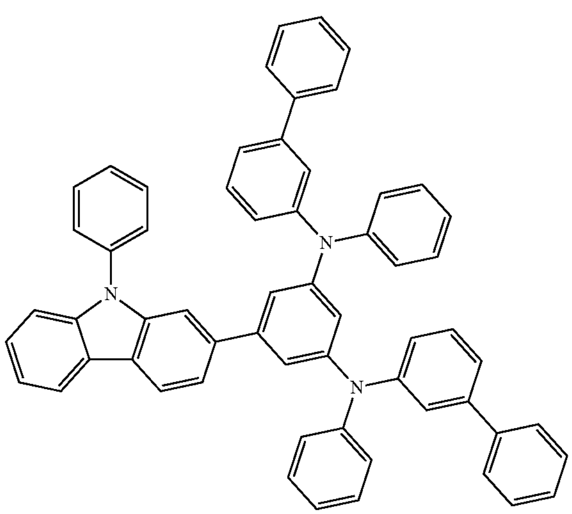
-continued
2-52
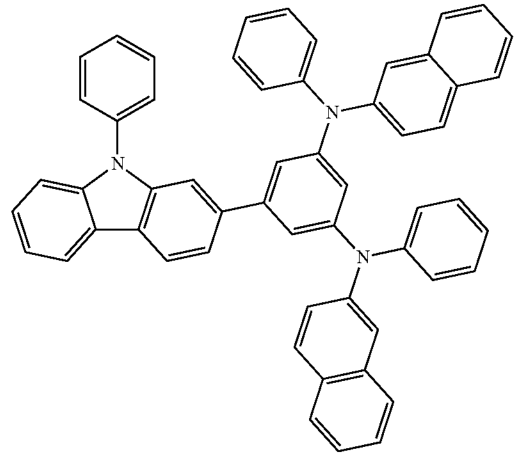
2-53
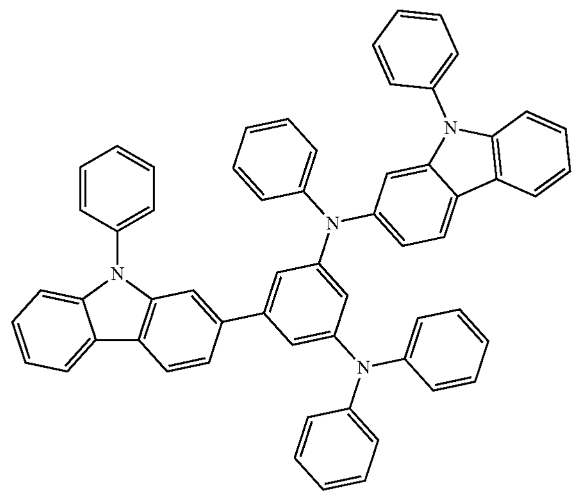
2-54
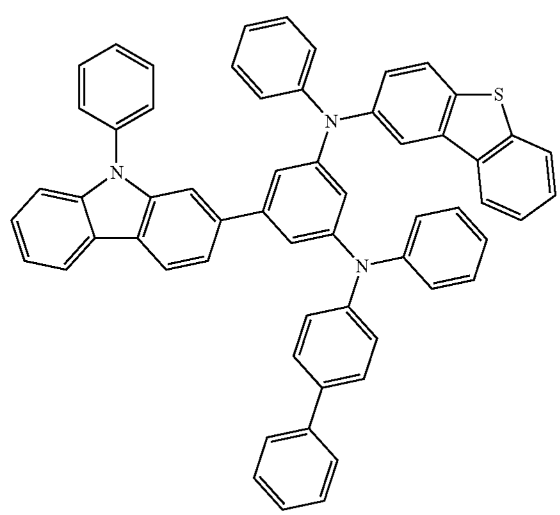

-continued
2-55
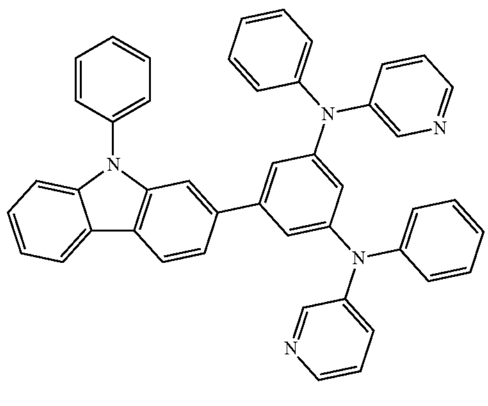
2-56
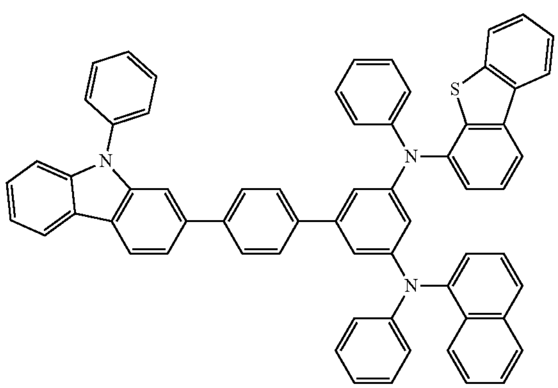
2-57
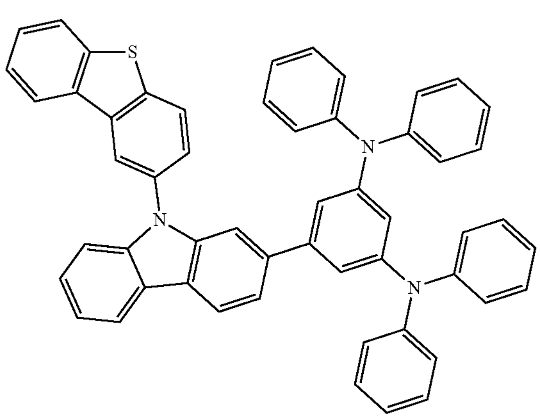
-continued
2-58
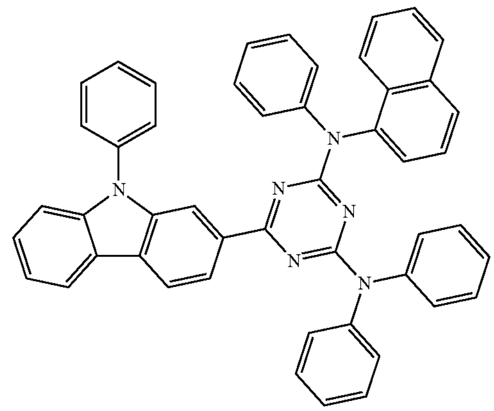
2-59
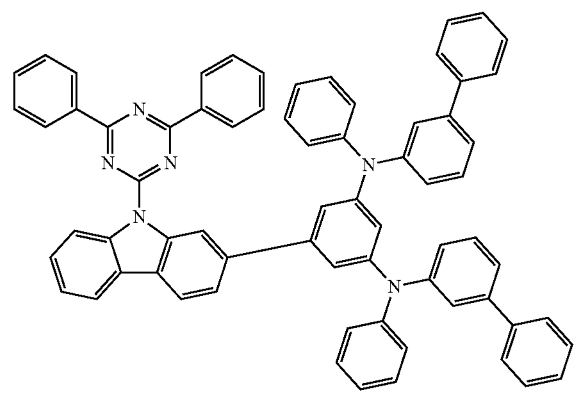
2-60
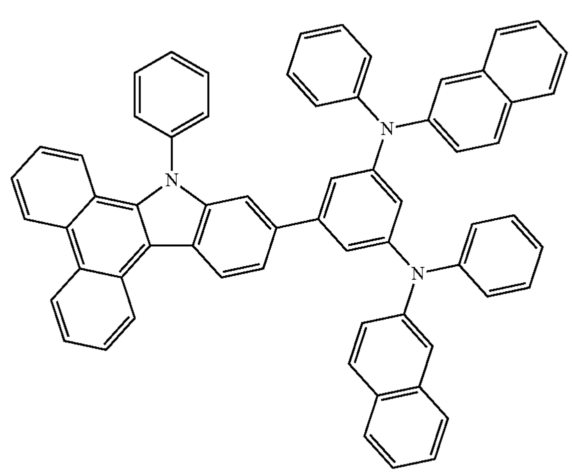

-continued
2-61
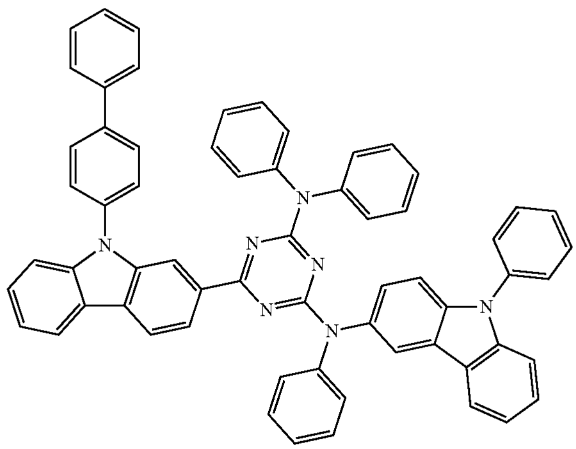
2-62
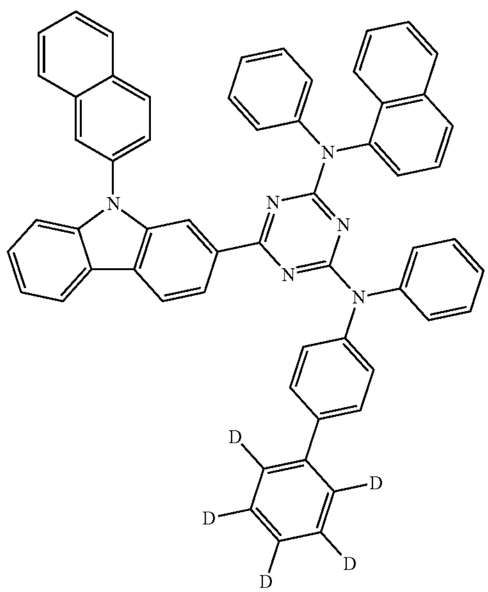
2-63
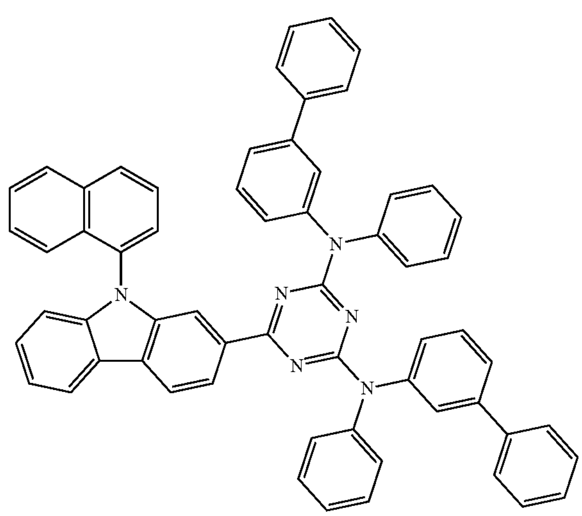
-continued
2-64
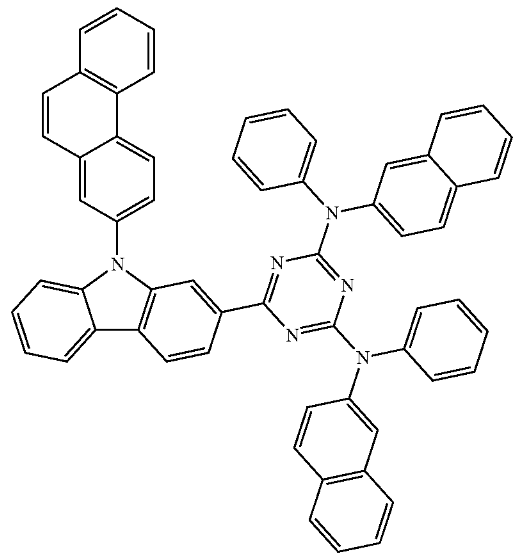
2-65
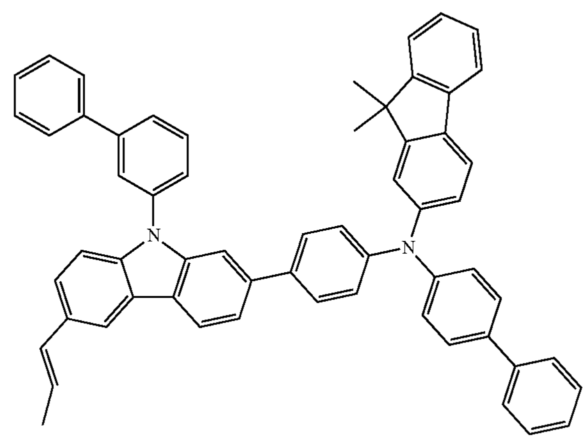
2-66
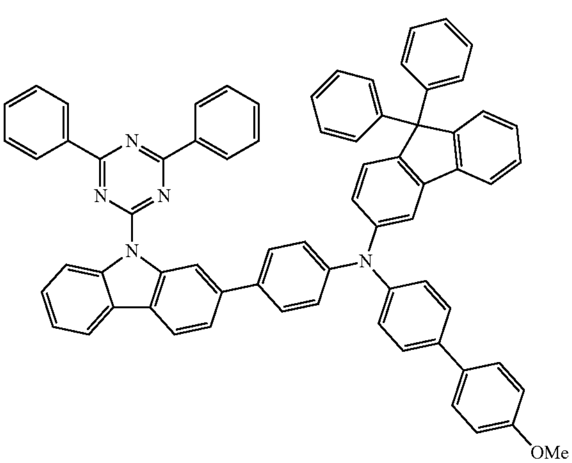

-continued
2-67
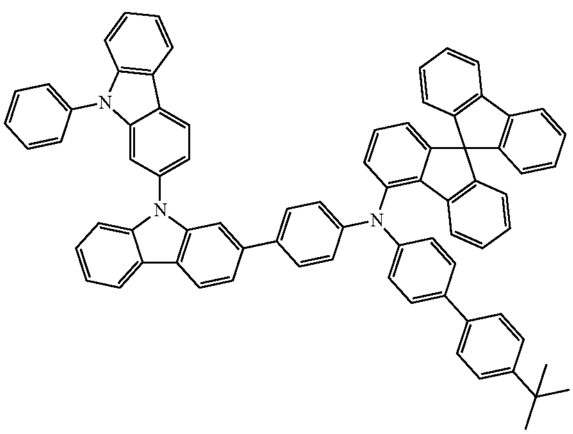
2-68
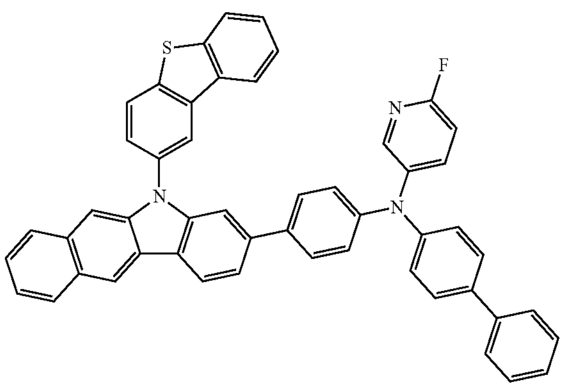
2-69
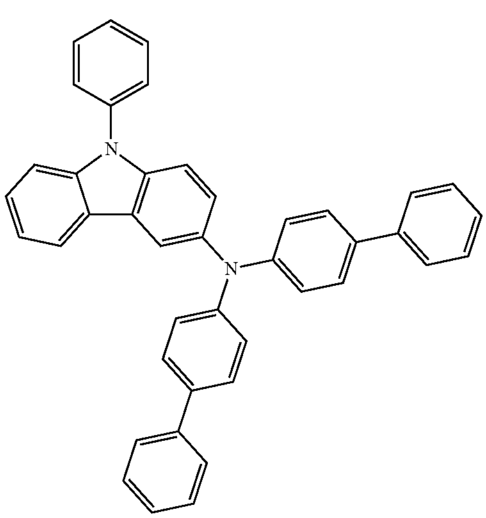
-continued
2-70
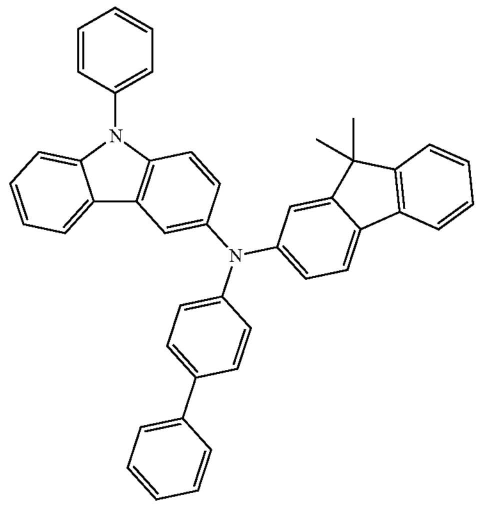
2-71
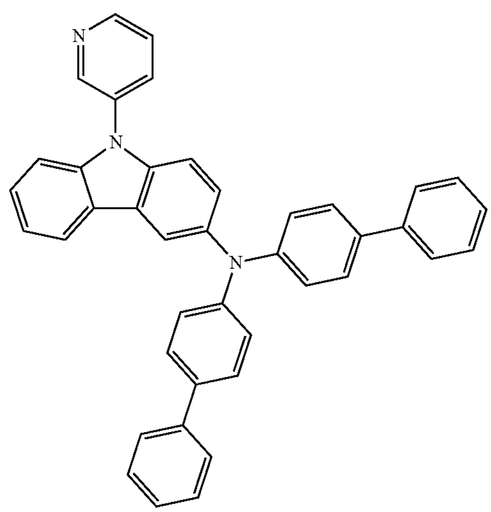
2-72
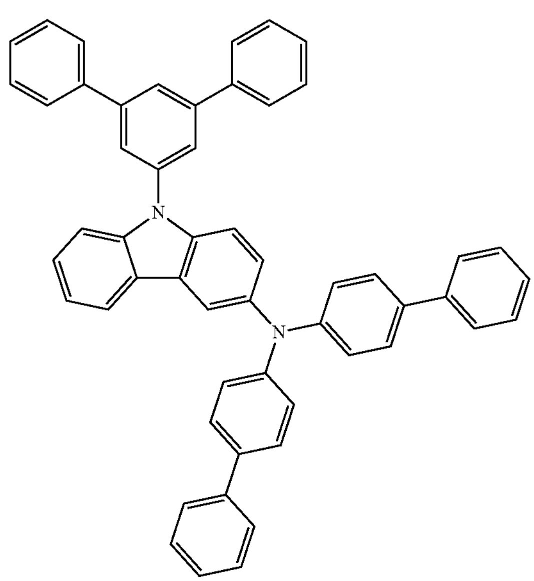

-continued
2-73
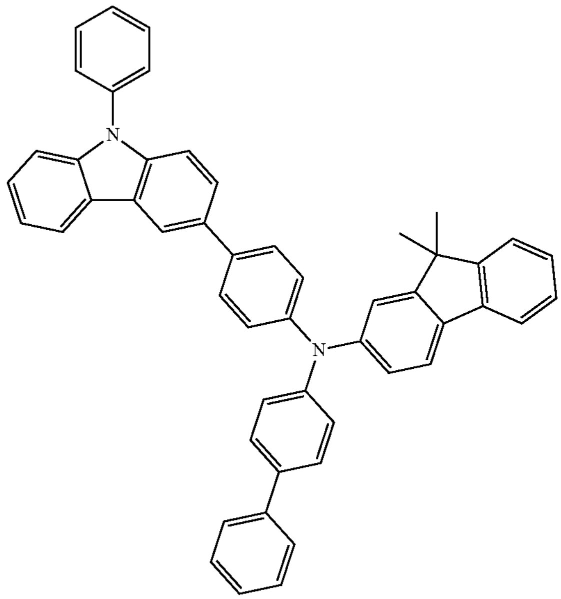
2-74
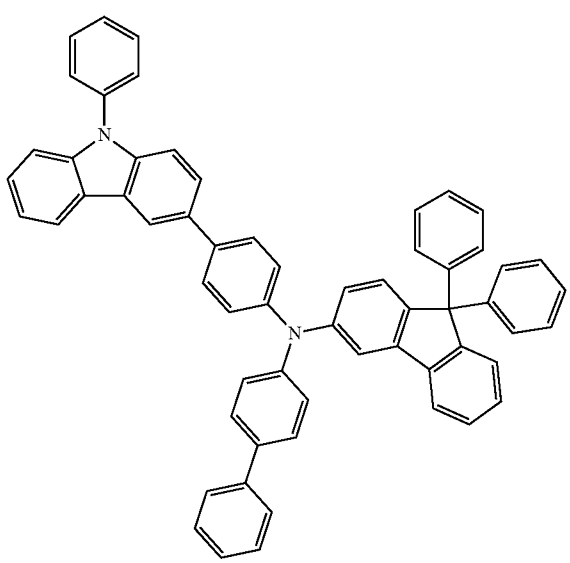
-continued
2-75
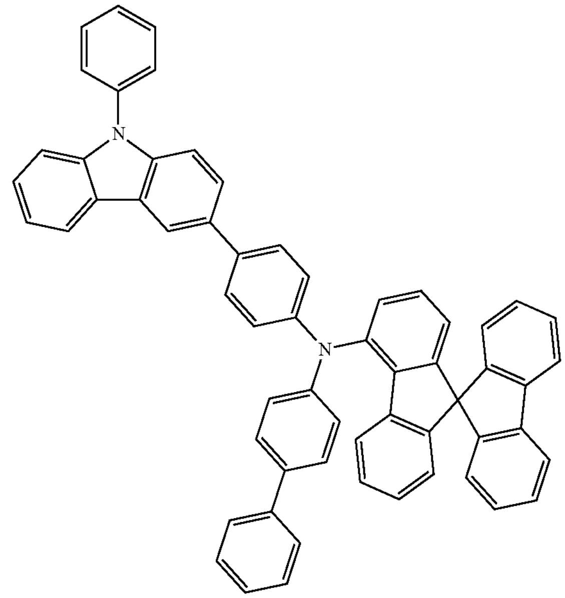
2-76
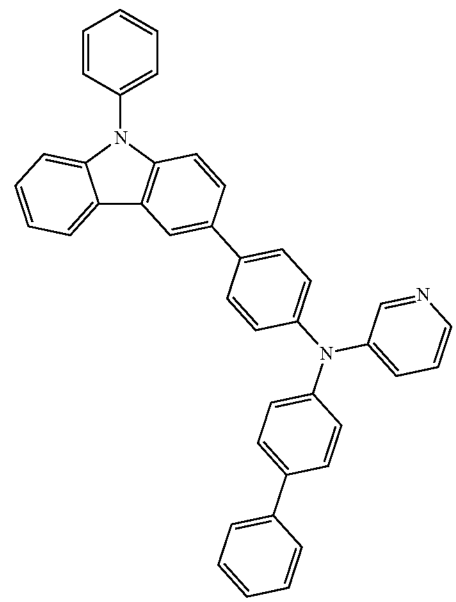
2-77
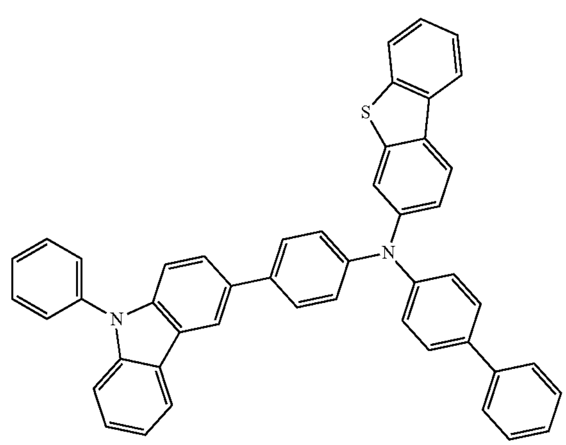

-continued
2-78
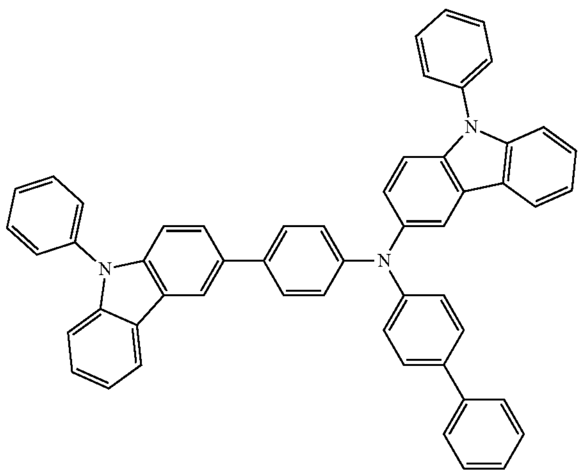
2-79
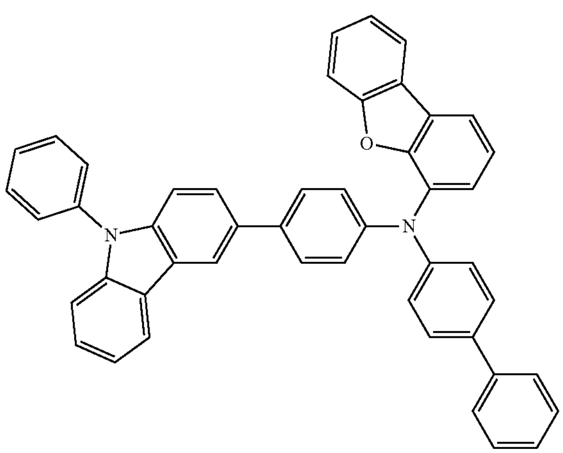
2-80
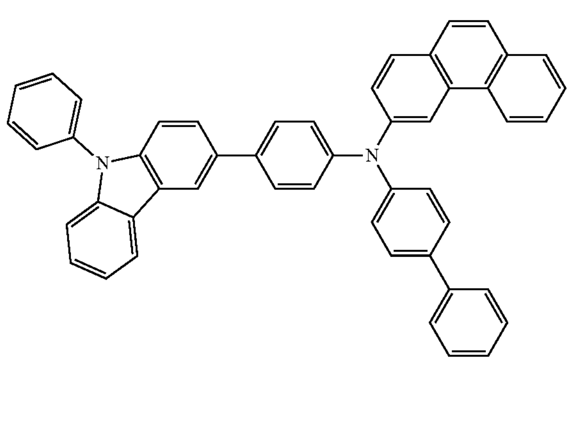
-continued
2-81
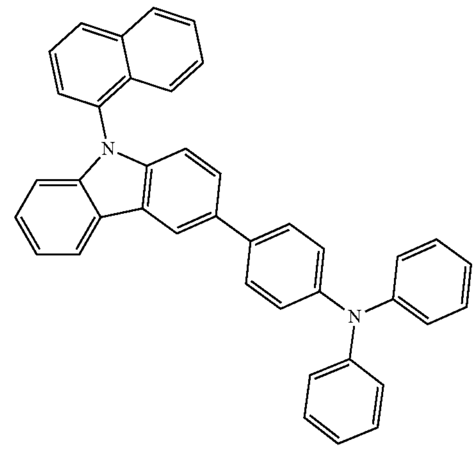
2-82
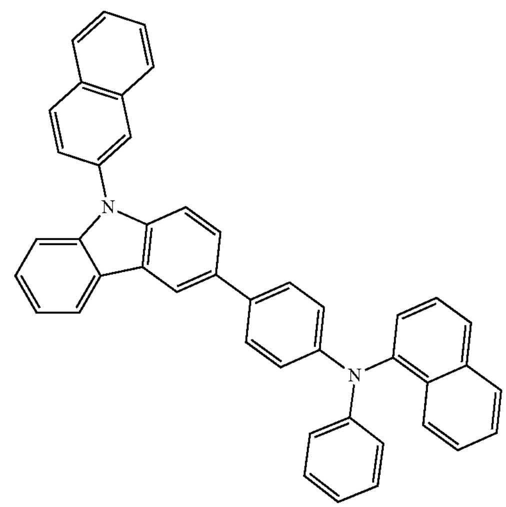
2-83
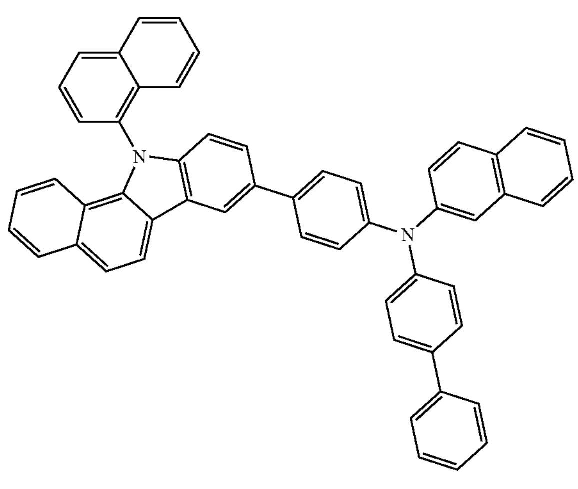

-continued
2-84
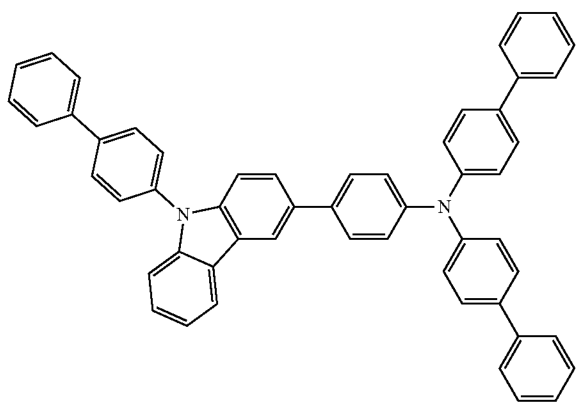
2-85
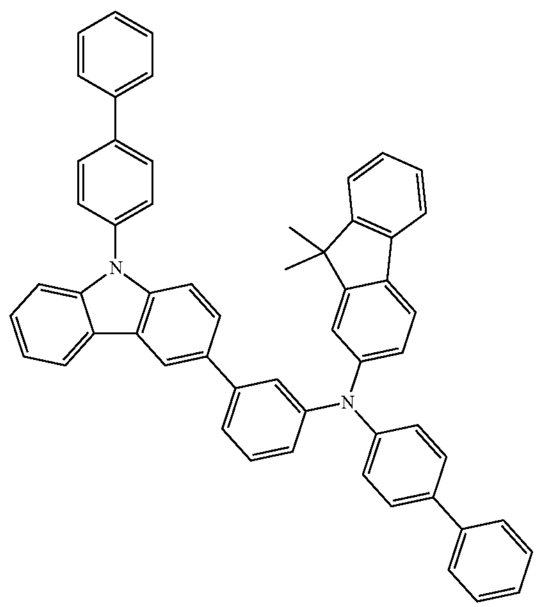
2-86
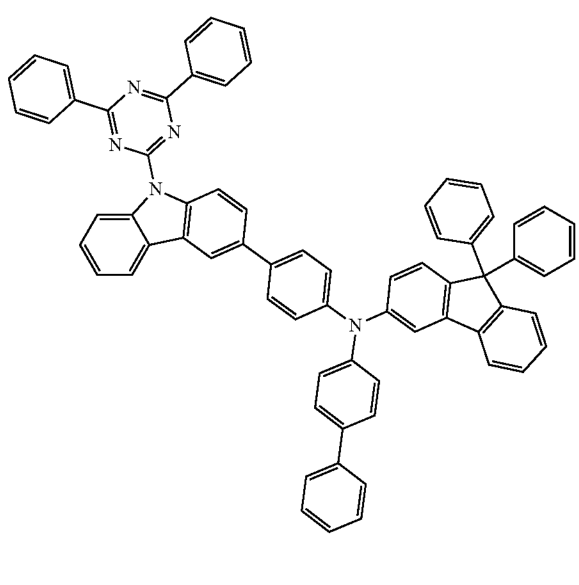
-continued
2-87
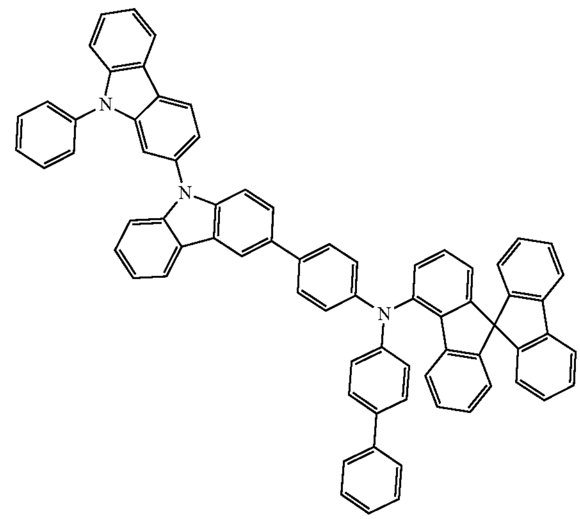
2-88
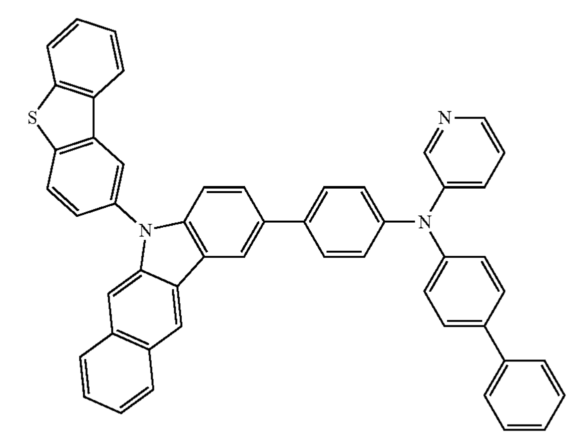
2-89
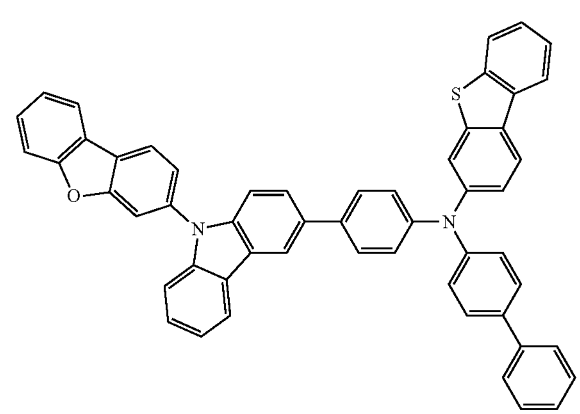

-continued
2-90
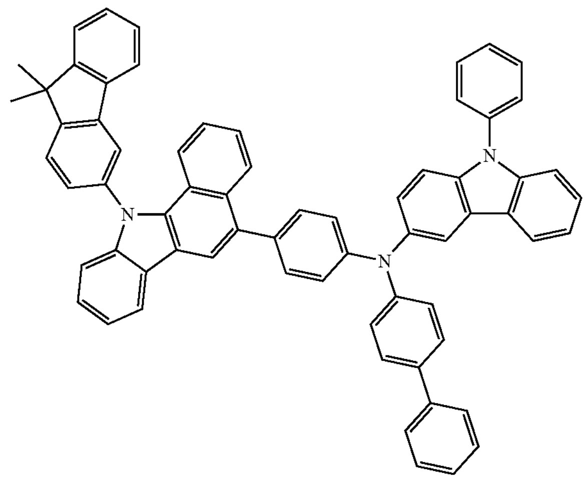
2-91
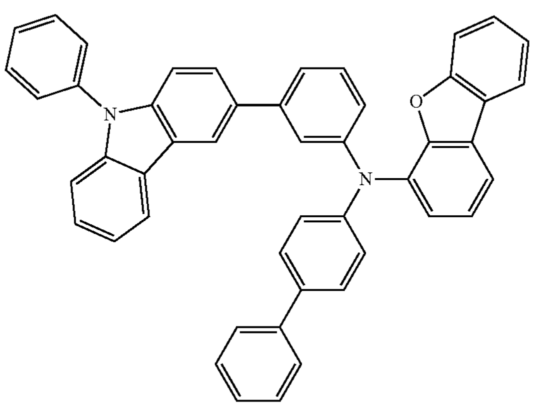
2-92
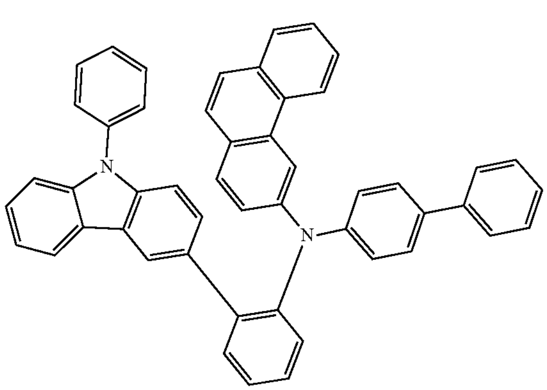
-continued
2-93
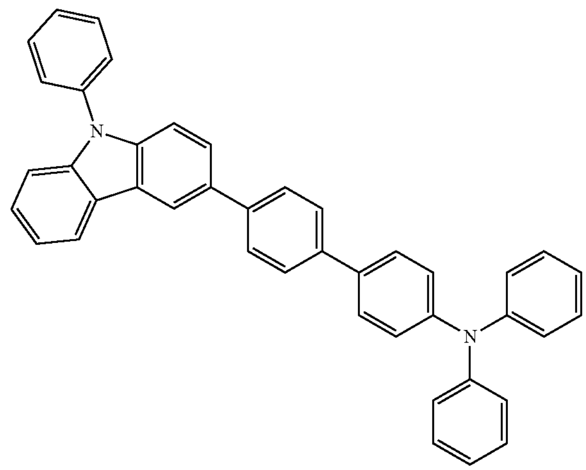
2-94
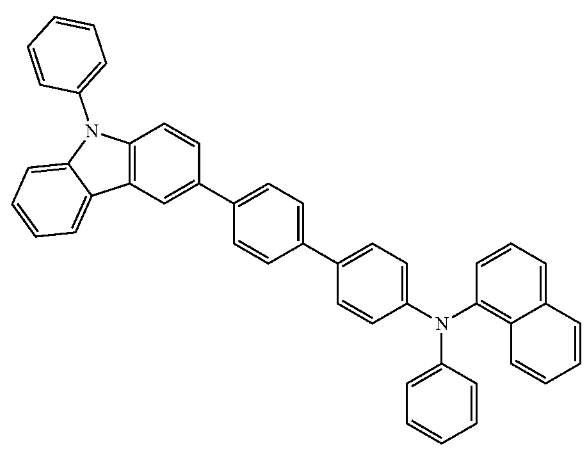
2-95
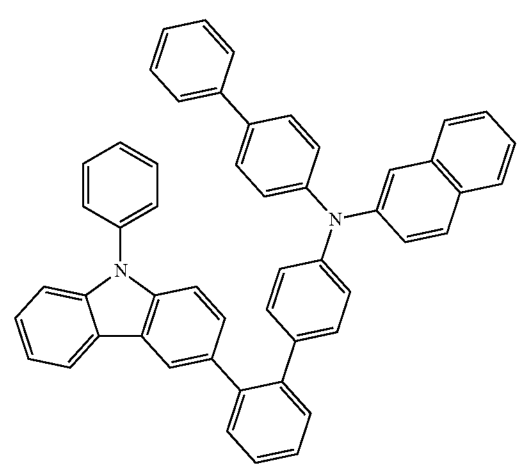

-continued
2-96
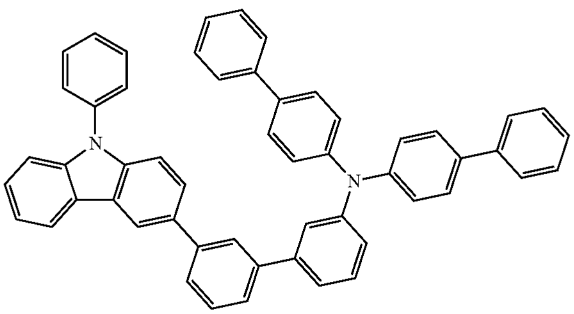
2-97
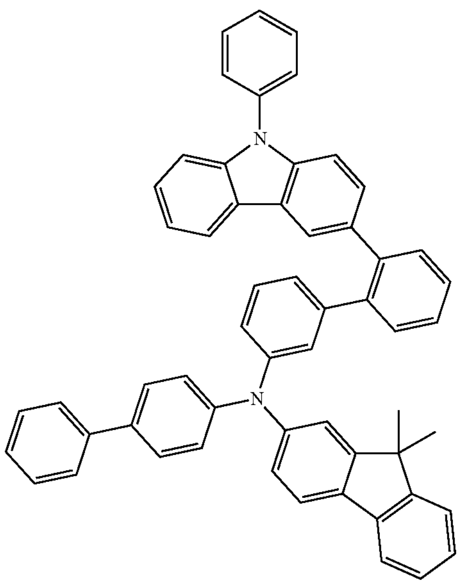
2-98
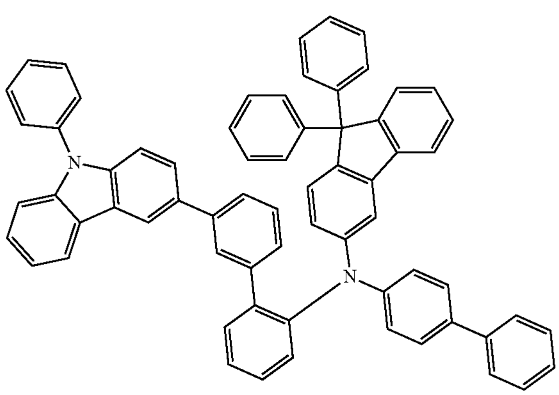
-continued
2-99
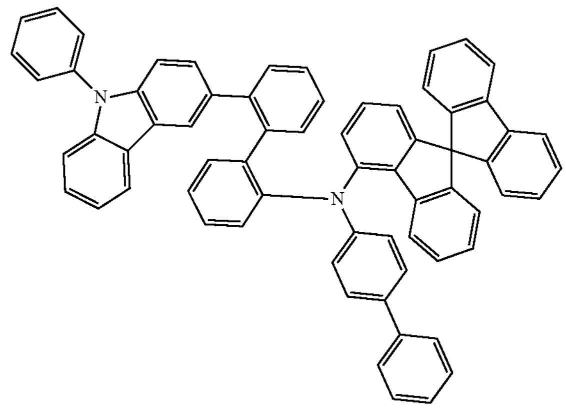
2-100
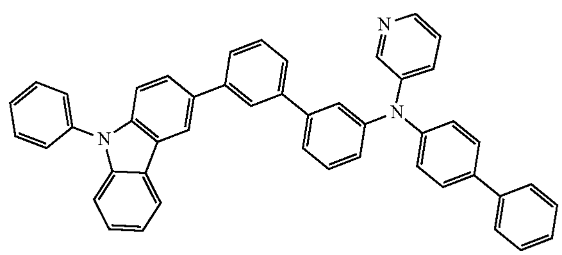
2-101
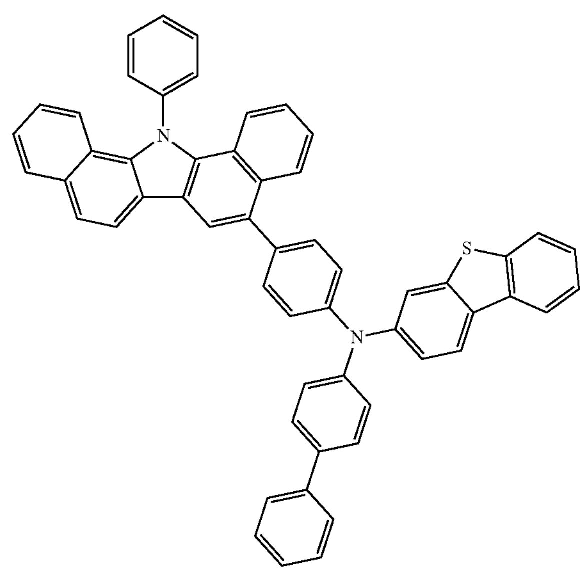

-continued
2-102
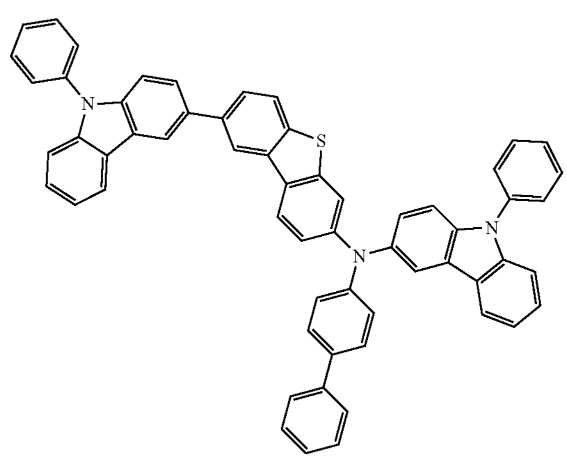
2-103
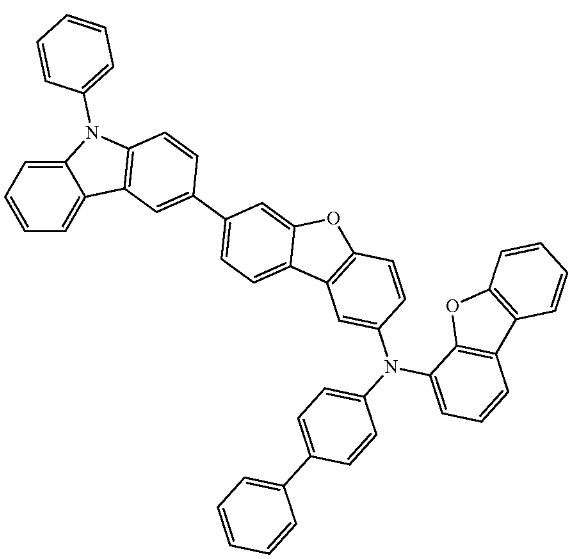
2-104
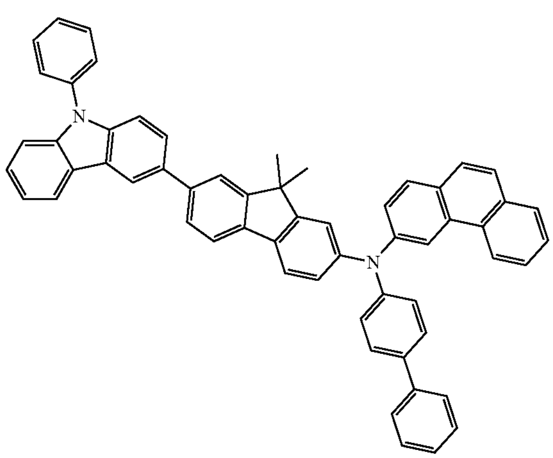
-continued
2-105
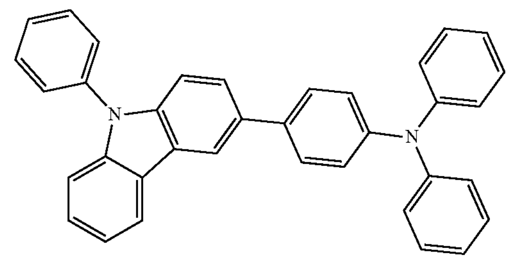
2-106
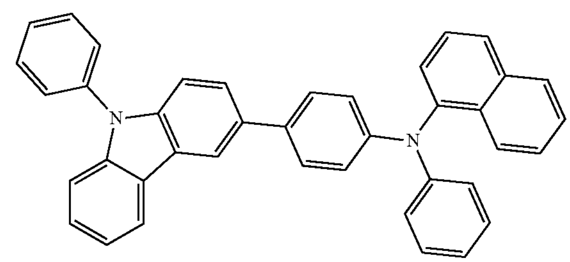
2-107
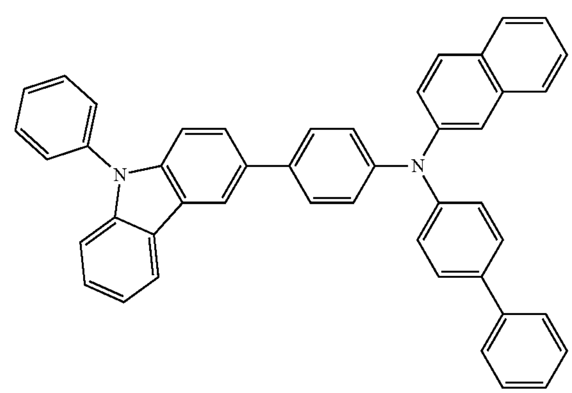
2-108
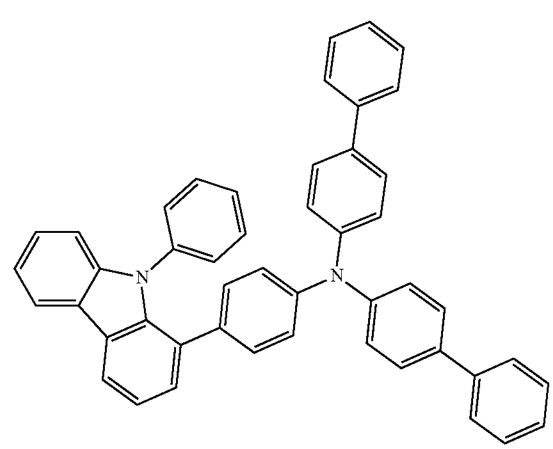

-continued
2-109
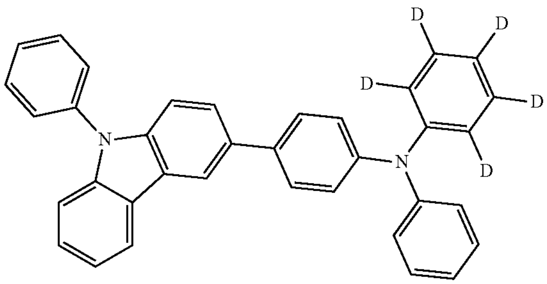
2-110
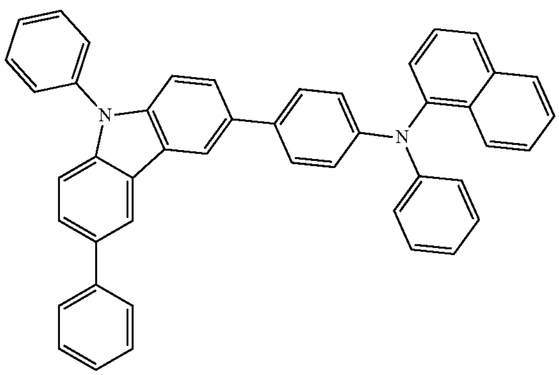
2-111
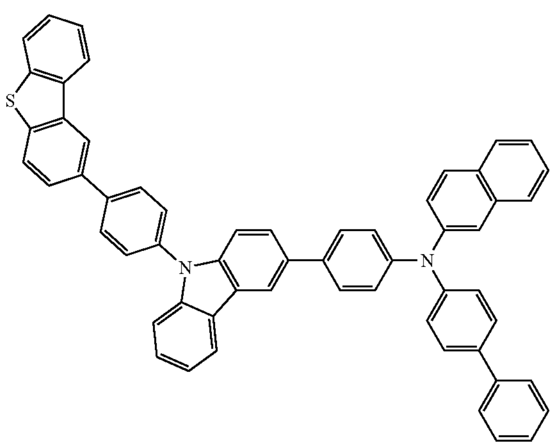
-continued
2-112
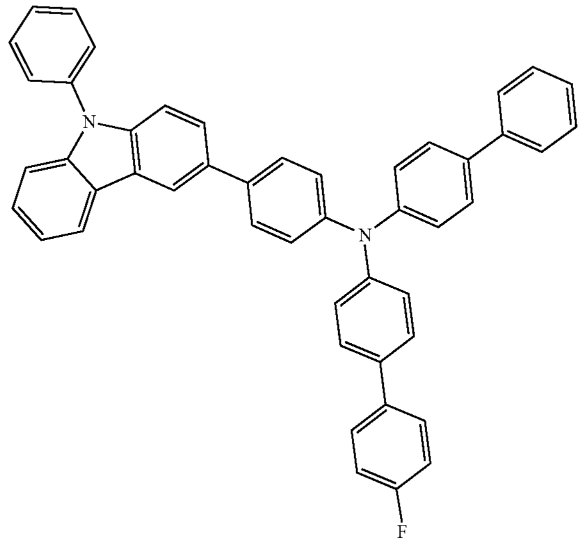
2-113
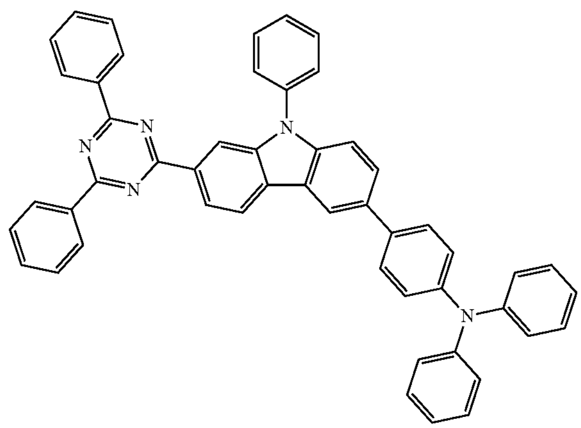
2-114
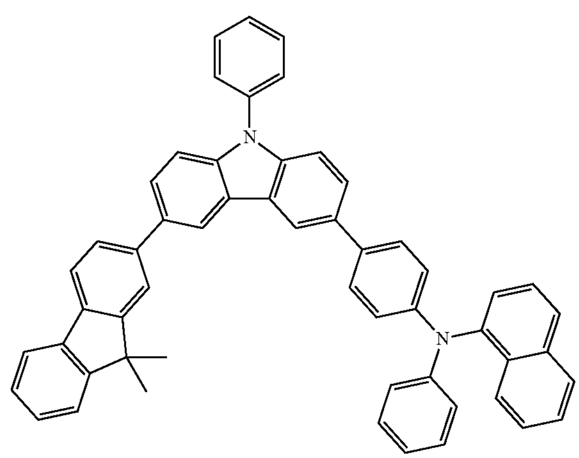

2-115
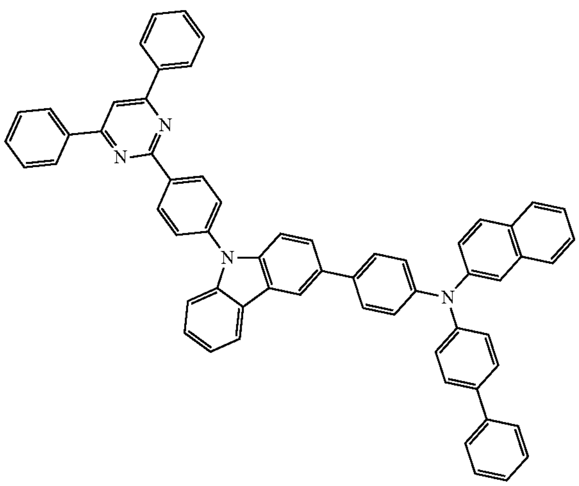
2-116
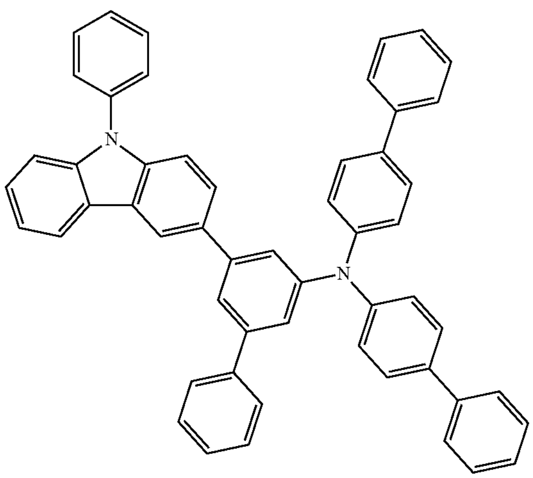
2-117
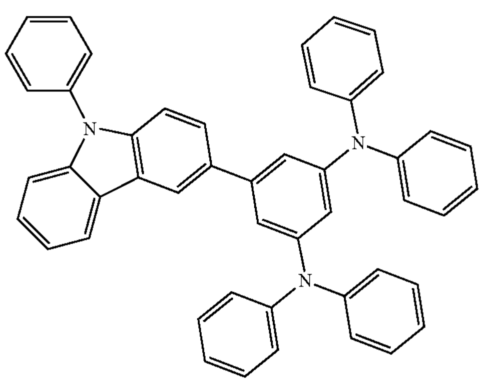
2-118
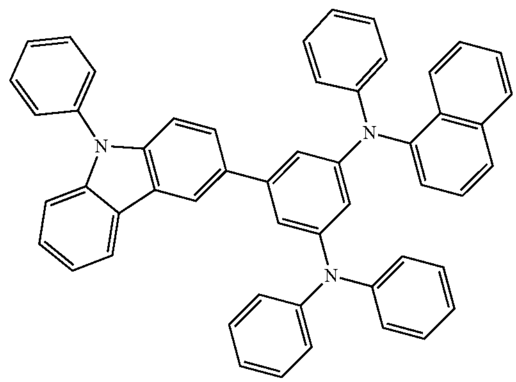
2-119
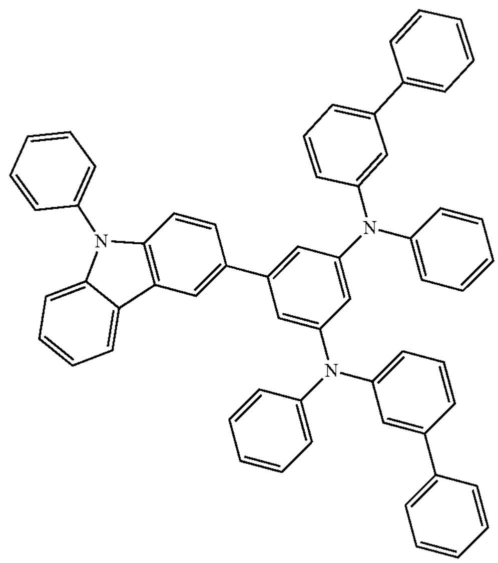
2-120
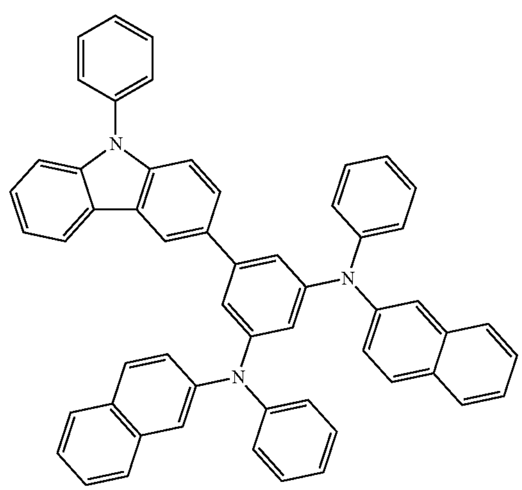

-continued
2-121
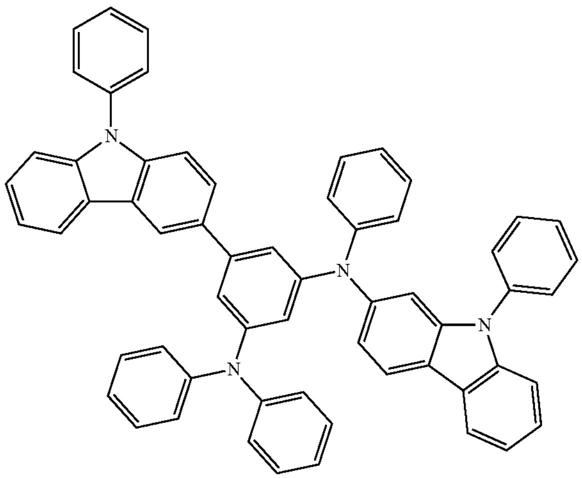
2-122
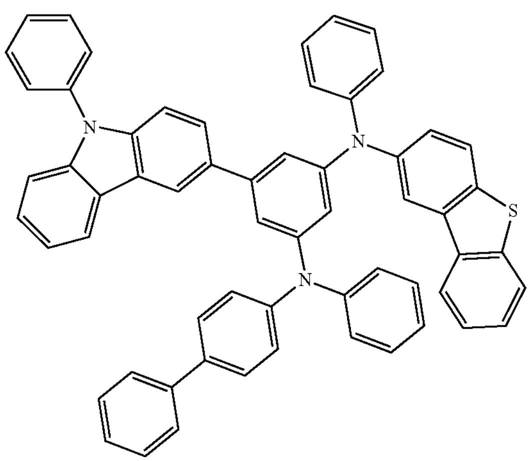
2-123
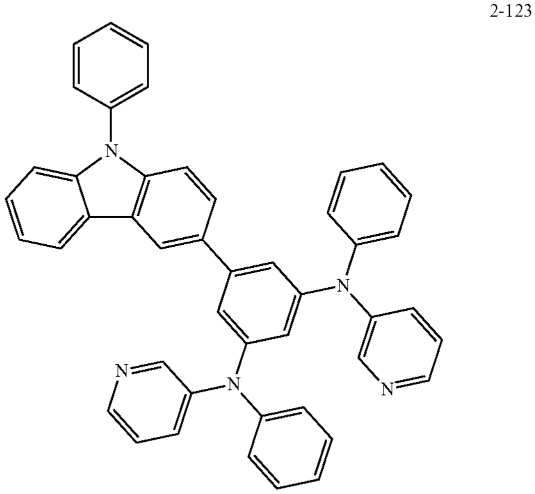
-continued
2-124
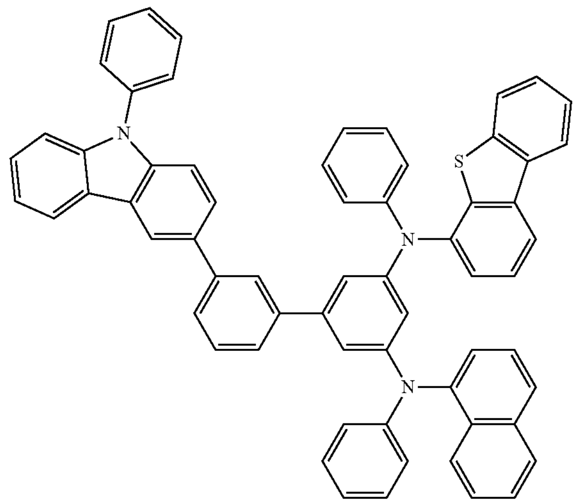
2-125
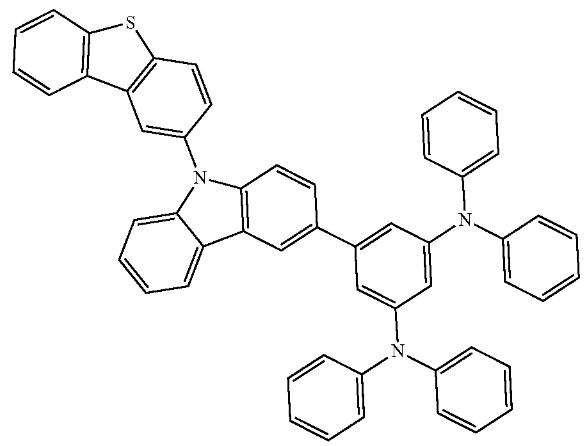
2-126
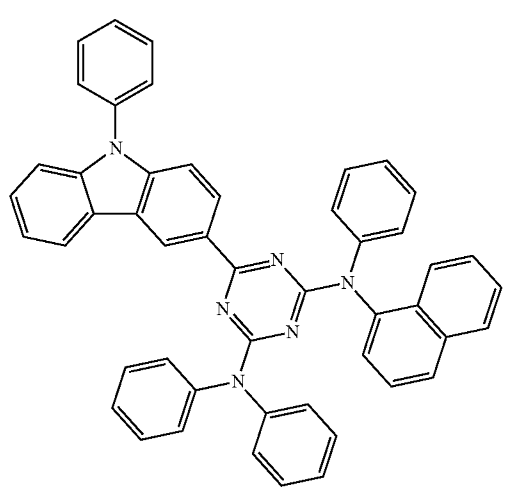

-continued
2-127
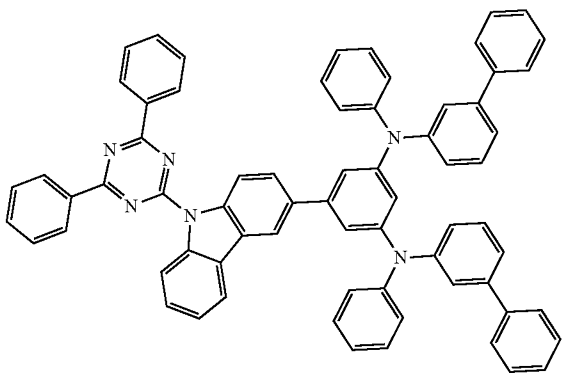
2-128
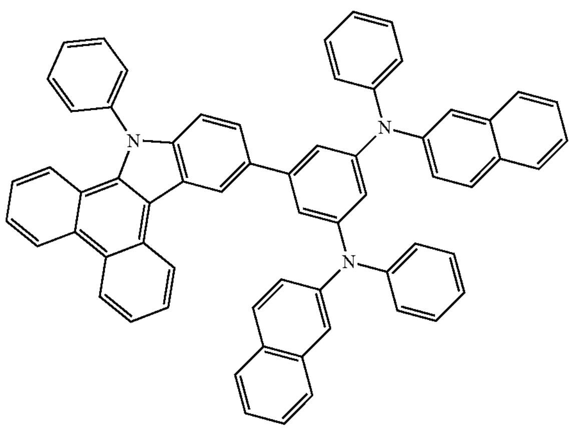
2-129
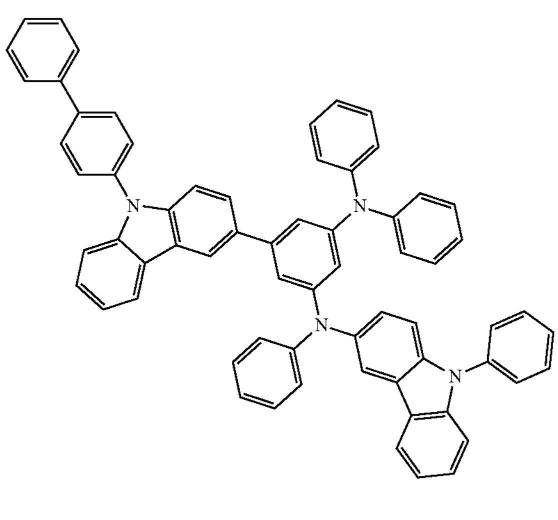
-continued
2-130
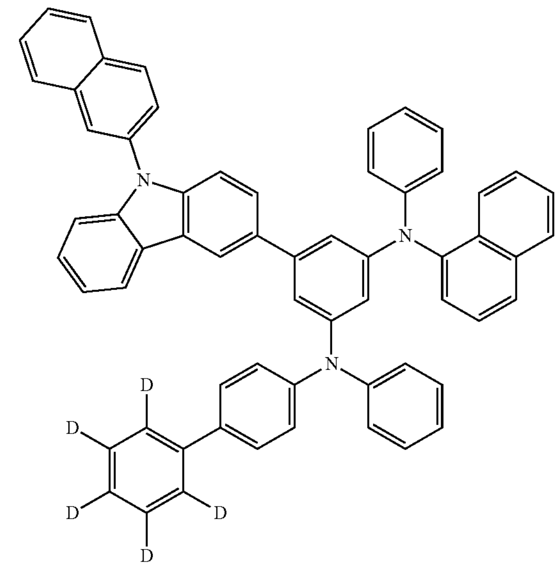
2-131
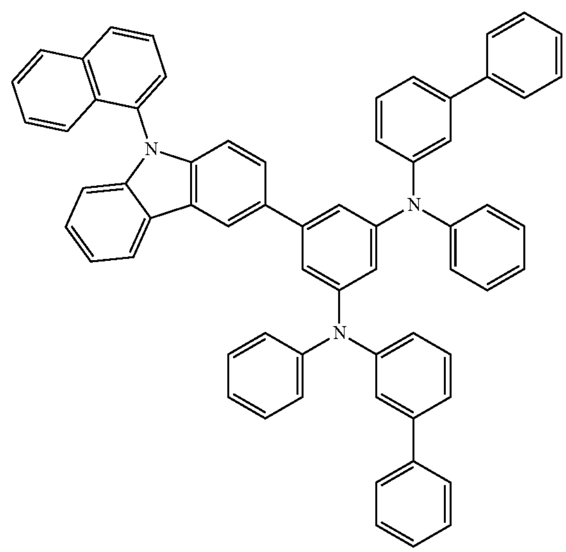
2-132
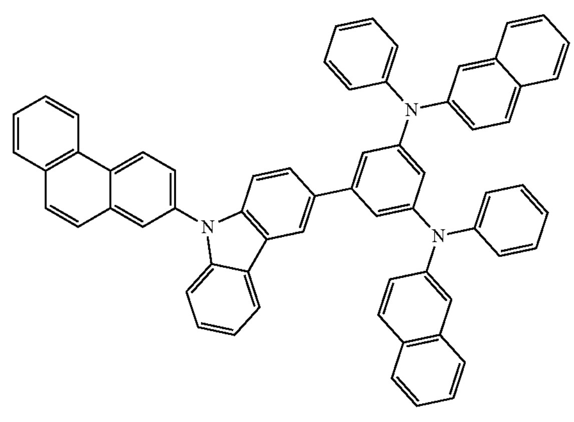

-continued 2-133

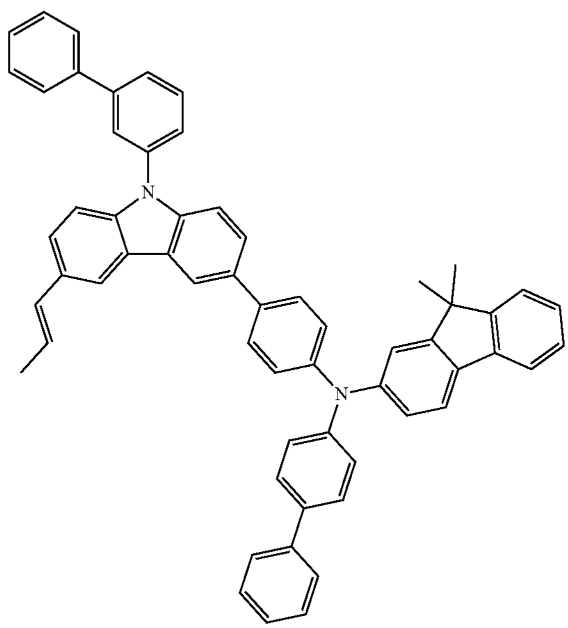

2-134

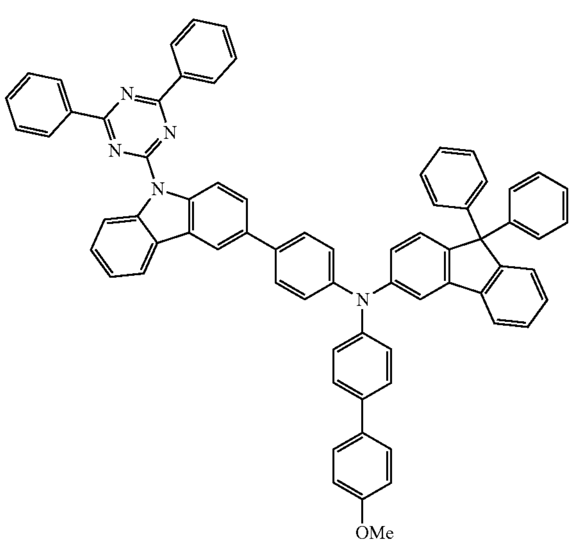

-continued 2-135

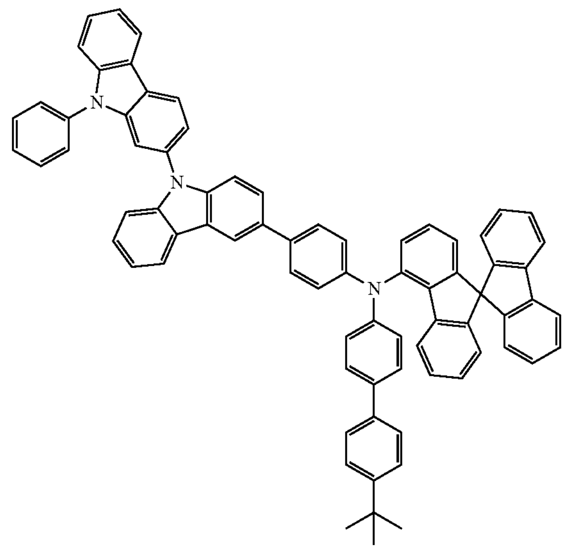

2-136

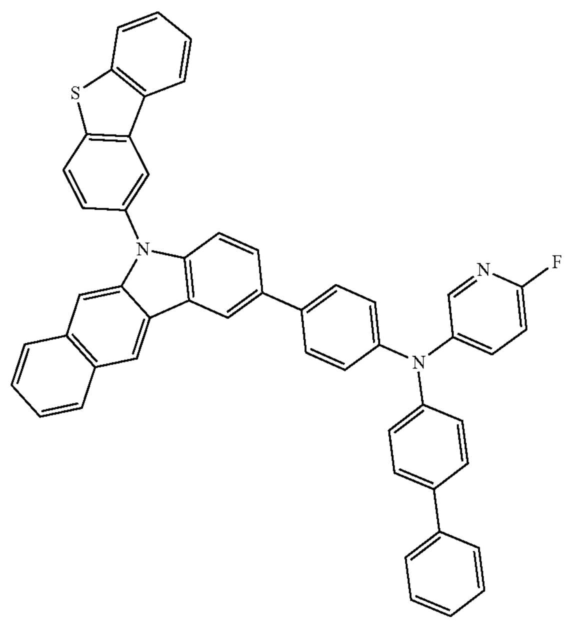

Hereinafter, examples for synthesizing the compounds represented by Formulas 1 and 2 according to the present invention and examples for preparing an organic electric element according to the present invention will be described in detail with reference to examples, but the present invention is not limited to the following examples.

[Synthesis Example 1] Formula 1

The compound represented by Formula 1 according to the present invention can be synthesized by reacting Sub 1 and Sub 2 as shown in Reaction Scheme 1, but there is no limitation thereto.

<Reaction Scheme 1>
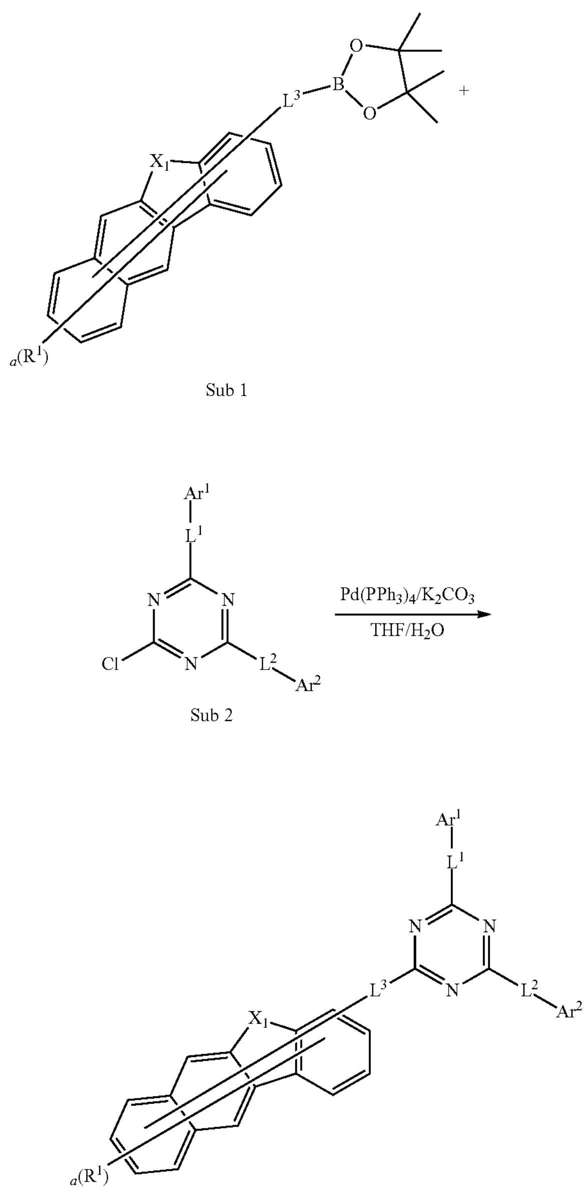
Compounds belong to Sub 1 of Reaction Scheme 1 are as follows, but are not limited thereto.
Sub 1-1
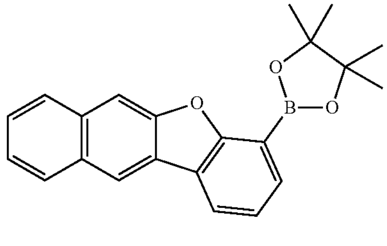
-continued
Sub 1-2
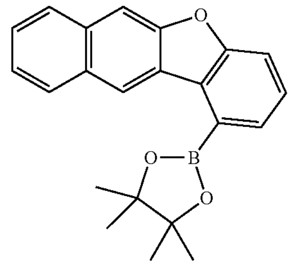
Sub 1-3
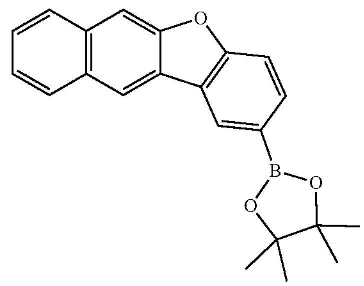
Sub 1-4
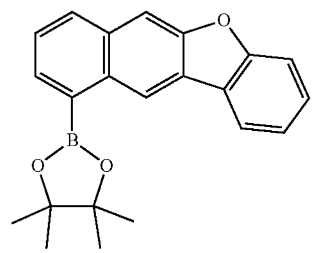
Sub 1-5
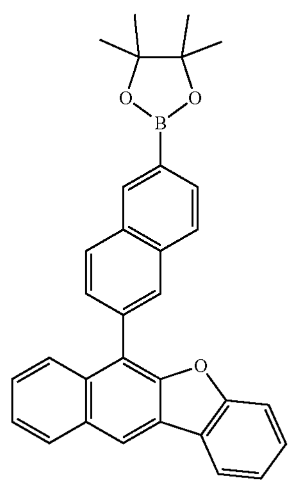
Sub 1-6
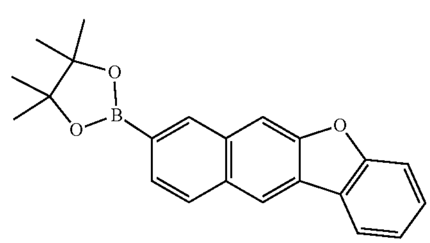

Sub 1-7
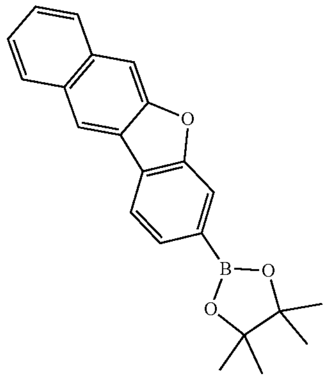
Sub 1-8
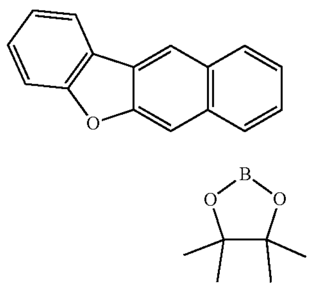
Sub 1-9
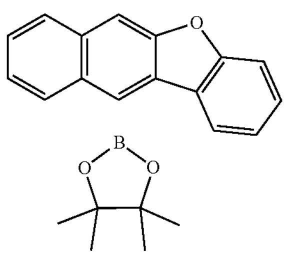
Sub 1-10
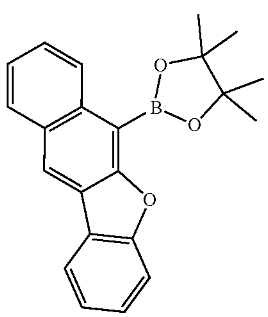
Sub 1-11
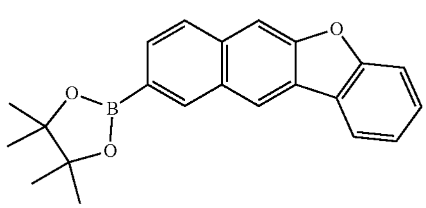
Sub 1-12
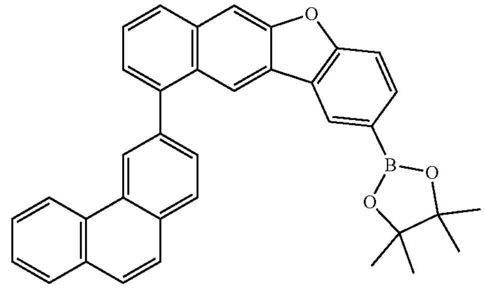
Sub 1-13
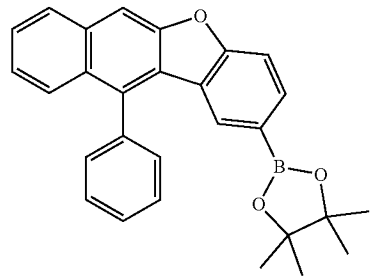
Sub 1-14
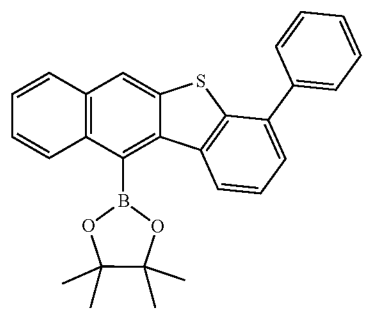
Sub 1-15
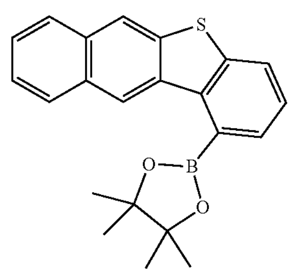
Sub 1-16
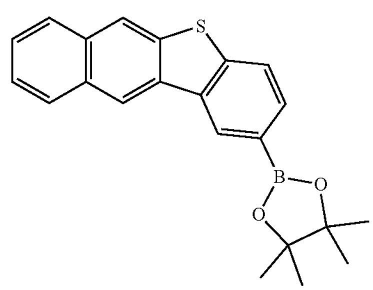

Sub 1-17
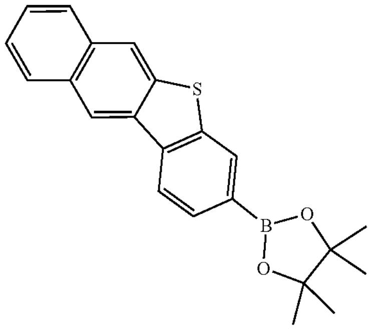
Sub 1-18
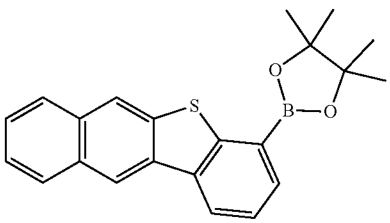
Sub 1-19
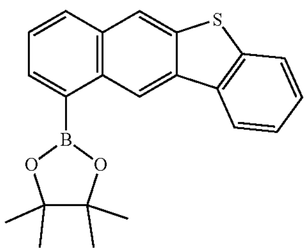
Sub 1-20
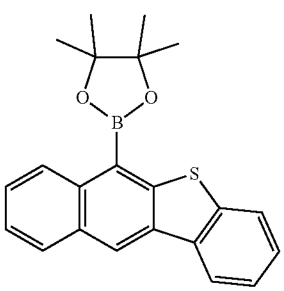
Sub 1-21
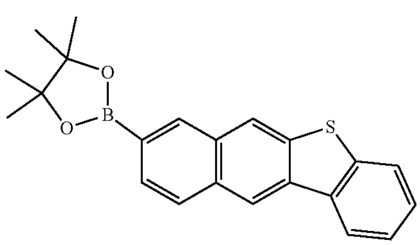
Sub 1-22
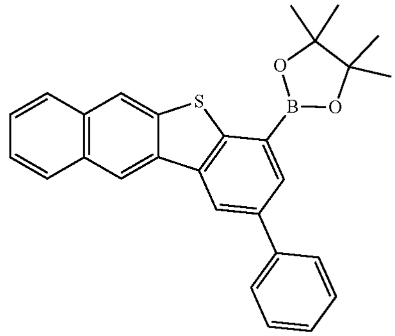
Sub 1-23
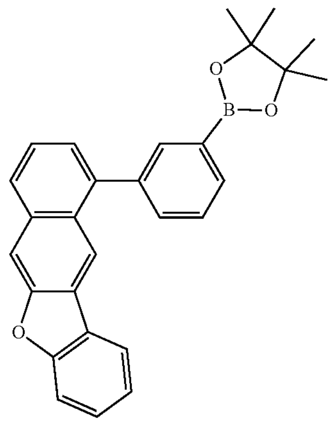
Sub 1-24
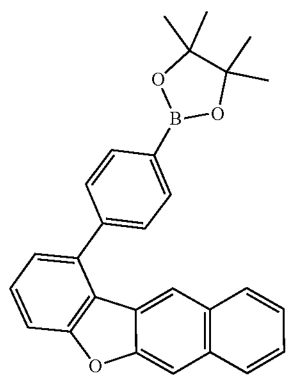
Sub 1-25
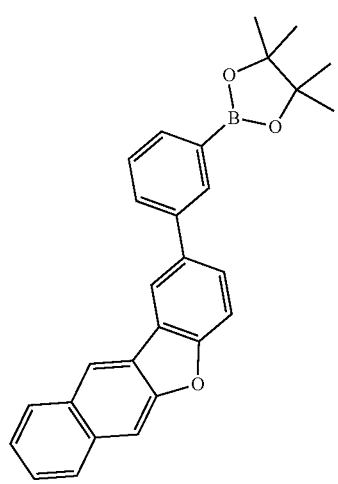

Sub 1-26
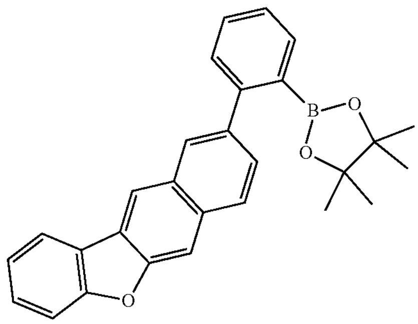
Sub 1-27
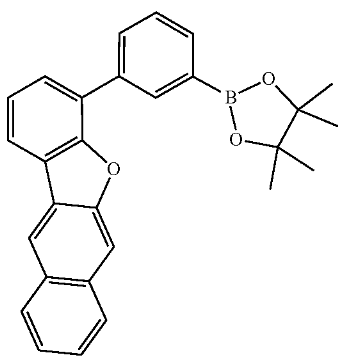
Sub 1-28
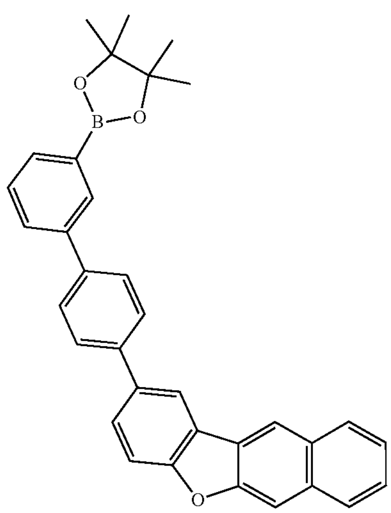
Sub 1-29
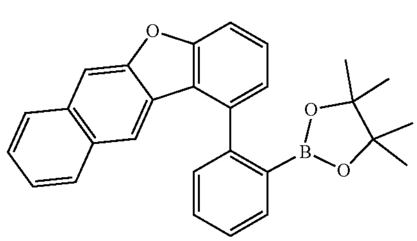
Sub 1-30
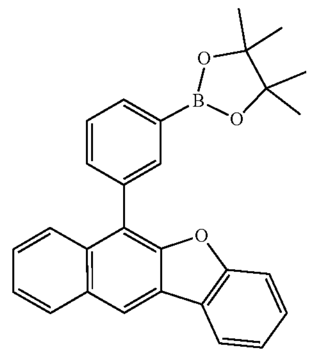
Sub 1-31
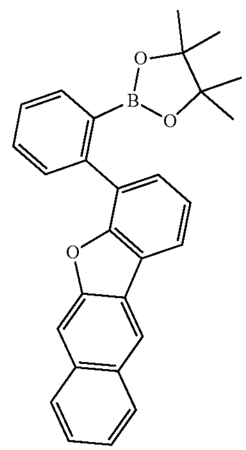
Sub 1-32
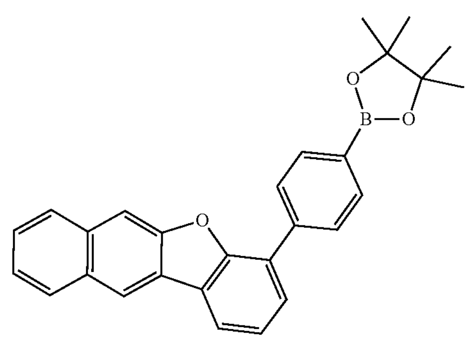
Sub 1-33
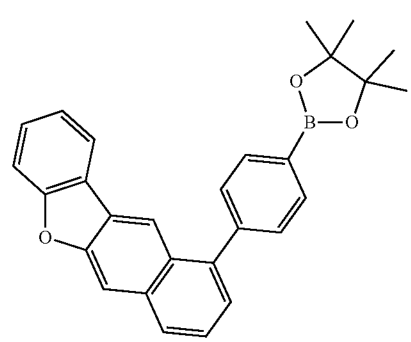

-continued
Sub 1-34
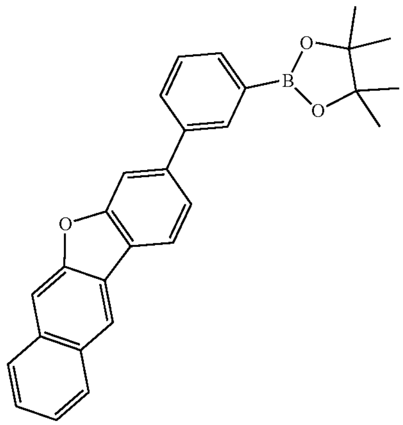
Sub 1-35
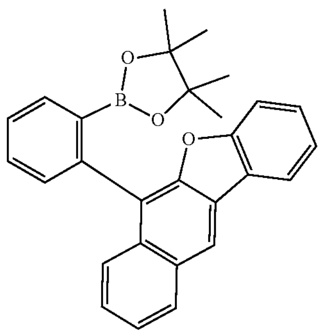
Sub 1-36
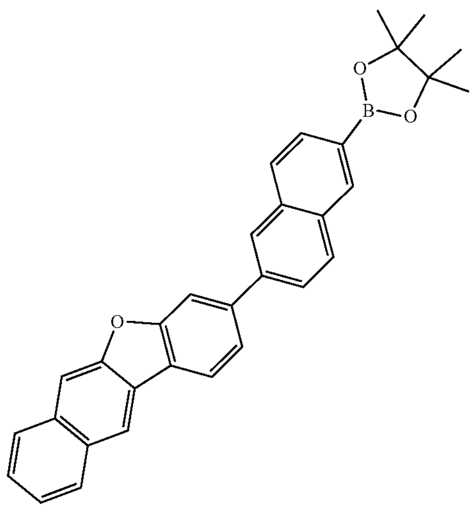
Sub 1-37
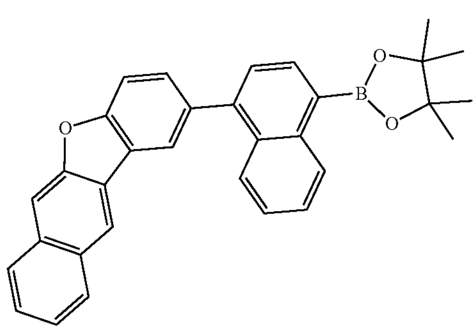
-continued
Sub 1-38
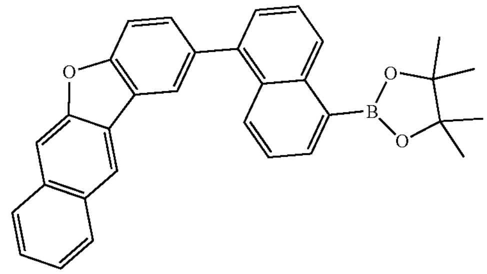
Sub 1-39
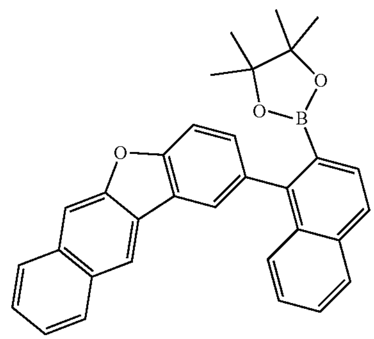
Sub 1-40
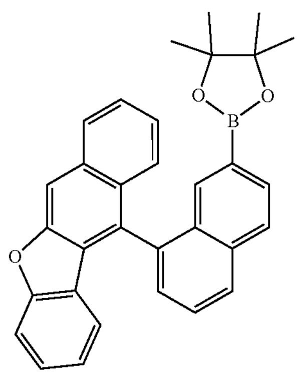
Sub 1-41
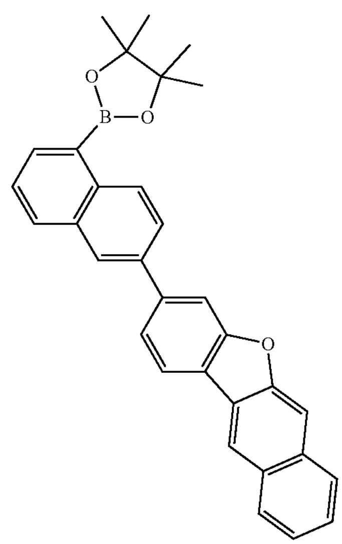

-continued
Sub 1-42
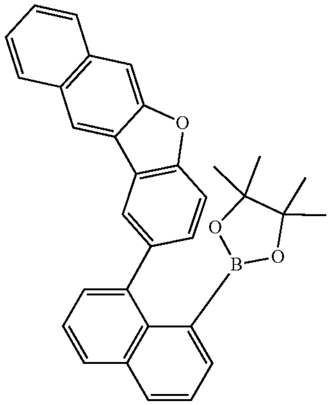
Sub 1-43
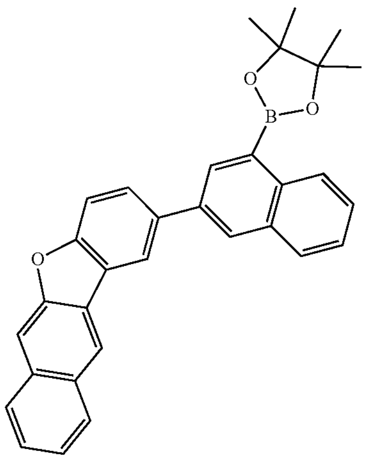
Sub 1-44
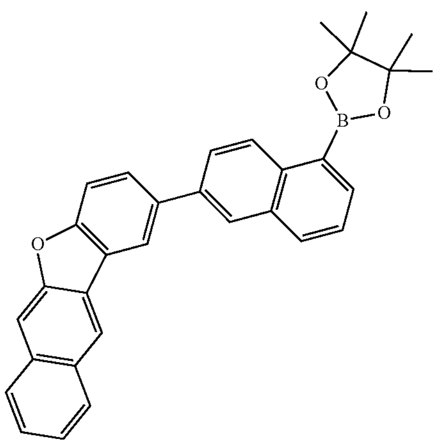
Sub 1-45
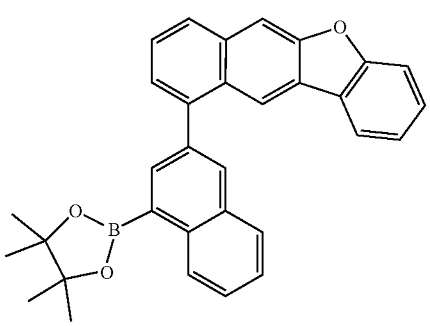
-continued
Sub 1-46
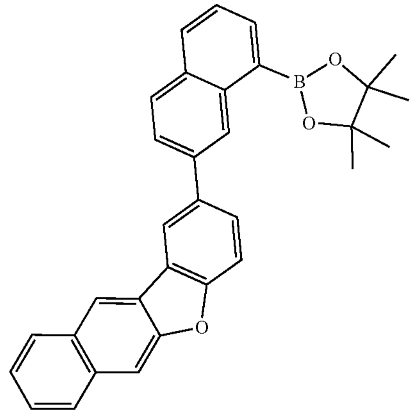
Sub 1-47
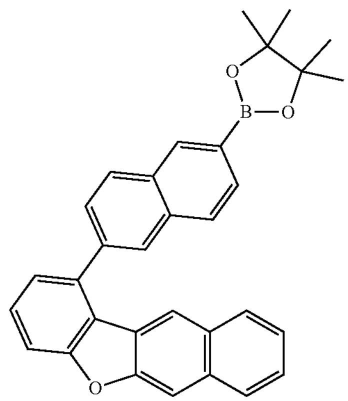
Sub 1-48
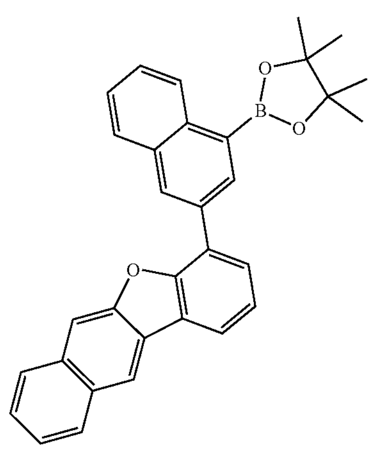

-continued
Sub 1-49
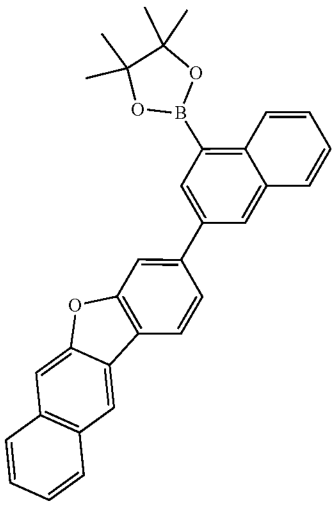
Sub 1-50
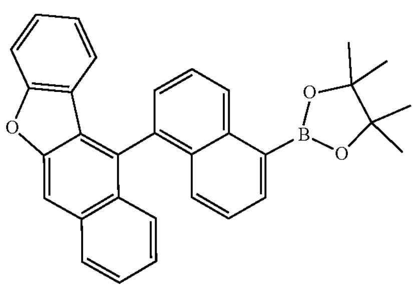
Sub 1-51
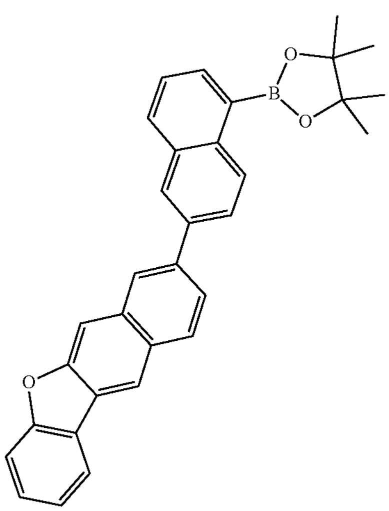
-continued
Sub 1-52
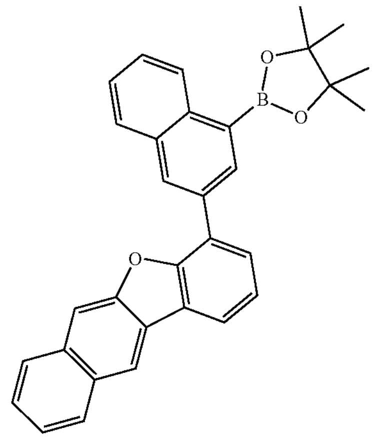
Sub 1-53
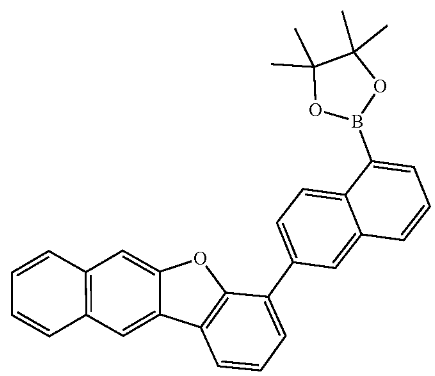
Sub 1-54
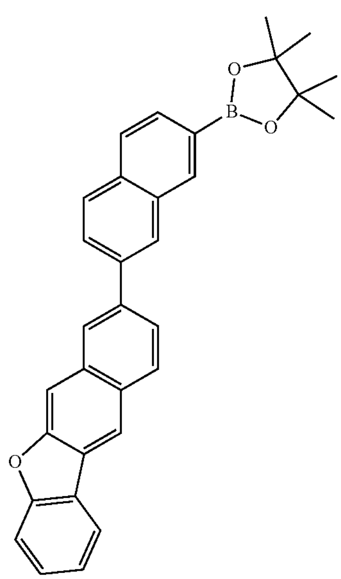

Sub 1-55
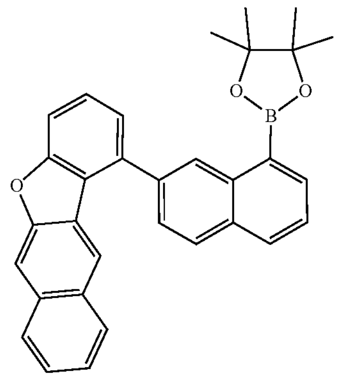
Sub 1-56
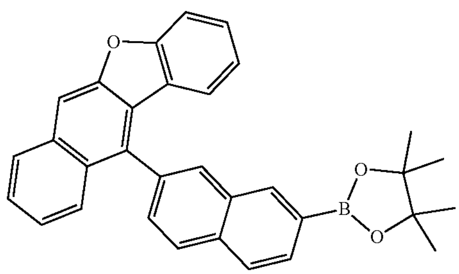
Sub 1-57
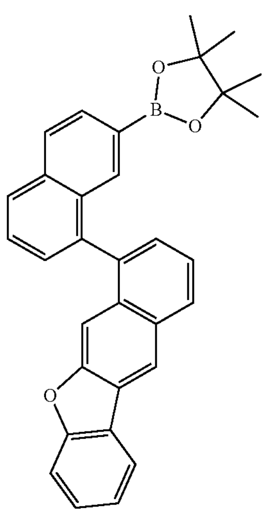
Sub 1-58
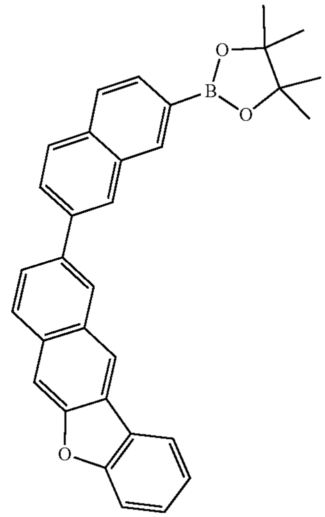
Sub 1-59
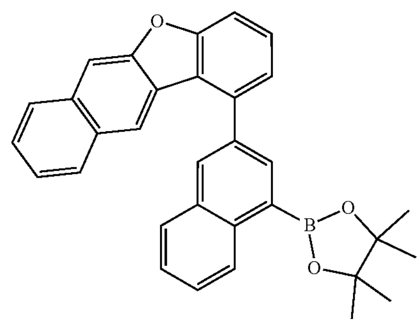
Sub 1-60
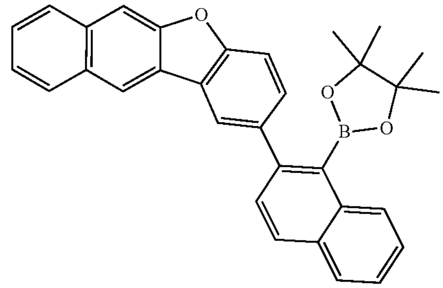

Sub 1-61
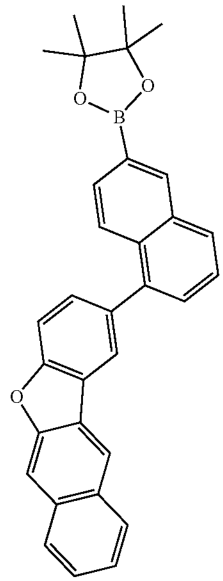
Sub 1-62
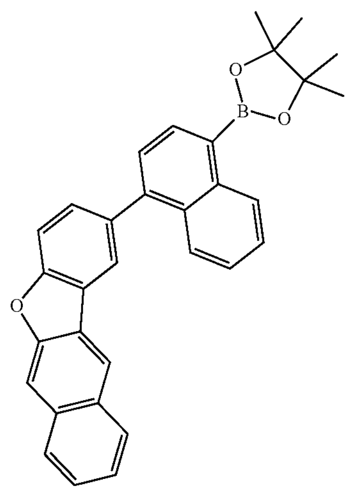
Sub 1-63
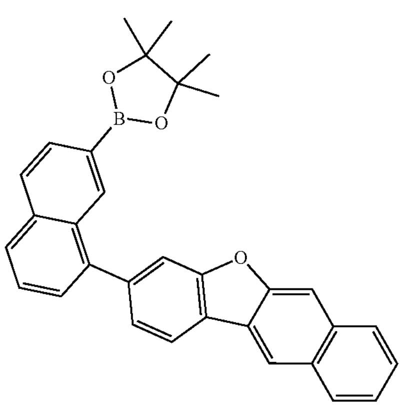
Sub 1-64
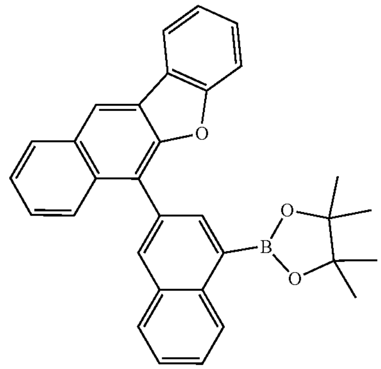
Sub 1-65
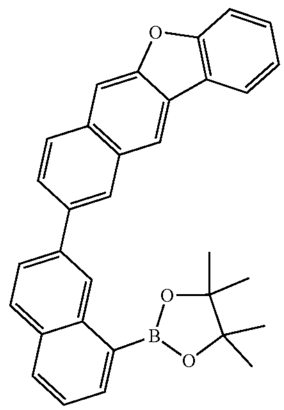
Sub 1-66
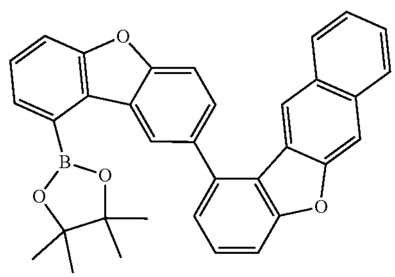
Sub 1-67
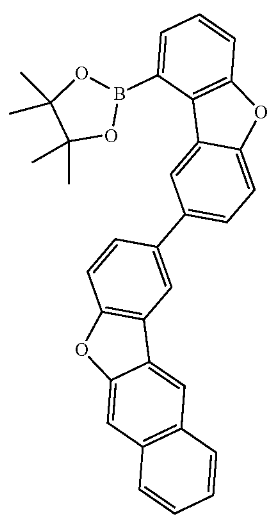

-continued
Sub 1-68
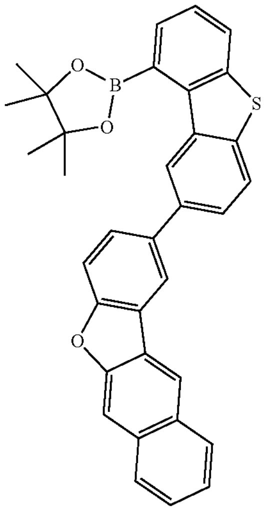
Sub 1-69
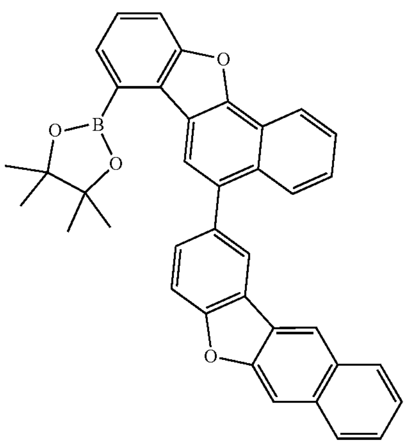
Sub 1-70
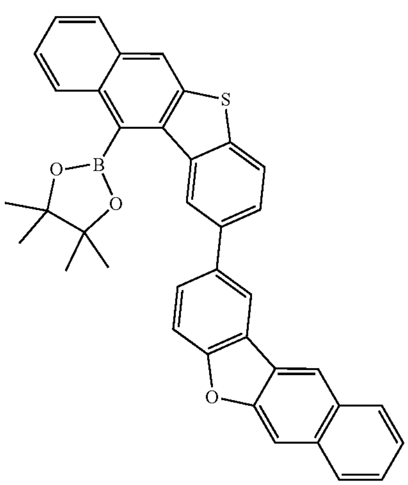
-continued
Sub 1-71
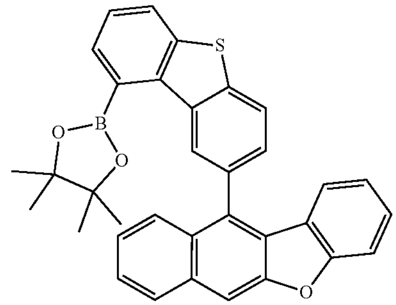
Sub 1-72
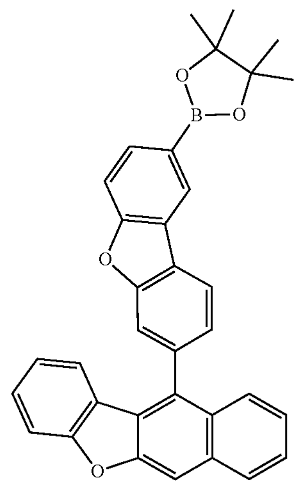
Sub 1-73
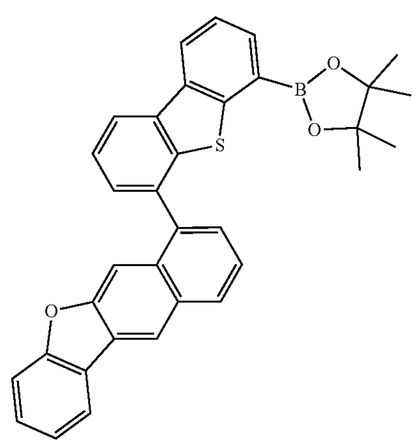

-continued
Sub 1-74
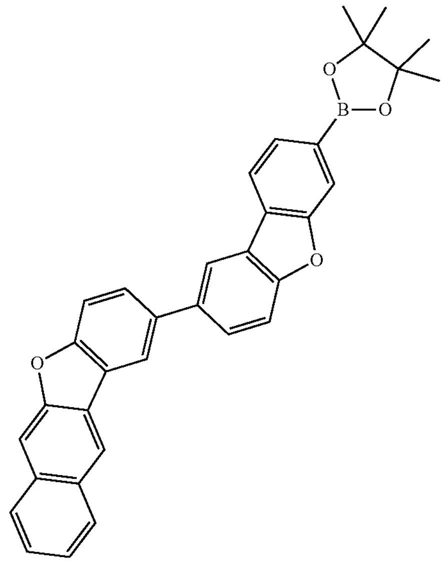
Sub 1-75
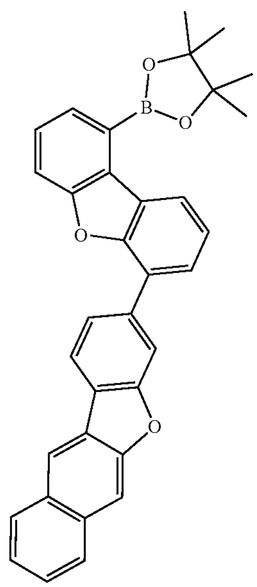
Sub 1-76
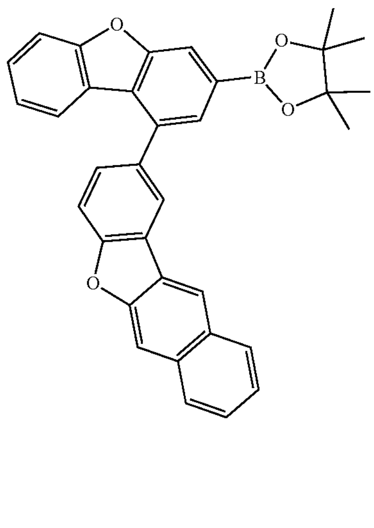
-continued
Sub 1-77
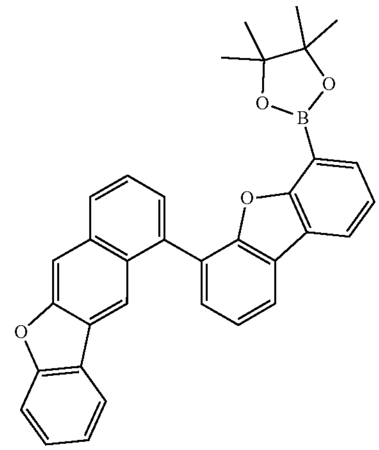
Sub 1-78
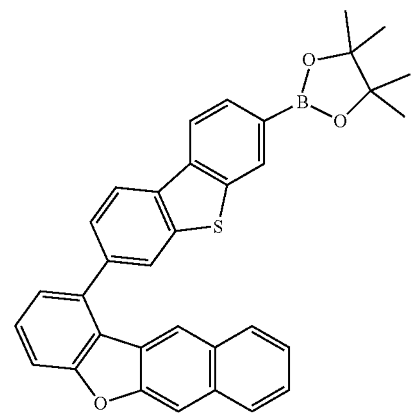
Sub 1-79
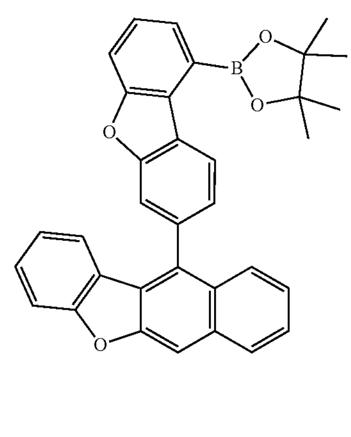

-continued
Sub 1-80
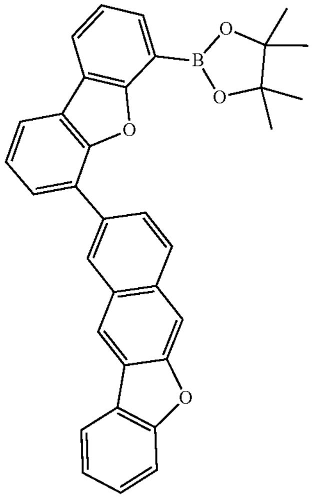
Sub 1-81
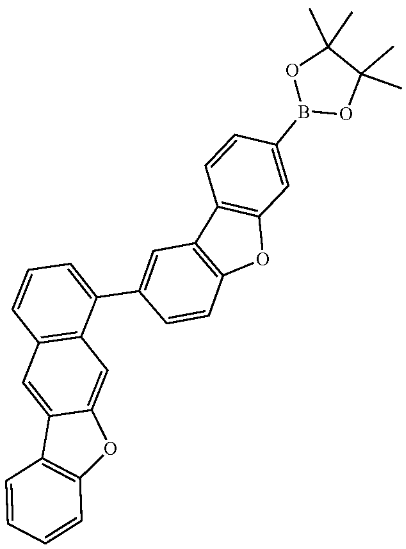
Sub 1-82
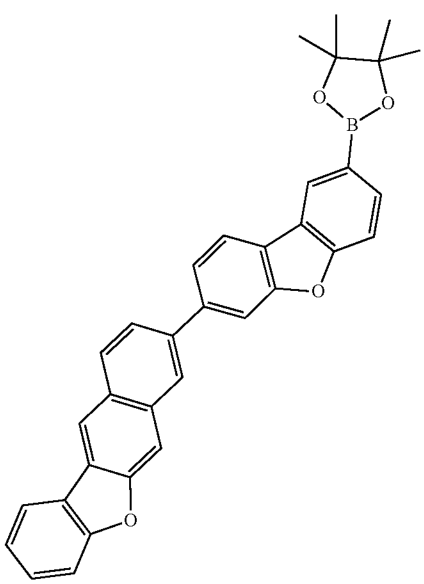
-continued
Sub 1-83
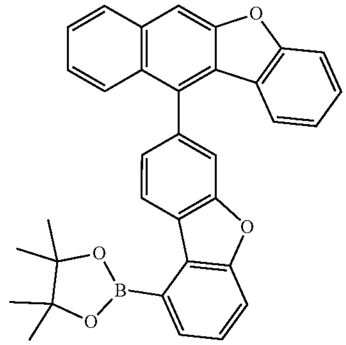
Sub 1-84
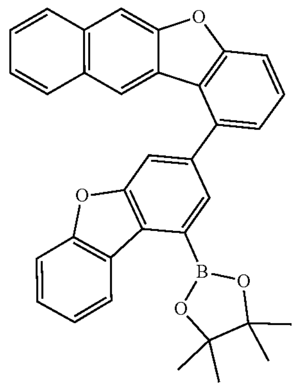
Sub 1-85
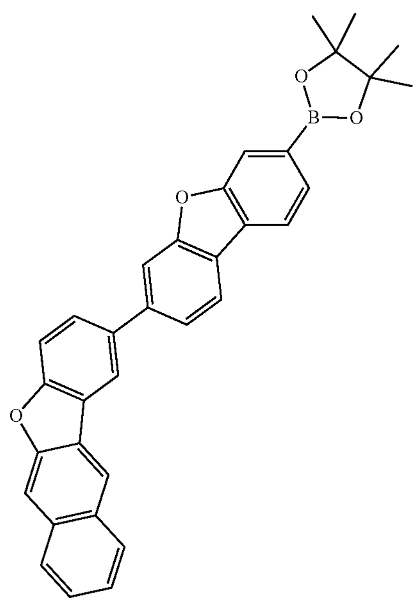

-continued
Sub 1-86
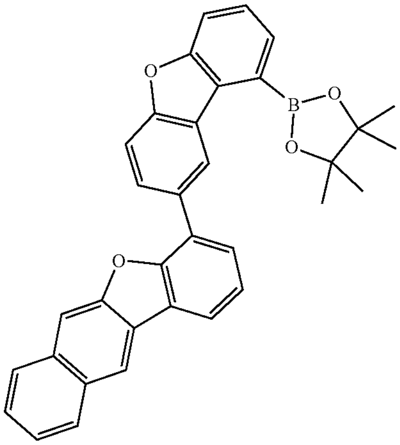
Sub 1-87
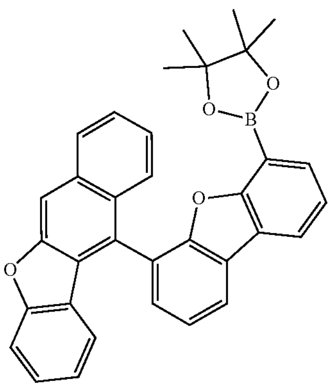
Sub 1-88
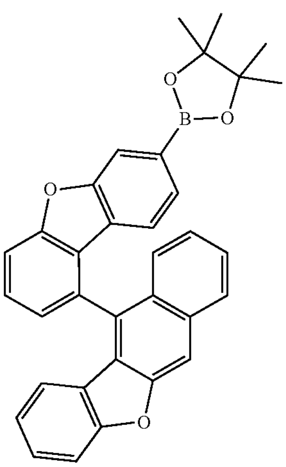
-continued
Sub 1-89
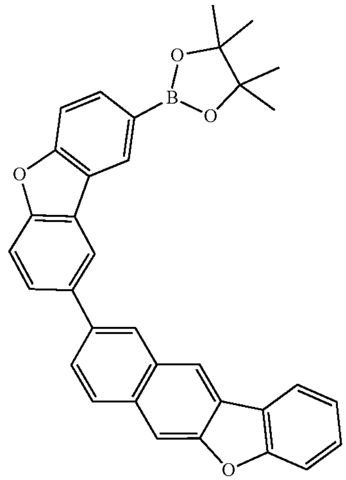
Sub 1-90
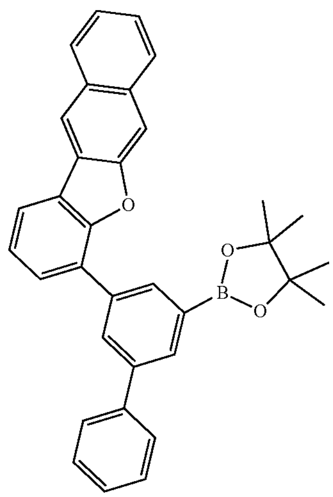
Sub 1-91
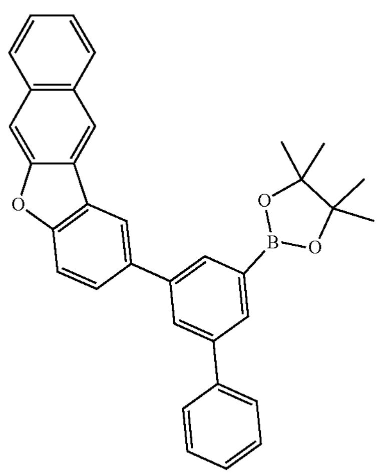

-continued
Sub 1-92
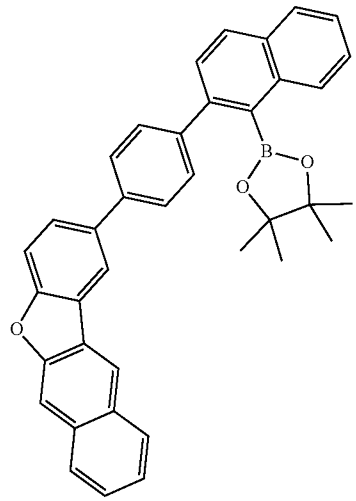
Sub 1-93
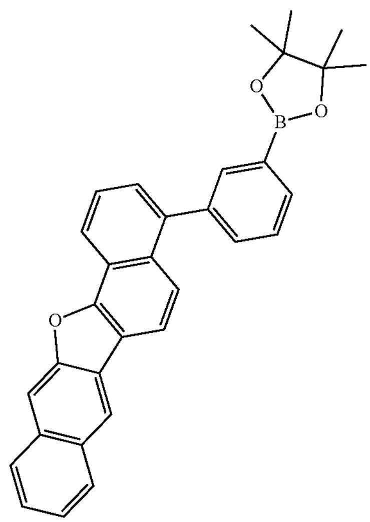
Sub 1-94
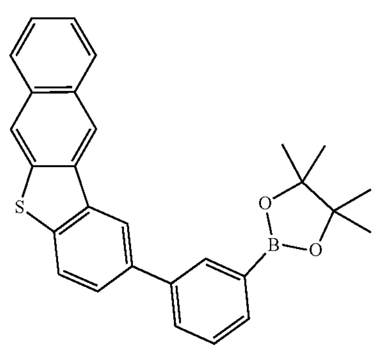
Sub 1-95
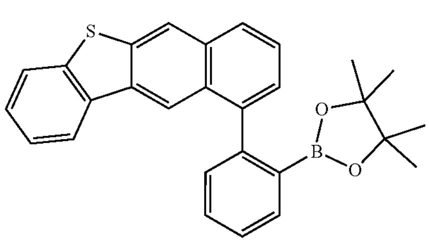
-continued
Sub 1-96
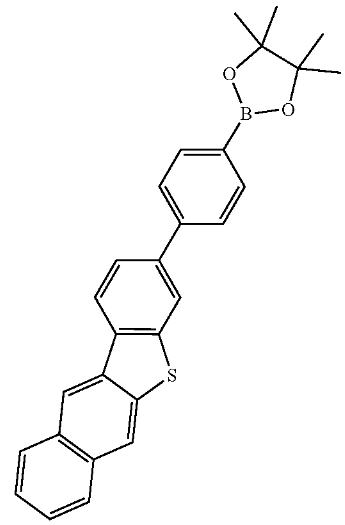
Sub 1-97
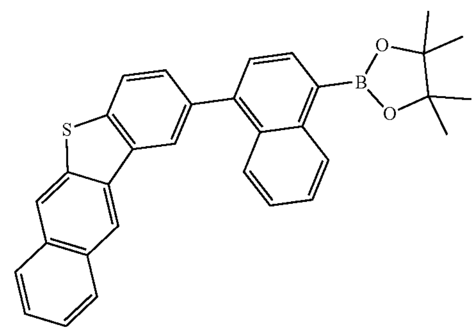
Sub 1-98
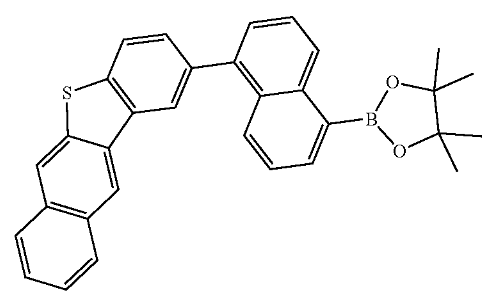
Sub 1-99
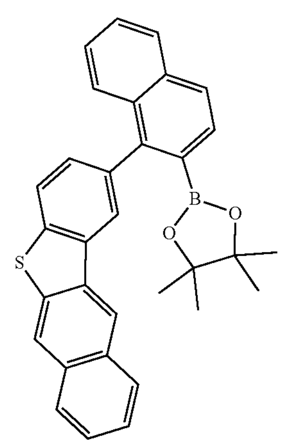

-continued
Sub 1-100
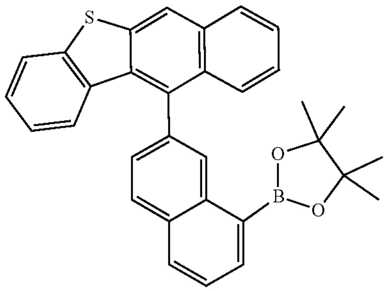
Sub 1-101
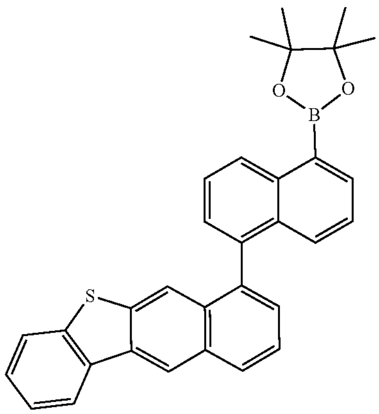
Sub 1-102
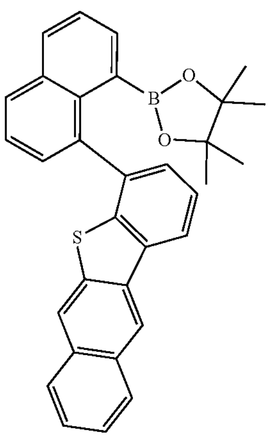
Sub 1-103
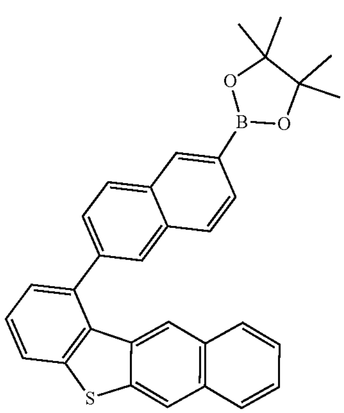
-continued
Sub 1-104
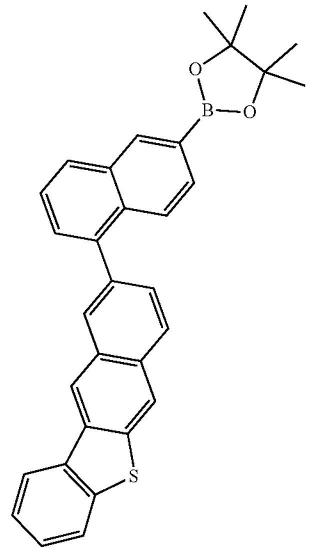
Sub 1-105
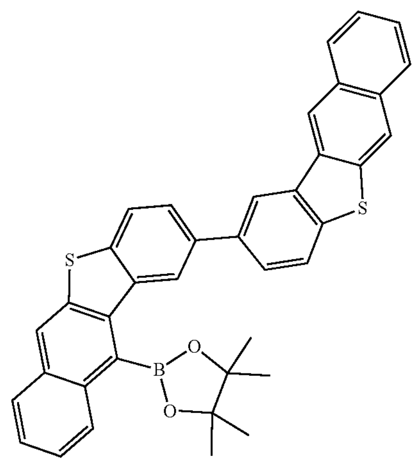
Sub 1-106
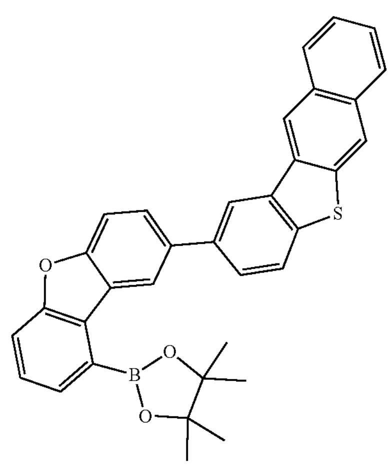

-continued
Sub 1-107
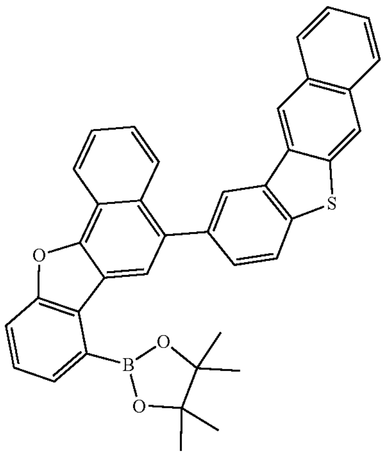
Sub 1-108
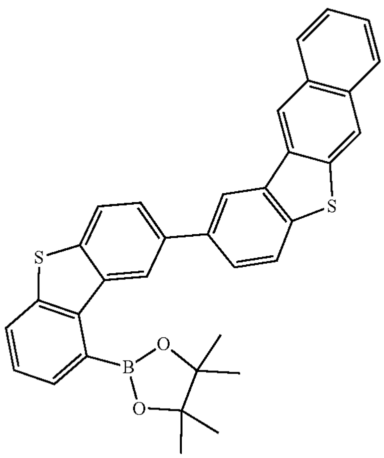
Sub 1-109
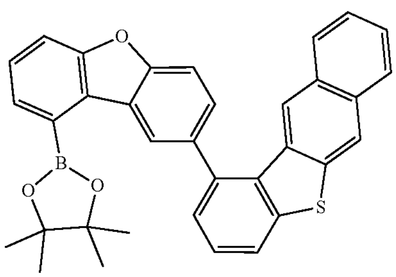
Sub 1-110
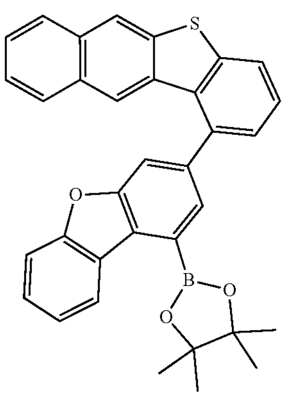
-continued
Sub 1-111
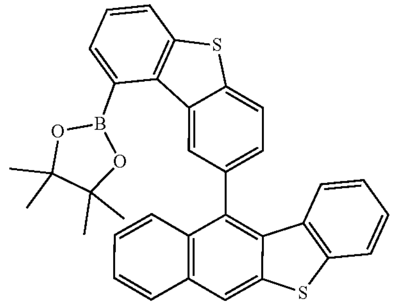
Sub 1-112
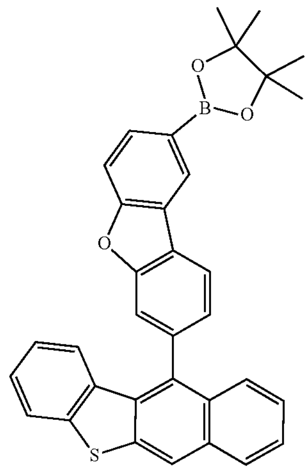
Sub 1-113
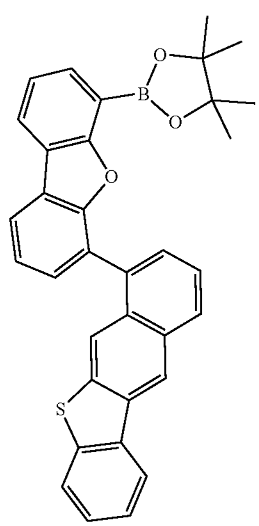

Sub 1-114
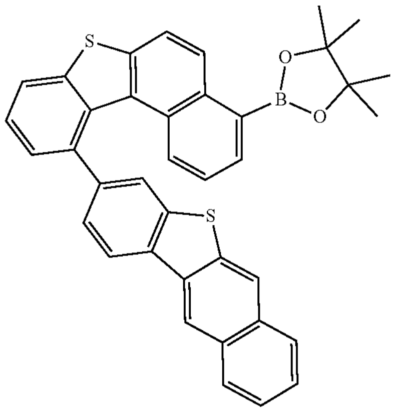
Sub 1-115
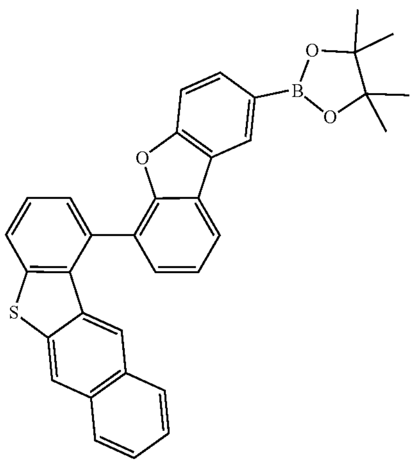
Sub 1-116
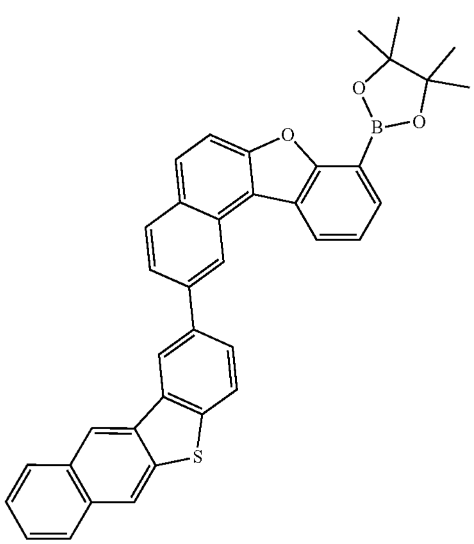
Sub 1-117
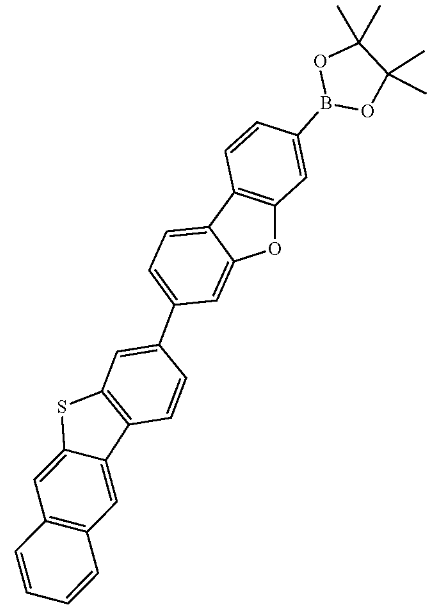
Sub 1-118
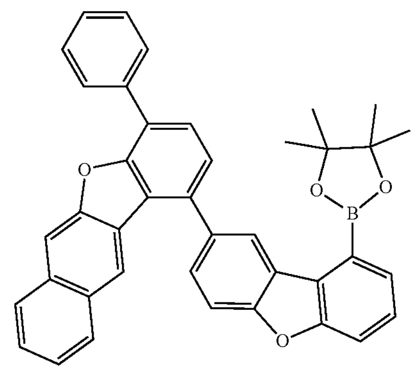
Sub 1-119
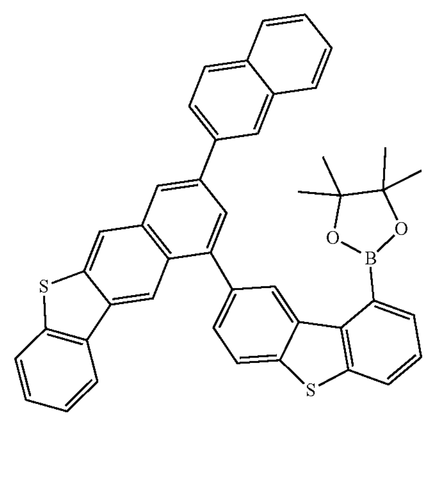

-continued

Sub 1-120

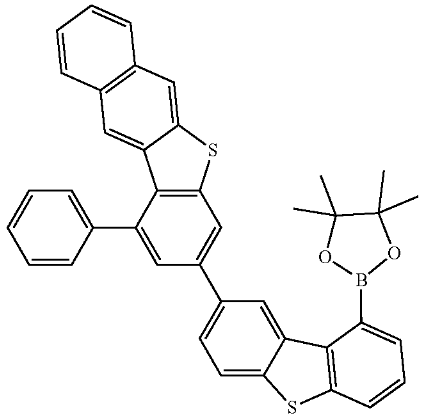

Sub 1-121

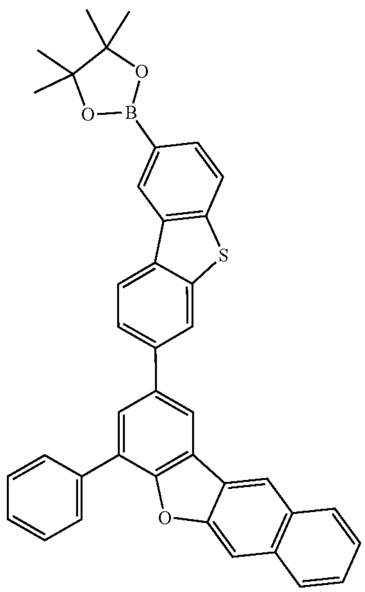

FD-MS values of compounds belong to Sub 1 are shown in Table 1 below.

TABLE 1

| Compound | FD-MS | Compound | FD-MS |
|---|---|---|---|
| Sub 1-1 | m/z = 344.16($C_{22}H_{21}BO_3$ = 344.22) | Sub 1-2 | m/z = 344.16($C_{22}H_{21}BO_3$ = 344.22) |
| Sub 1-3 | m/z = 344.16($C_{22}H_{21}BO_3$ = 344.22) | Sub 1-4 | m/z = 344.16($C_{22}H_{21}BO_3$ = 344.22) |
| Sub 1-5 | m/z = 470.21($C_{32}H_{27}BO_3$ = 470.38) | Sub 1-6 | m/z = 344.16($C_{22}H_{21}BO_3$ = 344.22) |
| Sub 1-7 | m/z = 344.16($C_{22}H_{21}BO_3$ = 344.22) | Sub 1-8 | m/z = 344.16($C_{22}H_{21}BO_3$ = 344.22) |
| Sub 1-9 | m/z = 344.16($C_{22}H_{21}BO_3$ = 344.22) | Sub 1-10 | m/z = 344.16($C_{22}H_{21}BO_3$ = 344.22) |
| Sub 1-11 | m/z = 344.16($C_{22}H_{21}BO_3$ = 344.22) | Sub 1-12 | m/z = 520.22($C_{36}H_{29}BO_3$ = 520.44) |
| Sub 1-13 | m/z = 420.19($C_{28}H_{25}BO_3$ = 420.32) | Sub 1-14 | m/z = 436.17($C_{28}H_{25}BO_2S$ = 436.38) |
| Sub 1-15 | m/z = 360.14($C_{22}H_{21}BO_2S$ = 360.28) | Sub 1-16 | m/z = 360.14($C_{22}H_{21}BO_2S$ = 360.28) |
| Sub 1-17 | m/z = 360.14($C_{22}H_{21}BO_2S$ = 360.28) | Sub 1-18 | m/z = 360.14($C_{22}H_{21}BO_2S$ = 360.28) |
| Sub 1-28 | m/z = 496.22($C_{34}H_{29}BO_3$ = 496.41) | Sub 1-30 | m/z = 420.19($C_{28}H_{25}BO_3$ = 420.32) |
| Sub 1-36 | m/z = 470.21($C_{32}H_{27}BO_3$ = 470.38) | Sub 1-66 | m/z = 510.2($C_{34}H_{27}BO_4$ = 510.4) |
| Sub 1-68 | m/z = 526.18($C_{34}H_{27}BO_3S$ = 526.46) | Sub 1-69 | m/z = 560.22($C_{38}H_{29}BO_4$ = 560.46) |
| Sub 1-70 | m/z = 576.19($C_{38}H_{29}BO_3S$ = 576.52) | Sub 1-90 | m/z = 496.22($C_{34}H_{29}BO_3$ = 496.41) |
| Sub 1-92 | m/z = 546.24($C_{38}H_{31}BO_3$ = 546.47) | Sub 1-93 | m/z = 470.21($C_{32}H_{27}BO_3$ = 470.38) |
| Sub 1-94 | m/z = 436.17($C_{28}H_{25}BO_2S$ = 436.38) | Sub 1-97 | m/z = 486.18($C_{32}H_{27}BO_2S$ = 486.44) |
| Sub 1-105 | m/z = 592.17($C_{38}H_{29}BO_2S_2$ = 592.58) | Sub 1-106 | m/z = 526.18($C_{34}H_{27}BO_3S$ = 526.46) |
| Sub 1-107 | m/z = 576.19($C_{38}H_{29}BO_3S$ = 576.52) | Sub 1-108 | m/z = 542.15($C_{34}H_{27}BO_2S_2$ = 542.52) |
| Sub 1-118 | m/z = 586.23($C_{40}H_{31}BO_4$ = 586.49) | Sub 1-119 | m/z = 652.22($C_{44}H_{33}BO_3S$ = 652.62) |
| Sub 1-120 | m/z = 618.19($C_{40}H_{31}BO_2S_2$ = 618.62) | Sub 1-121 | m/z = 602.21($C_{40}H_{31}BO_3S$ = 602.56) |

Compounds belong to Sub 2 of Reaction Scheme 1 are as follows, but are not limited thereto.

Sub2-1

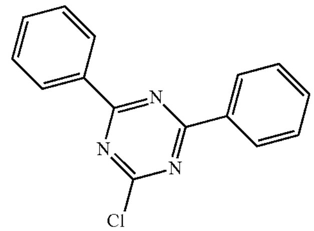

Sub2-2

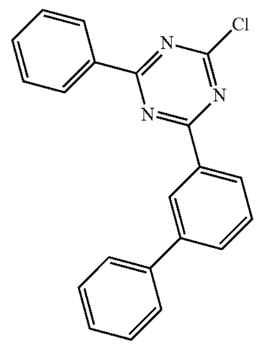

Sub2-3

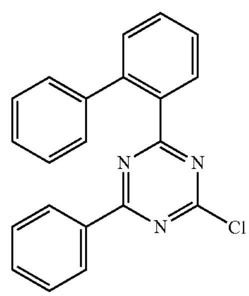

-continued
Sub2-4
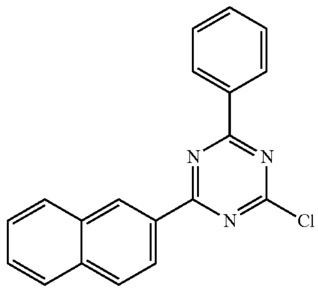
Sub2-5
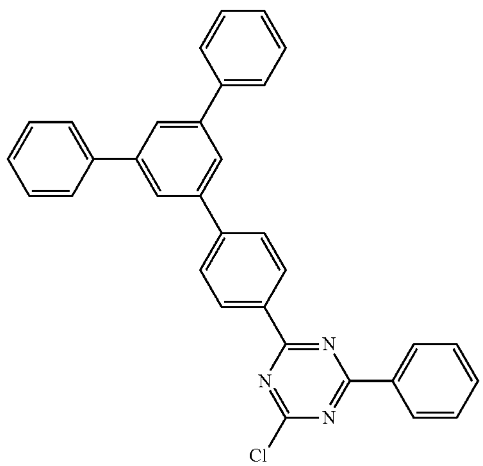
Sub2-6
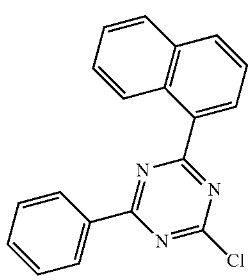
Sub2-7
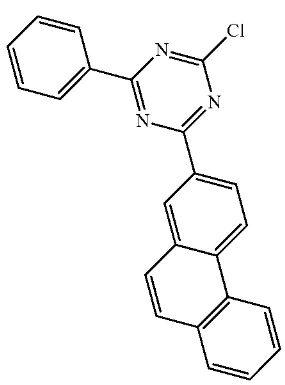
-continued
Sub2-8
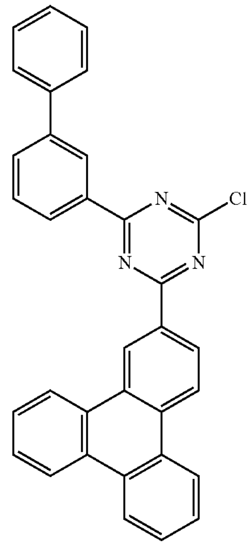
Sub2-9
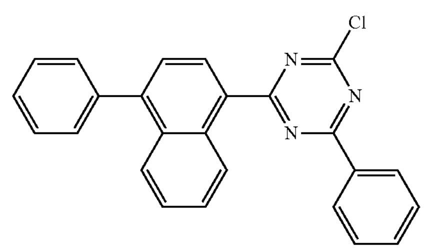
Sub2-10
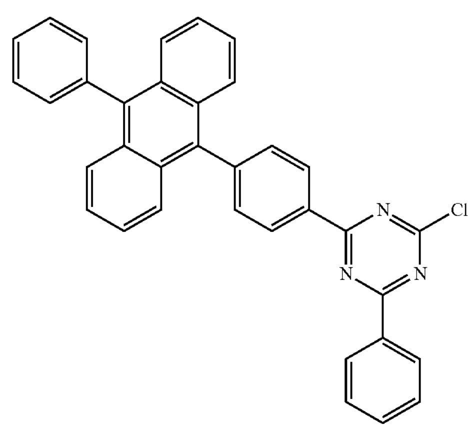

-continued
Sub2-11
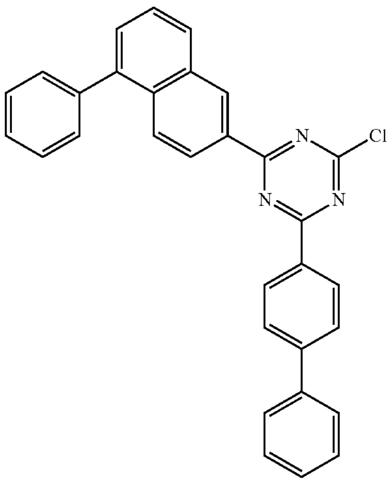
Sub2-12
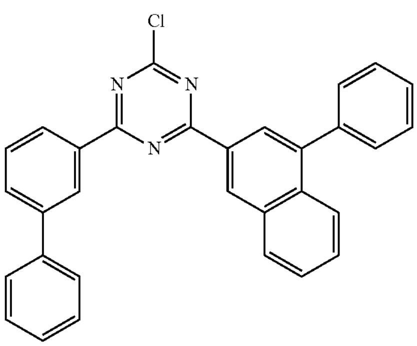
Sub2-13
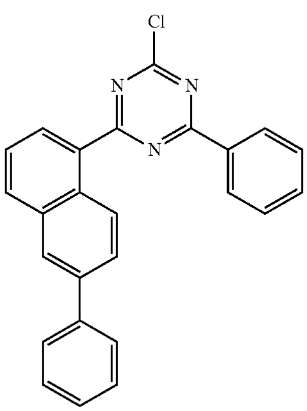
Sub2-14
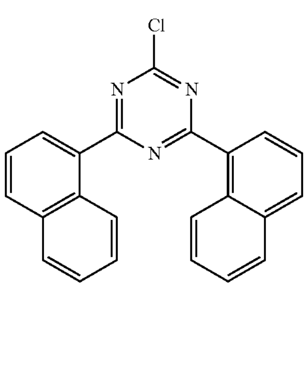
-continued
Sub2-15
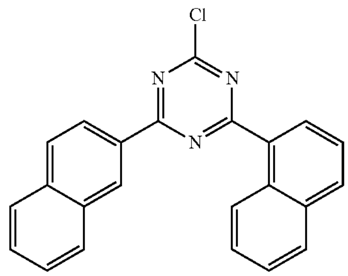
Sub2-16
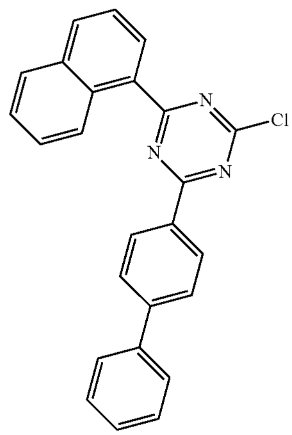
Sub2-17
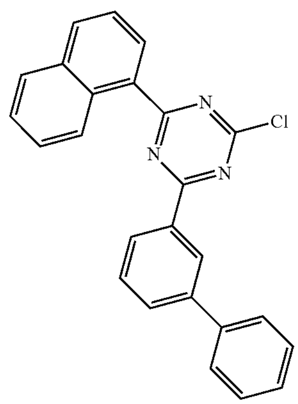
Sub2-18
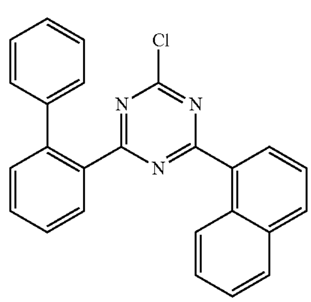

Sub2-19
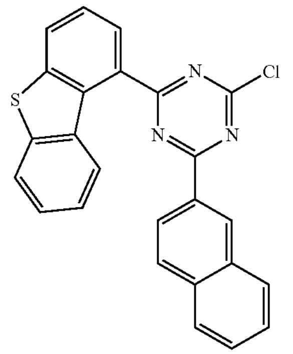
Sub2-20
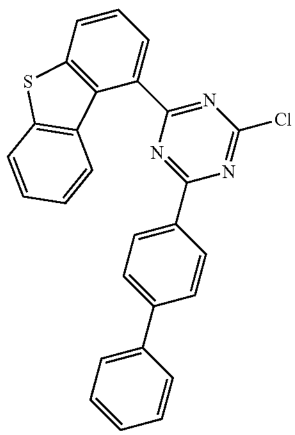
Sub2-21
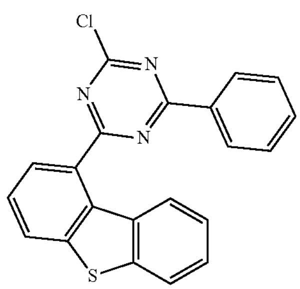
Sub2-22
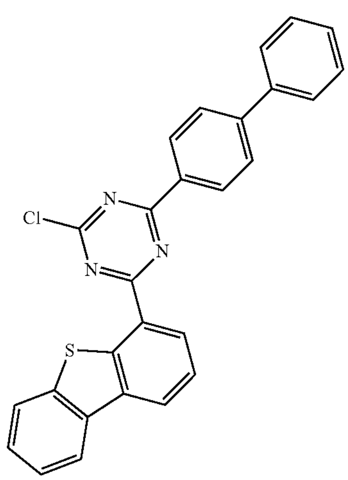
Sub2-23
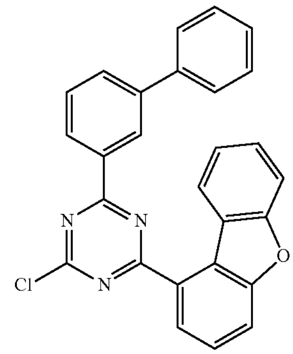
Sub2-24
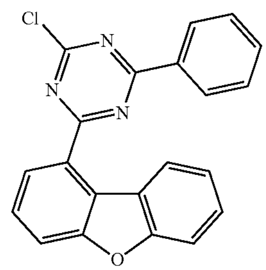
Sub2-25
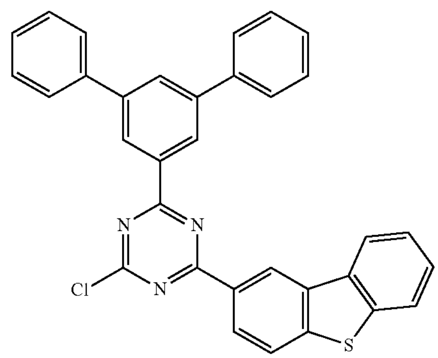
Sub2-26
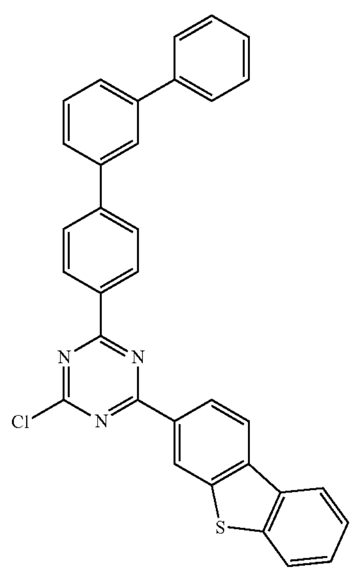

-continued
Sub2-27
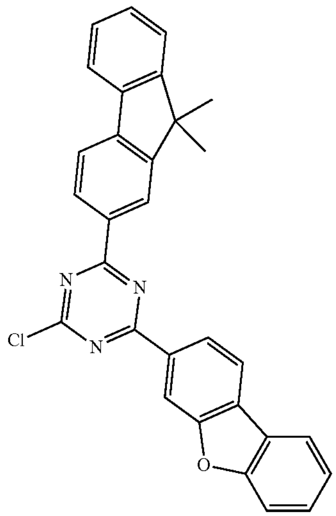
Sub2-28
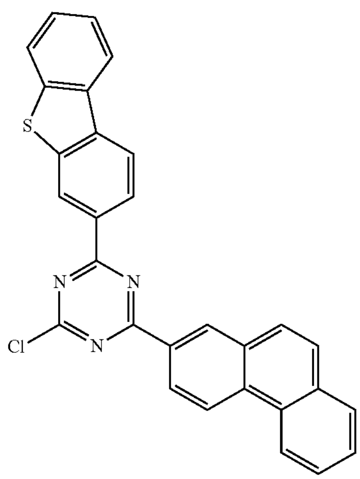
Sub2-29
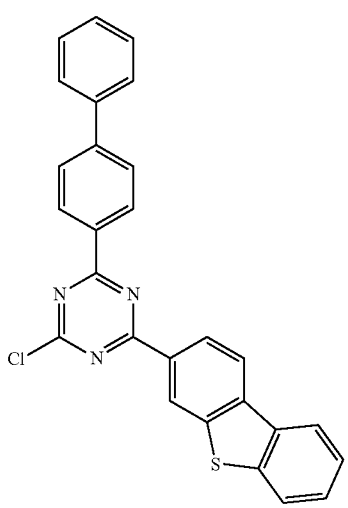
-continued
Sub2-30
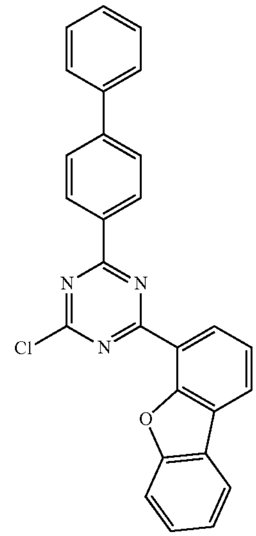
Sub2-31
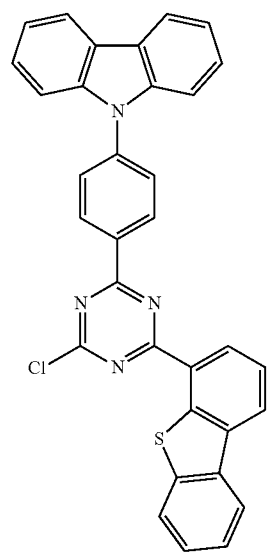
Sub2-32
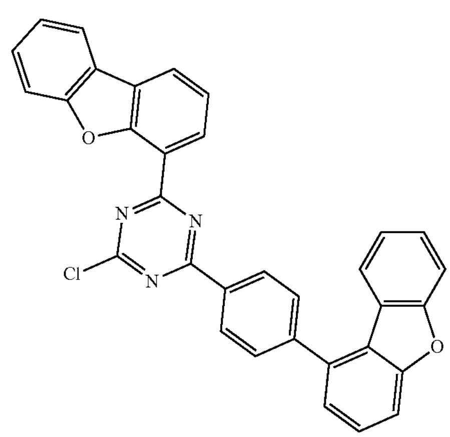

-continued
Sub2-33
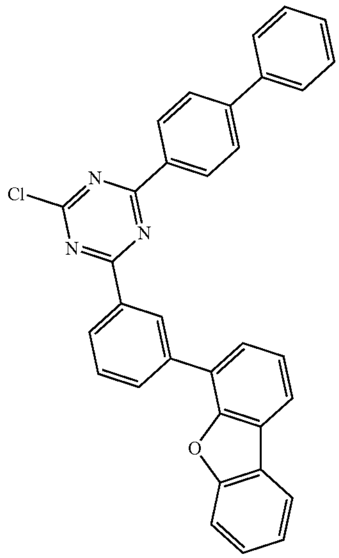
Sub2-34
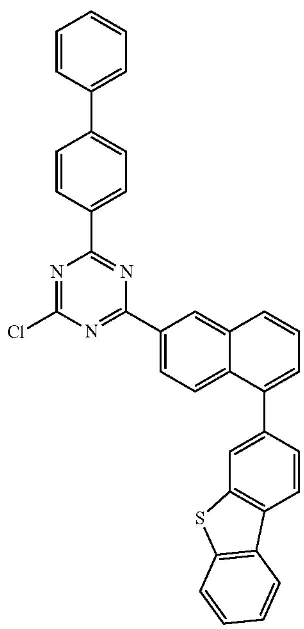
Sub2-35
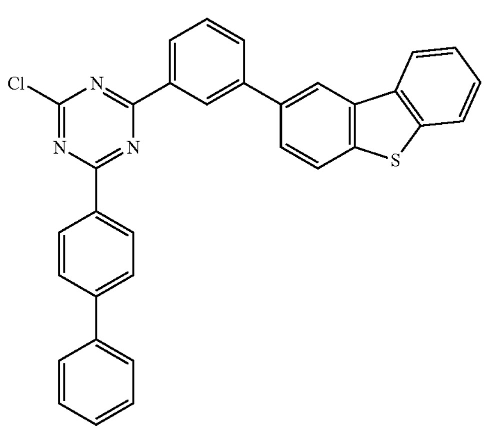
-continued
Sub2-36
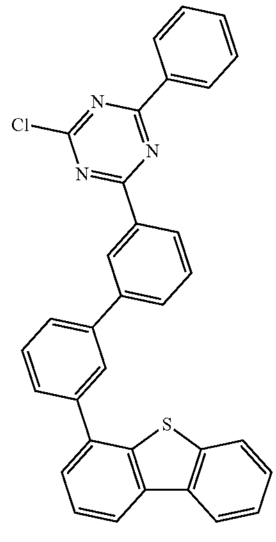
Sub2-37
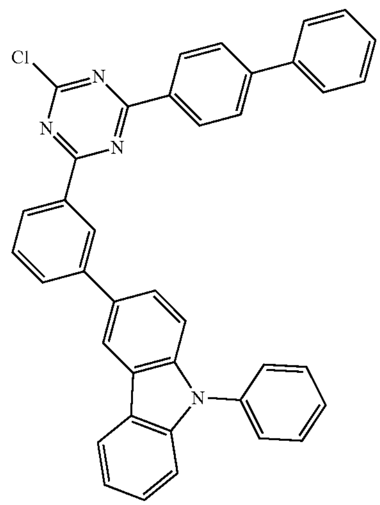
Sub2-38
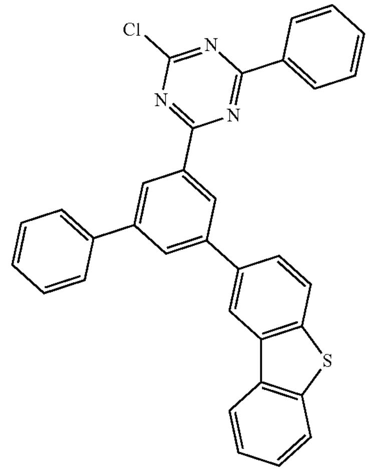

-continued
Sub2-39
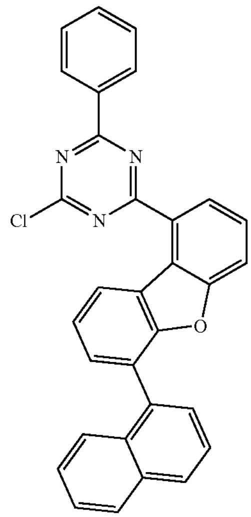
Sub2-40
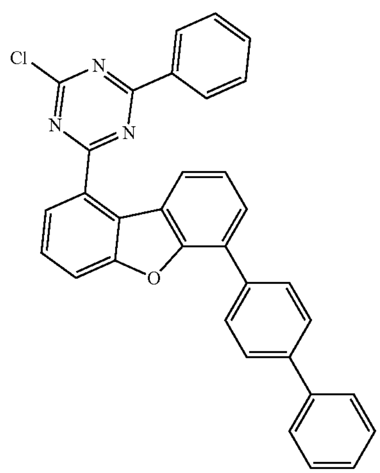
Sub2-41
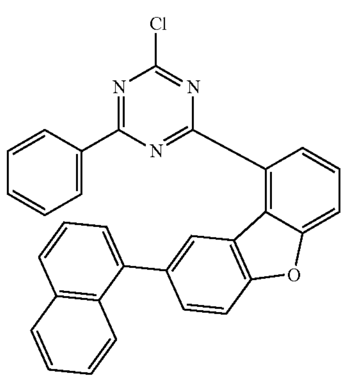
-continued
Sub2-42
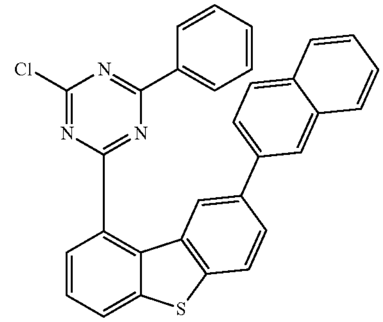
Sub2-43
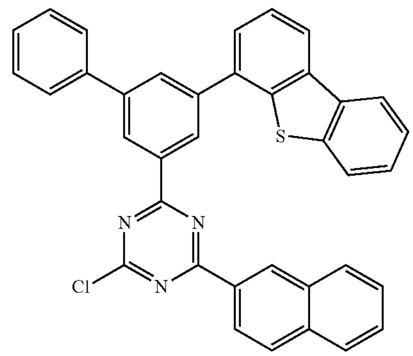
Sub2-44
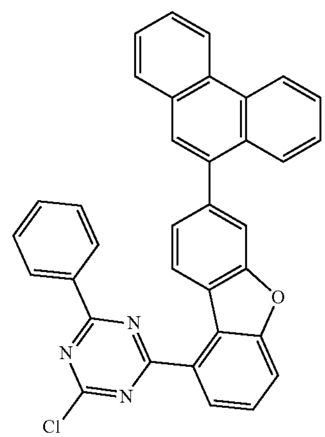
Sub2-45
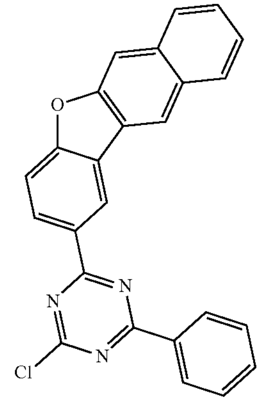

-continued
Sub2-46
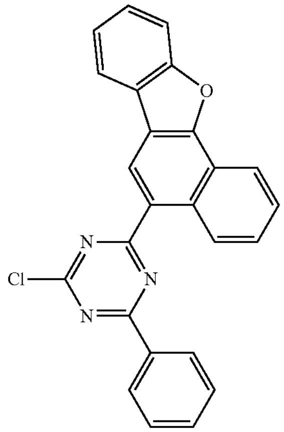
Sub2-47
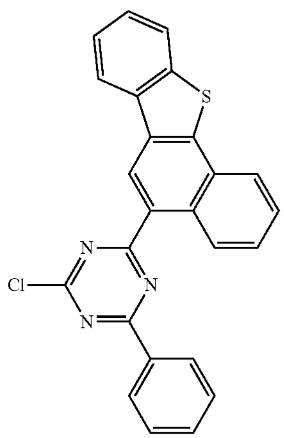
Sub2-48
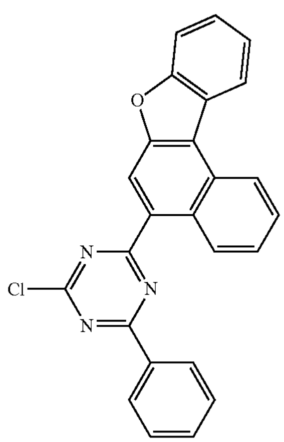
-continued
Sub2-49
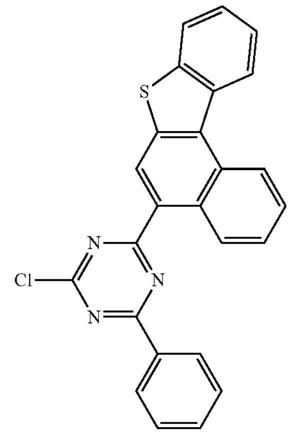
Sub2-50
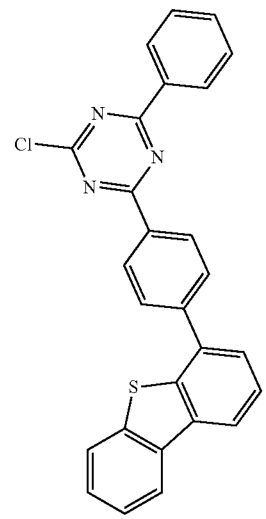
Sub2-51
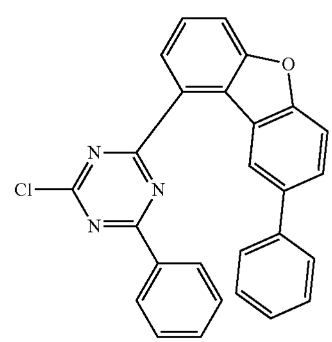

-continued
Sub2-52
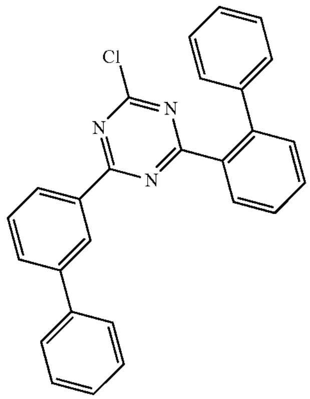
Sub2-53
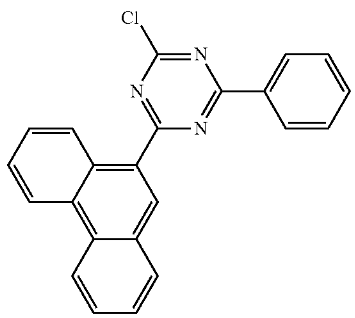
Sub2-54
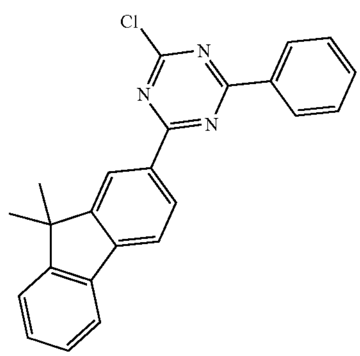
Sub2-55
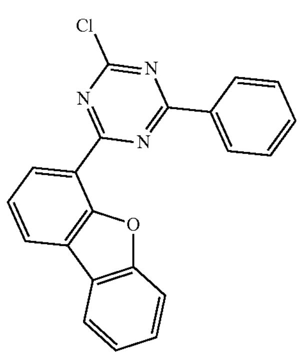
-continued
Sub2-56
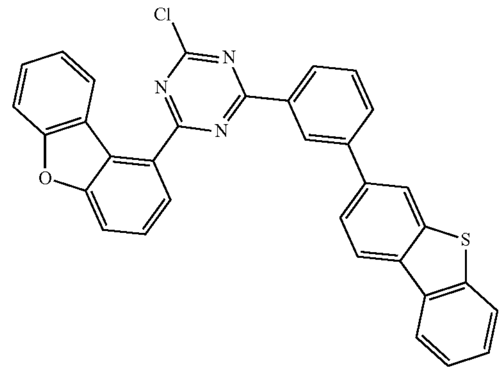
Sub2-57
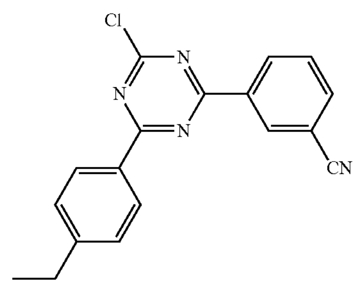
Sub2-58
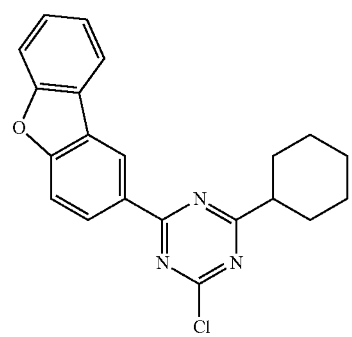
Sub2-59
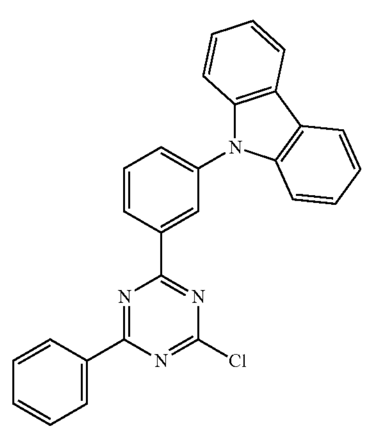

Sub2-60
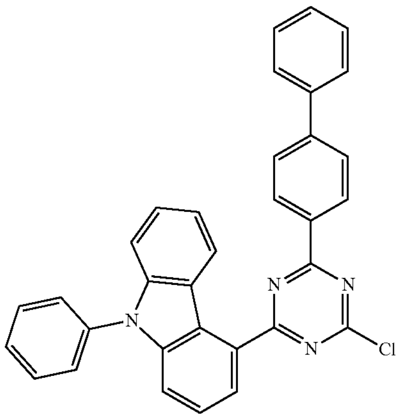
Sub2-61
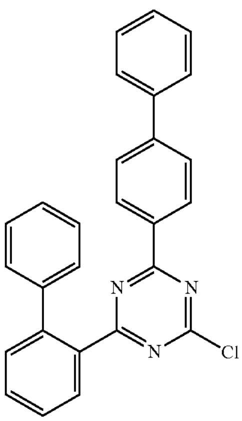
Sub2-62
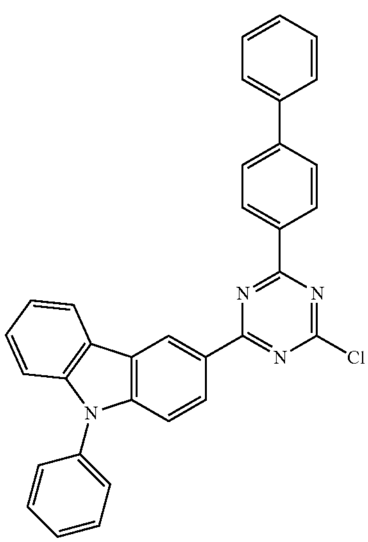
Sub2-63
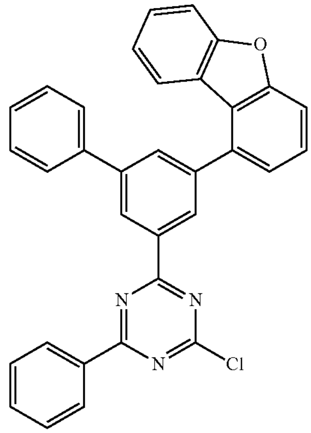
Sub2-64
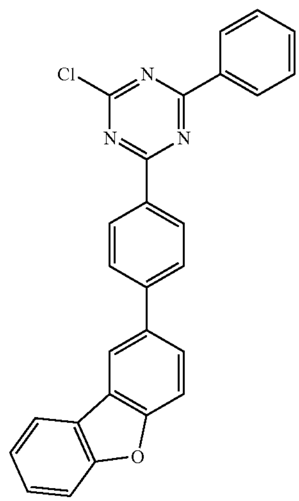
Sub2-65
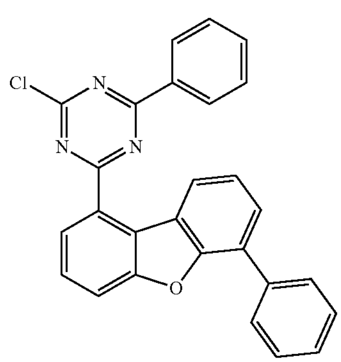

Sub2-66
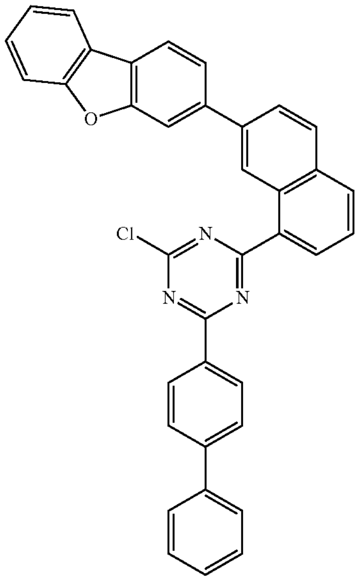
Sub2-67
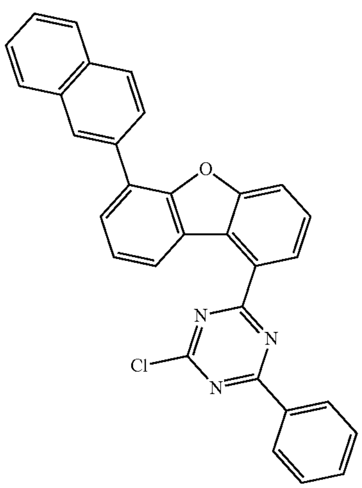
Sub2-68
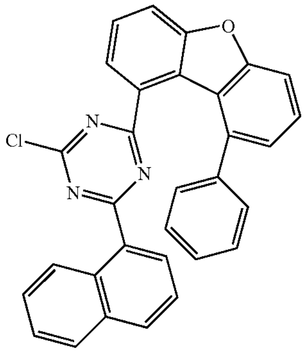
Sub2-69
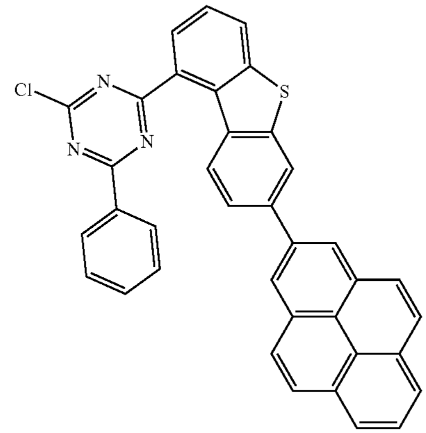
Sub2-70
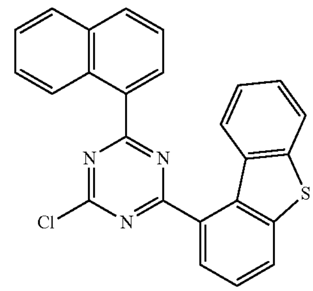
Sub2-71
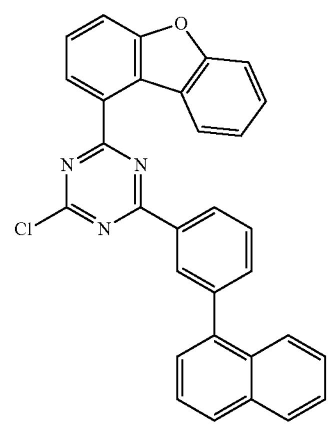
Sub2-72
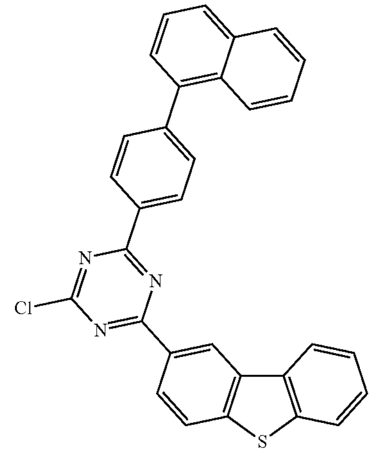

-continued
Sub2-73
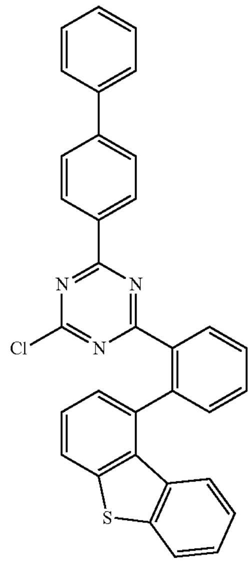
Sub2-74
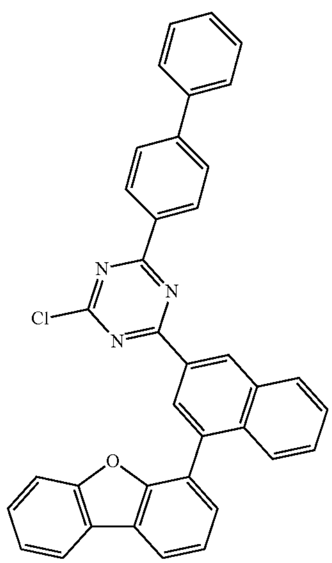
Sub2-75
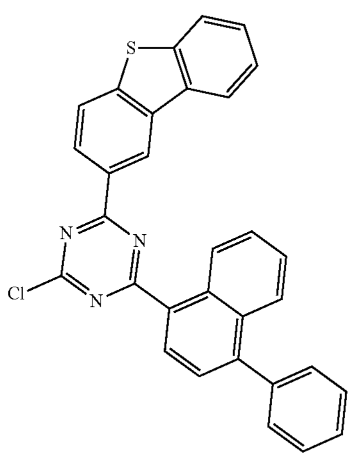
-continued
Sub2-76
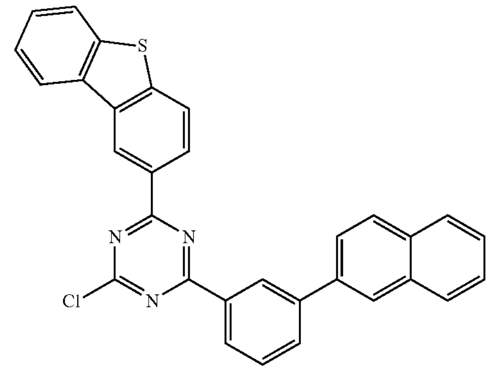
Sub2-77
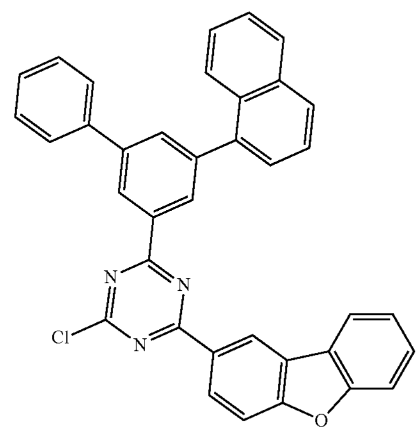
Sub2-78
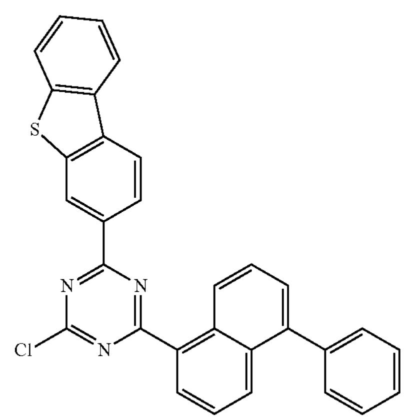

-continued
Sub2-79
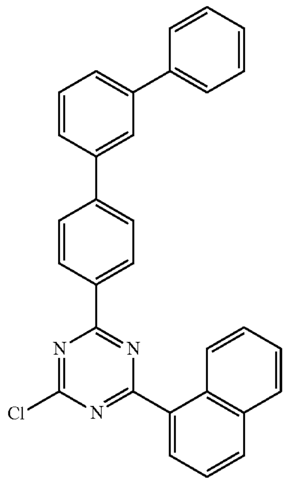
Sub2-80
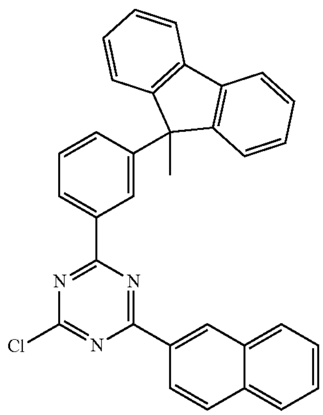
Sub2-81
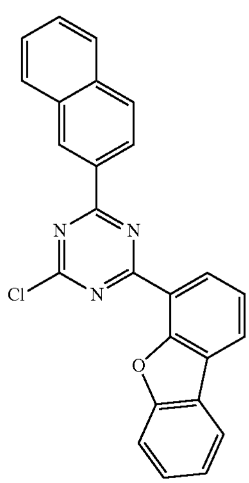
-continued
Sub2-82
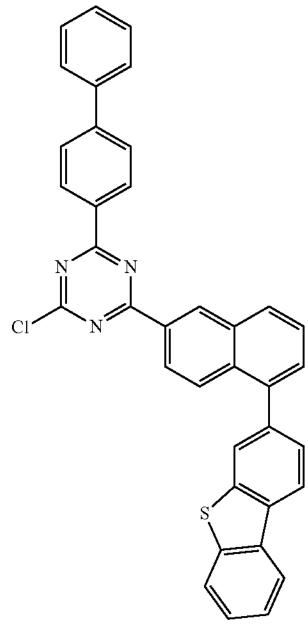
Sub2-83
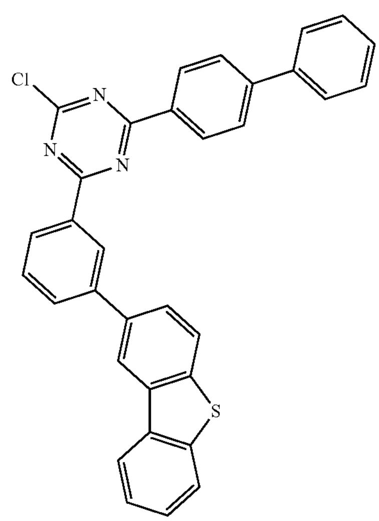

-continued
Sub2-84
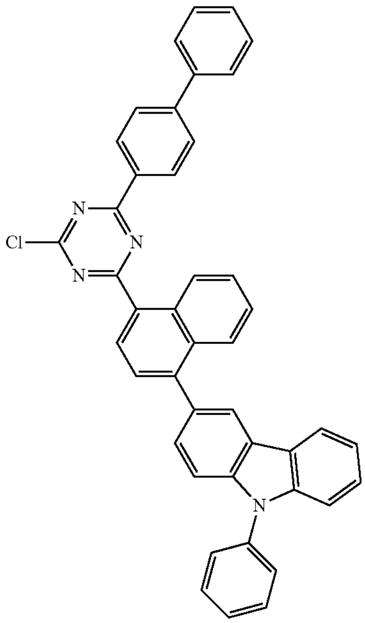
Sub2-85
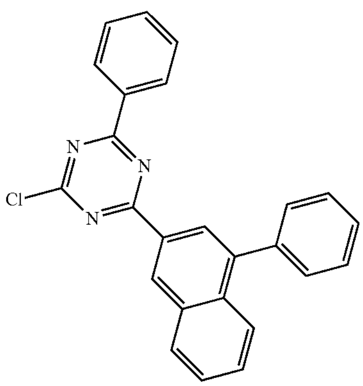
Sub2-86
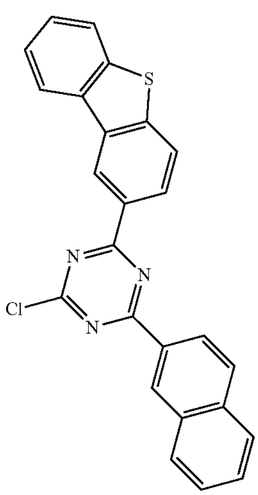
-continued
Sub2-87
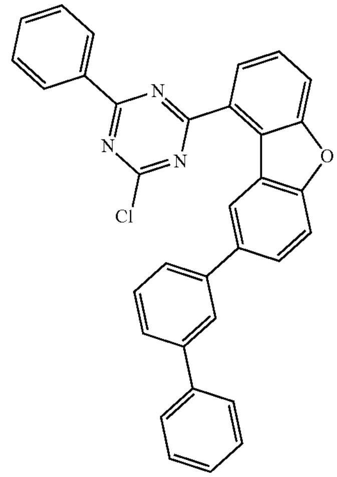
Sub2-88
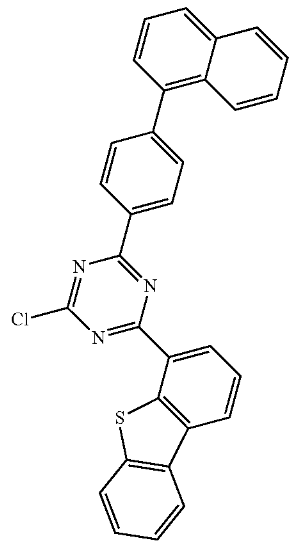
Sub2-89
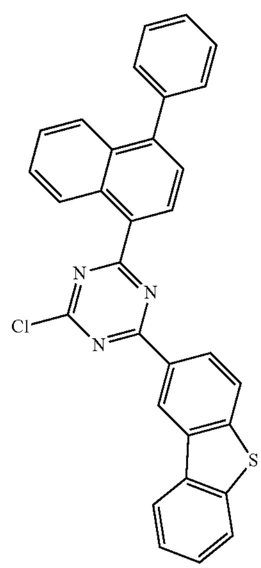

Sub2-90
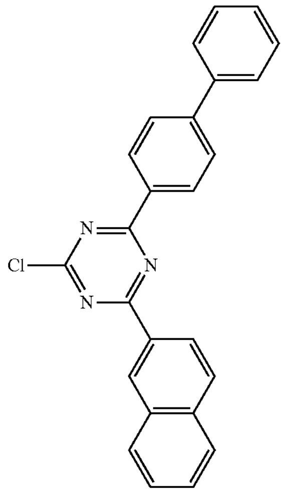
Sub2-91
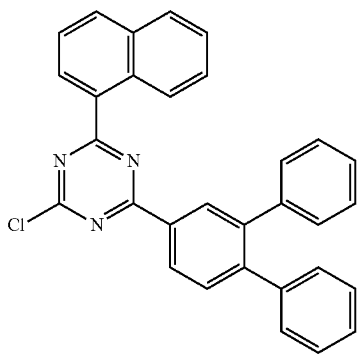
Sub2-92
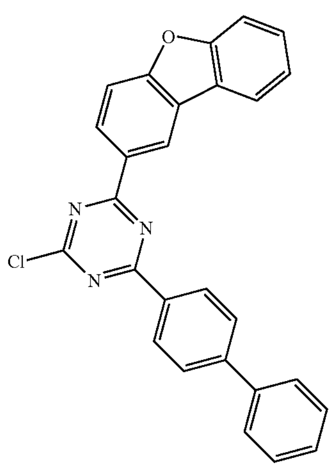
Sub2-93
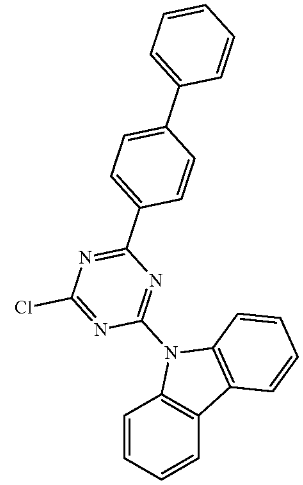
Sub2-94
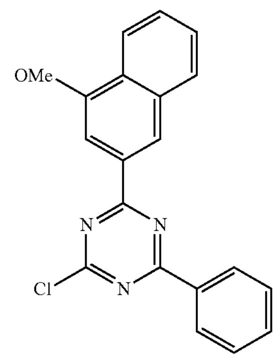
Sub2-95
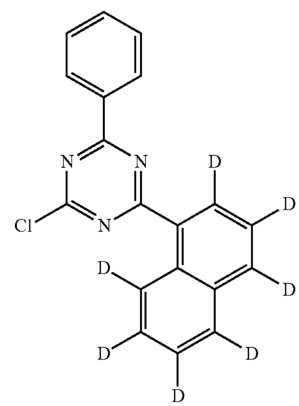
Sub2-96
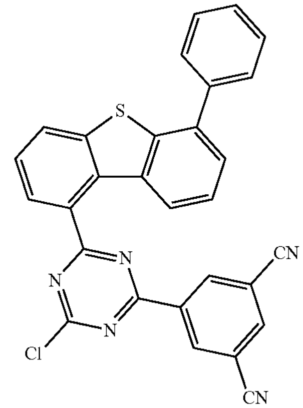

-continued
Sub2-97
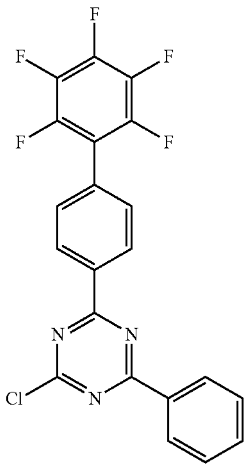
Sub2-98
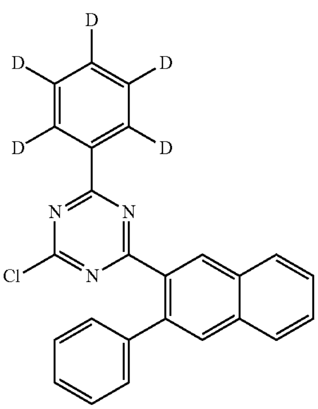
Sub2-99
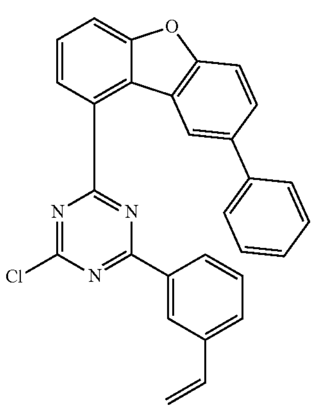
-continued
Sub2-100
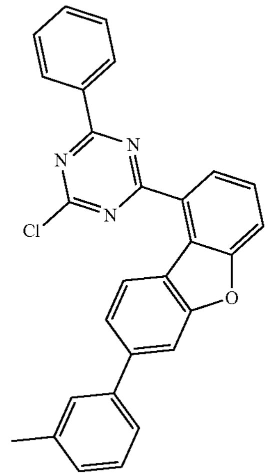
Sub2-101
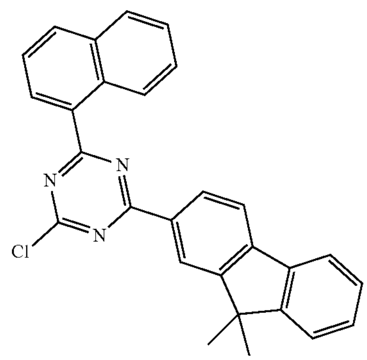
Sub2-102
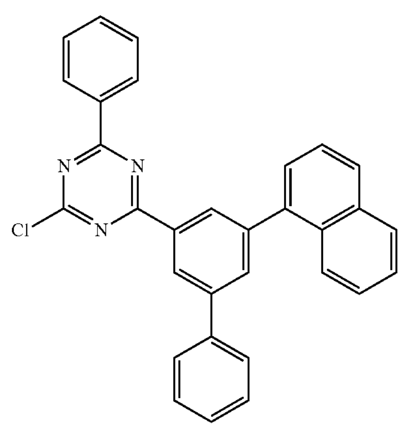

-continued

Sub-103

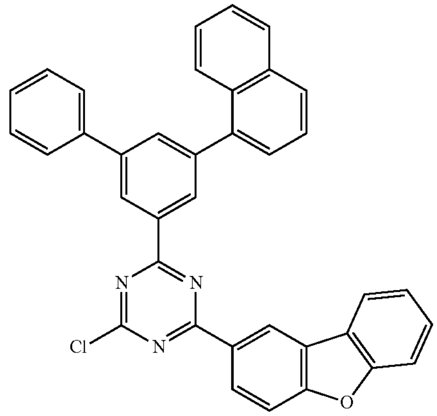

FD-MS values of compounds belong to Sub 2 are shown in Table 2 below.

TABLE 2

| Compound | FD-MS | Compound | FD-MS |
|---|---|---|---|
| Sub 2-1 | m/z = 267.06($C_{15}H_{10}ClN_3$ = 267.72) | Sub 2-2 | m/z = 343.09($C_{21}H_{14}ClN_3$ = 343.81) |
| Sub 2-4 | m/z = 317.07($C_{19}H_{12}ClN_3$ = 317.78) | Sub 2-5 | m/z = 495.15($C_{33}H_{22}ClN_3$ = 496.01) |
| Sub 2-7 | m/z = 367.09($C_{23}H_{14}ClN_3$ = 367.84) | Sub 2-8 | m/z = 493.13($C_{33}H_{20}ClN_3$ = 493.99) |
| Sub 2-9 | m/z = 393.1($C_{25}H_{16}ClN_3$ = 393.87) | Sub 2-10 | m/z = 519.15($C_{35}H_{22}ClN_3$ = 520.03) |
| Sub 2-11 | m/z = 469.13($C_{31}H_{20}ClN_3$ = 469.97) | Sub 2-12 | m/z = 393.1($C_{25}H_{16}ClN_3$ = 393.87) |
| Sub 2-14 | m/z = 367.09($C_{23}H_{14}ClN_3$ = 367.84) | Sub 2-19 | m/z = 423.06($C_{25}H_{14}ClN_3S$ = 423.92) |
| Sub 2-20 | m/z = 449.08($C_{27}H_{16}ClN_3S$ = 449.96) | Sub 2-21 | m/z = 373.04($C_{21}H_{12}ClN_3S$ = 373.86) |
| Sub 2-22 | m/z = 433.1($C_{27}H_{16}ClN_3O$ = 433.9) | Sub 2-24 | m/z = 357.07($C_{21}H_{12}ClN_3O$ = 357.8) |
| Sub 2-25 | m/z = 525.11($C_{33}H_{20}ClN_3S$ = 526.05) | Sub 2-27 | m/z = 473.13($C_{30}H_{20}ClN_3O$ = 473.96) |
| Sub 2-28 | m/z = 473.08($C_{29}H_{16}ClN_3S$ = 473.98) | Sub 2-31 | m/z = 538.1($C_{33}H_{19}ClN_4S$ = 539.05) |
| Sub 2-32 | m/z = 523.11($C_{33}H_{18}ClN_3O_2$ = 523.98) | Sub 2-33 | m/z = 509.13($C_{33}H_{20}ClN_3O$ = 509.99) |
| Sub 2-34 | m/z = 575.12($C_{37}H_{22}ClN_3S$ = 576.11) | Sub 2-37 | m/z = 584.18($C_{39}H_{25}ClN_4$ = 585.11) |
| Sub 2-39 | m/z = 483.11($C_{31}H_{18}ClN_3O$ = 483.96) | Sub 2-40 | m/z = 509.13($C_{33}H_{20}ClN_3O$ = 509.99) |
| Sub 2-42 | m/z = 499.09($C_{31}H_{18}ClN_3S$ = 500.02) | Sub 2-43 | m/z = 575.12($C_{37}H_{22}ClN_3S$ = 576.11) |
| Sub 2-44 | m/z = 533.13($C_{35}H_{20}ClN_3O$ = 534.02) | Sub 2-45 | m/z = 407.08($C_{25}H_{14}ClN_3O$ = 407.86) |
| Sub 2-47 | m/z = 423.06($C_{25}H_{14}ClN_3S$ = 423.92) | Sub 2-50 | m/z = 449.08($C_{27}H_{16}ClN_3S$ = 449.96) |
| Sub 2-51 | m/z = 433.1($C_{27}H_{16}ClN_3O$ = 433.9) | Sub 2-52 | m/z = 419.12($C_{27}H_{18}ClN_3$ = 419.91) |
| Sub 2-54 | m/z = 383.12($C_{24}H_{18}ClN_3$ = 383.88) | Sub 2-55 | m/z = 357.07($C_{21}H_{12}ClN_3O$ = 357.8) |
| Sub 2-56 | m/z = 539.09($C_{33}H_{18}ClN_3OS$ = 540.04) | Sub 2-57 | m/z = 320.08($C_{18}H_{13}ClN_4$ = 320.78) |
| Sub 2-58 | m/z = 363.11($C_{21}H_{18}ClN_3O$ = 363.85) | Sub 2-59 | m/z = 432.11($C_{27}H_{17}ClN_4$ = 432.91) |
| Sub 2-60 | m/z = 508.15($C_{33}H_{21}ClN_4$ = 509.01) | Sub 2-64 | m/z = 433.1($C_{27}H_{16}ClN_3O$ = 433.9) |
| Sub 2-66 | m/z = 559.15($C_{37}H_{22}ClN_3O$ = 560.05) | Sub 2-67 | m/z = 483.11($C_{31}H_{18}ClN_3O$ = 483.96) |
| Sub 2-69 | m/z = 573.11($C_{37}H_{20}ClN_3S$ = 574.1) | Sub 2-80 | m/z = 495.15($C_{33}H_{22}ClN_3$ = 496.01) |
| Sub 2-84 | m/z = 634.19($C_{43}H_{27}ClN_4$ = 635.17) | Sub 2-94 | m/z = 347.08($C_{20}H_{14}ClN_3O$ = 347.8) |
| Sub 2-95 | m/z = 324.12($C_{19}H_5D_7ClN_3$ = 324.82) | Sub 2-96 | m/z = 499.07($C_{29}H_{14}ClN_5S$ = 499.98) |
| Sub 2-97 | m/z = 433.04($C_{21}H_9ClF_5N_3$ = 433.77) | Sub 2-98 | m/z = 398.13($C_{25}H_{11}D_5ClN_3$ = 398.9) |
| Sub 2-99 | m/z = 459.11($C_{29}H_{18}ClN_3O$ = 459.93) | Sub 2-100 | m/z = 447.11($C_{25}H_{18}ClN_3O$ = 447.92) |
| Sub 2-101 | m/z = 433.13($C_{28}H_{20}ClN_3$ = 433.94) | Sub 2-102 | m/z = 469.13($C_{31}H_{20}ClN_3$ = 469.97) |
| Sub 2-103 | m/z = 559.15($C_{37}H_{22}ClN_3O$ = 560.05) | | |

1. Synthesis Example of Sub 1

Sub 1 of Reaction Scheme 1 may be synthesized by the reaction route of the following Reaction Scheme 2, but are not limited thereto.

<Reaction Scheme 2>

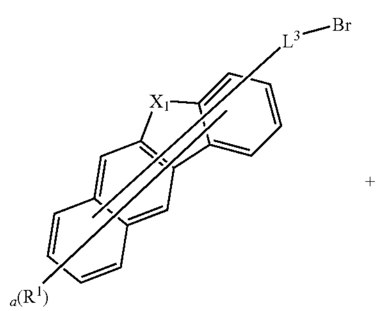

-continued

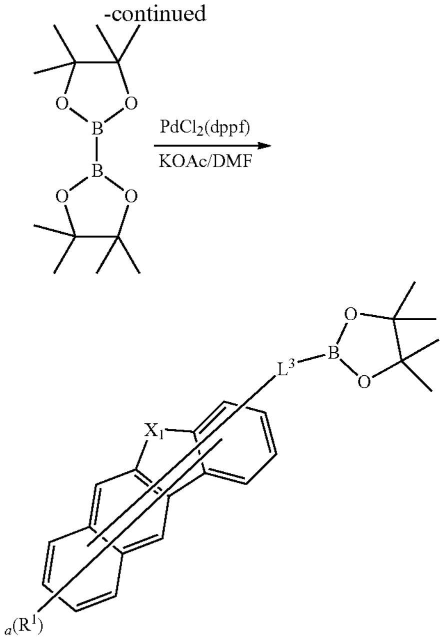

Sub 1

Synthesis Example of Sub 1-3

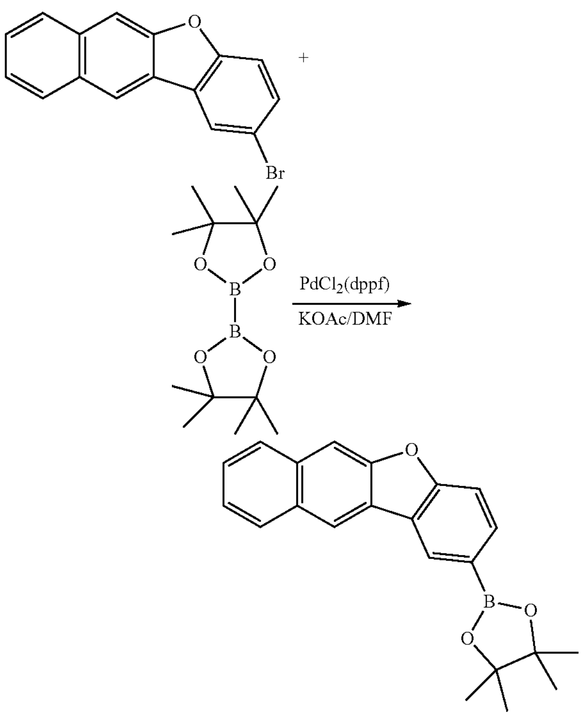

Sub 1-3

After adding bis(pinacolato)diboran (CAS Registry Number: 73183-34-3) (33.28 g, 131.04 mmol), $PdCl_2$(dppf) (2.92 g, 3.57 mmol), KOAc (35.07 g, 357.40 mmol) and DMF (596 ml) to 2-bromonaphtho[2,3-b]benzofuran (35.4 g, 119.13 mmol), the mixture was stirred under reflux. When the reaction was completed, an organic layer of the reaction product was extracted using $CH_2Cl_2$ and water. The organic layer was dried over $MgSO_4$ and concentrated. Then, the concentrate was separated by a silica gel column and recrystallized to obtain 34.86 g (yield: 85%) of the product.

Synthesis Example of Sub 1-21

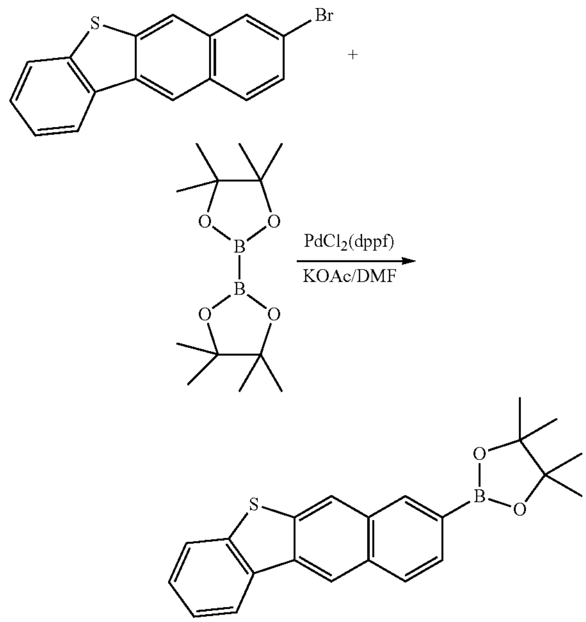

Sub 1-21

Bis(pinacolato)diboran (CAS Registry Number: 73183-34-3) (31.57 g, 124.33 mmol), $PdCl_2$(dppf) (2.77 g, 3.39 mmol), KOAc (33.28 g, 339.07 mmol), DMF (565 ml) were added to 8-bromobenzo[b]naphtho[2,3-d]thiophene (35.40 g, 113.02 mmol), and then the reaction was carried out in the same manner as in the synthesis method of 1-3 to obtain a product 33.39 g (yield: 82%).

Synthesis Example of Sub 1-37

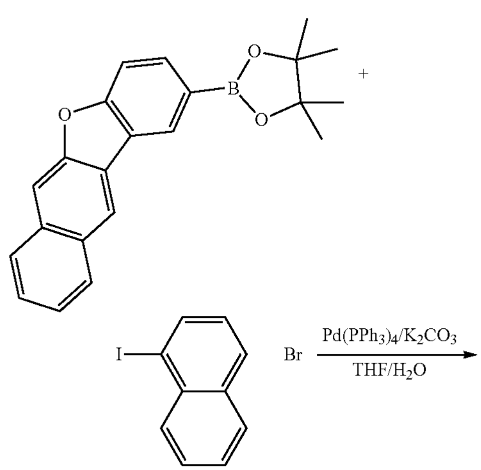

-continued

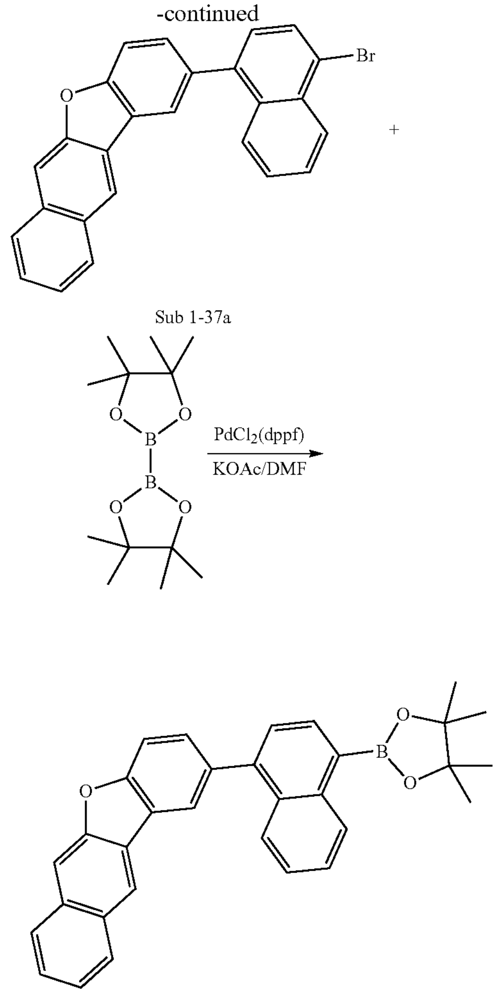

Sub 1-37a

Sub 1-37

(1) Synthesis of Sub 1-37a

After adding 1-bromo-4-iodonaphthalene (69.65 g, 209.17 mmol), Pd(PPh3)4 (8.06 g, 6.97 mmol), K2CO3 (72.27 g, 522.92 mmol), THF (639 ml) and water (320 ml) to 4,4,5,5-tetramethyl-2-(naphtho[2,3-b]benzofuran-2-yl)-1,3,2-dioxaborolane (60 g, 174.31 mmol), the mixture was stirred under reflux. When the reaction was completed, an organic layer of the reaction product was extracted using ether and water. After concentrating the organic layer, it was dried over $MgSO_4$ and concentrated. Then, the concentrate was separated by a silica gel column and recrystallized to obtain 45.01 g (yield: 61%) of the product.

(2) Synthesis of Sub 1-37

Bis(pinacolato)diboran (CAS Registry Number: 73183-34-3) (29.70 g, 116.96 mmol), PdCl$_2$(dppf) (2.60 g, 3.19 mmol), KOAc (31.31 g, 318.99 mmol), DMF (532 ml) were added to Sub 1-37a (45.01 g, 106.33 mmol), and then the reaction was carried out in the same manner as in the synthesis method of 1-3 to obtain a product 39.01 g (yield: 78%).

Synthesis Example of Sub 1-68

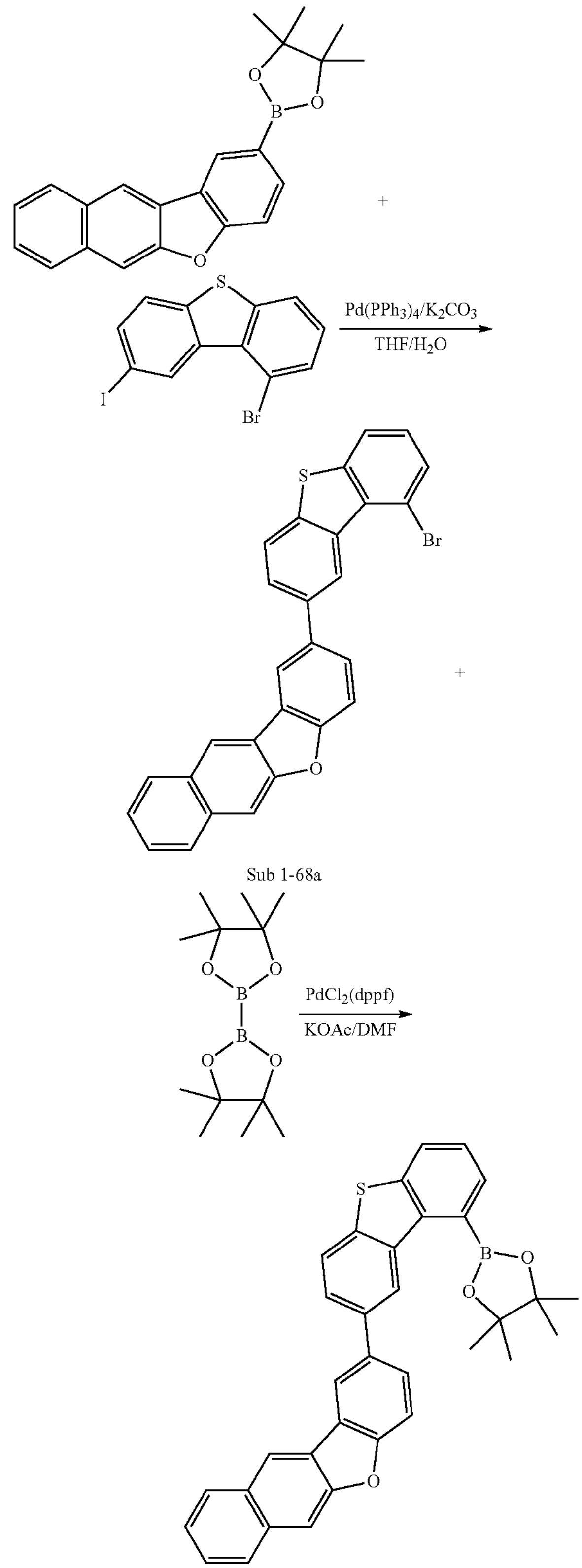

Sub 1-68a

Sub 1-68

(1) Synthesis of Sub 1-68a 1-bromo-8-iododibenzo[b,d]thiophene (81.38 g, 209.17 mmol), $Pd(PPh_3)_4$ (8.06 g, 6.97 mmol), $K_2CO_3$ (72.27 g, 522.92 mmol), THF (639 ml) and water (320 ml) were added to 4,4,5,5-tetramethyl-2-(naphtho[2,3-b]benzofuran-2-yl)-1,3,2-dioxaborolane (60 g, 174.31 mmol), and then the reaction was carried out in the same manner as in the synthesis method of Sub 1-37a to obtain a product 56.82 g (yield: 68%).

(2) Synthesis of Sub 1-68

Bis(pinacolato)diboran (CAS Registry Number: 73183-34-3) (33.11 g, 130.38 mmol), $PdCl_2(dppf)$ (2.90 g, 3.56 mmol), KOAc (34.90 g, 355.58 mmol), DMF (593 ml) were added to Sub 1-68a (56.82 g, 118.53 mmol), and then the reaction was carried out in the same manner as in the synthesis method of 1-3 to obtain a product 46.80 g (yield: 75%).

Synthesis Example of Sub 1-98

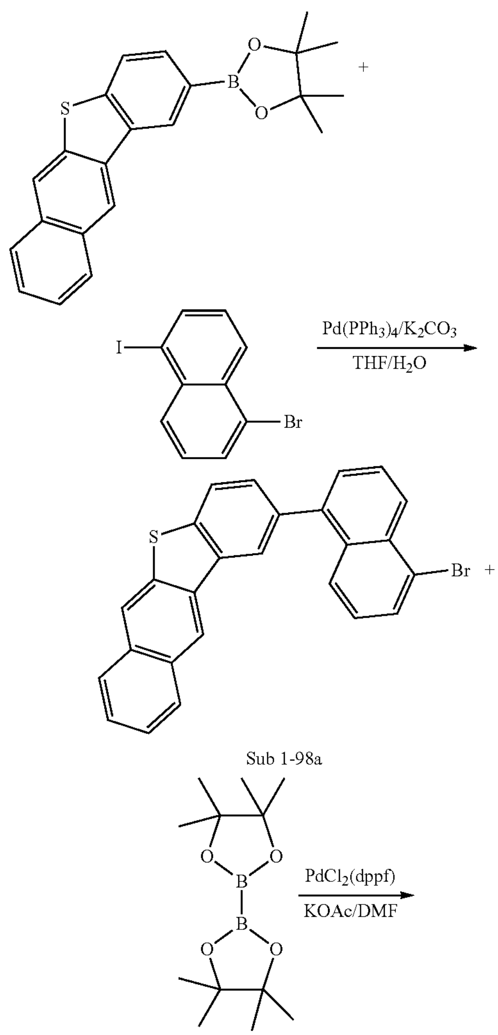

-continued

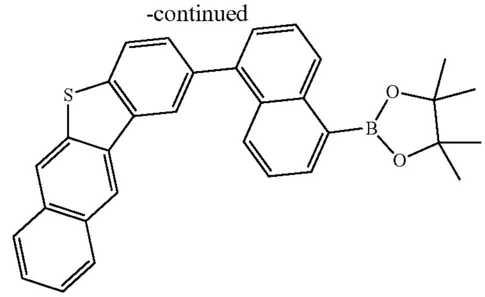

Sub 1-98

(1) Synthesis of Sub 1-98a 1-bromo-5-iodonaphthalene (66.54 g, 199.84 mmol), $Pd(PPh_3)_4$ (7.70 g, 6.66 mmol), $K_2CO_3$ (69.05 g, 499.61 mmol), THF (611 ml) and water (305 ml) were added to 2-(benzo[b]naphtho[2,3-d]thiophen-2-yl)-4,4,5,5-tetramethyl-1,3,2-dioxaborolane (60 g, 166.54 mmol), and then the reaction was carried out in the same manner as in the synthesis method of Sub 1-37a to obtain a product 46.83 g (yield: 64%).

(2) Synthesis of Sub 1-98

Bis(pinacolato)diboran (CAS Registry Number: 73183-34-3) (29.77 g, 117.24 mmol), $PdCl_2(dppf)$ (2.61 g, 3.20 mmol), KOAc (31.38 g, 319.75 mmol) and DMF (533 ml) were added to 1-98a (46.83 g, 106.58 mmol), and then the reaction was carried out in the same manner as in the synthesis method of 1-3 to obtain a product 37.33 g (yield: 72%).

6. Synthesis Example of Sub 1-111

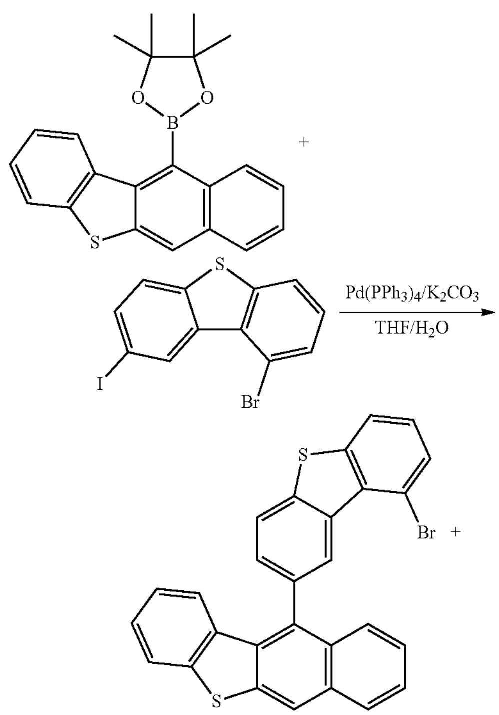

Sub 1-111a

-continued

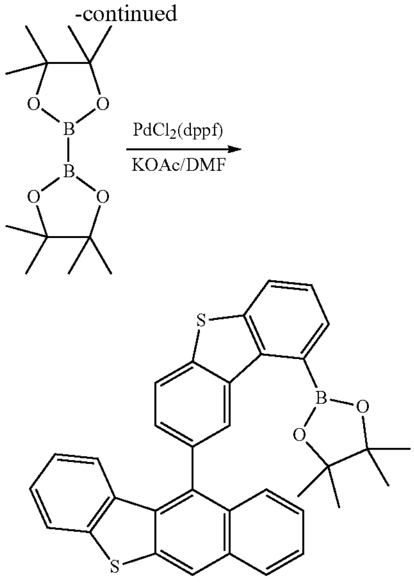

Sub 1-111

(1) Synthesis of Sub 1-111a 1-bromo-8-iododibenzo[b,d]thiophene (77.75 g, 199.84 mmol), $Pd(PPh_3)_4$ (7.70 g, 6.66 mmol), $K_2CO_3$ (69.05 g, 499.61 mmol), THF (611 ml) and water (305 ml) were added to 2-(benzo[b]naphtho[2,3-d]thiophen-11-yl)-4,4,5,5-tetramethyl-1,3,2-dioxaborolane (60 g, 166.54 mmol), and then the reaction was carried out in the same manner as in the synthesis method of Sub 1-37a to obtain a product 54.46 g (yield: 66%).

(2) Synthesis of Sub 1-111

Bis(pinacolato)diboran (CAS Registry Number: 73183-34-3) (30.70 g, 120.91 mmol), $PdCl_2(dppf)$ (2.69 g, 3.30 mmol), KOAc (32.36 g, 329.76 mmol), DMF (550 ml) were added to Sub 1-111a (54.46 g, 109.92 mmol), and then the reaction was carried out in the same manner as in the synthesis method of 1-3 to obtain a product 41.15 g (yield: 69%).

2. Synthesis Example of Sub 2

Sub 2 of Reaction Scheme 1 may be synthesized by the reaction route of the following Reaction Scheme 3, but are not limited thereto.

<Reaction Scheme 3>

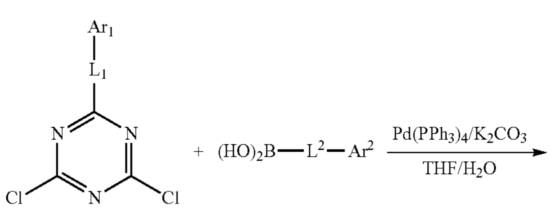

-continued

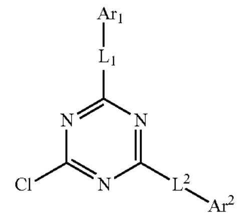

Sub 2

Synthesis Example of Sub 2-2

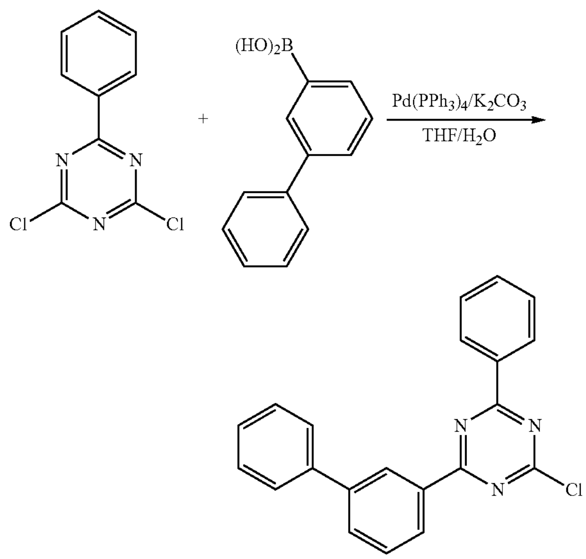

Sub 2-2

After adding [1,1'-biphenyl]-3-ylboronic acid (31.01 g, 156.60 mmol), $Pd(PPh_3)_4$ (7.24 g, 6.26 mmol), $K_2CO_3$ (64.93 g, 469.79 mmol), THF (522 ml) and water (261 ml) to 2,4-dichloro-6-phenyl-1,3,5-triazine (35.4 g, 156.60 mmol), the mixture was stirred under reflux. When the reaction was completed, an organic layer of the reaction product was extracted using ether and water. The organic layer was dried over $MgSO_4$ and concentrated. Then, the concentrate was separated by a silica gel column and recrystallized to obtain 43.07 g (yield: 80%) of the product.

Synthesis Example of Sub 2-6

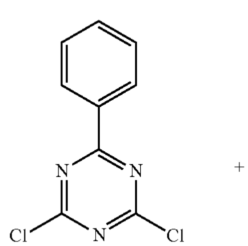

-continued

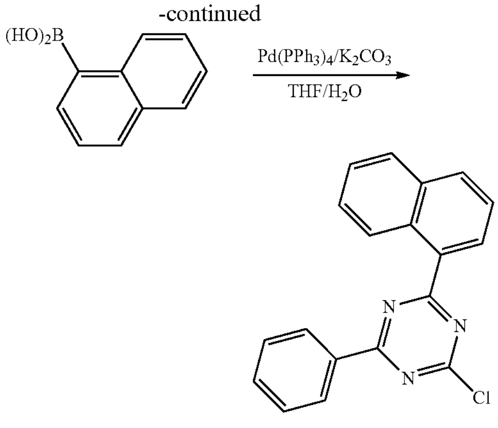

Sub 2-6

Naphthalen-1-ylboronic acid (26.93 g, 156.60 mmol), $Pd(PPh_3)_4$ (7.24 g, 6.26 mmol), $K_2CO_3$ (64.93 g, 469.79 mmol), THF (522 ml) and water (261 ml) were added to 2,4-dichloro-6-phenyl-1,3,5-triazine (35.4 g, 156.60 mmol), and then the reaction was carried out in the same manner as in the synthesis method of Sub 2-2 to obtain a product 36.82 g (yield: 74%).

Synthesis Example of Sub 2-22

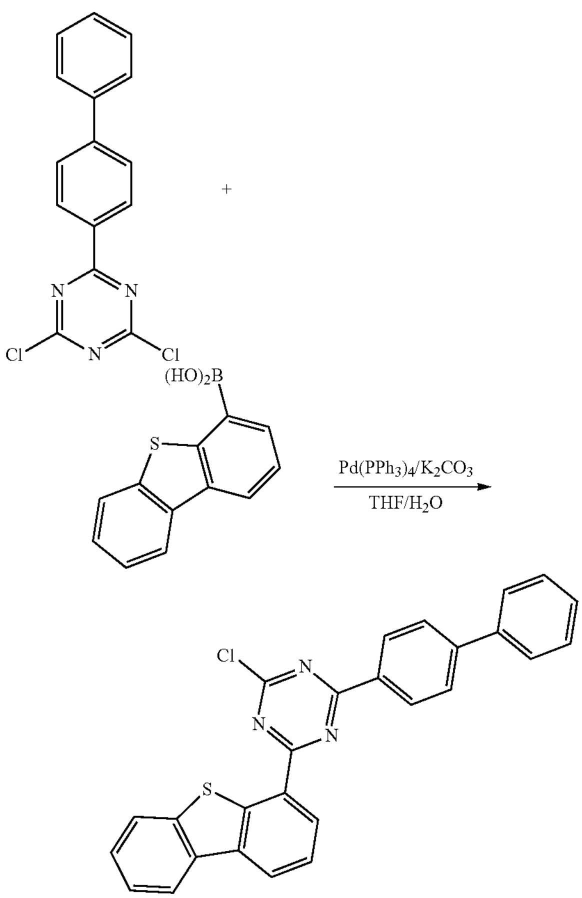

Sub 2-22

Dibenzo[b,d]thiophen-4-ylboronic acid (26.72 g, 117.16 mmol), $Pd(PPh_3)_4$ (5.42 g, 4.69 mmol), $K_2CO_3$ (48.58 g, 351.47 mmol), THF (391 ml) and water (195 ml) were added to 2-([1,1'-biphenyl]-4-yl)-4,6-dichloro-1,3,5-triazine (35.4 g, 117.16 mmol), and then the reaction was carried out in the same manner as in the synthesis method of Sub 2-2 to obtain a product 40.06 g (yield: 76%).

Synthesis Example of Sub 2-24

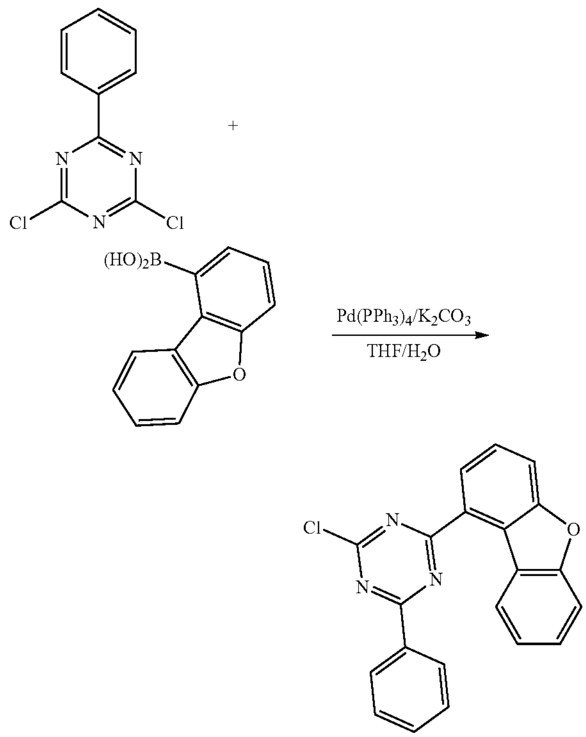

Sub 2-24

Dibenzo[b,d]furan-1-ylboronic acid (33.20 g, 156.60 mmol), $Pd(PPh_3)_4$ (7.24 g, 6.26 mmol), $K_2CO_3$ (64.93 g, 469.79 mmol), THF (522 ml) and water (261 ml) were added to 2,4-dichloro-6-phenyl-1,3,5-triazine (35.4 g, 156.60 mmol), and then the reaction was carried out in the same manner as in the synthesis method of Sub 2-2 to obtain a product 38.66 g (yield: 69%).

Synthesis Example of Sub 2-47

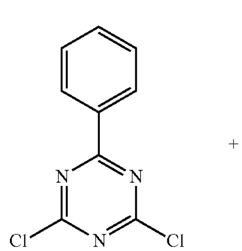

-continued

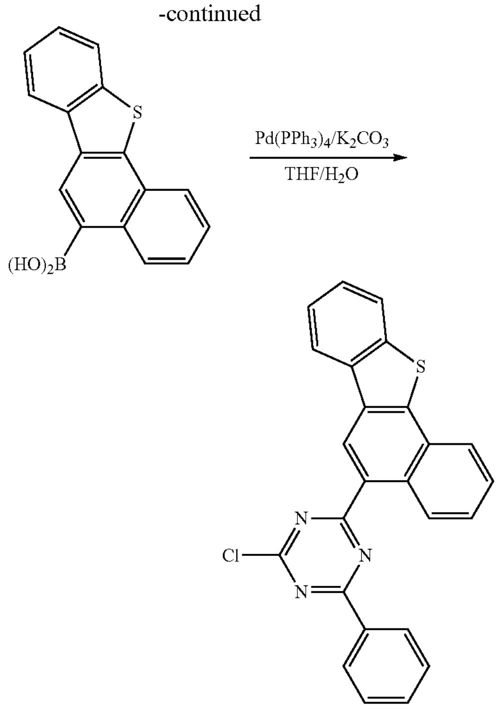

Sub 2-47

Benzo[b]naphtho[2,1-d]thiophen-5-ylboronic acid (43.55 g, 156.60 mmol), $Pd(PPh_3)_4$ (7.24 g, 6.26 mmol), $K_2CO_3$ (64.93 g, 469.79 mmol), THF (522 ml) and water (261 ml) were added to 2,4-dichloro-6-phenyl-1,3,5-triazine (35.4 g, 156.60 mmol), and then the reaction was carried out in the same manner as in the synthesis method of Sub 2-2 to obtain a product 19.58 g (yield: 45%).

3. Synthesis Example of Final Product

Synthesis Example of 1-6

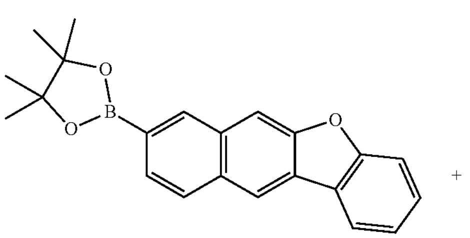

Sub 1-6

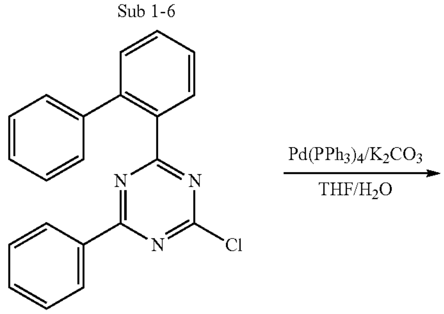

Sub 2-3

-continued

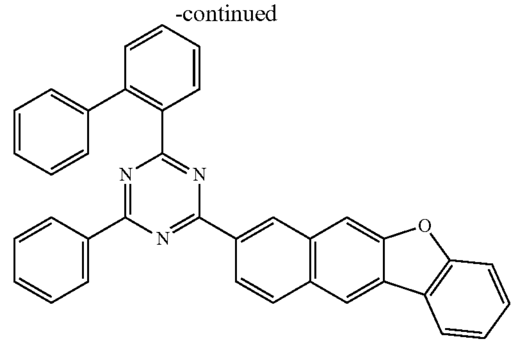

1-6

Sub 1-6 (56.7 g, 164.72 mmol) was put in a round bottom flask and dissolved in THF (604 mL). After Sub 2-3 (67.96 g, 197.66 mmol), $Pd(PPh_3)_4$ (7.61 g, 6.59 mmol), $K_2CO_3$ (68.30 g, 494.16 mmol) and water (302 mL) were added thereto, the mixture was stirred under reflux. When the reaction was completed, an organic layer of the reaction product was extracted using ether and water. The organic layer was dried over $MgSO_4$ and concentrated. Then, the concentrate was separated by a silica gel column and recrystallized to obtain 64.93 g (yield: 75%) of the product.

Synthesis Example of 1-46

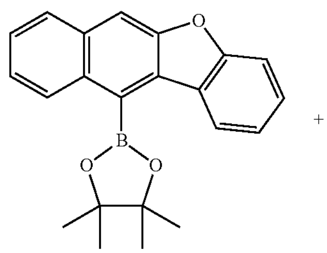

Sub 1-9

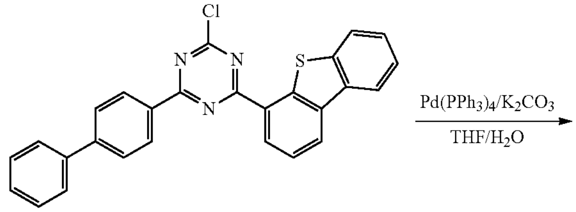

Sub 2-22

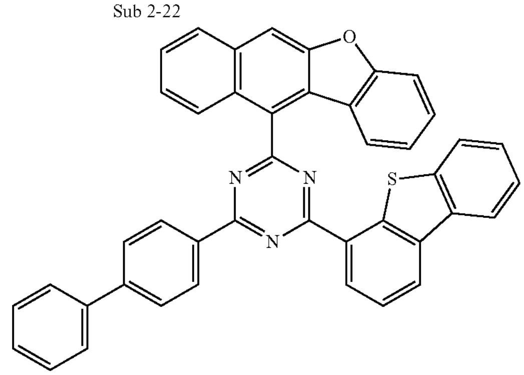

1-46

THF (604 mL), Sub 2-22 (88.94 g, 197.66 mmol), $Pd(PPh_3)_4$ (7.61 g, 6.59 mmol), $K_2CO_3$ (68.30 g, 494.16 mmol) and water (302 mL) were added to Sub 1-9 (56.7 g, 164.72 mmol), and then the reaction was carried out in the same manner as in the synthesis method of 1-6 to obtain a product 81.17 g (yield: 73%).

Synthesis Example of 1-81

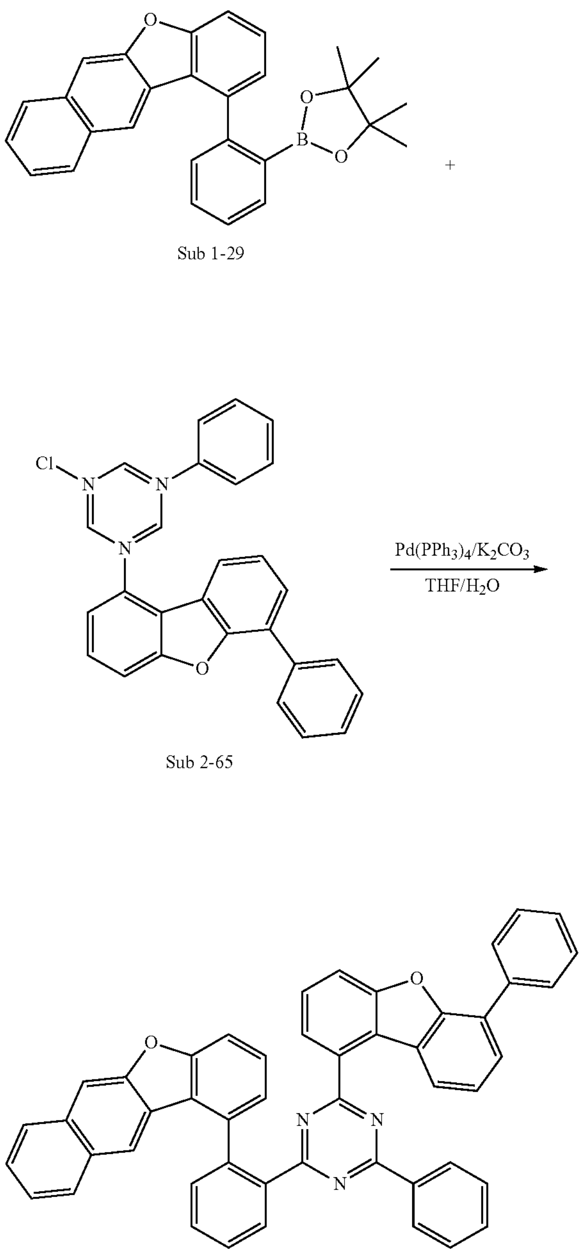

Sub 1-29

Sub 2-65

1-81

THF (495 mL), Sub 2-65 (70.24 g, 161.88 mmol), $Pd(PPh_3)_4$ (6.24 g, 5.40 mmol), $K_2CO_3$ (55.93 g, 404.69 mmol) and water (247 mL) were added to Sub 1-29 (56.7 g, 134.90 mmol), and then the reaction was carried out in the same manner as in the synthesis method of 1-6 to obtain a product 59.73 g (yield: 64%).

Synthesis Example of 1-92

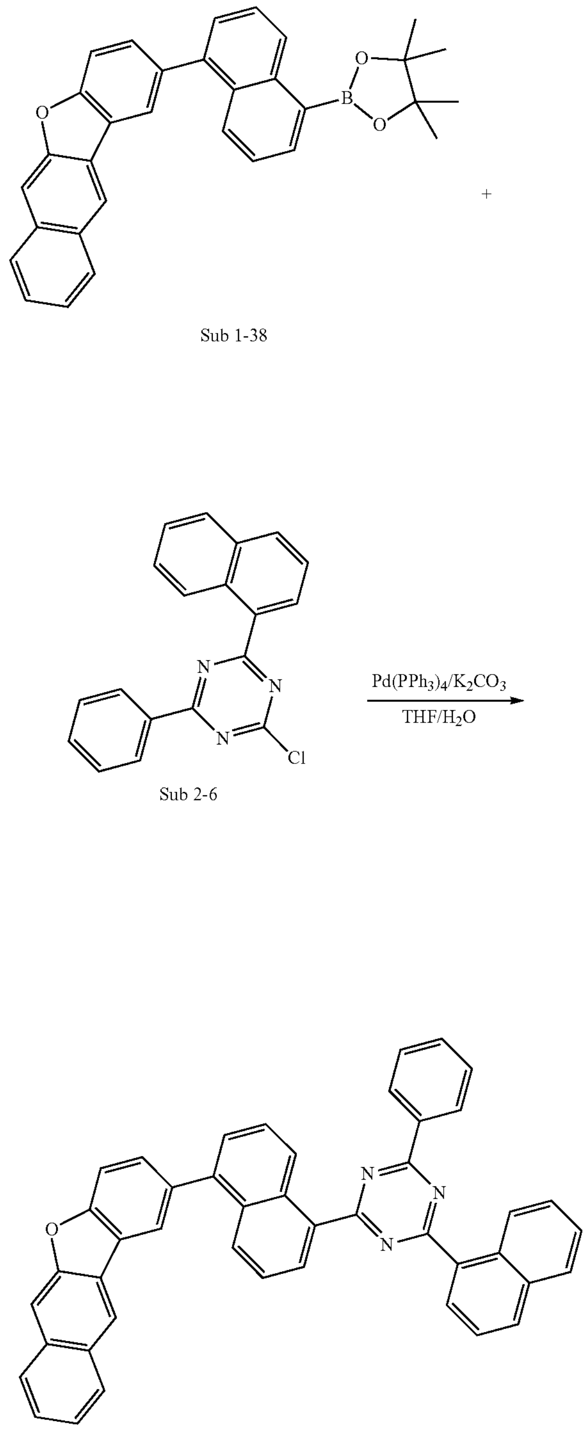

Sub 1-38

Sub 2-6

1-92

THF (442 mL), Sub 2-6 (45.97 g, 144.65 mmol), $Pd(PPh_3)_4$ (5.57 g, 4.82 mmol), $K_2CO_3$ (49.98 g, 361.62 mmol) and water (221 mL) were added to Sub 1-38 (56.7 g, 120.54 mmol), and then the reaction was carried out in the same manner as in the synthesis method of 1-6 to obtain a product 65.62 g (yield: 87%).

Synthesis Example of 1-122

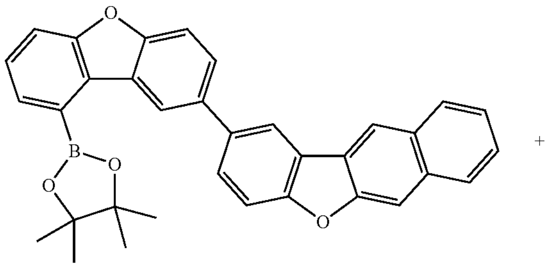

Sub 1-67

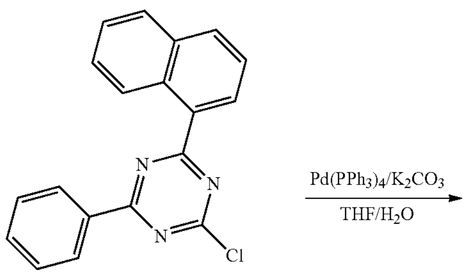

Sub 2-6

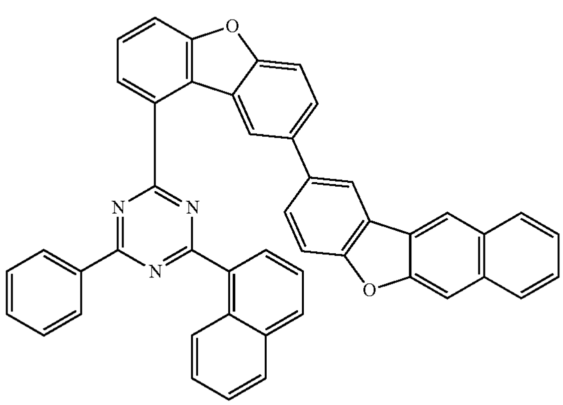

1-122

THF (407 mL), Sub 2-6 (42.36 g, 133.31 mmol), $Pd(PPh_3)_4$ (5.13 g, 4.44 mmol), $K_2CO_3$ (46.06 g, 333.27 mmol) and water (204 mL) were added to Sub 1-67 (56.7 g, 111.09 mmol), and then the reaction was carried out in the same manner as in the synthesis method of 1-6 to obtain a product 59.17 g (yield: 80%).

Synthesis Example of 1-148

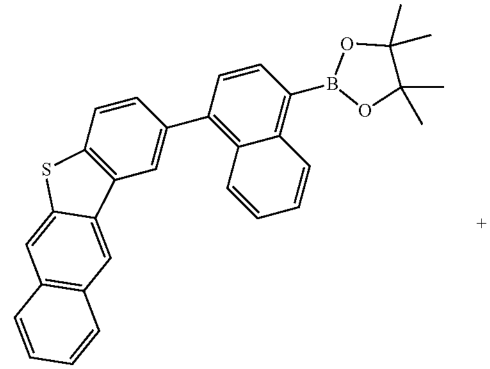

Sub 1-97

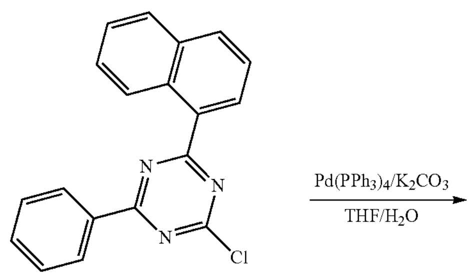

Sub 2-6

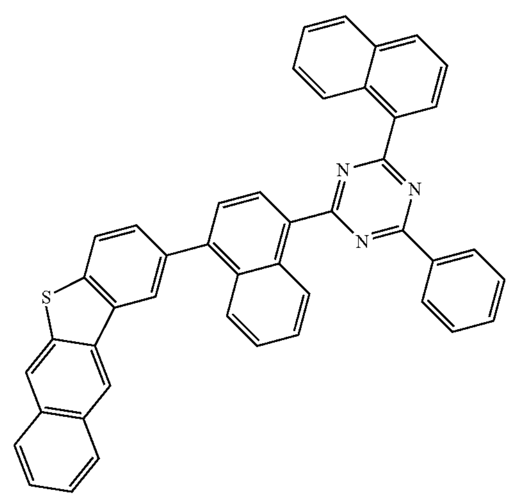

1-148

THF (427 mL), Sub 2-6 (44.45 g, 139.87 mmol), $Pd(PPh_3)_4$ (5.39 g, 4.66 mmol), $K_2CO_3$ (48.33 g, 349.68 mmol) and water (214 mL) were added to Sub 1-97 (56.7 g, 116.56 mmol), and then the reaction was carried out in the same manner as in the synthesis method of 1-6 to obtain a product 62.84 g (yield: 84%).

Synthesis Example of 1-157

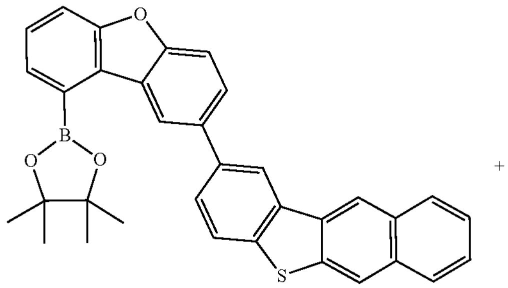

Sub 1-106

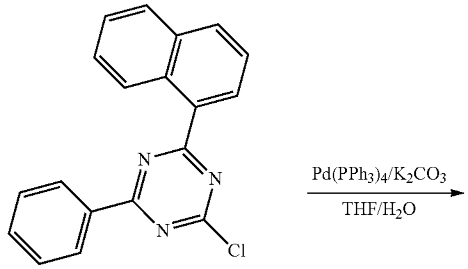

Sub 2-6

-continued

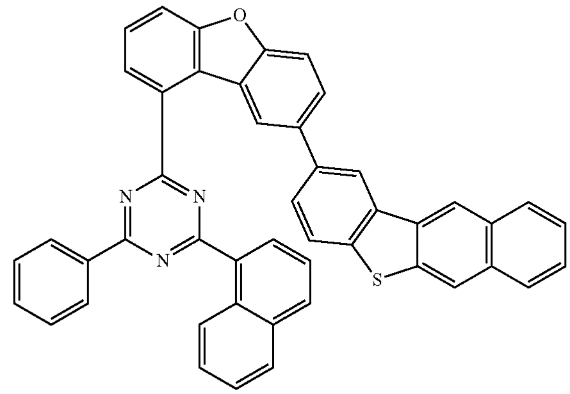

1-157

THF (395 mL), Sub 2-6 (41.07 g, 129.24 mmol), $Pd(PPh_3)_4$ (4.98 g, 4.31 mmol), $K_2CO_3$ (44.66 g, 323.10 mmol) and water (197 mL) were added to Sub 1-106 (56.7 g, 107.70 mmol), and then the reaction was carried out in the same manner as in the synthesis method of 1-6 to obtain a product 59.48 g (yield: 81%).

The FD-MS values of compounds 1-1 to 1-176 of the present invention synthesized by the same method as in Synthesis Example are shown in Table 3 below.

TABLE 3

| Compound | FD-MS | Compound | FD-MS |
|---|---|---|---|
| 1-1 | m/z = 449.15($C_{31}H_{19}N_3O$ = 449.51) | 1-2 | m/z = 525.18($C_{37}H_{23}N_3O$ = 525.61) |
| 1-3 | m/z = 449.15($C_{31}H_{19}N_3O$ = 449.51) | 1-4 | m/z = 449.15($C_{31}H1_{9}N_3O$ = 449.51) |
| 1-5 | m/z = 575.2($C_{41}H_{25}N_3O$ = 575.67) | 1-6 | m/z = 525.18($C_{37}H_{23}N_3O$ = 525.61) |
| 1-7 | m/z = 499.17($C_{35}H_{21}N_3O$ = 499.57) | 1-8 | m/z = 677.25($C_{49}H_{31}N_3O$ = 677.81) |
| 1-9 | m/z = 499.17($C_{35}H_{21}N_3O$ = 499.57) | 1-10 | m/z = 549.18($C_{39}H_{23}N_3O$ = 549.63) |
| 1-11 | m/z = 675.23($C_{49}H_{29}N_3O$ = 675.79) | 1-12 | m/z = 575.2($C_{41}H_{25}N_3O$ = 575.67) |
| 1-13 | m/z = 701.25($C_{51}H_{31}N_3O$ = 701.83) | 1-14 | m/z = 651.23($C_{47}H_{29}N_3O$ = 651.77) |
| 1-15 | m/z = 651.23($C_{47}H_{29}N_3O$ = 651.77) | 1-16 | m/z = 575.2($C_{41}H_{25}N_3O$ = 575.67) |
| 1-17 | m/z = 549.18($C_{39}H_{23}N_3O$ = 549.63) | 1-18 | m/z = 549.18($C_{39}H_{23}N_3O$ = 549.63) |
| 1-19 | m/z = 575.2($C_{41}H_{25}N_3O$ = 575.67) | 1-20 | m/z = 575.2($C_{41}H_{25}N_3O$ = 575.67) |
| 1-21 | m/z = 575.2($C_{41}H_{25}N_3O$ = 575.67) | 1-22 | m/z = 555.14($C_{37}H_{21}N_3OS$ = 555.66) |
| 1-23 | m/z = 605.16($C_{41}H_{23}N_3OS$ = 605.72) | 1-24 | m/z = 631.17($C_{43}H_{25}N_3OS$ = 631.75) |
| 1-25 | m/z = 631.17($C_{43}H_{25}N_3OS$ = 631.75) | 1-26 | m/z = 615.19($C_{43}H_{25}N_3O_2$ = 615.69) |
| 1-27 | m/z = 539.16($C_{37}H_{21}N_3O_2$ = 539.59) | 1-28 | m/z = 707.2($C_{49}H_{29}N_3OS$ = 707.85) |
| 1-29 | m/z = 707.2($C_{49}H_{29}N_3OS$ = 707.85) | 1-30 | m/z = 655.23($C_{46}H_{29}N_3O_2$ = 655.76) |
| 1-31 | m/z = 655.17($C_{45}H_{25}N_3OS$ = 655.78) | 1-32 | m/z = 631.17($C_{43}H_{25}N_3OS$ = 631.75) |
| 1-33 | m/z = 615.19($C_{43}H_{25}N_3O_2$ = 615.69) | 1-34 | m/z = 720.2($C_{49}H_{28}N_4OS$ = 720.85) |
| 1-35 | m/z = 705.21($C_{49}H_{27}N_3O_3$ = 705.77) | 1-36 | m/z = 691.23($C_{49}H_{29}N_3O_2$ = 691.79) |
| 1-37 | m/z = 757.22($C_{53}H_{31}N_3OS$ = 757.91) | 1-38 | m/z = 707.2($C_{49}H_{29}N_3OS$ = 707.85) |
| 1-39 | m/z = 707.2($C_{49}H_{29}N_3OS$ = 707.85) | 1-40 | m/z = 766.27($C_{55}H_{34}N_4O$ = 766.9) |
| 1-41 | m/z = 631.17($C_{43}H_{25}N_3OS$ = 631.75) | 1-42 | m/z = 631.17($C_{43}H_{25}N_3OS$ = 631.75) |
| 1-43 | m/z = 631.17($C_{43}H_{25}N_3OS$ = 631.75) | 1-44 | m/z = 707.2($C_{49}H_{29}N_3OS$ = 707.85) |
| 1-45 | m/z = 631.17($C_{43}H_{25}N_3OS$ = 631.75) | 1-46 | m/z = 631.17($C_{43}H_{25}N_3OS$ = 631.75) |
| 1-47 | m/z = 665.21($C_{47}H_{27}N_3O_2$ = 665.75) | 1-48 | m/z = 691.23($C_{49}H_{29}N_3O_2$ = 691.79) |
| 1-49 | m/z = 665.21($C_{47}H_{27}N_3O_2$ = 665.75) | 1-50 | m/z = 681.19($C_{47}H_{27}N_3OS$ = 681.81) |
| 1-51 | m/z = 757.22($C_{53}H_{31}N_3OS$ = 757.91) | 1-52 | m/z = 715.23($C_{51}H_{29}N_3O_2$ = 715.81) |
| 1-53 | m/z = 589.18($C_{41}H_{23}N_3O_2$ = 589.65) | 1-54 | m/z = 589.18($C_{41}H_{23}N_3O_2$ = 589.65) |
| 1-55 | m/z = 605.16($C_{41}H_{23}N_3OS$ = 605.72) | 1-56 | m/z = 589.18($C_{41}H_{23}N_3O_2$ = 589.65) |
| 1-57 | m/z = 605.16($C_{41}H_{23}N_3OS$ = 605.72) | 1-58 | m/z = 807.23($C_{57}H_{33}N_3OS$ = 807.97) |
| 1-59 | m/z = 691.23($C_{49}H_{29}N_3O_2$ = 691.79) | 1-60 | m/z = 591.18($C_{41}H_{25}N_3S$ = 591.73) |
| 1-61 | m/z = 515.15($C_{35}H_{21}N_3S$ = 515.63) | 1-62 | m/z = 617.19($C_{43}H_{27}N_3S$ = 617.77) |
| 1-63 | m/z = 565.16($C_{39}H_{23}N_3S$ = 565.69) | 1-64 | m/z = 565.16($C_{39}H_{23}N_3S$ = 565.69) |
| 1-65 | m/z = 581.19($C_{40}H_{27}N_3S$ = 581.74) | 1-66 | m/z = 555.14($C_{37}H_{21}N_3OS$ = 555.66) |
| 1-67 | m/z = 737.16($C_{49}H_{27}N_3OS_2$ = 737.9) | 1-68 | m/z = 518.16($C_{34}H_{22}N_4S$ = 518.64) |
| 1-69 | m/z = 515.15($C_{35}H_{21}N_3S$ = 515.63) | 1-70 | m/z = 561.19($C_{37}H_{27}N_3OS$ = 561.7) |
| 1-71 | m/z = 630.19($C_{43}H_{26}N_4S$ = 630.77) | 1-72 | m/z = 591.18($C_{41}H_{25}N_3S$ = 591.73) |
| 1-73 | m/z = 766.27($C_{55}H_{34}N_4O$ = 766.9) | 1-74 | m/z = 575.2($C_{41}H_{25}N_3O$ = 575.67) |
| 1-75 | m/z = 677.25($C_{49}H_{31}N_3O$ = 677.81) | 1-76 | m/z = 707.2($C_{49}H_{29}N_3OS$ = 707.85) |
| 1-77 | m/z = 766.27($C_{55}H_{34}N_4O$ = 766.9) | 1-78 | m/z = 707.2($C_{49}H_{29}N_3OS$ = 707.85) |
| 1-79 | m/z = 767.26($C_{55}H_{33}N_3O_2$ = 767.89) | 1-80 | m/z = 767.26($C_{55}H_{33}N_3O_2$ = 767.89) |
| 1-81 | m/z = 691.23($C_{49}H_{29}N_3O_2$ = 691.79) | 1-82 | m/z = 817.27($C_{59}H_{35}N_3O_2$ = 817.95) |

TABLE 3-continued

| Compound | FD-MS | Compound | FD-MS |
|---|---|---|---|
| 1-83 | m/z = 741.24($C_{53}H_{31}N_3O_2$ = 741.85) | 1-84 | m/z = 741.24($C_{53}H_{31}N_3O_2$ = 741.85) |
| 1-85 | m/z = 831.23($C_{59}H_{33}N_3OS$ = 831.99) | 1-86 | m/z = 767.26($C_{55}H_{33}N_3O_2$ = 767.89) |
| 1-87 | m/z = 757.19($C_{51}H_{27}N_5OS$ = 757.87) | 1-88 | m/z = 601.22($C_{43}H_{27}N_3O$ = 601.71) |
| 1-89 | m/z = 757.22($C_{53}H_{31}N_3OS$ = 757.91) | 1-90 | m/z = 625.22($C_{45}H_{27}N_3O$ = 625.73) |
| 1-91 | m/z = 625.22($C_{45}H_{27}N_3O$ = 625.73) | 1-92 | m/z = 625.22($C_{45}H_{27}N_3O$ = 625.73) |
| 1-93 | m/z = 625.22($C_{45}H_{27}N_3O$ = 625.73) | 1-94 | m/z = 651.23($C_{47}H_{29}N_3O$ = 651.77) |
| 1-95 | m/z = 731.2($C_{51}H_{29}N_3OS$ = 731.87) | 1-96 | m/z = 833.25($C_{59}H_{35}N_3OS$ = 834.01) |
| 1-97 | m/z = 757.22($C_{53}H_{31}N_3OS$ = 757.91) | 1-98 | m/z = 867.29($C_{63}H_{37}N_3O_2$ = 868.01) |
| 1-99 | m/z = 757.22($C_{53}H_{31}N_3OS$ = 757.91) | 1-100 | m/z = 655.23($C_{46}H_{29}N_3O_2$ = 655.76) |
| 1-101 | m/z = 625.22($C_{45}H_{27}N_3O$ = 625.73) | 1-102 | m/z = 625.22($C_{45}H_{27}N_3O$ = 625.73) |
| 1-103 | m/z = 625.22($C_{45}H_{27}N_3O$ = 625.73) | 1-104 | m/z = 807.23($C_{57}H_{33}N_3OS$ = 807.97) |
| 1-105 | m/z = 731.2($C_{51}H_{29}N_3OS$ = 731.87) | 1-106 | m/z = 731.2($C_{51}H_{29}N_3OS$ = 731.87) |
| 1-107 | m/z = 791.26($C_{57}H_{33}N_3O_2$ = 791.91) | 1-108 | m/z = 807.23($C_{57}H_{33}N_3OS$ = 807.97) |
| 1-109 | m/z = 807.23($C_{57}H_{33}N_3OS$ = 807.97) | 1-110 | m/z = 575.20($C_{41}H_{25}N_3O$ = 575.67) |
| 1-111 | m/z = 867.29($C_{63}H_{37}N_3O_2$ = 868.01) | 1-112 | m/z = 807.23($C_{57}H_{33}N_3OS$ = 807.97) |
| 1-113 | m/z = 777.28($C_{57}H_{35}N_3O$ = 777.93) | 1-114 | m/z = 803.29($C_{59}H_{37}N_3O$ = 803.97) |
| 1-115 | m/z = 632.26($C_{45}H_{20}D_7N_3O$ = 632.77) | 1-116 | m/z = 715.23($C_{51}H_{29}N_3O_2$ = 715.81) |
| 1-117 | m/z = 883.27($C_{63}H_{37}N_3OS$ = 884.07) | 1-118 | m/z = 833.25($C_{59}H_{35}N_3OS$ = 834.01) |
| 1-119 | m/z = 942.34($C_{69}H_{42}N_4O$ = 943.12) | 1-120 | m/z = 701.25($C_{51}H_{31}N_3O$ = 701.83) |
| 1-121 | m/z = 615.19($C_{43}H_{25}N_3O_2$ = 615.69) | 1-122 | m/z = 665.21($C_{47}H_{27}N_3O_2$ = 665.75) |
| 1-123 | m/z = 681.19($C_{47}H_{27}N_3OS$ = 681.81) | 1-124 | m/z = 715.23($C_{51}H_{29}N_3O_2$ = 715.81) |
| 1-125 | m/z = 691.23($C_{49}H_{29}N_3O_2$ = 691.79) | 1-126 | m/z = 691.23($C_{49}H_{29}N_3O_2$ = 691.79) |
| | | 1-128 | m/z = 691.23($C_{49}H_{29}N_3O_2$ = 691.79) |
| 1-129 | m/z = 757.22($C_{53}H_{31}N_3OS$ = 757.91) | 1-130 | m/z = 691.23($C_{49}H_{29}N_3O_2$ = 691.79) |
| 1-131 | m/z = 817.27($C_{59}H_{35}N_3O_2$ = 817.95) | 1-132 | m/z = 691.23($C_{49}H_{29}N_3O_2$ = 691.79) |
| 1-133 | m/z = 781.24($C_{55}H_{31}N_3O_3$ = 781.87) | 1-134 | m/z = 797.21($C_{55}H_{31}N_3O_2S$ = 797.93) |
| | | 1-136 | m/z = 691.23($C_{49}H_{29}N_3O_2$ = 691.79) |
| 1-137 | m/z = 691.23($C_{49}H_{29}N_3O_2$ = 691.79) | 1-138 | m/z = 780.25($C_{55}H_{32}N_4O_2$ = 780.89) |
| 1-139 | m/z = 691.23($C_{49}H_{29}N_3O_2$ = 691.79) | 1-140 | m/z = 781.18($C_{49}H_{24}F_5N_3O_2$ = 781.74) |
| 1-141 | m/z = 732.29($C_{53}H_{28}D_5N_3O$ = 732.9) | 1-142 | m/z = 793.27($C_{57}H_{35}N_3O_2$ = 793.93) |
| 1-143 | m/z = 651.23($C_{47}H_{29}N_3O$ = 651.77) | 1-144 | m/z = 755.26($C_{34}H_{33}N_3O_2$ = 755.88) |
| 1-145 | m/z = 591.18($C_{41}H_{25}N_3S$ = 591.73) | 1-146 | m/z = 617.19($C_{43}H_{27}N_3S$ = 617.77) |
| 1-147 | m/z = 707.24($C_{50}H_{33}N_3S$ = 707.9) | 1-148 | m/z = 641.19($C_{45}H_{27}N_3S$ = 641.79) |
| 1-149 | m/z = 641.19($C_{45}H_{27}N_3S$ = 641.79) | 1-150 | m/z = 641.19($C_{45}H_{27}N_3S$ = 641.79) |
| 1-151 | m/z = 793.26($C_{57}H_{35}N_3S$ = 793.99) | 1-152 | m/z = 641.19($C_{45}H_{27}N_3S$ = 641.79) |
| 1-153 | m/z = 667.21($C_{47}H_{29}N_3S$ = 667.83) | 1-154 | m/z = 823.21($C_{57}H_{33}N_3S_2$ = 824.03) |
| 1-155 | m/z = 883.27($C_{53}H_{37}N_3OS$ = 884.07) | 1-156 | m/z = 747.18($C_{51}H_{29}N_3S_2$ = 747.93) |
| 1-157 | m/z = 681.19($C_{47}H_{27}N_3OS$ = 681.81) | 1-158 | m/z = 697.16($C_{47}H_{27}N_3S_2$ = 697.87) |
| 1-159 | m/z = 731.2($C_{51}H_{29}N_3OS$ = 731.87) | 1-160 | m/z = 631.17($C_{43}H_{25}N_3OS$ = 631.75) |
| | | 1-162 | m/z = 737.16($C_{49}H_{27}N_3OS_2$ = 737.9) |
| 1-163 | m/z = 707.2($C_{49}H_{29}N_3OS$ = 707.85) | 1-164 | m/z = 707.2($C_{49}H_{29}N_3OS$ = 707.85) |
| 1-165 | m/z = 747.18($C_{51}H_{29}N_3S_2$ = 747.93) | 1-166 | m/z = 681.19($C_{47}H_{27}N_3OS$ = 681.81) |
| 1-167 | m/z = 731.2($C_{51}H_{29}N_3OS$ = 731.87) | 1-168 | m/z = 631.17($C_{43}H_{25}N_3OS$ = 631.75) |
| 1-169 | m/z = 731.2($C_{51}H_{29}N_3OS$ = 731.87) | 1-170 | m/z = 721.18($C_{49}H_{27}N_3O_2S$ = 721.83) |
| 1-171 | m/z = 691.23($C_{49}H_{29}N_3O_2$ = 691.79) | 1-172 | m/z = 691.23($C_{49}H_{29}N_3O_2$ = 691.79) |
| 1-173 | m/z = 741.24($C_{53}H_{31}N_3O_2$ = 741.85) | 1-174 | m/z = 807.23($C_{57}H_{33}N_3OS$ = 807.97) |
| 1-175 | m/z = 799.21($C_{55}H_{33}N_3S_2$ = 800.01) | 1-176 | m/z = 757.22($C_{53}H_{31}N_3OS$ = 757.91) |

[Synthesis Example 2] Formula 2

The compound (Final product 2) represented by Formula 2 of the present invention may be prepared by reacting Sub 3 and Sub 4 as shown in Reaction Scheme 4 below, but is not limited thereto.

<Reaction Scheme 4>

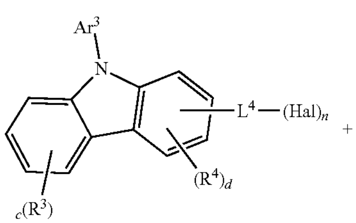

*Hal = halogen (F, Cl, Br, I)

Sub 3

-continued

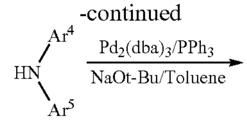

Sub 4

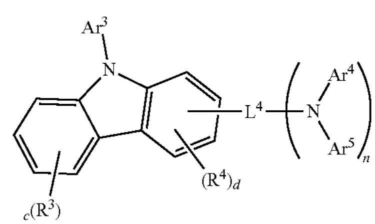

Final Products 2

The compounds belonging to Sub 3 of Reaction Scheme 4 are as follows, but are not limited thereto.

-continued
Sub 3-1
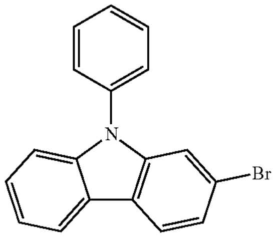
Sub 3-2
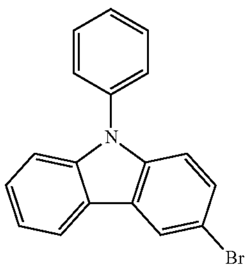
Sub 3-3
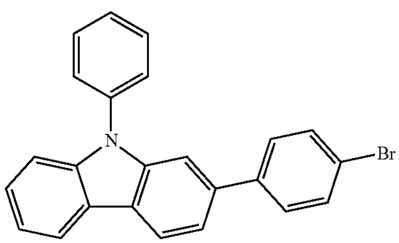
Sub 3-4
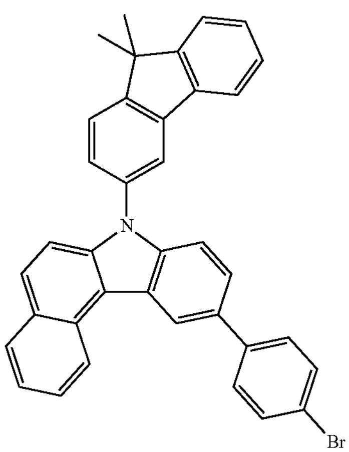
Sub 3-5
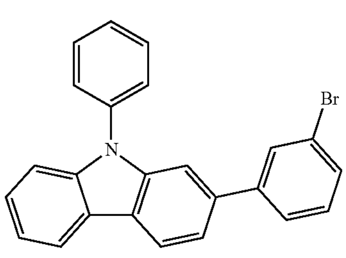
Sub 3-6
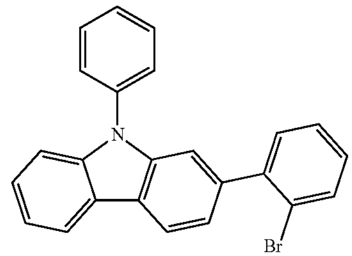
Sub 3-7
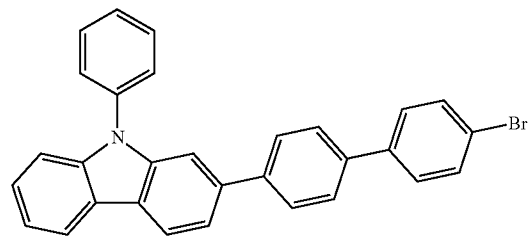
Sub 3-8
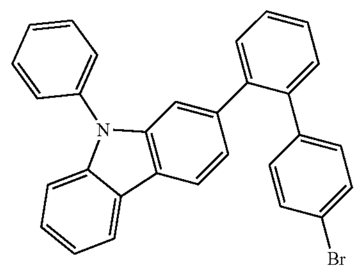
Sub 3-9
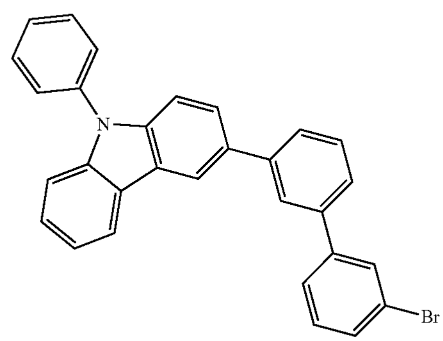
Sub 3-10
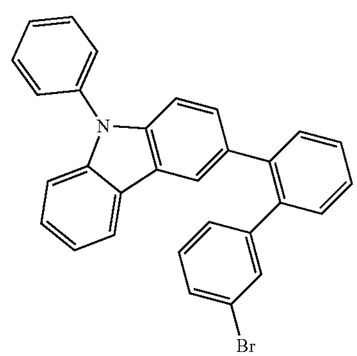

-continued
Sub 3-11
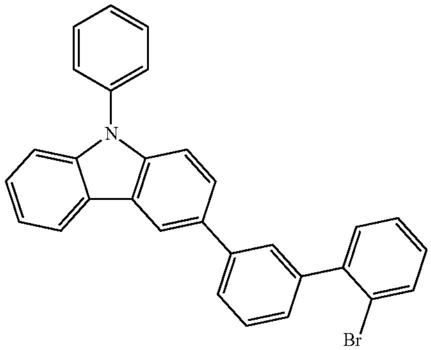
Sub 3-12
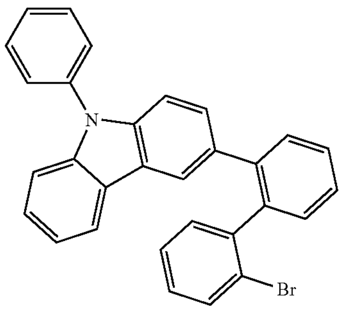
Sub 3-13
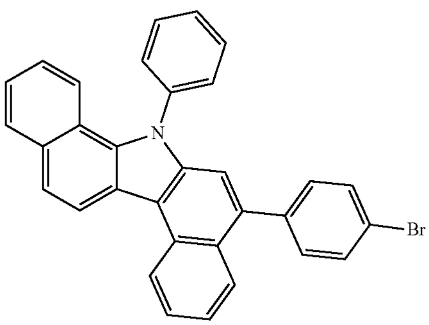
Sub 3-14
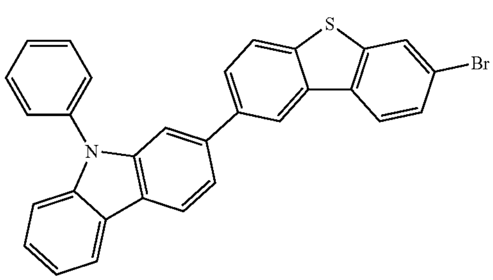
Sub 3-15
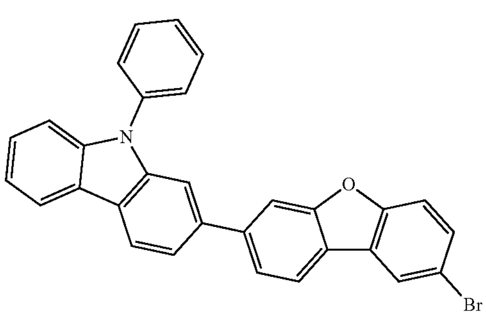
-continued
Sub 3-16
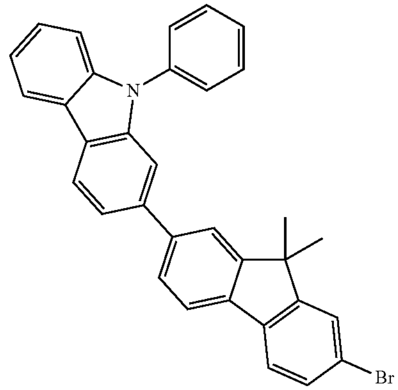
Sub 3-17
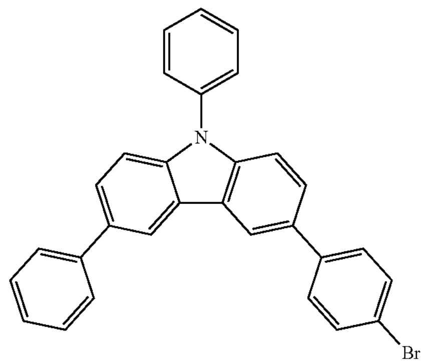
Sub 3-18
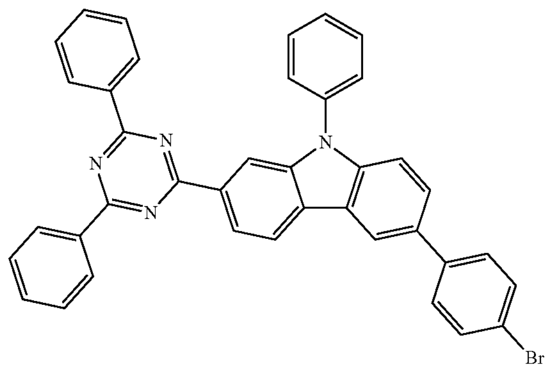
Sub 3-19
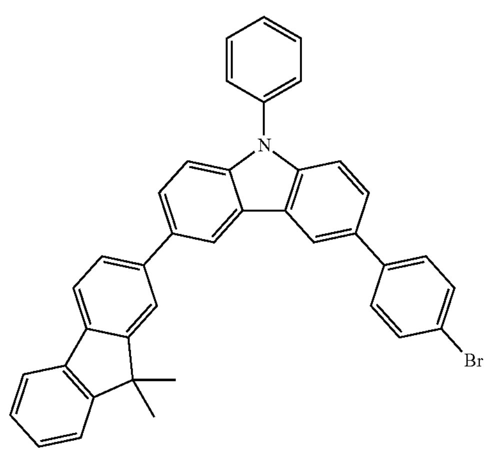

-continued
Sub 3-20
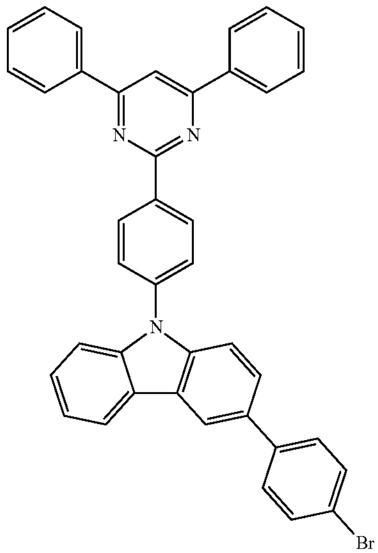
Sub 3-21
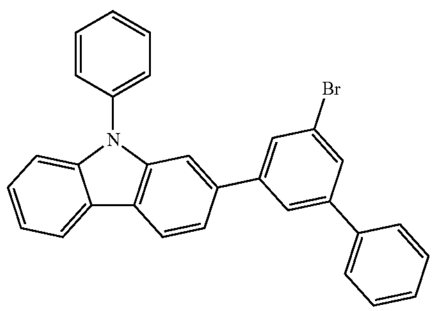
Sub 3-22
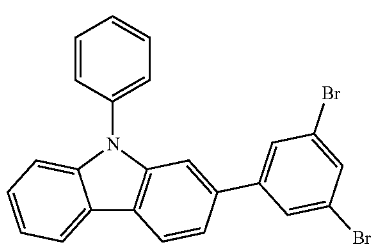
Sub 3-23
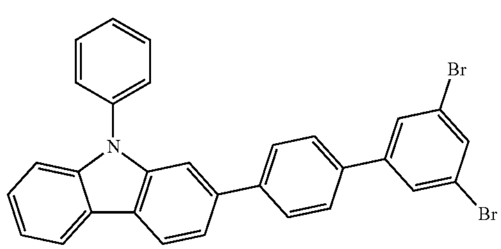
-continued
Sub 3-24
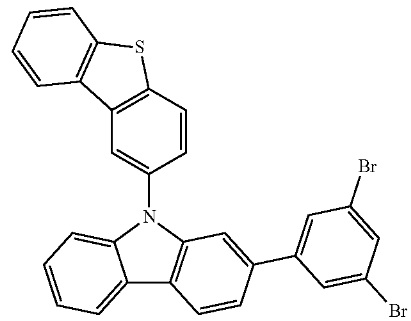
Sub 3-25
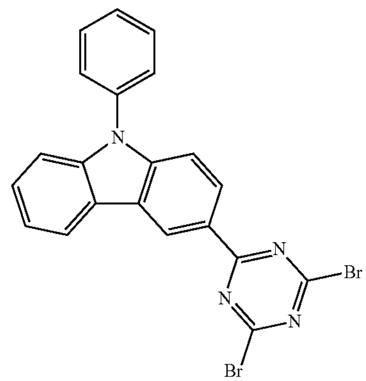
Sub 3-26
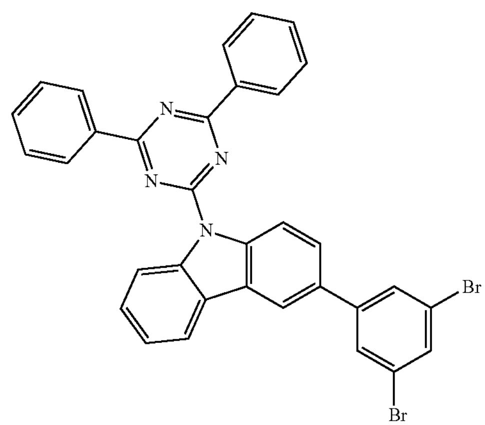
Sub 3-27
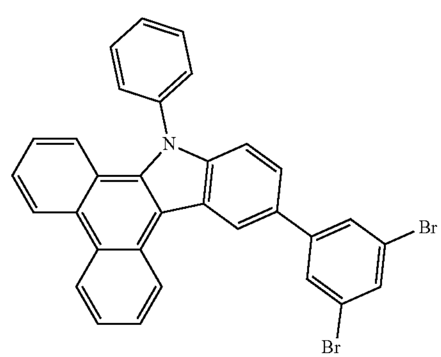

-continued

Sub 3-28

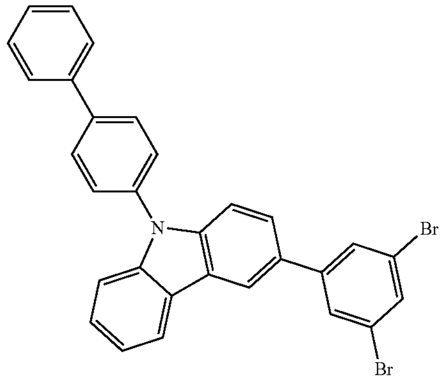

Sub 3-29

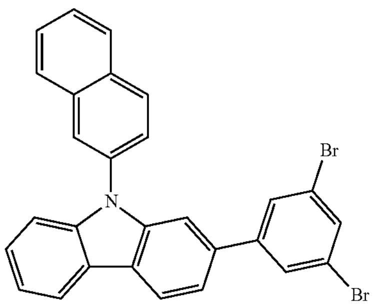

Sub 3-30

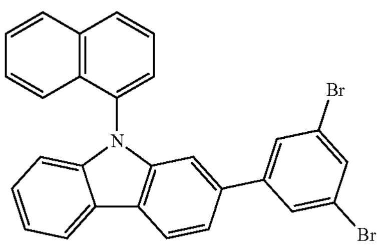

-continued

Sub 3-31

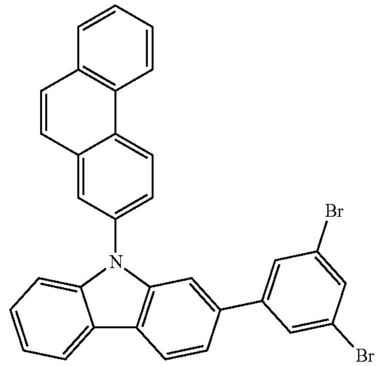

Sub 3-32

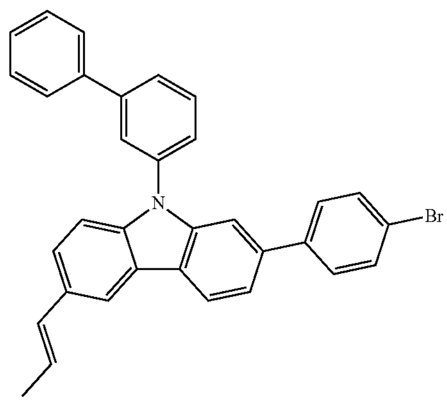

The FD-MS values of the compounds belonging to Sub 3 are shown in Table 4 below.

TABLE 4

| Compound | FD-MS | Compound | FD-MS |
|---|---|---|---|
| Sub 3-1 | m/z = 321.02($C_{18}H_{12}BrN$ = 322.21) | Sub 3-2 | m/z = 321.02($C_{18}H_{12}BrN$ = 322.21) |
| Sub 3-3 | m/z = 397.05($C_{24}H_{16}BrN$ = 398.30) | Sub 3-4 | m/z = 563.12($C_{37}H_{26}BrN$ = 564.53) |
| Sub 3-5 | m/z = 397.05($C_{24}H_{16}BrN$ = 398.30) | Sub 3-6 | m/z = 397.05($C_{24}H_{16}BrN$ = 398.30) |
| Sub 3-7 | m/z = 473.08($C_{30}H_{20}BrN$ = 474.40) | Sub 3-8 | m/z = 473.08($C_{30}H_{20}BrN$ = 474.40) |
| Sub 3-9 | m/z = 473.08($C_{30}H_{20}BrN$ = 474.40) | Sub 3-10 | m/z = 473.08($C_{30}H_{20}BrN$ = 474.40) |
| Sub 3-11 | m/z = 473.08($C_{30}H_{20}BrN$ = 474.40) | Sub 3-12 | m/z = 473.08($C_{30}H_{20}BrN$ = 474.40) |
| Sub 3-13 | m/z = 497.08($C_{32}H_{20}BrN$ = 498.42) | Sub 3-14 | m/z = 503.03($C_{30}H_{18}BrNS$ = 504.45) |
| Sub 3-15 | m/z = 487.06($C_{30}H_{18}BrNO$ = 488.38) | Sub 3-16 | m/z = 513.11($C_{33}H_{24}BrN$ = 514.47) |
| Sub 3-17 | m/z = 473.08($C_{30}H_{20}BrN$ = 474.40) | Sub 3-18 | m/z = 628.13($C_{39}H_{25}BrN_4$ = 629.56) |
| Sub 3-19 | m/z = 589.14($C_{39}H_{28}BrN$ = 590.56) | Sub 3-20 | m/z = 627.13($C_{40}H_{26}BrN_3$ = 628.57) |
| Sub 3-21 | m/z = 473.08($C_{30}H_{20}BrN$ = 474.40) | Sub 3-22 | m/z = 474.96($C_{24}H_{15}Br_2N$ = 477.20) |
| Sub 3-23 | m/z = 550.99($C_{30}H_{19}Br_2N$ = 553.30) | Sub 3-24 | m/z = 580.94($C_{30}H_{17}Br_2N$ = 580.34) |
| Sub 3-25 | m/z = 477.94($C_{21}H_{12}Br_2N_4$ = 480.16) | Sub 3-26 | m/z = 630.01($C_{33}H_{20}Br_2N_4$ = 632.36) |
| Sub 3-27 | m/z = 574.99($C_{32}H_{19}Br_2N$ = 577.32) | Sub 3-28 | m/z = 550.99($C_{30}H_{19}Br_2N$ = 553.30) |
| Sub 3-29 | m/z = 524.97($C_{28}H_{17}Br_2N$ = 527.26) | Sub 3-30 | m/z = 524.97($C_{28}H_{17}Br_2N$ = 527.26) |
| Sub 3-31 | m/z = 574.99($C_{32}H_{19}Br_2N$ = 577.32) | Sub 3-32 | m/z = 513.11($C_{33}H_{24}BrN$ = 514.47) |

The compounds belonging to Sub 4 of Reaction Scheme 4 are as follows, but are not limited thereto.

Sub 4-1
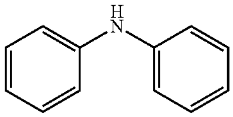
Sub 4-2
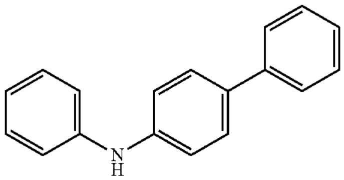
Sub 4-3
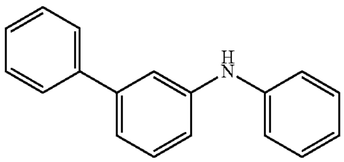
Sub 4-4
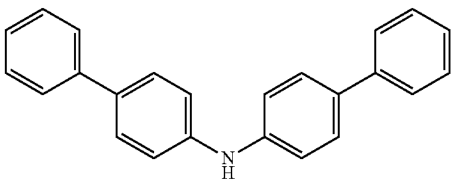
Sub 4-5
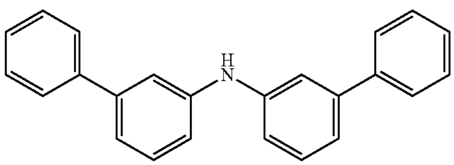
Sub 4-6
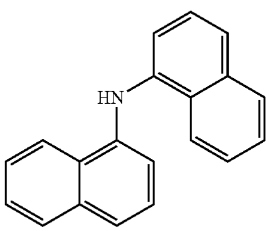
Sub 4-7
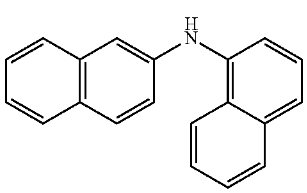
Sub 4-8
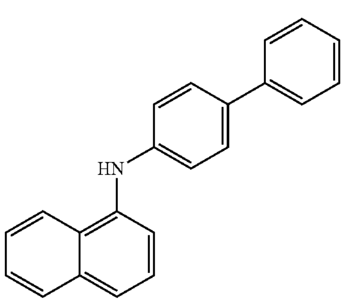
-continued
Sub 4-9
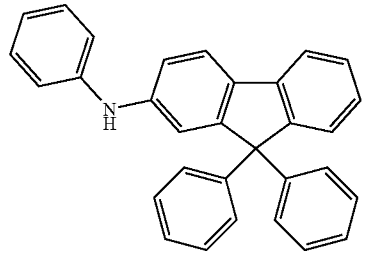
Sub 4-10
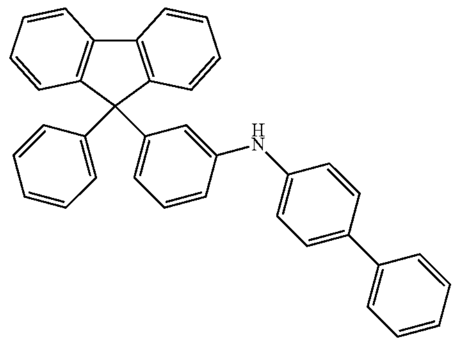
Sub 4-11
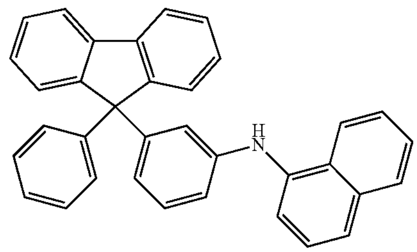
Sub 4-12
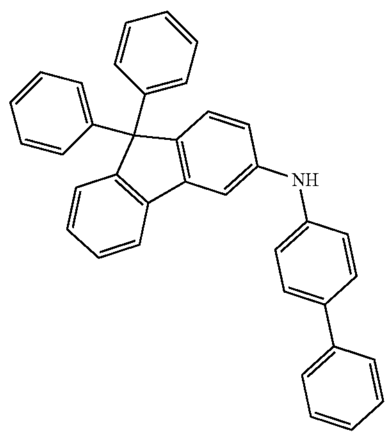
Sub 4-13
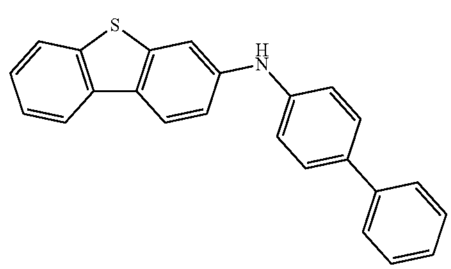

-continued
Sub 4-14
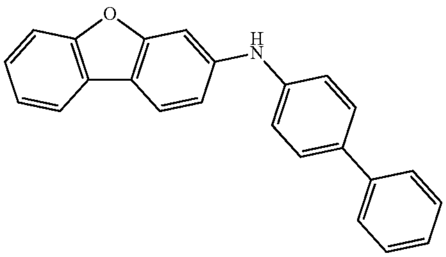
Sub 4-15
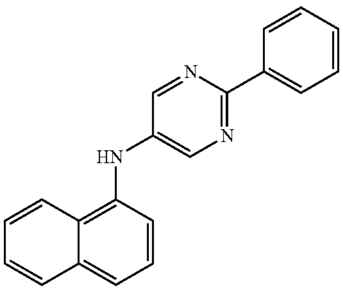
Sub 4-16
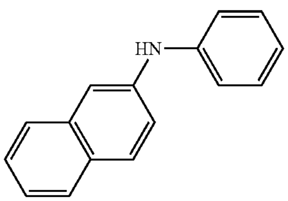
Sub 4-17
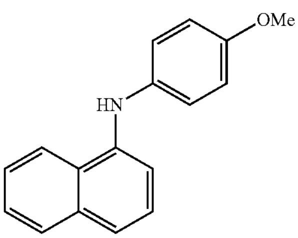
Sub 4-18
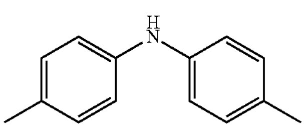
Sub 4-19
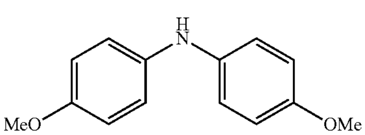
Sub 4-20
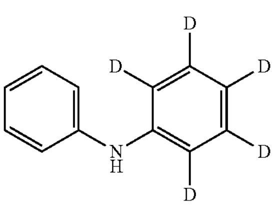
Sub 4-21
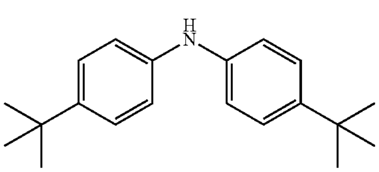
-continued
Sub 4-22
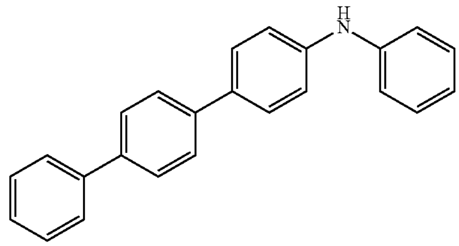
Sub 4-23
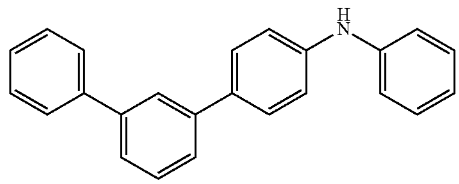
Sub 4-24
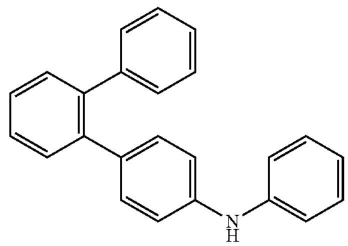
Sub 4-25
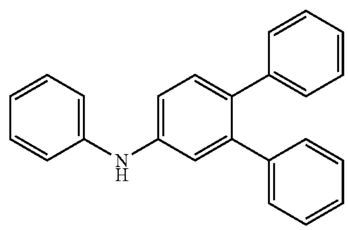
Sub 4-26
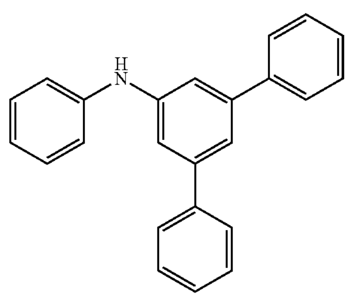
Sub 4-27
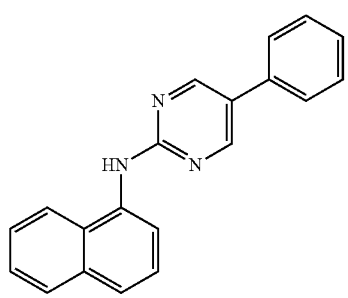

-continued
Sub 4-28
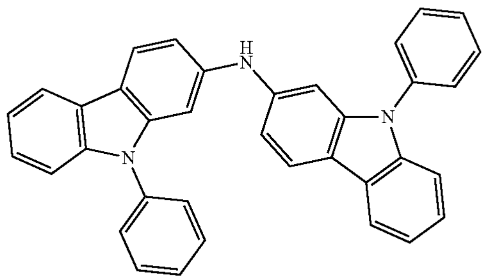
Sub 4-29
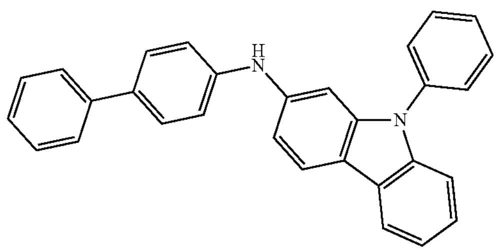
Sub 4-30
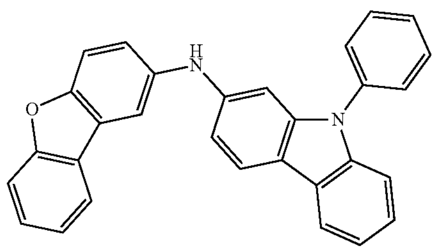
Sub 4-31
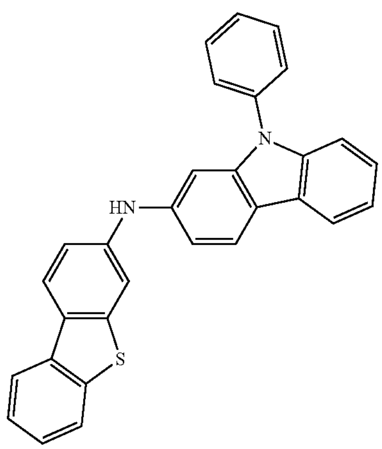
Sub 4-32
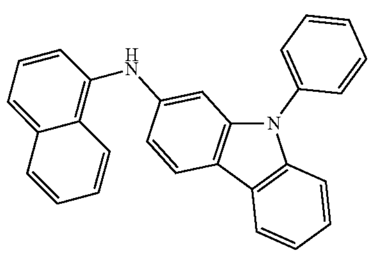
-continued
Sub 4-33
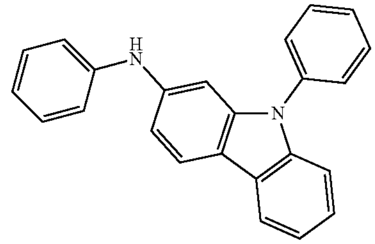
Sub 4-34
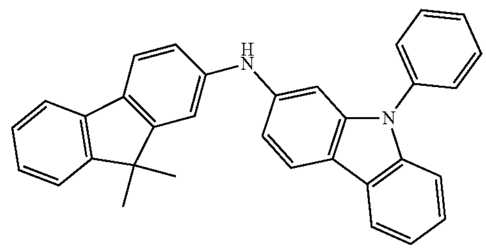
Sub 4-35
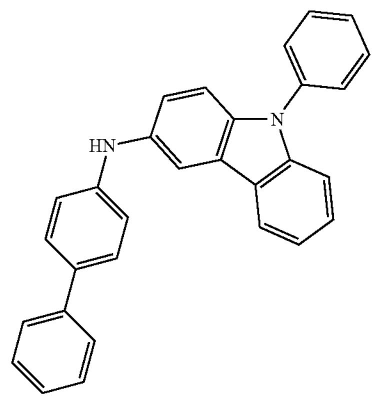
Sub 4-36
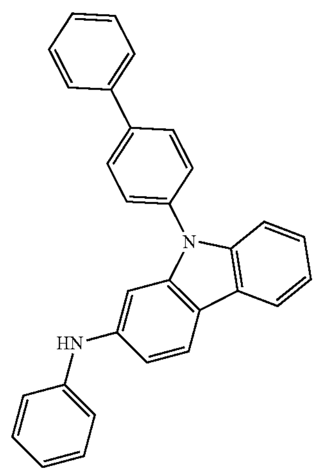

-continued
Sub 4-37
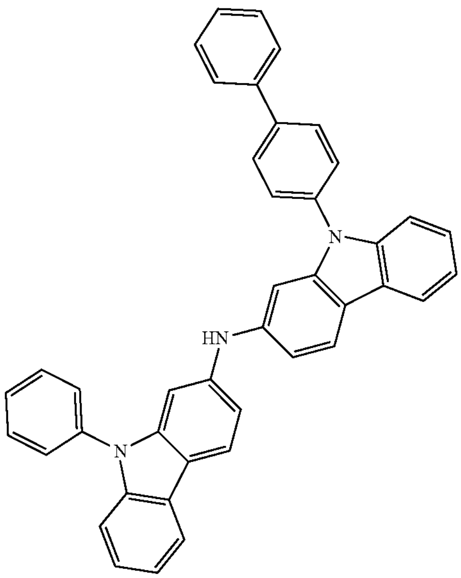
Sub 4-38
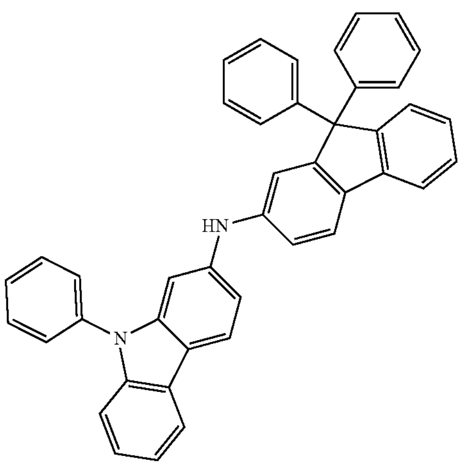
Sub 4-39
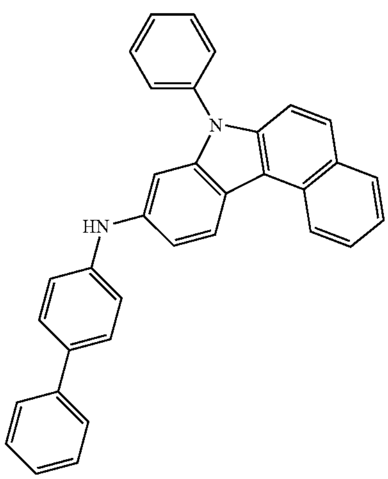
-continued
Sub 4-40
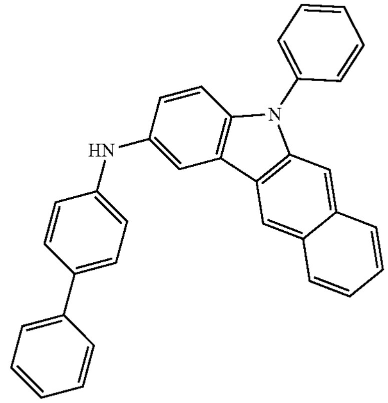
Sub 4-41
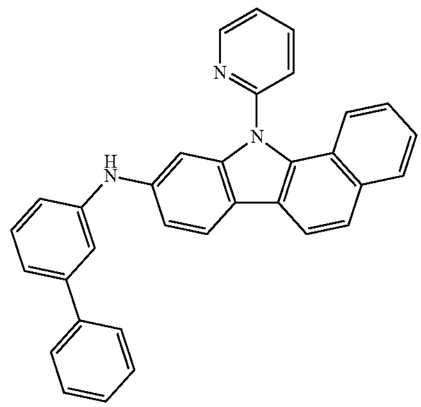
Sub 4-42
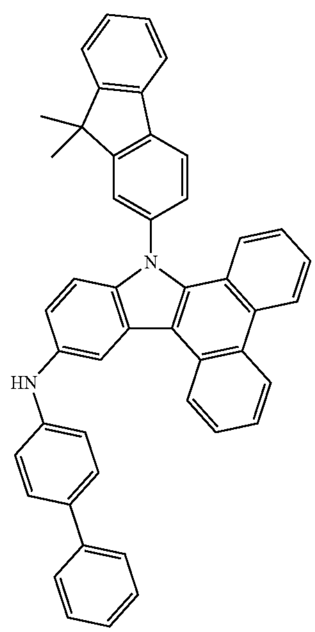

Sub 4-43

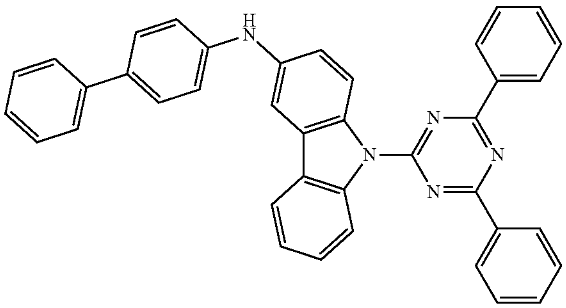

Sub 4-44

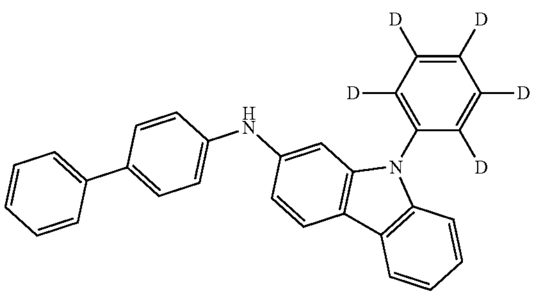

-continued

Sub 4-45

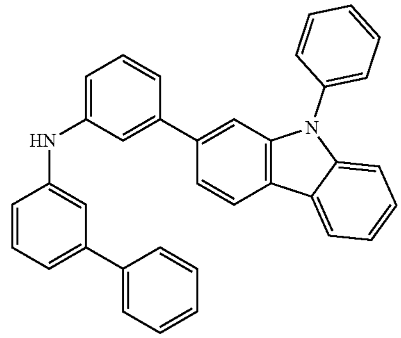

Sub 4-46

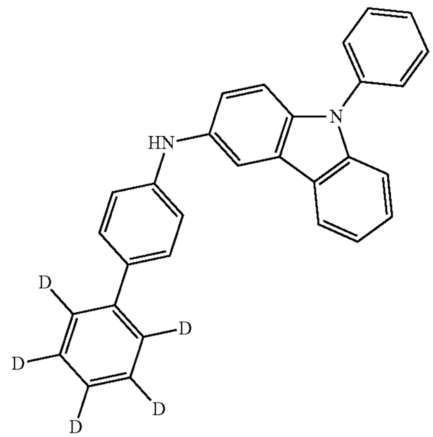

The FD-MS values of the compounds belonging to Sub 4 are shown in Table 5 below.

TABLE 5

| Compound | FD-MS | Compound | FD-MS |
|---|---|---|---|
| Sub 4-1 | m/z = 169.09($C_{12}H_{11}N$ = 169.22) | Sub 4-2 | m/z = 245.12($C_{18}H_{15}N$ = 245.32) |
| Sub 4-3 | m/z = 245.12($C_{18}H_{15}N$ = 245.32) | Sub 4-4 | m/z = 321.15($C_{24}H_{19}N$ = 321.41) |
| Sub 4-5 | m/z = 321.15 ($C_{24}H_{19}N$ = 321.41) | Sub 4-6 | m/z = 269.12($C_{20}H_{15}N$ = 269.34) |
| Sub 4-7 | m/z = 269.12($C_{20}H1_{5}N$ = 269.34) | Sub 4-8 | m/z = 295.14($C_{22}H_{17}N$ = 295.38) |
| Sub 4-9 | m/z = 409.18($C_{31}H_{23}N$ = 409.52) | Sub 4-10 | m/z = 483.20($C_{37}H_{25}N$ = 483.60) |
| Sub 4-11 | m/z = 459.20($C_{35}H_{25}N$ = 459.58) | Sub 4-12 | m/z = 485.21($C_{37}H_{27}N$ = 485.62) |
| Sub 4-13 | m/z = 275.08($C_{18}H_{13}NS$ = 275.37) | Sub 4-14 | m/z = 335.13($C_{24}H_{17}NO$ = 335.40) |
| Sub 4-15 | m/z = 297.13($C_{20}H_{15}N_3$ = 297.35) | Sub 4-16 | m/z = 219.10($C_{16}H_{13}N$ = 219.28) |
| Sub 4-17 | m/z = 249.12($C_{17}H_{15}NO$ = 249.31) | Sub 4-18 | m/z = 197.12($C_{14}H_{15}N$ = 197.28) |
| Sub 4-19 | m/z = 229.11($C_{14}H_{15}NO_2$ = 229.27) | Sub 4-20 | m/z = 174.12($C_{12}H_6D_5N$ = 174.25) |
| Sub 4-21 | m/z = 281.21($C_{20}H_{27}N$ = 281.44) | Sub 4-22 | m/z = 321.15($C_{24}H_{19}N$ = 321.41) |
| Sub 4-23 | m/z = 321.15($C_{24}H_{19}N$ = 321.41) | Sub 4-24 | m/z = 321.15($C_{24}H_{19}N$ = 321.41) |
| Sub 4-25 | m/z = 321.15($C_{24}H_{19}N$ = 321.41) | Sub 4-26 | m/z = 321.15($C_{24}H_{19}N$ = 321.41) |
| Sub 4-27 | m/z = 297.13($C_{20}H_{15}N_3$ = 297.35) | Sub 4-28 | m/z = 499.20($C_{36}H_{25}N_3$ = 499.60) |
| Sub 4-29 | m/z = 499.20($C_{36}H_{22}N_2$ = 410.51) | Sub 4-30 | m/z = 424.16($C_{30}H_{20}N_2O$ = 424.49) |
| Sub 4-31 | m/z = 440.13($C_{30}H_{20}N_2S$ = 440.56) | Sub 4-32 | m/z = 384.16($C_{28}H_{20}N_2$ = 384.47) |
| Sub 4-33 | m/z = 334.15($C_{24}H_{18}N_2$ = 334.41) | Sub 4-34 | m/z = 450.21($C_{33}H_{26}N_2$ = 450.57) |
| Sub 4-35 | m/z = 410.18($C_{30}H_{22}N_2$ = 410.51) | Sub 4-36 | m/z = 410.18($C_{30}H_{22}N_2$ = 410.51) |
| Sub 4-37 | m/z = 575.24($C_{42}H_{29}N_3$ = 575.70) | Sub 4-38 | m/z = 574.24($C_{43}H_{30}N_2$ = 574.71) |
| Sub 4-39 | m/z = 460.19($C_{34}H_{24}N_2$ = 460.57) | Sub 4-40 | m/z = 460.19($C_{34}H_{24}N_2$ = 460.57) |
| Sub 4-41 | m/z = 461.19($C_{33}H_{23}N_3$ = 461.56) | Sub 4-42 | m/z = 626.27($C_{47}H_{34}N_2$ = 626.79) |
| Sub 4-43 | m/z = 565.23($C_{39}H_{27}N_5$ = 565.67) | Sub 4-44 | m/z = 415.21($C_{30}H_{17}D_5N_2$ = 415.54) |
| Sub 4-45 | m/z = 486.21($C_{36}H_{26}N_2$ = 486.61) | Sub 4-46 | m/z = 415.21($C_{30}H_{17}D_5N_2$ = 415.54) |

1. Synthesis Example of Sub 3

Sub 3 may be synthesized by the reaction route of the following Reaction Scheme 4-1, but are not limited thereto.

<Reaction Scheme 4-1>

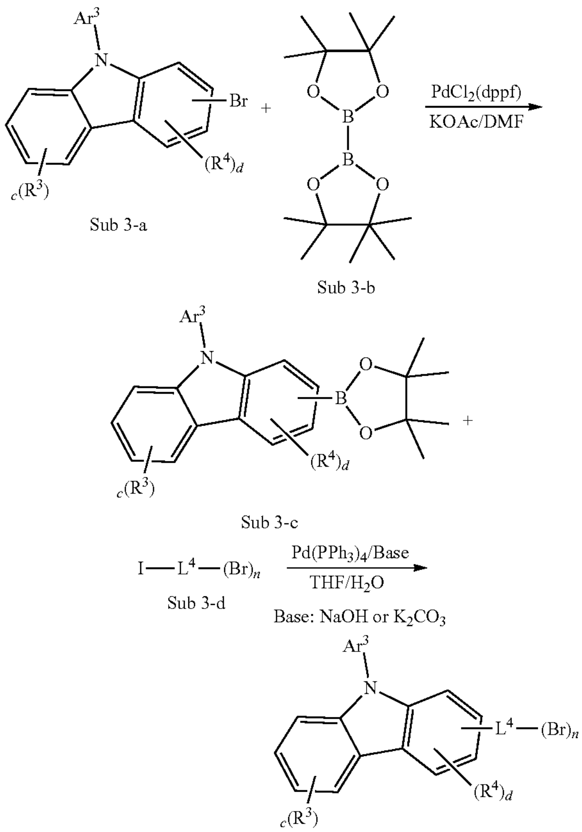

Sub 3

Synthesis Example of Sub 3-c(1)

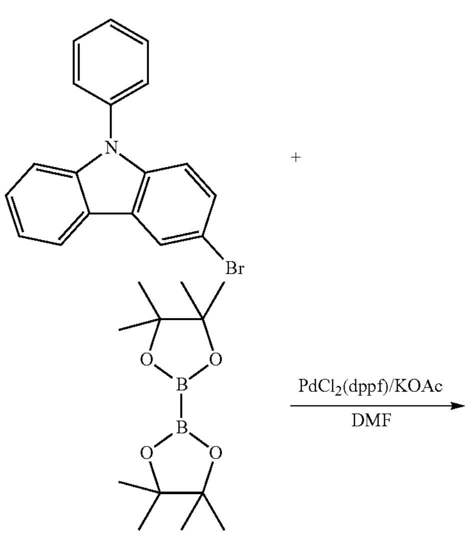

-continued

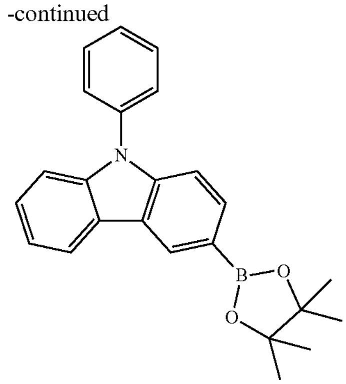

3-bromo-9-phenyl-9H-carbazole (45.1 g, 140 mmol) was dissolved in DMF (980 mL), and bispinacolborate (39.1 g, 154 mmol), $PdCl_2(dppf)$ catalyst (3.43 g, 4.2 mmol) and KOAc (41.3 g, 420 mmol) were sequentially added to the solution. Then, the mixture was stirred for 24 hours. The resulting intermediate product was separated by a silica gel column and recrystallized to obtain 35.2 g (68%) of a final compound.

Synthesis Example of Sub 3-c(2)

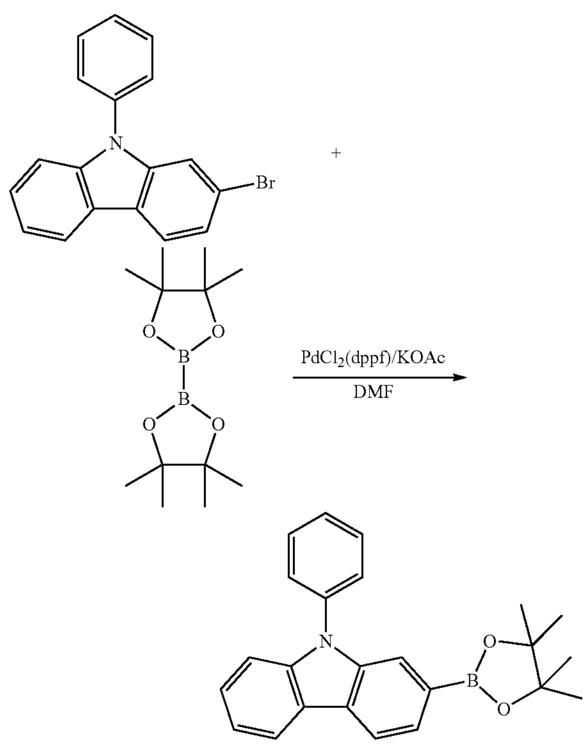

2-bromo-9-phenyl-9H-carbazole (76.78 g, 238.3 mmol) was dissolved in DMF (980 mL), and bis(pinacolato)diboron (66.57 g, 262.1 mmol), $Pd(dppf)Cl_2$ (5.84 g, 7.1 mmol), KOAc (70.16 g, 714.9 mmol) were sequentially added to the solution. Then, the mixture was stirred for 24 hours. The resulting intermediate product was separated by a silica gel column and recrystallized to obtain 73.92 g (yield: 84%) of a final compound.

Synthesis Example of Sub 3-3

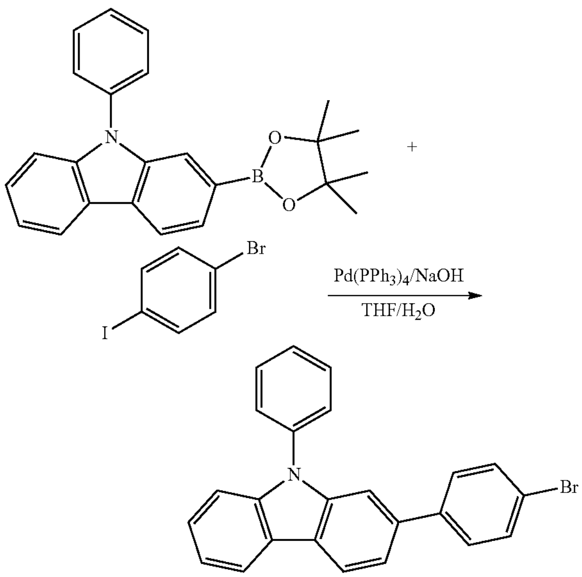

Sub 3-c(2) (29.5 g, 80 mmol) was dissolved in THF (360 mL), and 1-bromo-4-iodobenzene (23.8 g, 84 mmol), $Pd(PPh_3)_4$ (2.8 g, 2.4 mmol), NaOH (9.6 g, 240 mmol) and water (180 mL) were added to the solution. Then, the mixture was stirred under reflux. When the reaction was completed, an organic layer of the reaction product was extracted using ether and water. The organic layer was dried over $MgSO_4$ and concentrated. Then, the concentrate was separated by a silica gel column and recrystallized to obtain 22.9 g (72%) of the product.

Synthesis Example of Sub 3-5

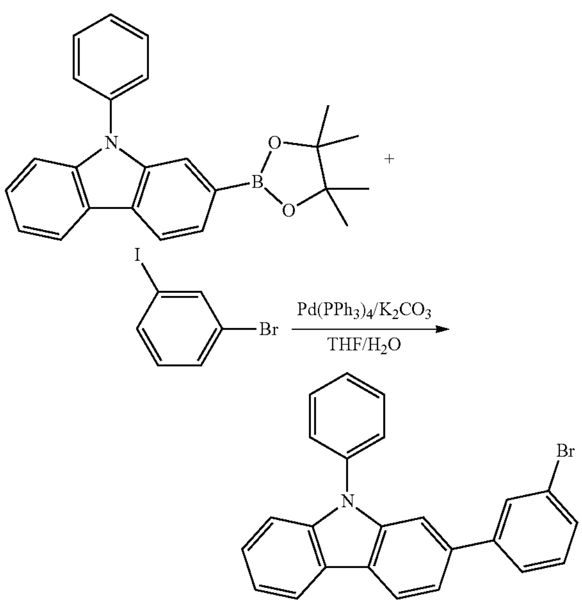

Sub 3-c(2) (73.92 g, 200.2 mmol) was dissolved in THF (880 mL) in a round bottom flask, and 1-bromo-2-iodobenzene (85.0 g, 300.3 mmol), $Pd(PPh_3)_4$ (11.6 g, 10 mmol), $K_2CO_3$ (83 g, 600.6 mmol) and water (440 mL) were added to the solution. Then, the mixture was stirred under reflux. When the reaction was completed, an organic layer of the reaction product was extracted using ether and water. The organic layer was dried over $MgSO_4$ and concentrated. Then, the concentrate was separated by a silica gel column and recrystallized to obtain 55.8 g (yield: 70%) of the product.

Synthesis Example of Sub 3-10

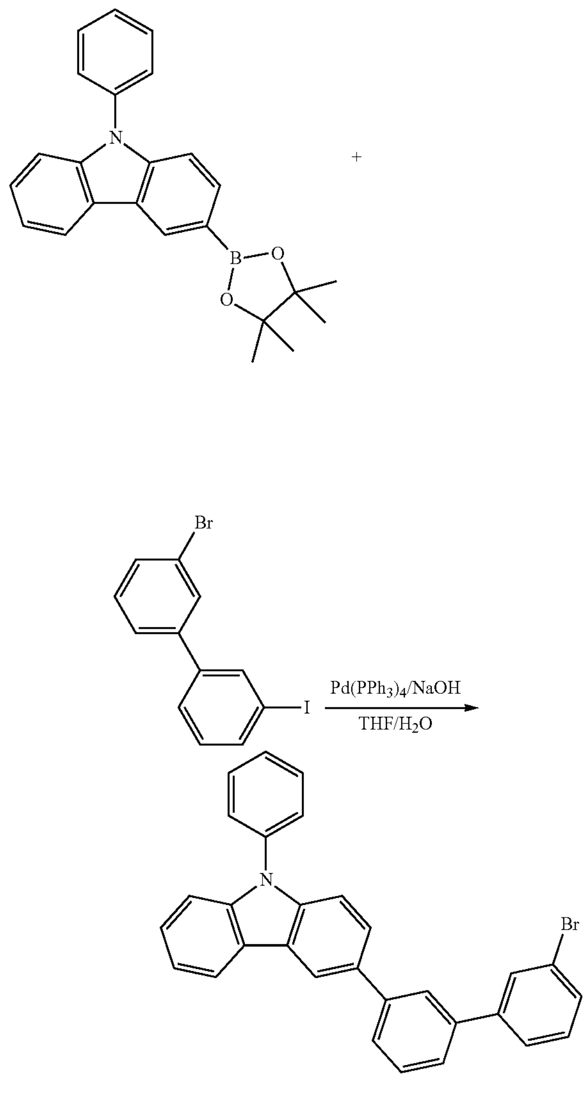

Sub 3-c(1) (29.5 g, 80 mmol) was dissolved in THF (360 mL), and 3-bromo-3'-iodo-1,1'-biphenyl (30.16 g, 84 mmol), $Pd(PPh_3)_4$ (2.8 g, 2.4 mmol), NaOH (9.6 g, 240 mmol) and water (180 mL) were added to the solution. Then, the mixture was stirred under reflux. When the reaction was completed, an organic layer of the reaction product was extracted using ether and water. The organic layer was dried over $MgSO_4$ and concentrated. Then, the concentrate was separated by a silica gel column and recrystallized to obtain 26.56 g (70%) of the product.

Synthesis Example of Sub 3-15

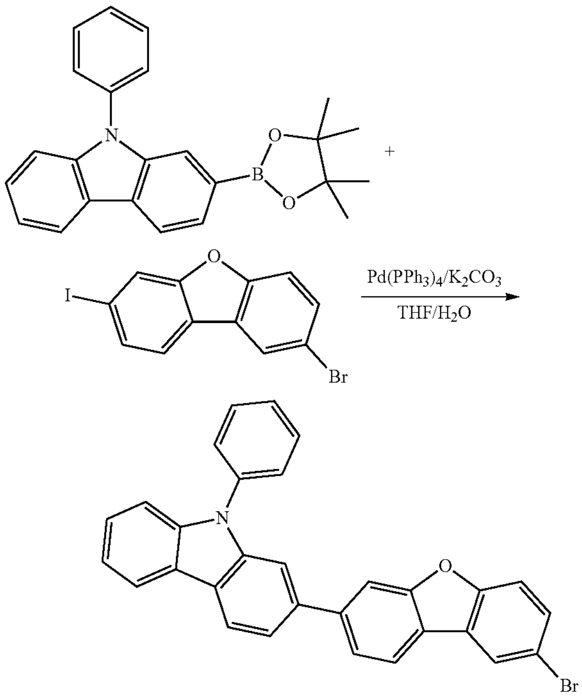

Sub 3-c(2) (73.92 g, 200.2 mmol) was dissolved in THF (880 mL) in a round bottom flask, and 2-bromo-7-iododibenzo[b,d]furan (112.0 g, 300.3 mmol), $Pd(PPh_3)_4$ (11.6 g, 10 mmol), $K_2CO_3$ (83 g, 600.6 mmol) and water (440 mL) were added to the solution. Then, the mixture was stirred under reflux. When the reaction was completed, an organic layer of the reaction product was extracted using ether and water. The organic layer was dried over $MgSO_4$ and concentrated. Then, the concentrate was separated by a silica gel column and recrystallized to obtain 72.4 g (yield: 74%) of the product.

Synthesis Example of Sub 3-22

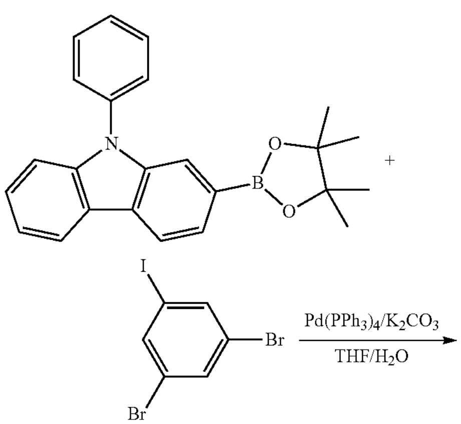

-continued

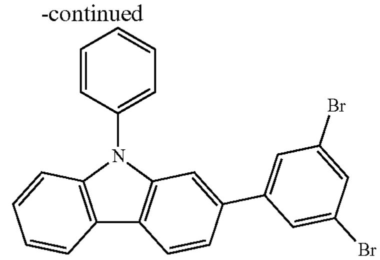

Sub 3-c(2) (73.92 g, 200.2 mmol) was dissolved in THF (880 mL) in a round bottom flask, and 1,3-dibromo-5-iodobenzene (108.65 g, 300.3 mmol), $Pd(PPh_3)_4$ (11.6 g, 10 mmol), $K_2CO_3$ (83 g, 600.6 mmol) and water (440 mL) were added to the solution. Then, the mixture was stirred under reflux. When the reaction was completed, an organic layer of the reaction product was extracted using ether and water. The organic layer was dried over $MgSO_4$ and concentrated. Then, the concentrate was separated by a silica gel column and recrystallized to obtain 69.7 g (yield: 73%) of the product.

2. Synthesis Example of Sub 4

Sub 4 of Reaction Scheme 4 may be synthesized by the reaction route of the following Reaction Scheme 4-2, but are not limited thereto.

<Reaction Scheme 4-2>

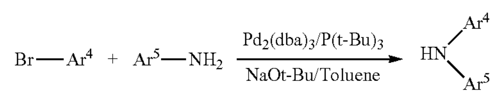

Sub 4

Synthesis Example of Sub 4-1

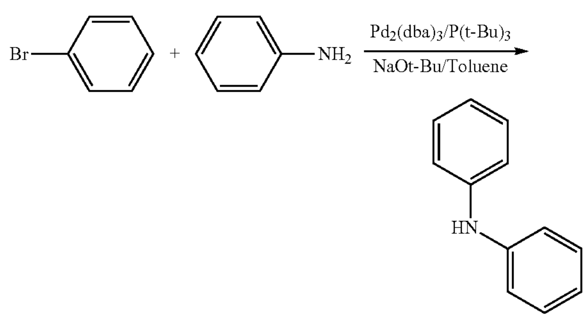

Bromobenzene (37.1 g, 236.2 mmol) was dissolve in toluene (2200 mL) in a round bottom flask, and aniline (20 g, 214.8 mmol), $Pd_2(dba)_3$ (9.83 g, 10.7 mmol), $P(t\text{-}Bu)_3$ (4.34 g, 21.5 mmol) and NaOt-Bu (62 g, 644.3 mmol) were added sequentially to the solution. Then, the mixture was stirred at 100° C. When the reaction was completed, an organic layer of the reaction product was extracted using ether and water. The organic layer was dried over $MgSO_4$ and concentrated. Then, the concentrate was separated by a silica gel column and recrystallized to obtain 28 g (yield: 77%) of the product.

Synthesis Example of Sub 4-13

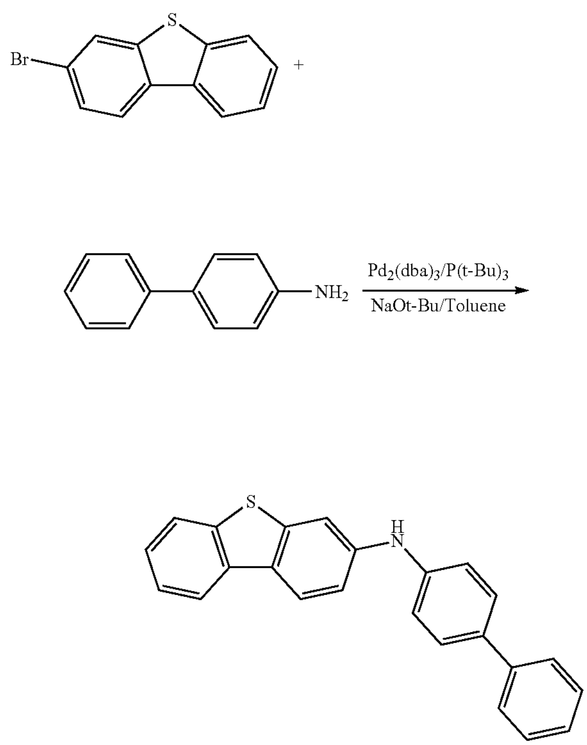

3-bromodibenzo[b,d]thiophene (42.8 g, 162.5 mmol) was dissolve in toluene (1550 mL) in a round bottom flask, and [1,1'-biphenyl]-4-amine (25 g, 147.7 mmol), $Pd_2(dba)_3$ (6.76 g, 7.4 mmol), $P(t\text{-}Bu)_3$ (3 g, 14.8 mmol) and NaOt-Bu (42.6 g, 443.2 mmol) were added to the solution. Then, the mixture was stirred at 100° C. When the reaction was completed, an organic layer of the reaction product was extracted using ether and water. The organic layer was dried over $MgSO_4$ and concentrated. Then, the concentrate was separated by a silica gel column and recrystallized to obtain 37.9 g (yield: 73%) of the product.

3. Synthesis Example of Final Products

Synthesis Example of 2-10

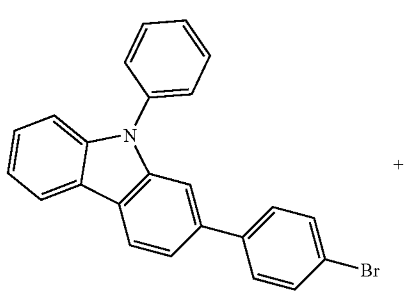

Sub 3-5

-continued

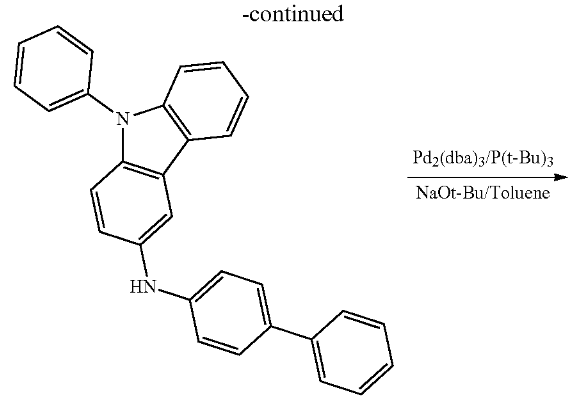

Sub 4-35

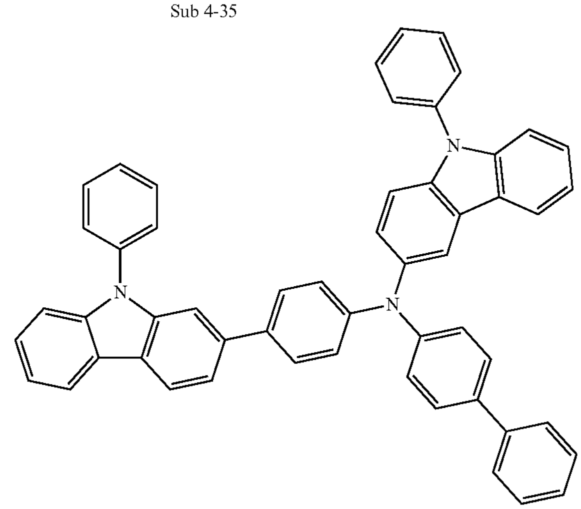

2-10

Sub 3-5 (20.7 g, 52.0 mmol) was dissolve in toluene (500 mL) in a round bottom flask, and Sub 4-35 (24.5 g, 59.8 mmol), $Pd_2(dba)_3$ (2.4 g, 2.6 mmol), $P(t\text{-}Bu)_3$ (1.05 g, 5.2 mmol) and NaOt-Bu (13.6 g, 141.8 mmol) were added to the solution. Then, the mixture was stirred at 100° C. When the reaction was completed, an organic layer of the reaction product was extracted using $CH_2Cl_2$ and water. The organic layer was dried over $MgSO_4$ and concentrated. Then, the concentrate was separated by a silica gel column and recrystallized to obtain 26.48 g (yield: 70%) of the product.

Synthesis Example of 2-37

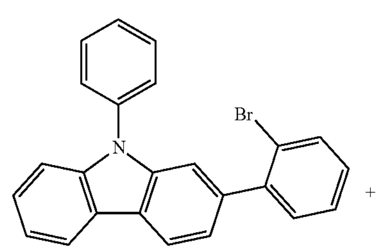

Sub 3-6

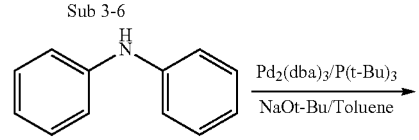

-continued

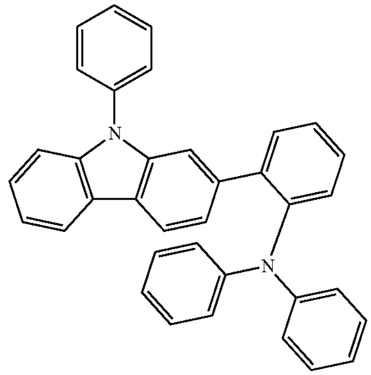

2-37

16.1 g (yield: 70%) of product was synthesized using Sub 3-6 (20.7 g, 52.0 mmol), toluene (500 mL), Sub 4-1 (8.0 g, 47.3 mmol), $Pd_2(dba)_3$ (2.4 g, 2.6 mmol), $P(t\text{-}Bu)_3$ (1.05 g, 5.2 mmol) and NaOt-Bu (13.6 g, 141.8 mmol) by the same manner as in the synthesis method of 2-10.

Synthesis Example of 2-54

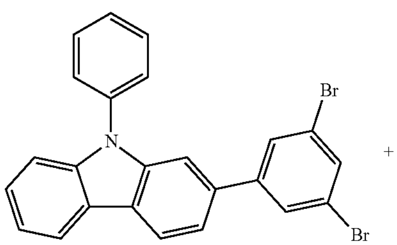

Sub 3-22

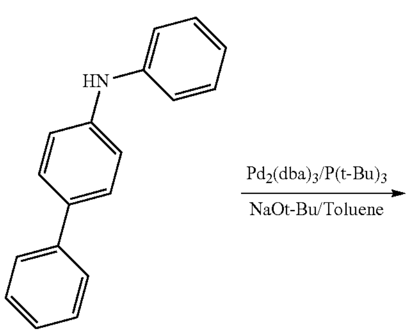

Sub 4-2

-continued

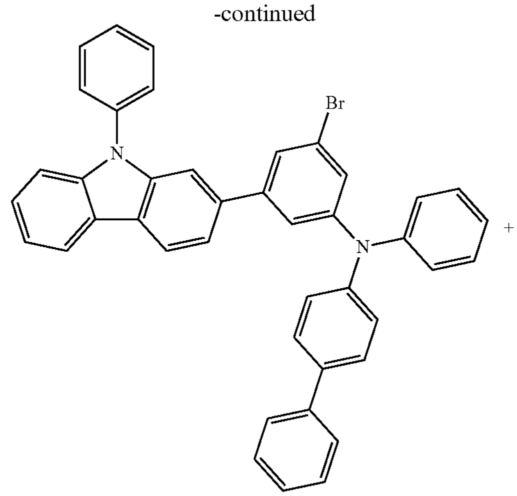

Inter_A-1

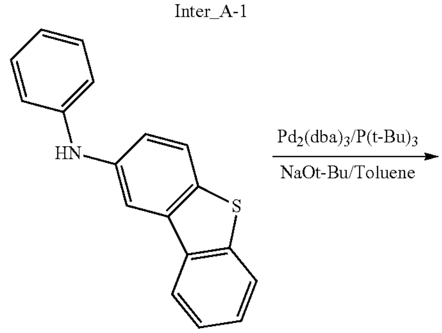

Sub 4-13

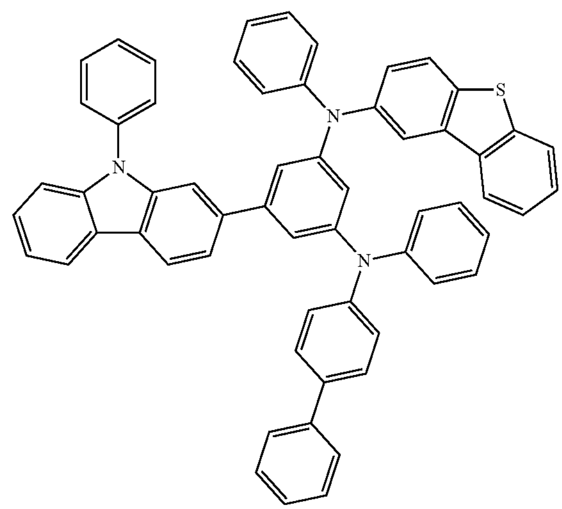

2-54

(1) Synthesis of Inter_A-1

25.01 g (yield: 62%) of a product Inter_A-1 was synthesized using Sub 3-22 (24.8 g, 52.0 mmol), Sub 4-2 (11.6 g, 47.3 mmol), toluene (500 mL), $Pd_2(dba)_3$ (2.4 g, 2.6 mmol), $P(t\text{-}Bu)_3$ (1.05 g, 5.2 mmol) and NaOt-Bu (13.6 g, 141.8 mmol) by the same manner as in the synthesis method of 2-10.

(2) Synthesis of 2-54

19.7 g (yield: 74%) of a product 2-54 was synthesized using Inter_A-1 (20.5 g, 32 mmol), Sub 4-13 (10.1 g, 36.7 mmol), toluene (305 mL), $Pd_2(dba)_3$ (1.5 g, 1.6 mmol), $P(t\text{-}Bu)_3$ (0.65 g, 3.2 mmol) and NaOt-Bu (8.4 g, 87.2 mmol) by the same manner as in the synthesis method of 2-10.

Synthesis Example of 2-73

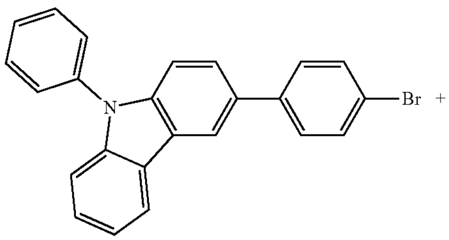

Sub 3-33

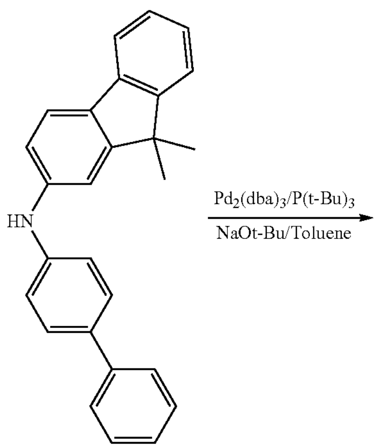

Sub 4-46

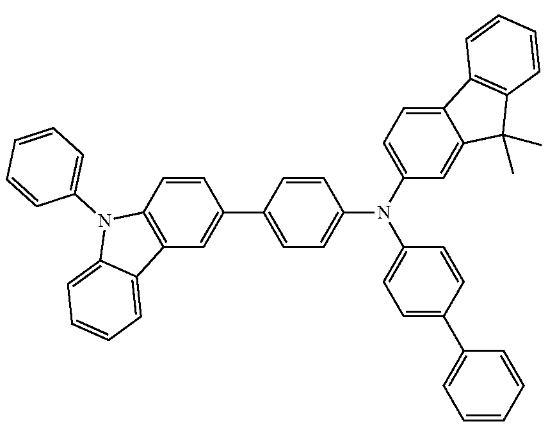

2-73

12.7 g (yield: 85%) of a product 2-73 was synthesized using Sub 3-33 (8.73 g, 22 mmol), Sub 4-46 (9.1 g, 25.2 mmol), $Pd_2(dba)_3$ (1 g, 1.1 mmol), $P(t\text{-}Bu)_3$ (0.4 g, 2.2 mmol), NaOt-Bu (5.74 g, 60 mmol) and toluene (210 mL) by the same manner as in the synthesis method of 2-10.

Synthesis Example of 2-86

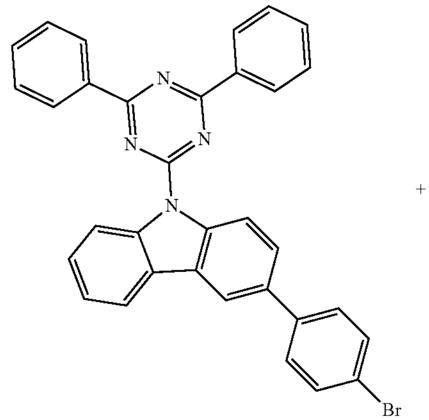

Sub 3-34

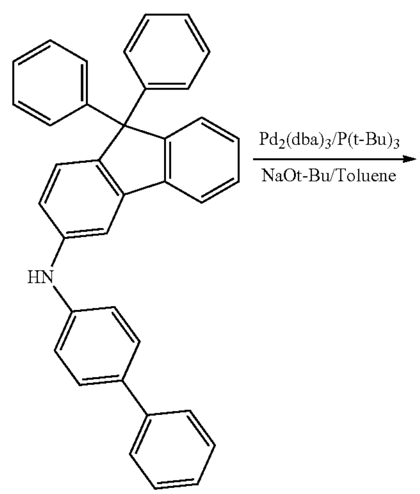

Sub 4-12

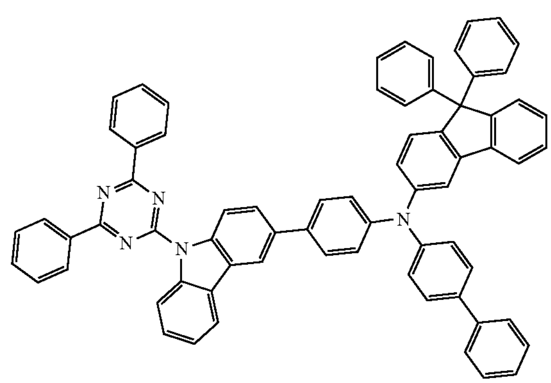

2-86

17.1 g (yield: 81%) of a product 2-86 was synthesized using Sub 3-34 (12.2 g, 22 mmol), Sub 4-12 (12.3 g, 25.4 mmol), $Pd_2(dba)_3$ (1.0 g, 1.1 mmol), $P(t\text{-}Bu)_3$ (0.4 g, 2.2 mmol), NaOt-Bu (5.8 g, 60 mmol) and toluene (210 mL) by the same manner as in the synthesis method of 2-10.

Synthesis Example of 2-128

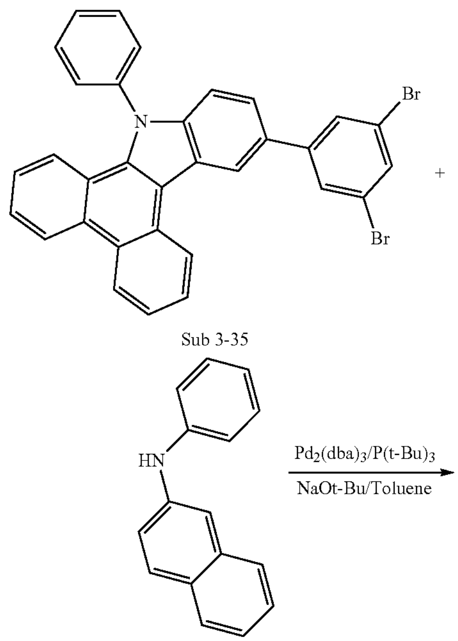

Sub 3-35

Sub 4-16

-continued

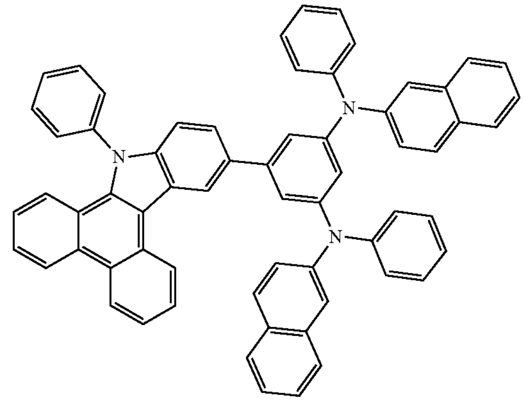

2-128

16.5 g (yield: 80%) of a product 2-128 was synthesized using Sub 3-35 (13.9 g, 24.1 mmol), Sub 4-16 (12.1 g, 55.4 mmol), $Pd_2(dba)_3$ (2.2 g, 2.4 mmol), $P(t\text{-}Bu)_3$ (1 g, 4.8 mmol), NaOt-Bu (8.3 g, 86.7 mmol) and toluene (260 mL) by the same manner as in the synthesis method of 2-10.

The FD-MS values of the compounds 2-1 to 2-136 of the present invention synthesized by the above synthesis method are shown in Table 6 below.

TABLE 6

| Compound | FD-MS | Compound | FD-MS |
|---|---|---|---|
| 2-1 | m/z = 562.24($C_{42}H_{30}N_2$ = 562.72) | 2-2 | m/z = 602.27($C_{45}H_{34}N_2$ = 602.78) |
| 2-3 | m/z = 563.24($C_{41}H_{29}N_3$ = 563.70) | 2-4 | m/z = 714.30($C_{54}H_{38}N_2$ = 714.91) |
| 2-5 | m/z = 678.30($C_{51}H_{38}N_2$ = 678.88) | 2-6 | m/z = 802.33($C_{51}H_{42}N_2$ = 803.02) |
| 2-7 | m/z = 800.32($C_{61}H_{40}N_2$ = 801.01) | 2-8 | m/z = 563.24($C_{41}H_{29}N_3$ = 563.70) |
| 2-9 | m/z = 668.23($C_{48}H_{32}N_2S$ = 668.86) | 2-10 | m/z = 727.30($C_{54}H_{37}N_3$ = 727.91) |
| 2-11 | m/z = 652.25($C_{48}H_{32}N_2O$ = 652.80) | 2-12 | m/z = 662.27($C_{50}H_{34}N_2$ = 662.84) |
| 2-13 | m/z = 536.23($C_{40}H_{28}N_2$ = 536.68) | 2-14 | m/z = 586.24($C_{44}H_{30}N_2$ = 586.74) |
| 2-15 | m/z = 712.29($C_{54}H_{36}N_2$ = 712.90) | 2-16 | m/z = 714.30($C_{54}H_{38}N_2$ = 714.91) |
| 2-17 | m/z = 754.33($C_{57}H_{42}N_2$ = 754.98) | 2-18 | m/z = 957.38($C_{70}H_{47}N_5$ = 958.18) |
| 2-19 | m/z = 965.38($C_{73}H_{47}N_3$ = 966.20) | 2-20 | m/z = 719.24($C_{51}H_{33}N_3S$ = 719.91) |
| 2-21 | m/z = 758.24($C_{54}H_{34}N_2OS$ = 758.94) | 2-22 | m/z = 893.38($C_{67}H_{47}N_3$ = 894.13) |
| 2-23 | m/z = 652.25($C_{45}H_{32}N_2O$ = 652.80) | 2-24 | m/z = 662.27($C_{50}H_{34}N_2$ = 662.84) |
| 2-25 | m/z = 562.24($C_{42}H_{30}N_2$ = 562.72) | 2-26 | m/z = 612.26($C_{46}H_{32}N_2$ = 612.78) |
| 2-27 | m/z = 688.29($C_{52}H_{36}N_2$ = 688.87) | 2-28 | m/z = 714.30($C_{54}H_{35}N_2$ = 714.91) |
| 2-29 | m/z = 754.33($C_{57}H_{42}N_2$ = 754.98) | 2-30 | m/z = 878.37($C_{67}H_{46}N_2$ = 879.12) |
| 2-31 | m/z = 876.35($C_{67}H_{44}N_2$ = 877.10) | 2-32 | m/z = 639.27($C_{47}H_{33}N_3$ = 369.80) |
| 2-33 | m/z = 768.26($C_{56}H_{36}N_2S$ = 768.98) | 2-34 | m/z = 833.29($C_{60}H_{39}N_3S$ = 834.05) |
| 2-35 | m/z = 742.26($C_{54}H_{34}N_2O_s$ = 742.88) | 2-36 | m/z = 778.333($C_{59}H_{42}N_2$ = 779.00) |
| 2-37 | m/z = 486.21($C_{36}H_{26}N_2$ = 486.62) | 2-38 | m/z = 536.23($C_{40}H_{28}N_2$ = 536.68) |
| 2-39 | m/z = 612.26($C_{45}H_{32}N_2$ = 612.78) | 2-40 | m/z = 638.27($C_{48}H_{34}N_2$ = 638.81) |
| 2-41 | m/z = 491.24($C_{36}H_{21}D_5N_2$ = 491.65) | 2-42 | m/z = 612.26($C_{45}H_{32}N_2$ = 612.78) |
| 2-43 | m/z = 794.28($C_{58}H_{38}N_2S$ = 795.02) | 2-44 | m/z = 656.26($C_{48}H_{33}FN_2$ = 656.80) |
| 2-45 | m/z = 717.29($C_{51}H_{35}N_5$ = 717.88) | 2-46 | m/z = 728.32($C_{55}H_{40}N_2$ = 728.94) |
| 2-47 | m/z = 842.34($C_{52}H_{42}N_4$ = 843.05) | 2-48 | m/z = 714.30($C_{54}H_{38}N_2$ = 714.91) |
| 2-49 | m/z = 653.28($C_{48}H_{35}N_3$ = 653.81) | 2-50 | m/z = 703.30($C_{52}H_{37}N_3$ = 703.87) |
| 2-51 | m/z = 805.35($C_{60}H_{43}N_3$ = 806.00) | 2-52 | m/z = 753.31($C_{56}H_{39}N_3$ = 753.93) |
| 2-53 | m/z = 818.34($C_{60}H_{42}N_4$ = 819.00) | 2-54 | m/z = 835.30($C_{60}H_{41}N_3S$ = 836.05) |
| 2-55 | m/z = 655.27($C_{46}H_{33}N_5$ = 655.79) | 2-56 | m/z = 885.32($C_{64}H_{43}N_3S$ = 886.11) |
| 2-57 | m/z = 759.27($C_{54}H_{37}N_3S$ = 759.96) | 2-58 | m/z = 706.28($C_{49}H_{34}N_6$ = 706.83) |
| 2-59 | m/z = 960.39($C_{59}H_{48}N_6$ = 961.16) | 2-60 | m/z = 853.35($C_{64}H_{43}N_3$ = 854.05) |
| 2-61 | m/z = 894.37($C_{66}H_{46}N_4$ = 895.10) | 2-62 | m/z = 834.38($C_{62}H_{38}D_5N_3$ = 835.06) |
| 2-63 | m/z = 855.36($C_{64}H_{45}N_3$ = 856.06) | 2-64 | m/z = 853.35($C_{64}H_{43}N_3$ = 854.05) |
| 2-65 | m/z = 794.37($C_{60}H_{46}N_2$ = 795.04) | 2-66 | m/z = 987.39($C_{71}H_{49}N_5O$ = 988.21) |
| 2-67 | m/z = 1021.44($C_{77}H_{55}N_3$ = 1022.31) | 2-68 | m/z = 737.23($C_{51}H_{32}FN_3S$ = 737.90) |
| 2-69 | m/z = 562.24($C_{42}H_{30}N_2$ = 562.72) | 2-70 | m/z = 602.27($C_{45}H_{34}N_2$ = 602.78) |
| 2-71 | m/z = 563.24($C_{41}H_{29}N_3$ = 563.70) | 2-72 | m/z = 714.30($C_{54}H_{38}N_2$ = 714.91) |
| 2-73 | m/z = 678.30($C_{51}H_{38}N_2$ = 678.88) | 2-74 | m/z = 802.33($C_{61}H_{42}N_2$ = 803.02) |
| 2-75 | m/z = 800.32($C_{61}H_{40}N_2$ = 801.01) | 2-76 | m/z = 563.24($C_{41}H_{29}N_3$ = 563.70) |
| 2-77 | m/z = 668.23($C_{48}H_{32}N_2S$ = 668.86) | 2-78 | m/z = 727.30($C_{54}H_{37}N_3$ = 727.91) |

TABLE 6-continued

| Compound | FD-MS | Compound | FD-MS |
|---|---|---|---|
| 2-79 | m/z = 652.25($C_{48}H_{32}N_2O$ = 652.80) | 2-80 | m/z = 662.27($C_{50}H_{34}N_2$ = 662.84) |
| 2-81 | m/z = 536.23($C_{40}H_{28}N_2$ = 536.68) | 2-82 | m/z = 586.24($C_{44}H_{30}N_2$ = 586.74) |
| 2-83 | m/z = 712.29($C_{54}H_{36}N_2$ = 712.90) | 2-84 | m/z = 714.30($C_{54}H_{38}N_2$ = 714.91) |
| 2-85 | m/z = 754.33($C_{57}H_{42}N_2$ = 754.98) | 2-86 | m/z = 957.38($C_{70}H_{47}N_5$ = 958.18) |
| 2-87 | m/z = 965.38($C_{73}H_{47}N_3$ = 966.20) | 2-88 | m/z = 719.24($C_{51}H_{33}N_3S$ = 719.91) |
| 2-89 | m/z = 758.24($C_{54}H_{34}N_2OS$ = 758.94) | 2-90 | m/z = 893.38($C_{67}H_{47}N_3$ = 894.13) |
| 2-91 | m/z = 652.25($C_{48}H_{32}N_2O$ = 652.80) | 2-92 | m/z = 662.27($C_{50}H_{34}N_2$ = 662.84) |
| 2-93 | m/z = 562.24($C_{42}H_{30}N_2$ = 562.72) | 2-94 | m/z = 612.26($C_{46}H_{32}N_2$ = 612.78) |
| 2-95 | m/z = 688.29($C_{52}H_{36}N_2$ = 688.87) | 2-96 | m/z = 714.30($C_{54}H_{38}N_2$ = 714.91) |
| 2-97 | m/z = 754.33($C_{57}H_{42}N_2$ = 754.98) | 2-98 | m/z = 878.37($C_{67}H_{46}N_2$ = 879.12) |
| 2-99 | m/z = 876.35($C_{67}H_{44}N_2$ = 877.10) | 2-100 | m/z = 639.27($C_{47}H_{33}N_3$ = 369.80) |
| 2-101 | m/z = 768.26($C_{56}H_{36}N_2S$ = 768.98) | 2-102 | m/z = 833.29($C_{60}H_{39}N_3S$ = 834.05) |
| 2-103 | m/z = 742.26($C_{54}H_{34}N_2O_s$ = 742.88) | 2-104 | m/z = 778.333($C_{59}H_{42}N_2$ = 779.00) |
| 2-105 | m/z = 486.21($C_{36}H_{26}N_2$ = 486.62) | 2-106 | m/z = 536.23($C_{40}H_{28}N_2$ = 536.68) |
| 2-107 | m/z = 612.26($C_{46}H_{32}N_2$ = 612.78) | 2-108 | m/z = 638.27($C_{48}H_{34}N_2$ = 638.81) |
| 2-109 | m/z = 491.24($C_{36}H_{21}D_5N_2$ = 491.65) | 2-110 | m/z = 612.26($C_{46}H_{32}N_2$ = 612.78) |
| 2-111 | m/z = 794.28($C_{58}H_{38}N_2S$ = 795.02) | 2-112 | m/z = 656.26($C_{48}H_{33}FN_2$ = 656.80) |
| 2-113 | m/z = 717.29($C_{51}H_{35}N_5$ = 717.88) | 2-114 | m/z = 728.32($C_{55}H_{40}N_2$ = 728.94) |
| 2-115 | m/z = 842.34($C_{62}H_{42}N_4$ = 843.05) | 2-116 | m/z = 714.30($C_{54}H_{38}N_2$ = 714.91) |
| 2-117 | m/z = 653.28($C_{48}H_{35}N_3$ = 653.81) | 2-118 | m/z = 703.30($C_{52}H_{37}N_3$ = 703.87) |
| 2-119 | m/z = 805.35($C_{60}H_{43}N_3$ = 806.00) | 2-120 | m/z = 753.31($C_{56}H_{39}N_3$ = 753.93) |
| 2-121 | m/z = 818.34($C_{60}H_{42}N_4$ = 819.00) | 2-122 | m/z = 835.30($C_{60}H_{41}N_3S$ = 836.05) |
| 2-123 | m/z = 655.27($C_{46}H_{33}N_5$ = 655.79) | 2-124 | m/z = 885.32($C_{64}H_{43}N_3S$ = 886.11) |
| 2-125 | m/z = 759.27($C_{54}H_{37}N_3S$ = 759.96) | 2-126 | m/z = 706.28($C_{49}H_{34}N_6$ = 706.83) |
| 2-127 | m/z = 960.39($C_{69}H_{48}N_6$ = 961.16) | 2-128 | m/z = 853.35($C_{64}H_{43}N_3$ = 854.05) |
| 2-129 | m/z = 894.37($C_{66}H_{46}N_4$ = 895.10) | 2-130 | m/z = 834.38($C_{62}H_{38}D_5N_3$ = 835.06) |
| 2-131 | m/z = 855.36($C_{64}H_{45}N_3$ = 856.06) | 2-132 | m/z = 853.35($C_{54}H_{43}N_3$ = 854.05) |
| 2-133 | m/z = 794.37($C_{60}H_{46}N_2$ = 795.04) | 2-134 | m/z = 987.39($C_{71}H_{49}N_5O$ = 988.21) |
| 2-135 | m/z = 1021.44($C_{77}H_{55}N_3$ = 1022.31) | 2-136 | m/z = 737.23($C_{51}H_{32}FN_3S$ = 737.90) |

Fabrication and Evaluation of Organic Electric Element

[Example 1] Red OLED

On the ITO layer (anode) formed on the glass substrate, 4,4',4"-Tris[2-naphthyl(phenyl)amino]triphenylamine (hereinafter, abbreviated as "2-TNATA") was vacuum deposited to a thickness of 60 nm to form a hole injection layer. Then, N,N'-bis(1-naphthalenyl)-N,N'-bis-phenyl-(1,1'-biphenyl)-4,4'-diamine (hereinafter abbreviated as "NPB") was vacuum deposited to a thickness of 60 nm to form a hole transport layer.

Next, a light emitting layer having a thickness of 30 nm was deposited on the hole transport layer by using the compound 1-19 of the present invention as a host material, bis-(1-phenylisoquinolyl)iridium(III)acetylacetonate (hereinafter, abbreviated as "$(piq)_2Ir(acac)$") as a dopant material, wherein the weight ratio of the host and the dopant was 95:5.

Next, (1,1'-biphenyl-4-olato)bis(2-methyl-8-quinolinolato)aluminum (hereinafter, "BAlq") was vacuum-deposited to a thickness of 10 nm on the light emitting layer to form a hole blocking layer, and bis(10-hydroxybenzo[h]quinolinato)beryllium (hereinafter, "$BeBq_2$") was vacuum-deposited to a thickness of 40 nm on the hole blocking layer to form a an electron transport layer. Thereafter, LiF was deposited to a thickness of 0.2 nm to form an electron injection layer on the electron transport layer, and then Al was deposited to a thickness of 150 nm to form a cathode on the electron injection layer.

[Example 2] to [Example 13]

The organic electroluminescent elements were manufactured in the same manner as described in Example 1 except that compounds of the present invention described in the following Table 7 instead of compound 1-19 of the present invention were used as host material of the light emitting layer.

[Comparative Example 1] to [Comparative Example 5]

The organic electroluminescent element was manufactured in the same manner as described in Example 1 except that one of the following Comparative Compounds 1 to 5 instead of compound 1-19 of the present invention was used as host material of the light emitting layer.

<Comp. Compd 1>

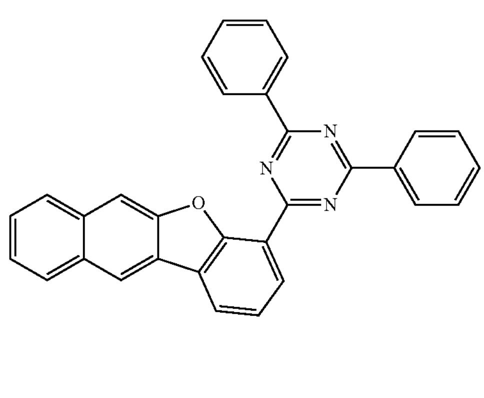

-continued

<Comp. Compd 2>

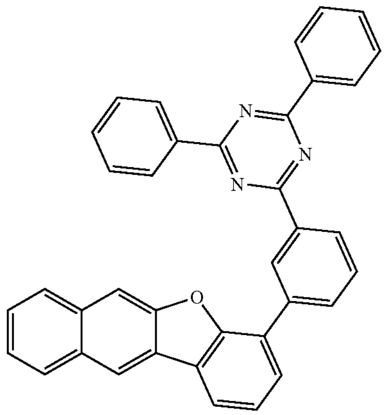

<Comp. Compd 3>

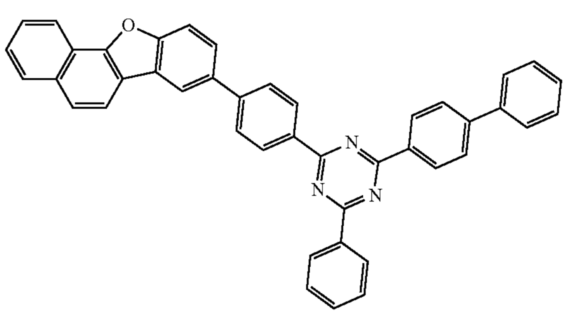

-continued

<Comp. Compd 4>

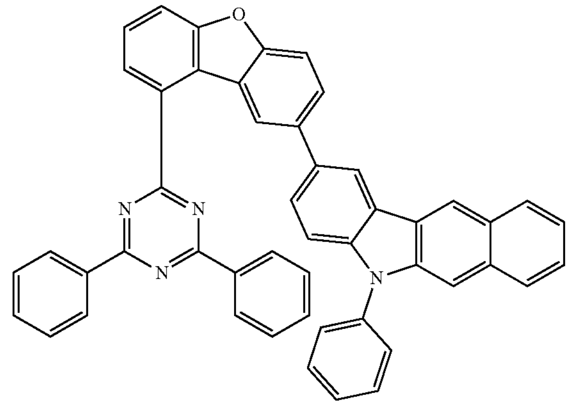

<Comp. Compd 5>

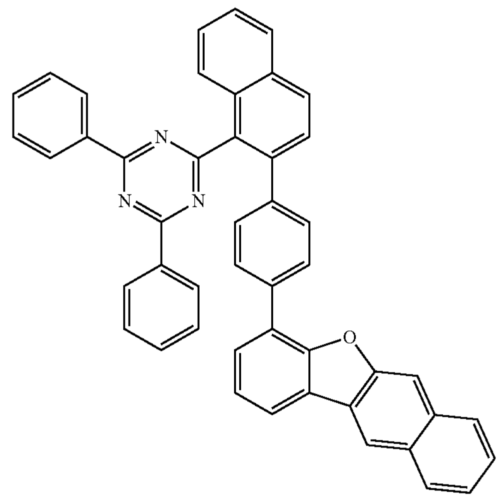

Electroluminescence (EL) characteristics were measured with PR-650 (Photo research) by applying a forward bias DC voltage to the organic electroluminescent elements prepared in Examples 1 to 13 of the present invention and Comparative Examples 1 to 5. The life time (T95) was measured using a life time measuring apparatus manufactured by mc science Inc. at reference brightness of 5000 cd/m$^2$. The measurement results are shown in Table 7.

TABLE 7

| | Compound | Voltage (V) | Current Density (mA/cm$^2$) | Brightness (cd/m$^2$) | Efficiency (cd/A) | Lifetime T(95) | CIE X | CIE Y |
|---|---|---|---|---|---|---|---|---|
| comp. Ex(1) | Comp. compd 1 | 6.3 | 17.5 | 2500 | 14.3 | 96.7 | 0.66 | 0.33 |
| comp. Ex(2) | Comp. compd 2 | 6.1 | 14.0 | 2500 | 17.8 | 100.4 | 0.66 | 0.33 |
| comp. Ex(3) | Comp. compd 3 | 6.3 | 15.2 | 2500 | 16.5 | 98.5 | 0.66 | 0.34 |
| comp. Ex(4) | Comp. compd 4 | 5.9 | 13.3 | 2500 | 18.8 | 104.5 | 0.66 | 0.34 |
| comp. Ex(5) | Comp. compd 5 | 6.1 | 14.5 | 2500 | 17.2 | 102.3 | 0.66 | 0.34 |
| Ex.(1) | Com. 1-91 | 5.4 | 10.4 | 2500 | 24.1 | 131.1 | 0.67 | 0.33 |
| Ex.(2) | Com. 1-92 | 5.3 | 10.1 | 2500 | 24.7 | 132.2 | 0.67 | 0.33 |
| Ex.(3) | Com. 1-103 | 5.6 | 10.5 | 2500 | 23.9 | 125.7 | 0.66 | 0.33 |
| Ex.(4) | Com. 1-121 | 5.7 | 11.1 | 2500 | 22.5 | 135.3 | 0.66 | 0.34 |
| Ex.(5) | Com. 1-122 | 5.6 | 11.7 | 2500 | 21.4 | 133.0 | 0.66 | 0.34 |
| Ex.(6) | Com. 1-148 | 5.3 | 9.9 | 2500 | 25.3 | 128.8 | 0.66 | 0.33 |
| Ex.(7) | Com. 1-149 | 5.4 | 9.7 | 2500 | 25.8 | 130.6 | 0.66 | 0.34 |
| Ex.(8) | Com. 1-151 | 5.6 | 10.5 | 2500 | 23.7 | 123.9 | 0.66 | 0.34 |
| Ex.(9) | Com. 1-158 | 5.4 | 11.0 | 2500 | 22.8 | 134.6 | 0.66 | 0.34 |
| Ex.(10) | Com. 1-160 | 5.4 | 10.9 | 2500 | 23.0 | 139.7 | 0.67 | 0.33 |
| Ex.(11) | Com. 1-172 | 5.7 | 11.3 | 2500 | 22.1 | 133.8 | 0.67 | 0.33 |

TABLE 7-continued

| | Compound | Voltage (V) | Current Density (mA/cm²) | Brightness (cd/m²) | Efficiency (cd/A) | Lifetime T(95) | CIE X | CIE Y |
|---|---|---|---|---|---|---|---|---|
| Ex.(12) | Com. 1-173 | 5.3 | 10.8 | 2500 | 23.1 | 140.2 | 0.66 | 0.33 |
| Ex.(13) | Com. 1-174 | 5.3 | 10.6 | 2500 | 23.5 | 141.5 | 0.66 | 0.34 |

From Table 7 above, it can be seen that the electrical properties of the element are significantly improved when the compound represented by Formula 1-F or 1-G of the present invention is used as the phosphorescent host material of the light emitting layer (Examples 1 to 13) than when Comparative Compounds 1 to 5 are used (Comparative Examples 1 to 5).

Comparative Compounds 1 to 5 and the compounds of the present invention are similar in that their basic skeleton contains a heterocycle in which triazine and aromatic rings are condensed, but Comparative Compound 1 and Comparative Compound 2 are different from the compound of the present invention in that triazine and benzo[b]naphtho[2,3-d]furan were directly bonded in Comparative Compound 1 and triazine and benzo[b]naphtho[2,3-d]furan is linked with a phenyl linking group in Comparative Compound 2. In addition, Comparative Compound 3 is generally similar to Comparative Compound 2, but it differs from Comparative Compound 2 in that benzo[b]naphtho[2,1-d]furan is linked to triazine. Comparative Compound 4 is similar to the compound of the present invention (Formula 1-F) in that it has 3-membered ring as a linking group between the triazine and the 4-membered ring, but the comparative compound 4 differs from the present invention in that the hetero atom in the 4-membered heterocycle which is linked to the triazine through a linker is N. Comparative compound 5 is different from the compound of the present invention in that a phenyl-naphthyl group as a linking group is introduced between benzo[b]naphtho[2,3-d]furan and triazine and the triazine is bonded to naphthyl in the ortho position.

Comparing Comparative Examples 1 to 3, electrical properties of organic electric elements when Comparative Compounds 2 or 3 (hereinafter, referred to as 'Trz-L-fused DBF') in which a linking group is introduced between triazine and benzonaphthofuran is used as a host were better, compared to the case of using Comparative Compound 1 (hereinafter referred to as 'Trz-fused DBF') in which triazine and benzo[b]naphtho[2,3-d]furan are directly bonded.

Comparing Comparative Examples 2 and 3, Comparative Compounds 2 and 3 are identical in that they contain dibenzofuran fused with an aromatic ring. However, the electrical characteristics were better when Comparative Compound 2 which comprises benzo[b]naphtho[2,3-d]furan was used as the host, compared to the case where Comparative Compound 3 which comprises benzo[b]naphtho[2,1-d]furan was used as the host.

Accordingly, it can be seen that the condensed heterocycle bonded to the triazine is a linear condensation structure, and the introduction of a linking group between the triazine and the 4-membered heterocycle affects the performance improvement of the element. From this, it can be seen that the difference in the skeleton and structure of the compound affects the electrical properties of the element.

Comparative Compounds 2 and 5 are identical in that a linking group is introduced between triazine and benzo[b]naphtho[2,3-d]furan, but there is a difference in that the linking groups are phenyl and phenyl-naphthyl respectively. Example 2 was slightly improved in terms of the efficiency of the element than Comparative Example 5, but showed a deteriorated result in terms of life. This seems to be because in the case of Comparative Compound 5, the energy level was changed due to the structural characteristics of the phenyl-naphthyl linker, so that the efficiency of the element was lowered, and the lifespan was improved as the molecular weight of the compound was increased.

On the other hand, in the case of Comparative Compound 4 having a specific heterocyclic group as a linking group between the triazine and the condensed heterocycle, the thermal stability of the compound was increased by having a heterocyclic group as a linking group, as a result, the electrical characteristics of the element were improved when Comparative Compound 4 was used as host, compared to when Comparative Compounds 1-3 and 5 are used.

Therefore, comparing the compounds in Comparative Examples 1 to 5 with the compound of the present invention, it can be seen that the element exhibits the best performance when a compound in which a triazine and the condensed heterocycle having a linear structure are interconnected via a linker of a less-bent structure (a structure bonded at the meta- or para-position, not the ortho-) and a specific substituent group such as dibenzothiophene or dibenzofuran is introduced as a linking group is used as a host.

In compounds of the present invention represented by Formula 1-F or Formula 1-G of the present invention, a linking group must exist between triazine and benzo[b]naphtho[2,3-d]thiophene or benzo[b]naphtho[2,3-d]furan (hereinafter, also referred to as 'fused DBT/DBF') and a specific linking group such as naphthyl, dibenzofuran, and dibenzothiophene is introduced as the linking group. As a result, the element characteristics of the embodiments of the present invention are significantly improved compared to Comparative Examples 1 to 5.

That is, the element characteristics of element are significantly improved when a compound represented by Formula 1-G of the present invention having naphthalene as a linking group between triazine and fused DBT/DBF (Compounds 1-91, 1-92, 1-103, 1-148, 1-149) is used as a host, compared to the case where Comparative compound 1 in which triazine and fused DBT/DBF are connected by a single bond, Comparative compound 2 in which triazine and fused DBT/DBF are connected by a phenyl linking group, or Comparative compound 5 in which triazine and fused DBT/DBF are connected by a phenyl-naphthyl linking group is used.

This can be explained by the LUMO value of each compound. Table 8 shows the LUMO values of Comparative Compounds 1, 2 and 5 and Compound 1-103 of the present invention.

TABLE 8

| | Comp. compd 1 | Comp. compd 2 | Comp. compd 5 | 1-103 |
|---|---|---|---|---|
| LUMO (eV) | −1.77 | −1.79 | −1.787 | −1.933 |

Referring to Table 8, the LUMO level of Comparative Compound 2 among the comparative compounds is the lowest, and the LUMO level of the compound of the present invention is lower(deeper) than that of Comparative Compound 2.

Therefore, it can be seen that when the phenyl linker is present, the LUMO level is lower than when the linker is not present, and the LUMO level is lower in the case of a naphthalene linker such as the compound of the present invention compared to the phenyl linker. In addition, it can be seen that the LUMO level of Compound 1-103 containing meta-naphthyl as a linking group of Example of the present invention is lower(deeper) than that of Comparative Compound 5 having ortho-naphthyl as a linking group.

This suggests that the physical properties of the compound remarkably vary depending on the type of linking group and the degree of bending of the molecule and the compound represented by Formula 1-G of the present invention has an appropriate LUMO level in which electrons can easily transfer to the light emitting layer, compared to Comparative Compounds 1, 2, and 5, as a result, characteristics of element are improved.

In addition, a specific linker such as DBF and DBT is introduced between triazine and a fused DBT/DBF in the compounds represented by Formula 1-F of the present invention (compounds 1-121, 1-122, 1-158, 1-160, 1-172, 1-173, 1-174). When a compound into which such a specific linking group was introduced was used as a host (Examples 4, 5, 9 to 13), the life-span of the element was improved, compared to when Comparative Compound 4 is used. Accordingly, it can be seen that in the compound represented by Formula 1-F of the present invention, when the hetero element of the condensed heterocycle is O or S instead of N, the life-span of the element was improved.

In addition, compared to the case where the compound represented by Formula 1-G of the present invention was used as a host (Examples 1 to 3, Examples 6 to 8), when the compound represented by Formula 1-F of the present invention was used as a host (Examples 4, 5, 9 to 13), the life-span of the element is improved. It seems that this is because Formula 1-F has a higher molecular weight, which lowers the deposition temperature and increases the thermal stability of the compound.

On the other hand, the lifetime of the element was remarkably improved in Examples 12 and 13 of the present invention. From this, it can be seen that when a substituent other than hydrogen(H) is bonded to the benzene ring of the 4-membered rings(benzonaphthothiophene, benzonaphthofuran) bonded to the triazine, the characteristics of the organic electric element are improved. It seems that this is because a substituent other than hydrogen (H) is bonded to benzene ring of the 4-membered rings bonded to the triazine, thereby forming a three-dimensional structure compared to the case where hydrogen is substituted, so that the deposition temperature becomes low, and the the glass transition temperature(Tg) increases as the molecular weight increases, so that decomposition during evaporation is suppressed and thermal stability is increased.

Therefore, from the results of Table 7, it is suggested that the energy level (HOMO, LUMO, T1, etc.) of the compound may be significantly different depending on the type of the substituent, the substitution position and the type of heteroatom constituting the compound, and the differences in properties of the compound act as a major factor in improving the performance of the element when a compound is deposited during element manufacturing, as a result, different characteristics of element results can be derived. Moreover, it can be seen that like the compounds represented by Formula 1-F and Formula 1-G of the present invention, among compounds having a basic skeleton comprising triazine and fused DBT/DBF, 2,3-fused DBF/DBT which has a naphthyl and a specific hetero-substituent as a linking group and in which the condensation direction of fused DBT/DBF is linear is a structure suitable for improving element performance.

[Example 14] Mixed Phosphorescent Host of a Light Emitting Layer

On the ITO layer (anode) formed on the glass substrate, 2-TNATA was vacuum deposited to a thickness of 60 nm to form a hole injection layer. Then, NPB was vacuum deposited to a thickness of 60 nm to form a hole transport layer.

Next, a light emitting layer with a thickness of 30 nm was formed on the hole transport layer, wherein a mixture of a compound 1-61 of the present invention (host 1) and a compound 2-9 of the present invention (host 2) in a weight ratio of 3:7 was used as a host and $(piq)_2Ir(acac)$ was used as a dopant and the host and dopant were used in a weight ratio of 95:5.

Next, a film of BAlq was vacuum-deposited with a thickness of 10 nm on the light emitting layer to form a hole blocking layer and $BeBq_2$ was deposited on the hole blocking layer to form an electron transport layer having a thickness of 50 nm.

Next, LiF on the electron transport layer was deposited to a thickness of 0.2 nm and then Al was deposited to a thickness of 150 nm to form a cathode. In this way, the OLED was completed.

[Example 15] to [Example 73]

The organic electroluminescent elements were manufactured in the same manner as described in Example 14, except that a mixture of the first host compound(host 1) and the second host compound(host 2) described in the following Table 9 was used as host material of the light emitting layer.

[Comparative Example 6] to [Comparative Example 9]

The OLEDs were fabricated in the same manner as described in Example 14, except that a single compound 1-61, compound 1-92, compound 1-145 or compound 1-160 as listed in the following Table 9 was used as a host of a light emitting layer.

[Comparative Example 10] and [Comparative Example 11]

The OLEDs were fabricated in the same manner as described in Example 14 except that the the mixture of Comparative compounds 6 and 7 or the mixture of Comparative compounds 6 and 8 as listed in the following Table 9 were uses as a host of a light emitting layer, respectively.

Electroluminescence (EL) characteristics were measured with a PR-650 (Photoresearch) by applying a forward bias DC voltage to the OLEDs prepared in Examples 14 to 73 of the present invention and Comparative Examples 6 to 11. And, the life time (T95) was measured using a life time measuring apparatus manufactured by Mc science Inc. at reference brightness of 2500 $cd/m^2$. The measurement results are shown in Tables 9 below.

-continued

<Comp. Compd 5>

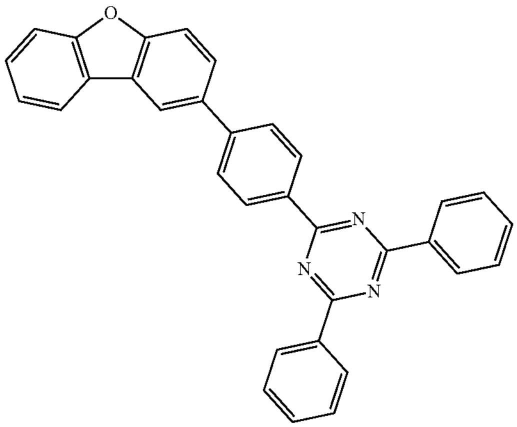

<Comp. Compd 6>

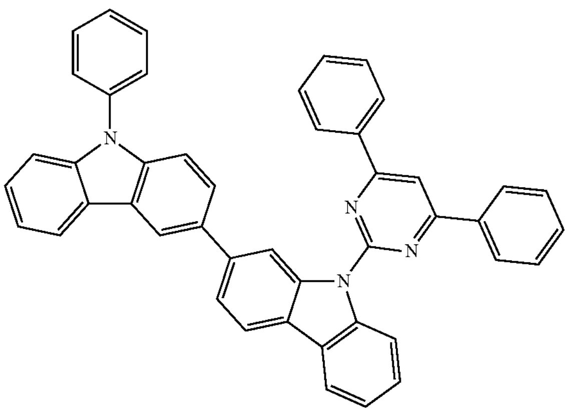

<Comp. Compd 7>

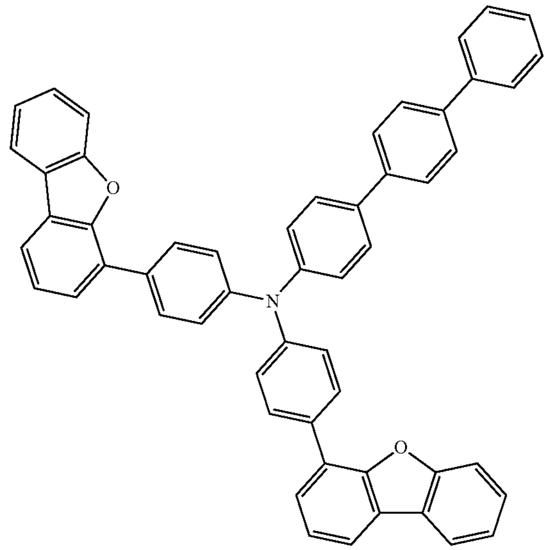

TABLE 9

| | Host 1 | Host 2 | Voltage (V) | Current Density (mA/cm$^2$) | Brightness (cd/m$^2$) | Efficiency (cd/A) | Lifetime T(95) |
|---|---|---|---|---|---|---|---|
| comp. Ex(6) | Com. 1-61 | | 6.3 | 16.7 | 2500 | 15.0 | 95.8 |
| comp. Ex(7) | Com. 1-92 | | 5.3 | 10.1 | 2500 | 24.7 | 132.2 |
| comp. Ex(8) | Com. 1-145 | | 6.1 | 14.0 | 2500 | 17.9 | 98.0 |
| comp. Ex(9) | Com. 1-160 | | 5.4 | 10.9 | 2500 | 23.0 | 139.7 |
| comp. Ex(10) | Comp. compd 6 | Comp. compd 7 | 5.2 | 10.0 | 2500 | 25.1 | 135.4 |
| comp.Ex(11) | Comp. compd 6 | Comp. compd 8 | 5.1 | 10.0 | 2500 | 24.9 | 136.7 |
| Ex.(14) | Com. 1-61 | Com. 2-9 | 4.9 | 7.5 | 2500 | 33.4 | 143.0 |
| Ex.(15) | Com. 1-91 | | 4.9 | 7.2 | 2500 | 34.6 | 143.6 |
| Ex.(16) | Com. 1-92 | | 4.9 | 7.2 | 2500 | 34.6 | 143.7 |
| Ex.(17) | Com. 1-103 | | 4.9 | 7.3 | 2500 | 34.4 | 143.3 |
| Ex.(18) | Com. 1-121 | | 4.8 | 7.4 | 2500 | 33.8 | 144.6 |
| Ex.(19) | Com. 1-122 | | 4.9 | 7.4 | 2500 | 33.7 | 143.8 |
| Ex.(20) | Com. 1-145 | | 4.9 | 7.5 | 2500 | 33.5 | 143.1 |
| Ex.(21) | Com. 1-148 | | 4.8 | 7.2 | 2500 | 34.7 | 143.5 |
| Ex.(22) | Com. 1-149 | | 4.9 | 7.2 | 2500 | 34.8 | 143.6 |
| Ex.(23) | Com. 1-151 | | 4.8 | 7.3 | 2500 | 34.4 | 143.3 |
| Ex.(24) | Com. 1-158 | | 4.9 | 7.4 | 2500 | 34.0 | 144.3 |
| Ex.(25) | Com. 1-160 | | 4.8 | 7.3 | 2500 | 34.1 | 144.7 |
| Ex.(26) | Com. 1-172 | | 4.9 | 7.4 | 2500 | 33.7 | 144.0 |
| Ex.(27) | Com. 1-173 | | 4.9 | 7.3 | 2500 | 34.2 | 144.7 |
| Ex.(28) | Com. 1-174 | | 4.8 | 7.3 | 2500 | 34.3 | 145.0 |
| Ex.(29) | Com. 1-61 | Com. 2-28 | 4.8 | 8.1 | 2500 | 30.8 | 145.2 |
| Ex.(30) | Com. 1-91 | | 4.9 | 7.6 | 2500 | 32.8 | 146.0 |
| Ex.(31) | Com. 1-92 | | 4.9 | 7.6 | 2500 | 32.9 | 146.2 |
| Ex.(32) | Com. 1-103 | | 4.8 | 7.7 | 2500 | 32.5 | 145.6 |
| Ex.(33) | Com. 1-121 | | 4.8 | 7.9 | 2500 | 31.5 | 146.8 |
| Ex.(34) | Com. 1-122 | | 4.8 | 8.0 | 2500 | 31.1 | 146.4 |
| Ex.(35) | Com. 1-145 | | 4.9 | 8.1 | 2500 | 30.9 | 145.3 |
| Ex.(36) | Com. 1-148 | | 4.8 | 7.6 | 2500 | 33.0 | 145.8 |

TABLE 9-continued

| | Host 1 | Host 2 | Voltage (V) | Current Density (mA/cm²) | Brightness (cd/m²) | Efficiency (cd/A) | Lifetime T(95) |
|---|---|---|---|---|---|---|---|
| Ex.(37) | Com. 1-149 | | 4.8 | 7.5 | 2500 | 33.2 | 145.9 |
| Ex.(38) | Com. 1-151 | Com. 2-28 | 4.8 | 7.7 | 2500 | 32.4 | 145.4 |
| Ex.(39) | Com. 1-158 | | 4.9 | 7.9 | 2500 | 31.7 | 146.6 |
| Ex.(40) | Com. 1-160 | | 4.9 | 7.8 | 2500 | 31.9 | 146.9 |
| Ex.(41) | Com. 1-172 | | 4.8 | 8.0 | 2500 | 31.3 | 146.6 |
| Ex.(42) | Com. 1-173 | | 4.9 | 7.8 | 2500 | 32.1 | 147.1 |
| Ex.(43) | Com. 1-174 | | 4.8 | 7.7 | 2500 | 32.3 | 147.2 |
| Ex.(44) | Com. 1-61 | Com. 2-54 | 4.7 | 8.8 | 2500 | 28.5 | 147.4 |
| Ex.(45) | Com. 1-91 | | 4.7 | 8.3 | 2500 | 30.3 | 148.3 |
| Ex.(46) | Com. 1-92 | | 4.7 | 8.2 | 2500 | 30.4 | 148.4 |
| Ex.(47) | Com. 1-103 | | 4.6 | 8.3 | 2500 | 30.1 | 147.8 |
| Ex.(48) | Com. 1-121 | | 4.7 | 8.6 | 2500 | 29.0 | 148.9 |
| Ex.(49) | Com. 1-122 | | 4.6 | 8.7 | 2500 | 28.7 | 148.6 |
| Ex.(50) | Com. 1-145 | | 4.7 | 8.7 | 2500 | 28.6 | 147.5 |
| Ex.(51) | Com. 1-148 | | 4.6 | 8.2 | 2500 | 30.6 | 147.9 |
| Ex.(52) | Com. 1-149 | | 4.7 | 8.2 | 2500 | 30.6 | 148.1 |
| Ex.(53) | Com. 1-151 | | 4.7 | 8.4 | 2500 | 29.8 | 147.6 |
| Ex.(54) | Com. 1-158 | | 4.7 | 8.6 | 2500 | 29.2 | 148.8 |
| Ex.(55) | Com. 1-160 | | 4.7 | 8.5 | 2500 | 29.3 | 149.1 |
| Ex.(56) | Com. 1-172 | | 4.7 | 8.7 | 2500 | 28.9 | 148.6 |
| Ex.(57) | Com. 1-173 | | 4.6 | 8.5 | 2500 | 29.5 | 149.2 |
| Ex.(58) | Com. 1-174 | | 4.7 | 8.4 | 2500 | 29.7 | 149.4 |
| Ex.(59) | Com. 1-61 | Com. 2-117 | 4.6 | 9.5 | 2500 | 26.2 | 149.6 |
| Ex.(60) | Com. 1-91 | | 4.7 | 9.0 | 2500 | 27.9 | 150.0 |
| Ex.(61) | Com. 1-92 | | 4.7 | 8.9 | 2500 | 28.1 | 150.2 |
| Ex.(62) | Com. 1-103 | | 4.6 | 9.0 | 2500 | 27.7 | 149.7 |
| Ex.(63) | Com. 1-121 | | 4.6 | 9.3 | 2500 | 26.9 | 150.6 |
| Ex.(64) | Com. 1-122 | | 4.6 | 9.4 | 2500 | 26.5 | 150.3 |
| Ex.(65) | Com. 1-145 | | 4.6 | 9.5 | 2500 | 26.3 | 149.6 |
| Ex.(66) | Com. 1-148 | | 4.6 | 8.8 | 2500 | 28.3 | 149.8 |
| Ex.(67) | Com. 1-149 | | 4.6 | 8.8 | 2500 | 28.4 | 149.9 |
| Ex.(68) | Com. 1-151 | Com. 2-117 | 4.6 | 9.0 | 2500 | 27.7 | 149.7 |
| Ex.(69) | Com. 1-158 | | 4.7 | 9.3 | 2500 | 27.0 | 150.5 |
| Ex.(70) | Com. 1-160 | | 4.7 | 9.2 | 2500 | 27.2 | 150.8 |
| Ex.(71) | Com. 1-172 | | 4.7 | 9.4 | 2500 | 26.7 | 150.3 |
| Ex.(72) | Com. 1-173 | | 4.7 | 9.1 | 2500 | 27.4 | 150.8 |
| Ex.(73) | Com. 1-174 | | 4.6 | 9.1 | 2500 | 27.5 | 151.0 |

From Table 9, it can be seen that the driving voltage, efficiency and lifetime were remarkably improved when the mixture of the compounds for an organic electroluminescent element of the present invention represented by Formula 1 and Formula 2 was used as a phosphorescent host (Examples 14 to 73), compared to element using a single material (Comparative Examples 6 to 9) or a mixture of Comparative Compounds 6 to 8 (Comparative Examples 10 and 11).

That is, it can be seen that the driving voltage was lowered and efficiency was improved in the case of Comparative Examples 10 and 11 in which the mixture of two compounds was used as hosts, compared to the case where Comparative Examples 6 to 9 in which the compounds of the present invention represented by Formula 1 were each used as a single host, and the characteristics of element were remarkably improved in the case of Examples 14 to 73 in which the mixture of compounds of the present invention was used as host.

From these results, the inventors of the present invention believed that a mixture of compounds represented by Formula 1 and Formula 2 has novel characteristics other than those of each compound, and thus the PL lifetime for each of these compounds and mixtures was measured. As a result, it was confirmed that a new PL wavelength for the mixture of compounds represented by Formula 1 and Formula 2 of the present invention was formed unlike a single compound. It seems that this is because when a mixture of compounds of the present invention is used, electrons and holes move or energy is transferred through a new region (exciplex) having a new energy level formed by mixing as well as the energy level of each substance, as a result, efficiency and lifetime are increased. This is an important example in which the mixed thin film shows exciplex energy transfer and light emission processes when the mixture of the present invention is used.

In addition, when the compounds of the present invention are used in mixture, characteristics of element are excellent. This is because when the polycyclic compound represented by Formula 1 having stability for electrons and holes and having a high T1 and compound represented by Formula 2 having strong hole properties were mixed, the electron blocking ability is improved and more holes move quickly and easily in the light emitting layer due to the high T1 and high LUMO energy value, as a result, the charge balance in the light emitting layer of holes and electrons increases, and thus light emission occurs well inside the light-emitting layer, not the interface of the hole transport layer. As a result, the deterioration in the interface of ahole transport layer is also reduced, thereby maximizing the driving voltage, efficiency and lifetime of the element. That is, it is believed that the combination of compounds represented by Formula 1 and Formula 2 electrochemically synergizes, thereby improving the overall performance of the element.

[Example 74] and [Example 76]

An OLED was manufactured in the same manner as in Example 14, except that Compound 1-92 and Compound 2-54 of the present invention were used in a weight ratio of 7:3 as shown in Table 10 below.

[Example 75] and [Example 77]

An OLED was manufactured in the same manner as in Example 14, except that Compound 1-121 and Compound 2-117 of the present invention were used in a weight ratio of 5:5 as shown in Table 10 below.

Electroluminescence (EL) characteristics were measured with a PR-650 (Photoresearch) by applying a forward bias DC voltage to the OLEDs prepared in Examples 74 to 77. And, the life time (T95) was measured using a life time measuring apparatus manufactured by Mc science Inc. at reference brightness of 2500 cd/m$^2$. The measurement results are shown in Tables 10 below. Examples 46 and 63 show the results of measuring device characteristics when host 1 and host 2 were mixed in a ratio of 3:7 and used as a host in as Table 9.

TABLE 10

| | Host 1 | Host 2 | Mixing ration (Host 1:Host 2) | Voltage (V) | Current Density (mA/cm$^2$) | Brightness (cd/m$^2$) | Efficiency (cd/A) | Lifetime T(95) |
|---|---|---|---|---|---|---|---|---|
| Ex.(74) | 1-92 | 2-54 | 7:3 | 5.2 | 8.9 | 2500 | 28.1 | 146.2 |
| Ex.(75) | | | 5:5 | 4.9 | 8.4 | 2500 | 29.6 | 147.1 |
| Ex.(46) | | | 3:7 | 4.7 | 8.2 | 2500 | 30.4 | 148.4 |
| Ex.(76) | 1-121 | 2-117 | 7:3 | 5.0 | 10.1 | 2500 | 24.8 | 149.2 |
| Ex.(77) | | | 5:5 | 4.8 | 9.6 | 2500 | 26.0 | 149.7 |
| Ex.(63) | | | 3:7 | 4.6 | 9.3 | 2500 | 26.9 | 150.6 |

From Table 10, it can be seen that when the mixture of compound 1-92 and compound 2-54 or the mixture of compound 1-121 and compound 2-117 is used and the mixing ratio is 3:7, the driving voltage, efficiency and life are the best, and characteristics of the element deteriorate as the mixing amount of the first host (host 1) increases. This seems to be because the charge balance in a light-emitting layer is maximized when the amount of the compound (host 2) represented by Formula 2 and having relatively stronger hole characteristics is higher than than that of compound represented by Formula 1 (host 1).

Although the exemplary embodiments of the present invention have been described for illustrative purposes, those skilled in the art to which the present invention pertains will be capable of various modifications without departing from the essential characteristics of the present invention. Therefore, the embodiments disclosed in this specification are not intended to limit the present invention, but to illustrate the present invention, and the spirit and scope of the present invention are not limited by the embodiments. The scope of the present invention shall be construed on the basis of the accompanying claims, and it shall be construed that all of the technical ideas included within the scope equivalent to the claims belong to the present invention.

The invention claimed is:

1. An organic electric element comprising a first electrode, a second electrode, and an organic material layer formed between the first electrode and the second electrode, wherein the organic material layer comprises a phosphorescent light emitting layer, and the phosphorescent light emitting layer consists of a dopant, a first host compound represented by Formula 1-G and a second host compound represented by Formula 2:

[Formula 1-G]

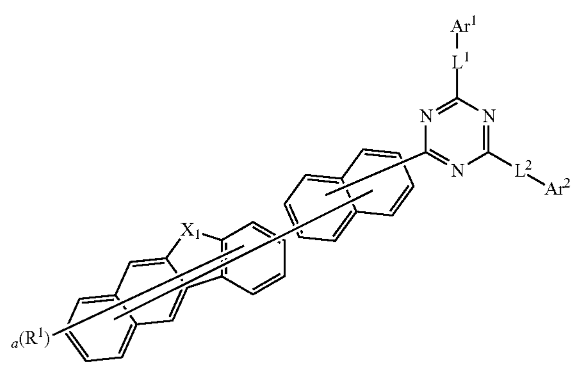

[Formula 2]

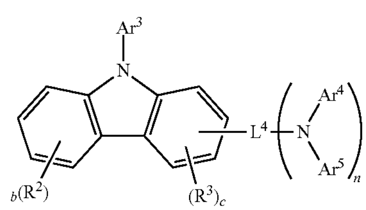

wherein:

$X_1$ is O or S, $Ar^1$ and $Ar^2$ are each a $C_6$-$C_{18}$ aryl group, or a fluorenyl group, $Ar^3$ to $Ar^5$ are each independently selected from the group consisting of a $C_6$-$C_{60}$ aryl group, a fluorenyl group, a $C_2$-$C_{60}$ heterocyclic group comprising at least one heteroatom selected from the group consisting of O, N, S, Si and P, a $C_3$-$C_{60}$ aliphatic ring, a fused ring of a $C_3$-$C_{60}$ aliphatic ring with a $C_6$-$C_{60}$ aromatic ring, a $C_1$-$C_{50}$ alkyl group, a $C_2$-$C_{20}$ alkenyl group, a $C_2$-$C_{20}$ alkynyl group, a $C_1$-$C_{30}$ alkoxyl group and a $C_6$-$C_{30}$ aryloxy group, and $Ar^4$ and $Ar^5$ may be bonded to each other to form a ring, $L^1$ and $L^2$ are each independently selected from the group consisting of a single bond, a $C_6$-$C_{60}$ arylene group, and a fluorenylene group, $L^4$ is selected from the group consisting of a single bond, a $C_6$-$C_{60}$ arylene group, a fluorenylene group, a $C_2$-$C_{60}$ heterocyclic group comprising at least one heteroatom selected from the group consisting of O, N, S, Si and P, a $C_3$-$C_{60}$ aliphatic ring, and a fused ring of a $C_3$-$C_{60}$ aliphatic ring with a $C_6$-$C_{60}$ aromatic ring, $R^1$ to $R^3$ are each independently selected from the group consisting of hydrogen, deuterium, halogen, a cyano group, a $C_6$-$C_{60}$ aryl group, a fluorenyl group, a $C_2$-$C_{60}$ heterocyclic group comprising at least one heteroatom selected from the group consisting of O, N, S, Si and P, a $C_3$-$C_{60}$ aliphatic ring, a fused ring of a $C_3$-$C_{60}$ aliphatic ring with a $C_6$-$C_{60}$ aromatic ring, a $C_1$-$C_{50}$ alkyl group, a $C_2$-$C_{20}$ alkenyl group, a $C_2$-$C_{20}$ alkynyl group, a $C_1$-$C_{30}$ alkoxyl group, a $C_6$-$C_{30}$ aryloxy group and -L'-N($R_a$)($R_b$), and adjacent groups may be bonded to each other to form a ring, a is an integer of 0-9, b is an integer of 0-4, c is an integer of 0-3, and where each of these is an integer of 2 or more, each of a plurality of $R^1$s, each of a plurality of $R^2$s, and each of a plurality of $R^3$s are the same as or different from each other, n is an integer of 0-3, and where n is an integer of 2 or more, each of a plurality of $Ar^4$s, and each of a plurality of $Ar^5$s are the same as or different from each other, L' is selected from the group consisting of a single bond, a $C_6$-$C_{60}$ arylene group, a fluorenylene group, a $C_2$-$C_{60}$ heterocyclic group comprising at least one heteroatom selected from the group consisting of O, N, S, Si and P, a $C_3$-$C_{60}$ aliphatic ring, and a fused ring of a $C_3$-$C_{60}$ aliphatic ring with a $C_6$-$C_{60}$ aromatic ring, and $R_a$ and $R_b$ are each independently selected from the group consisting of a $C_6$-$C_{60}$ aryl group, a fluorenyl group, a $C_2$-$C_{60}$ heterocyclic group comprising at least one heteroatom selected from the group consisting of O, N, S, Si and P, a $C_3$-$C_{60}$ aliphatic ring, and a fused ring of a $C_3$-$C_{60}$ aliphatic ring with a $C_6$-$C_{60}$ aromatic ring, wherein $Ar^3$ to $Ar^5$ and $L^4$, L', $R^1$ to $R^3$, $R_a$, $R_b$, and the ring formed by the adjacent groups may be optionally substituted with one or more substituents selected from the group consisting of deuterium, halogen, a silane group unsubstituted or substituted with a $C_1$-$C_{20}$ alkyl group or a $C_6$-$C_{20}$ aryl group, a siloxane group, a boron group, a germanium group, a cyano group, a nitro group, a $C_1$-$C_{20}$ alkylthio group, a $C_1$-$C_{20}$ alkoxy group, a $C_6$-$C_{20}$ aryloxy group, a $C_1$-$C_{20}$ alkyl group, a $C_2$-$C_{20}$ alkenyl group, a $C_2$-$C_{20}$ alkynyl group, a $C_6$-$C_{20}$ aryl group, a $C_6$-$C_{20}$ aryl group substituted with deuterium, a fluorenyl group, a $C_2$-$C_{20}$ heterocyclic group containing at least one heteroatom of O, N, S, Si, and P, a $C_3$-$C_{20}$ aliphatic ring group, a $C_7$-$C_{20}$ arylalkyl group, $C_8$-$C_{20}$ arylalkenyl group and -$L^a$-N($R^a$)($R^b$), and wherein $Ar^1$, $Ar^2$, $L^1$ and $L^2$ may be optionally substituted with one or more substituents selected from the group consisting of deuterium, halogen, a silane group unsubstituted or substituted with a $C_1$-$C_{20}$ alkyl group or a $C_6$-$C_{20}$ aryl group, a siloxane group, a boron group, a germanium group, a cyano group, a nitro group, a $C_1$-$C_{20}$ alkylthio group, a $C_1$-$C_{20}$ alkoxy group, a $C_6$-$C_{20}$ aryloxy group, a $C_1$-$C_{20}$ alkyl group, a $C_2$-$C_{20}$ alkenyl group, a $C_2$-$C_{20}$ alkynyl group, a $C_6$-$C_{20}$ aryl group, a $C_6$-$C_{20}$ aryl group substituted with deuterium, a fluorenyl group, a $C_3$-$C_{20}$ aliphatic ring group, a $C_7$-$C_{20}$ arylalkyl group, $C_8$-$C_{20}$ arylalkenyl group and -$L^a$-N($R^a$)($R^b$), wherein $L^a$ is selected from the group consisting of a single bond, a $C_6$-$C_{20}$ arylene group, a fluorenylene group, a $C_2$-$C_{20}$ heterocyclic group comprising at least one heteroatom selected from the group consisting of O, N, S, Si and P, a $C_3$-$C_{20}$ aliphatic ring, and a combination thereof, and $R^a$ and $R^b$ are each independently selected from the group consisting of a $C_6$-$C_{20}$ aryl group, a fluorenyl group, a $C_2$-$C_{20}$ heterocyclic group comprising at least one heteroatom selected from the group consisting of O, N, S, Si and P, a $C_3$-$C_{20}$ aliphatic ring, and a combination thereof.

2. The organic electric element of claim 1, wherein $L^1$ and $L^2$ are each independently represented by one of Formulas b-1 to b-12 and $L^4$ is represented by one of Formulas b-1 to b-13:

<Formula b-1>

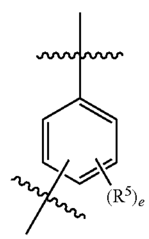

<Formula b-2>

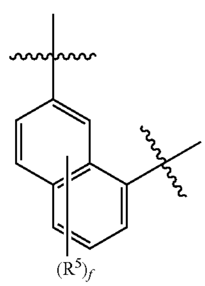

<Formula b-3>

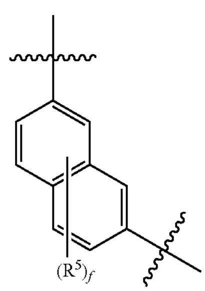

<Formula b-4>

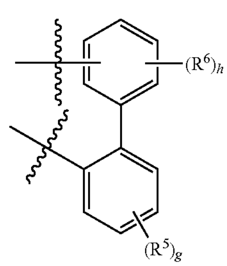

-continued

<Formula b-5>

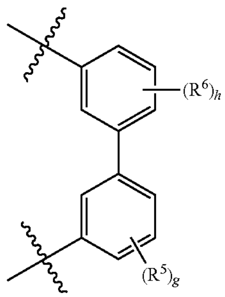

<Formula b-6>

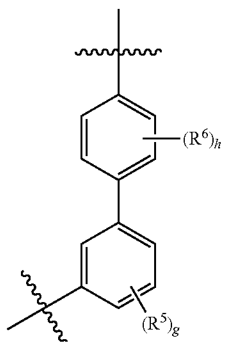

<Formula b-7>

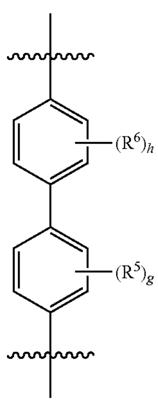

<Formula b-8>

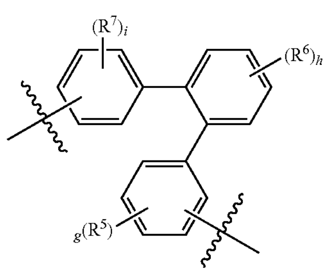

<Formula b-9>

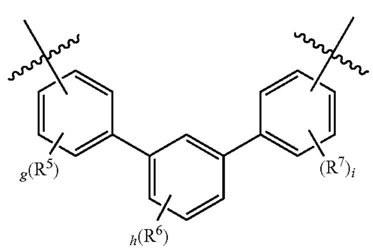

-continued

<Formula b-10>

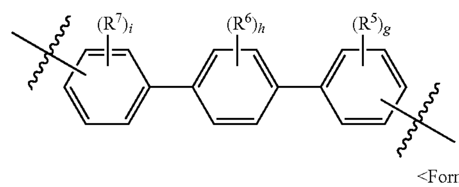

<Formula b-11>

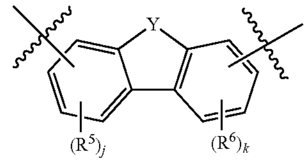

<Formula b-12>

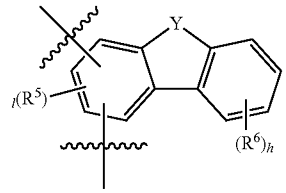

<Formula b-13>

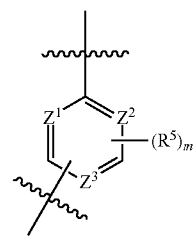

wherein:

$R^5$ to $R^7$ are each independently selected from the group consisting of hydrogen, deuterium, halogen, a cyano group, a nitro group, a $C_6$-$C_{20}$ aryl group, a fluorenyl group, a $C_3$-$C_{20}$ aliphatic ring, a fused ring of a $C_3$-$C_{20}$ aliphatic ring with a $C_6$-$C_{20}$ aromatic ring, a $C_1$-$C_{20}$ alkyl group, a $C_2$-$C_{20}$ alkenyl group, a $C_2$-$C_{20}$ alkynyl group, a $C_1$-$C_{20}$ alkoxyl group, a $C_6$-$C_{30}$ aryloxy group, and -$L^a$-N($R^a$)($R^b$), and adjacent groups may be bonded to each other to form a ring, Y is N-($L^a$-$Ar^a$), O, S or C(R')(R''), with the proviso that Y is C(R')(R'') in the case where $L^1$ or $L^2$ is Formula b-11 or Formula b-12, $Z^1$ to $Z^3$ are each independently C, C(R') or N, and at least one of $Z^1$ to $Z^3$ is N, f is an integer of 0-6, e, g, h and i are each an integer of 0-4, j and k are each an integer of 0-3, l is an integer of 0-2, m is an integer of 0-3, and where each of these is an integer of 2 or more, each of a plurality of $R^5$s, each of a plurality of $R^6$s, and each of a plurality of $R^7$s are the same as or different from each other, R' and R'' are each independently selected from the group consisting of hydrogen, deuterium, halogen, a cyano group, a nitro group, a $C_6$-$C_{20}$ aryl group, a fluorenyl group, a $C_3$-$C_{20}$ aliphatic ring, a fused ring of a $C_3$-$C_{20}$ aliphatic ring with a $C_6$-$C_{20}$ aromatic ring, a $C_1$-$C_{20}$ alkyl group, a $C_2$-$C_{20}$ alkenyl group, a $C_2$-$C_{20}$ alkynyl group, a $C_1$-$C_{20}$ alkoxyl group, a $C_6$-$C_{30}$ aryloxy group, and -$L^a$-N($R^a$)($R^b$), R' and R'' in C(R')(R'') may be linked to each other to form a ring, and adjacent R's in C(R') may be linked to each other to form a ring, $Ar^a$ is selected from the group consisting of a $C_6$-$C_{20}$ aryl group, a fluorenyl group, a $C_3$-$C_{20}$ aliphatic ring, and a combination thereof, $L^a$ is selected from the group consisting of a single bond, a $C_6$-$C_{20}$ arylene group, a fluorenylene group, a $C_3$-$C_{20}$ aliphatic ring, and a combination thereof, and $R^a$ and $R^b$ are each independently selected from the group consisting of a $C_6$-$C_{20}$ aryl group, a fluorenyl group, a $C_3$-$C_{20}$ aliphatic ring, and a combination thereof.

3. The organic electric element of claim 1, wherein Formula 2 is represented by Formula 2-A or Formula 2-B:

<Formula 2-A>

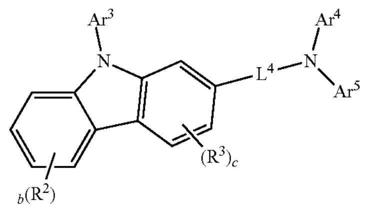

<Formula 2-B>

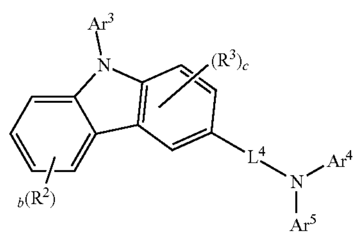

wherein $L^4$, $Ar^3$ to $Ar^5$, $R^2$, $R^3$, b and c are the same as defined in claim 1.

4. The organic electric element of claim 1, wherein Formula 2 is represented by one of Formula 2-C to Formula 2-F:

<Formula 2-C>

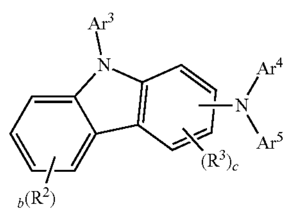

<Formula 2-D>

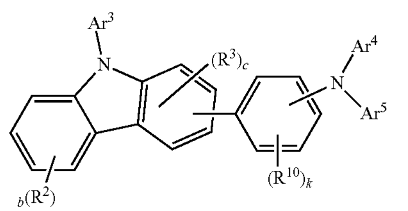

<Formula 2-E>

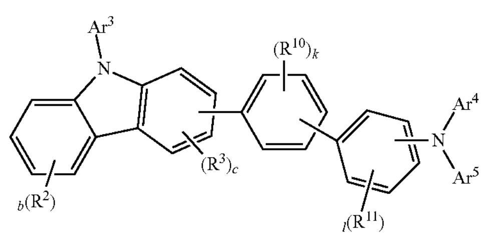

-continued

<Formula 2-F>

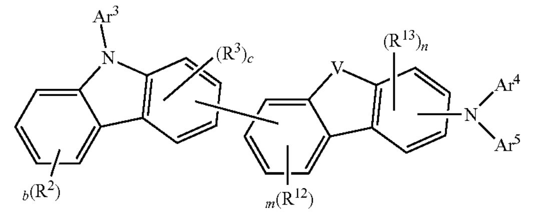

wherein $Ar^3$ to $Ar^5$, $R^2$, $R^3$, b and c are the same as defined in claim 1, $R^{10}$ to $R^{13}$ are each independently selected from the group consisting of hydrogen, deuterium, halogen, a $C_6$-$C_{20}$ aryl group, a fluorenyl group, a $C_2$-$C_{20}$ heterocyclic group comprising at least one heteroatom selected from the group consisting of O, N, S, Si and P, a $C_3$-$C_{20}$ aliphatic ring, a $C_1$-$C_{20}$ alkyl group, a $C_2$-$C_{20}$ alkenyl group, a $C_2$-$C_{20}$ alkynyl group, a $C_1$-$C_{20}$ alkoxyl group, a $C_6$-$C_{20}$ aryloxy group, -$L^a$-N($R^a$)($R^b$) and a combination thereof, and adjacent groups may be linked to each other to form a ring, k and l are each an integer of 0-4, n and m are each an integer of 0-3, and where each of these is an integer of 2 or more, each of a plurality of $R^{10}$s, each of a plurality of $R^{11}$s, each of a plurality of $R^{12}$s, and each of a plurality of $R^{13}$s are the same as or different from each other, V is N-($L^a$-$Ar^a$), O, S or C(R')(R"), R' and R" are each independently selected from the group consisting of hydrogen, deuterium, halogen, a cyano group, a nitro group, a $C_6$-$C_{20}$ aryl group, a fluorenyl group, a $C_2$-$C_{20}$ heterocyclic group comprising at least one heteroatom selected from the group consisting of O, N, S, Si and P, a $C_3$-$C_{20}$ aliphatic ring, a fused ring of a $C_3$-$C_{20}$ aliphatic ring with a $C_6$-$C_{20}$ aromatic ring, a $C_1$-$C_{20}$ alkyl group, a $C_2$-$C_{20}$ alkenyl group, a $C_2$-$C_{20}$ alkynyl group, a $C_1$-$C_{20}$ alkoxyl group, a $C_6$-$C_{20}$ aryloxy group, and -$L^a$-N($R^a$)($R^b$), and R' and R" may be linked to each other to form a ring, $Ar^a$ is selected from the group consisting of a $C_6$-$C_{20}$ aryl group, a fluorenyl group, a $C_2$-$C_{20}$ heterocyclic group comprising at least one heteroatom selected from the group consisting of O, N, S, Si and P, a $C_3$-$C_{20}$ aliphatic ring, and a combination thereof, and $L^a$, $R^a$ and $R^b$ are the same as defined in claim 1.

5. The organic electric element of claim 1, wherein Formula 2 is represented by Formula 2-S or Formula 2-T:

<Formula 2-S>

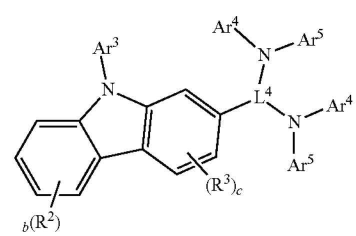

-continued

<Formula 2-T>

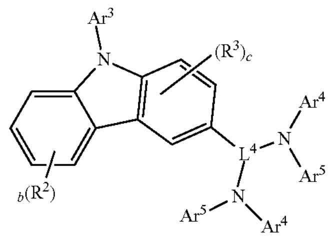

wherein $Ar^3$ to $Ar^5$, $L^4$, $R^2$, $R^3$, b and c are the same as defined in claim 1.

6. The organic electric element of claim 1, wherein n is 1 in Formula 2.

7. The organic electric element of claim 1, wherein n is 2 in Formula 2.

8. The organic electric element of claim 1, wherein Formula 2 is represented by Formula 2-U:

<Formula 2-U>

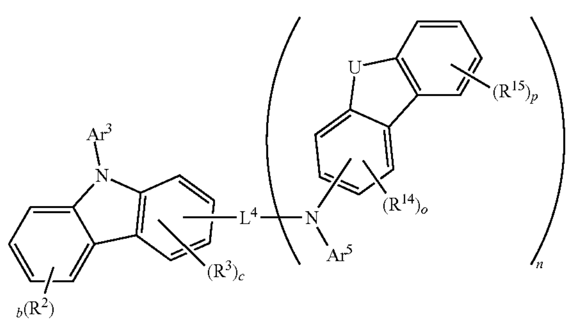

wherein $Ar^3$, $Ar^5$, $L^4$, $R^2$, $R^3$, b, c and n are the same as defined in claim 1, U is N-($L^a$-$Ar^a$), O, S or C(R')(R"), $R^{14}$ and $R^{15}$ are each independently selected from the group consisting of hydrogen, deuterium, halogen, a cyano group, a nitro group, a $C_6$-$C_{20}$ aryl group, a fluorenyl group, a $C_2$-$C_{20}$ heterocyclic group comprising at least one heteroatom selected from the group consisting of O, N, S, Si and P, a $C_3$-$C_{20}$ aliphatic ring, a fused ring of a $C_3$-$C_{20}$ aliphatic ring with a $C_6$-$C_{20}$ aromatic ring, a $C_1$-$C_{20}$ alkyl group, a $C_2$-$C_{20}$ alkenyl group, a $C_2$-$C_{20}$ alkynyl group, a $C_1$-$C_{20}$ alkoxyl group, a $C_6$-$C_{20}$ aryloxy group, and -$L^a$-N($R^a$)($R_b$), and adjacent groups may be linked to each other to form a ring, o is an integer of 0-3, p is an integer of 0-4, and where each of these is an integer of 2 or more, each of a plurality of $R^{14}$s, and each of a plurality of R" $^5$s are the same as or different from each other, R' and R" are each independently selected from the group consisting of hydrogen, deuterium, halogen, a cyano group, a nitro group, a $C_6$-$C_{20}$ aryl group, a fluorenyl group, a $C_2$-$C_{20}$ heterocyclic group comprising at least one heteroatom selected from the group consisting of O, N, S, Si and P, a $C_3$-$C_{20}$ aliphatic ring, a fused ring of a $C_3$-$C_{20}$ aliphatic ring with a $C_6$-$C_{20}$ aromatic ring, a $C_1$-$C_{20}$ alkyl group, a $C_2$-$C_{20}$ alkenyl group, a $C_2$-$C_{20}$ alkynyl group, a $C_1$-$C_{20}$ alkoxyl group, a $C_6$-$C_{30}$ aryloxy group, and -$L^a$-N($R^a$)($R_b$), and R' and R" may be linked to each other to form a ring, $Ar^a$ is selected from the group consisting of a $C_6$-$C_{20}$ aryl group, a fluorenyl group, a $C_2$-$C_{20}$ heterocyclic group comprising at least one heteroatom selected from the group consisting of O, N, S, Si and P, a $C_3$-$C_{20}$ aliphatic ring, and a combination thereof, and $L^a$, $R^a$ and $R^b$ are the same as defined in claim 1.

9. The organic electric element of claim 1, wherein the compound represented by Formula 1-G is selected from the group consisting of the following compounds:

1-5

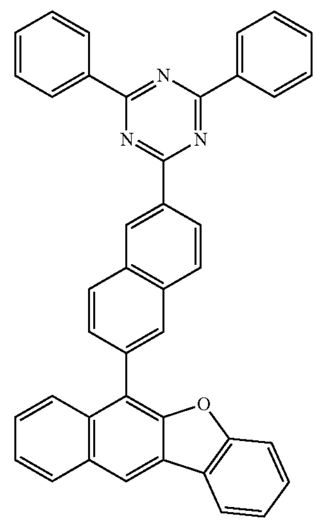

1-90

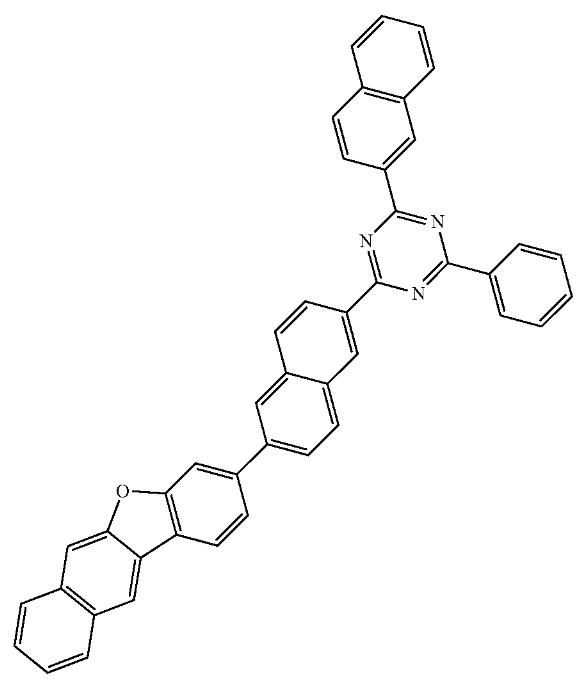

-continued
1-91
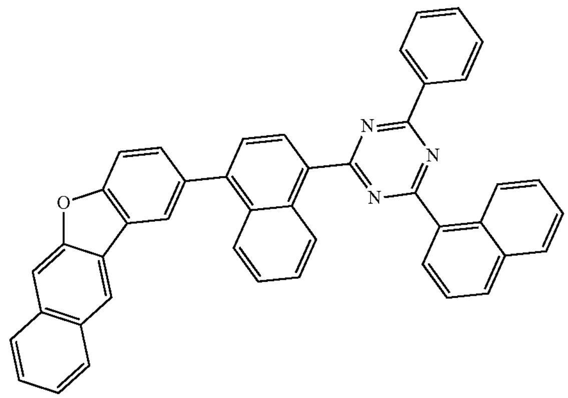
1-92
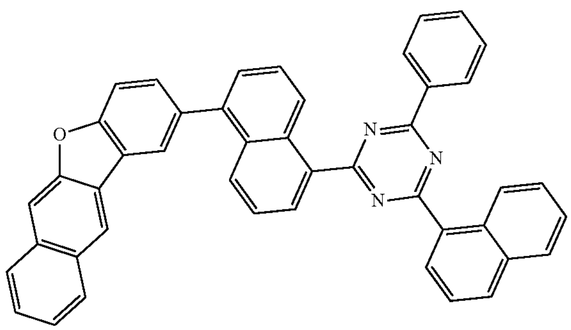
1-93
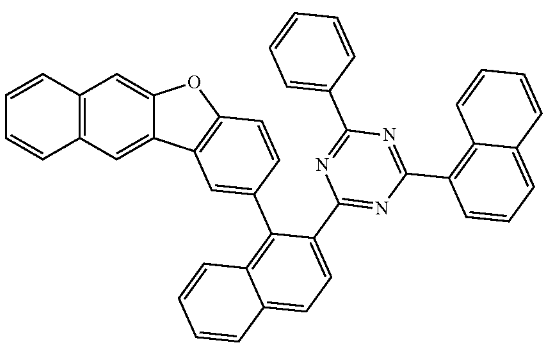
1-94
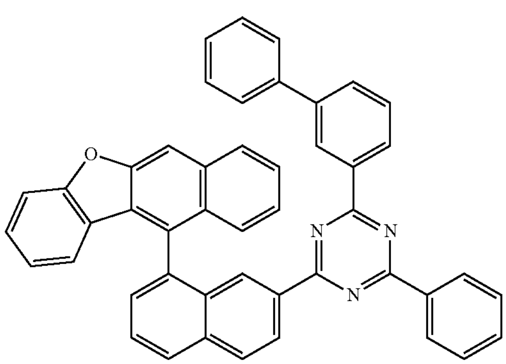
-continued
1-100
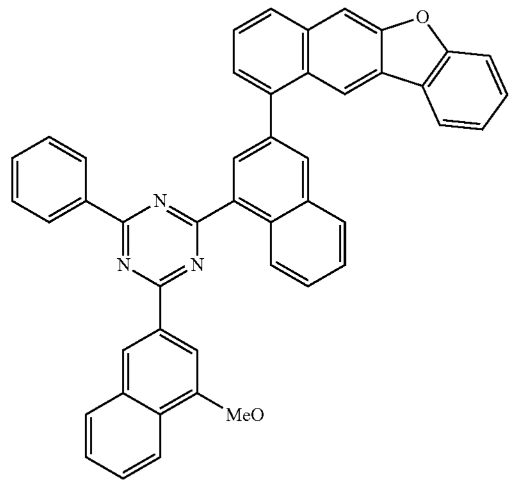
1-101
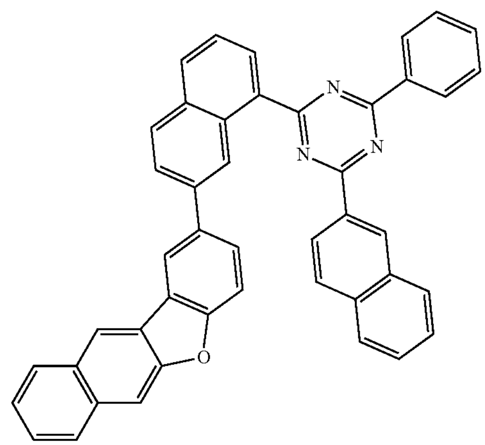
1-102
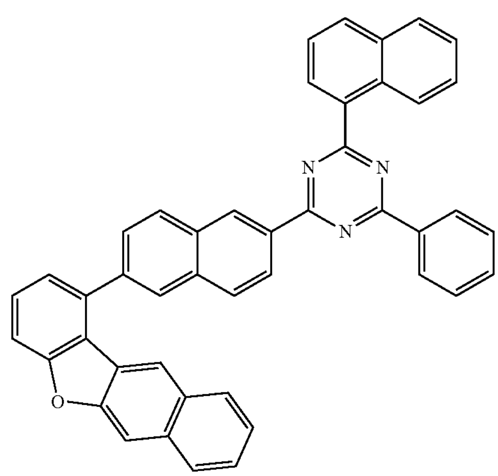

-continued
1-103
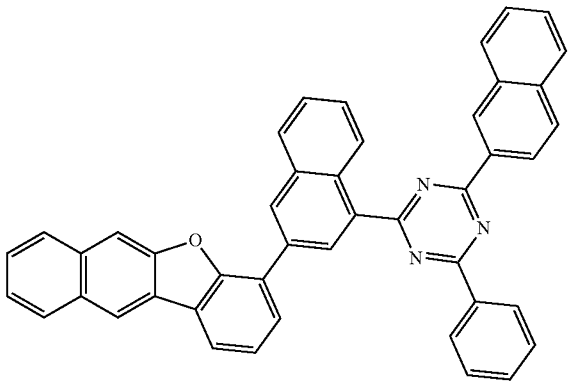
1-110
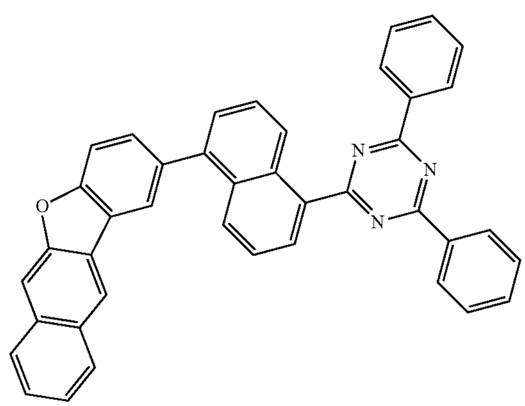
1-113
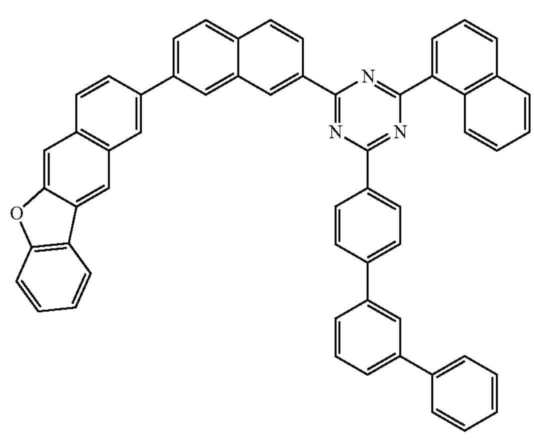
-continued
1-114
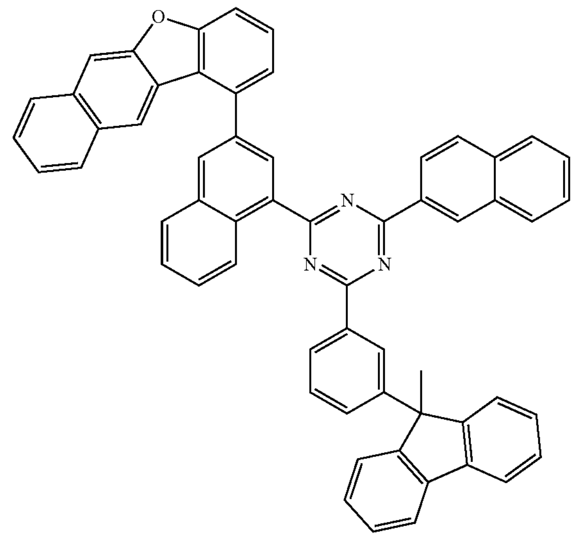
1-115
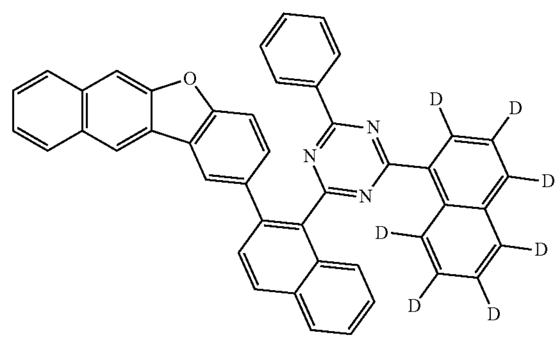
1-120
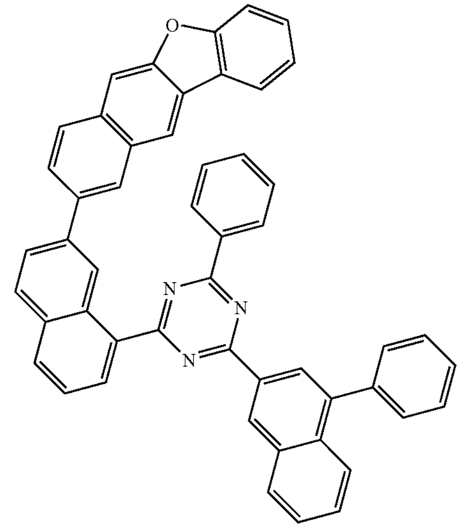
10. The organic electric element of claim 1, wherein the compound represented by Formula 2 is selected from the group consisting of the following compounds:

-continued
2-1
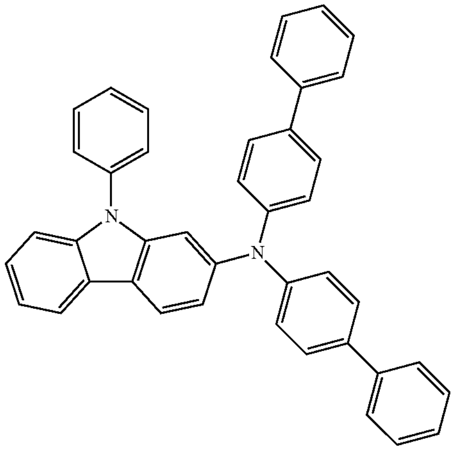
2-2
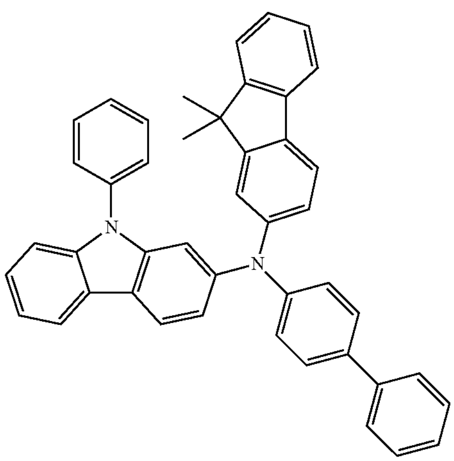
2-3
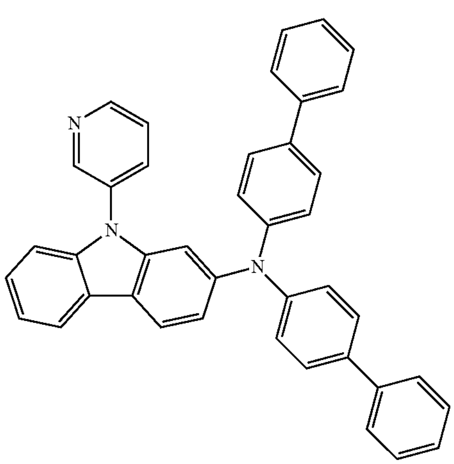
2-4
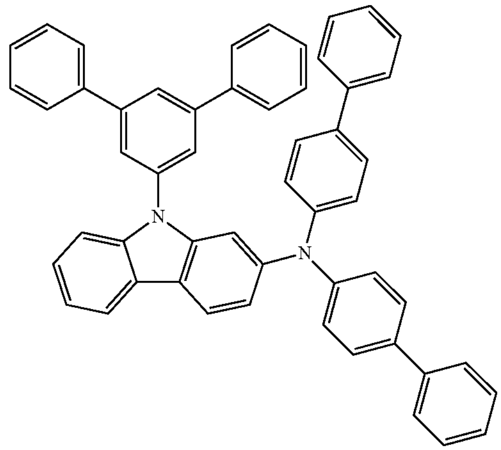
2-5
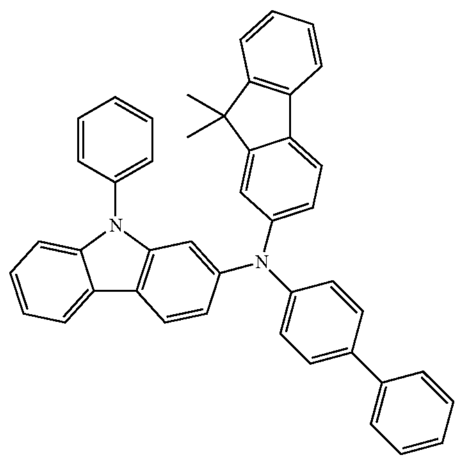
2-6
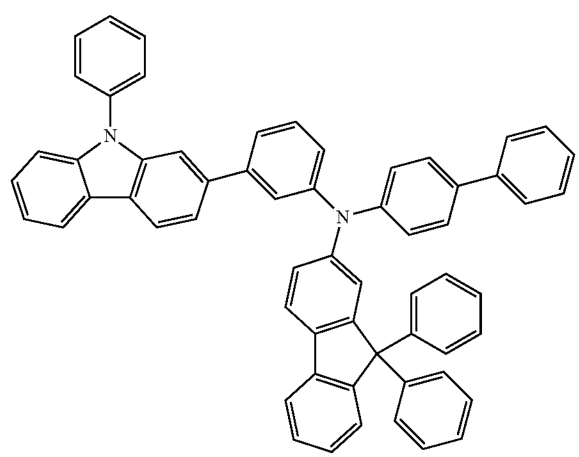

-continued
2-7
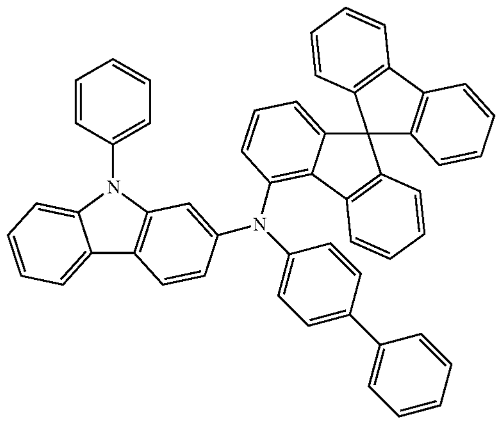
2-8
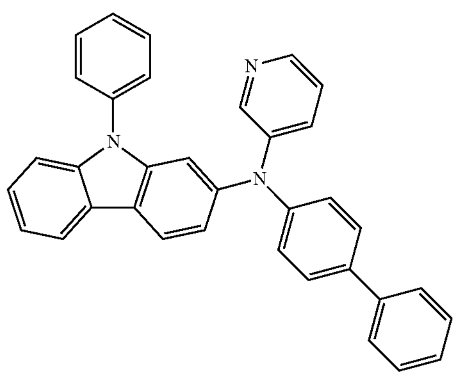
2-9
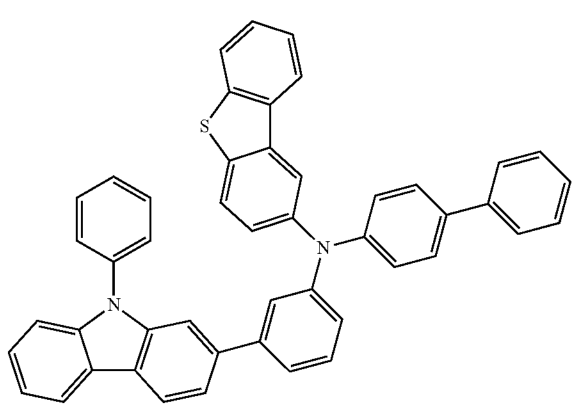
-continued
2-10
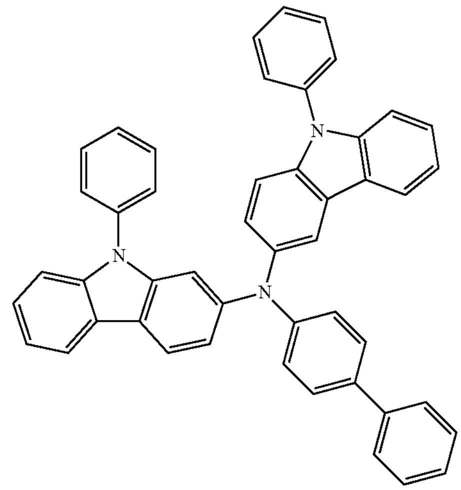
2-11
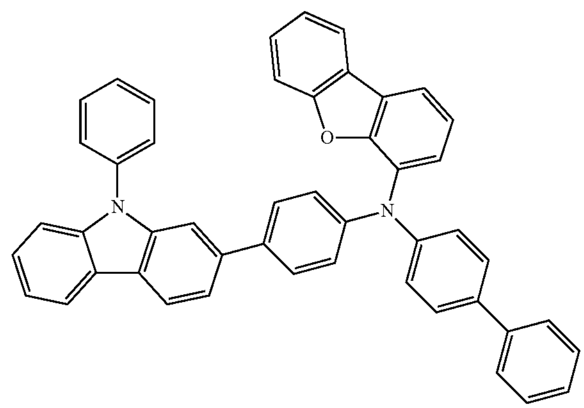
2-12
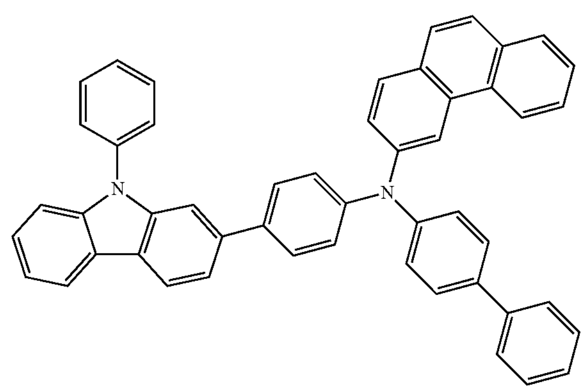
2-13
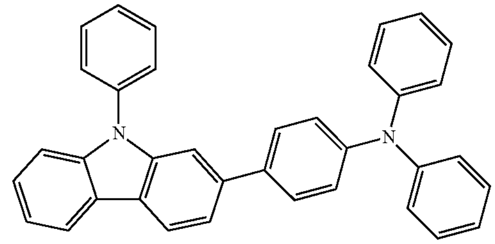

-continued
2-14
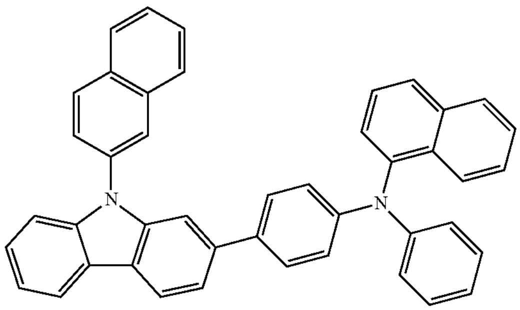
2-15
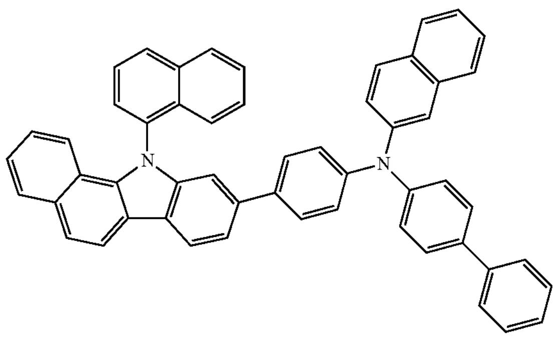
2-16
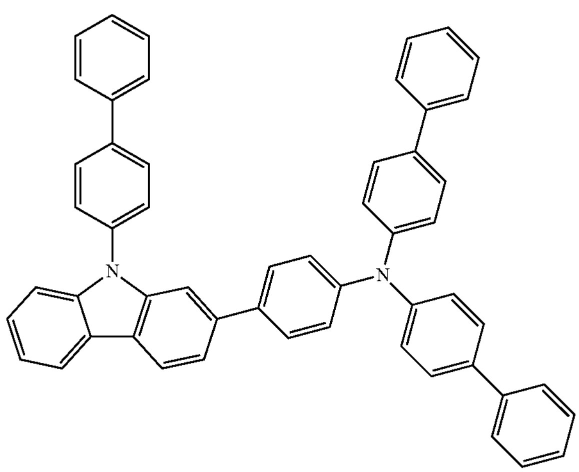
2-17
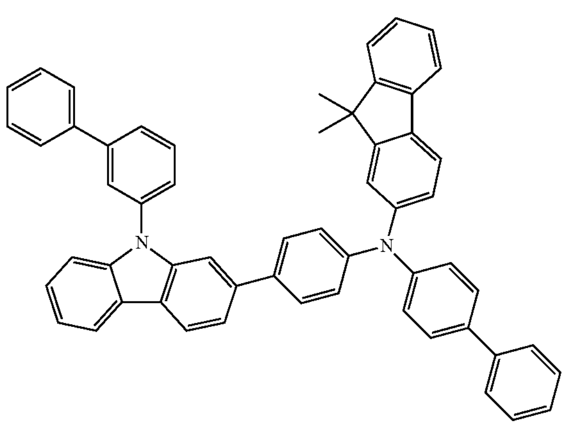
-continued
2-18
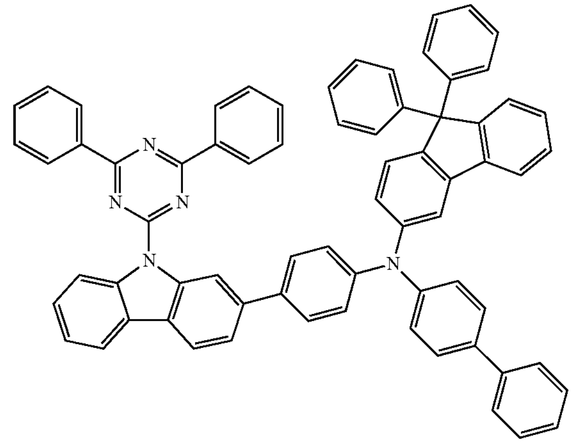
2-19
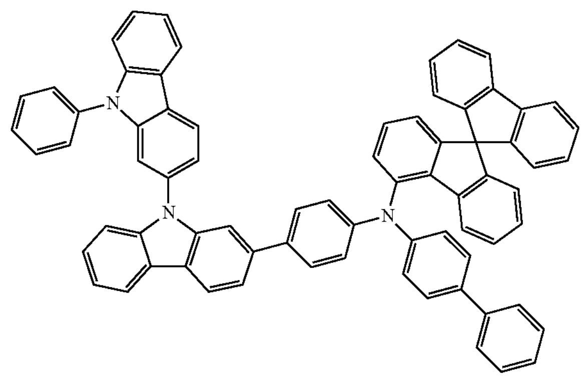
2-20
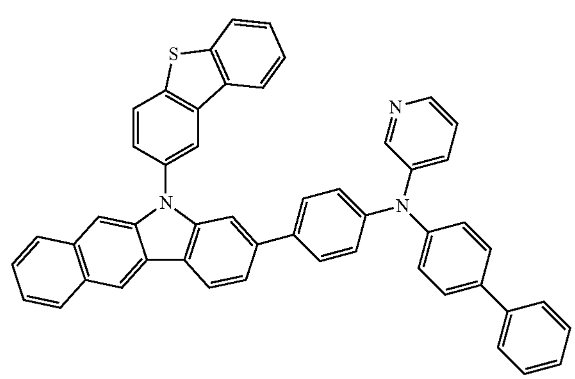

-continued
2-21
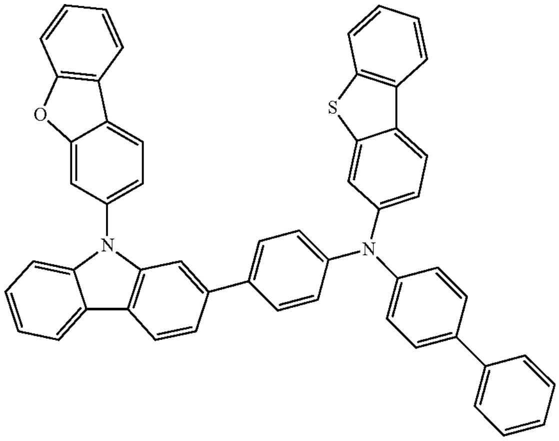
2-22
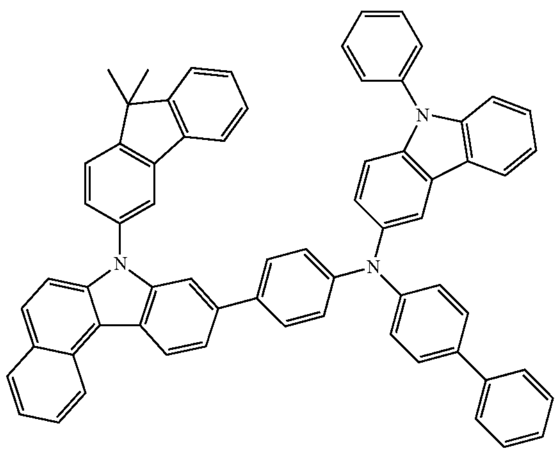
2-23
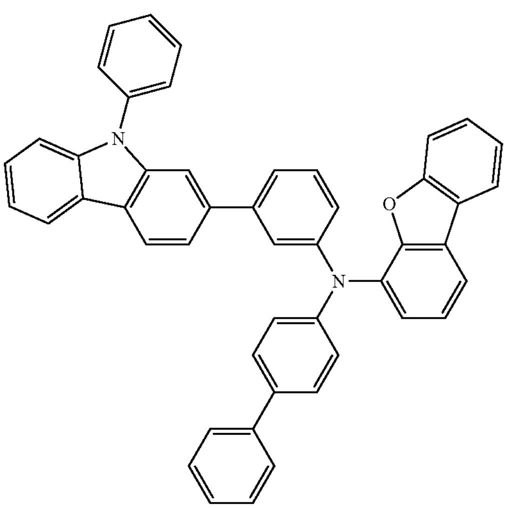
-continued
2-24
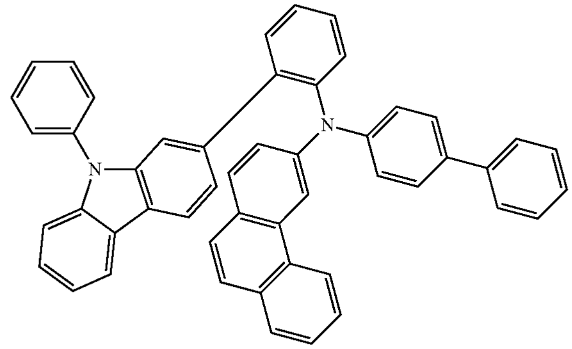
2-25
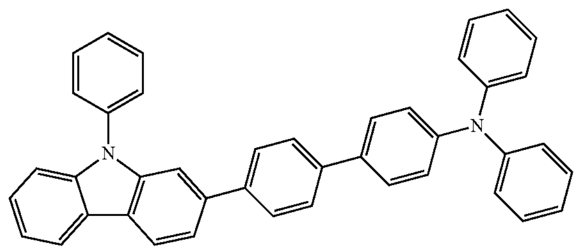
2-26
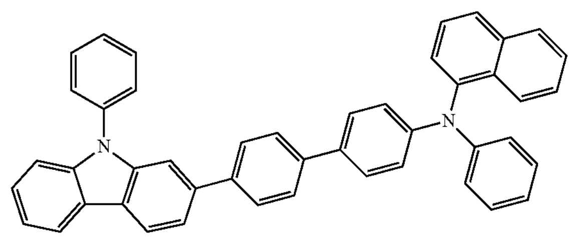
2-27
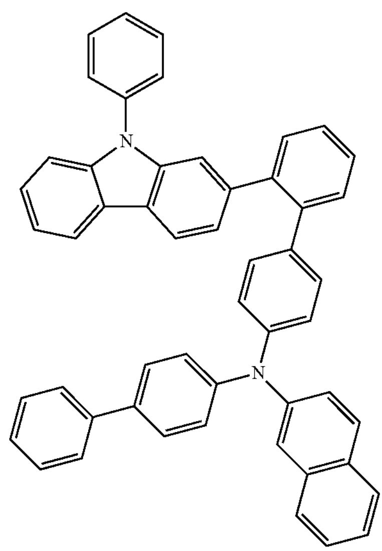

-continued
2-28
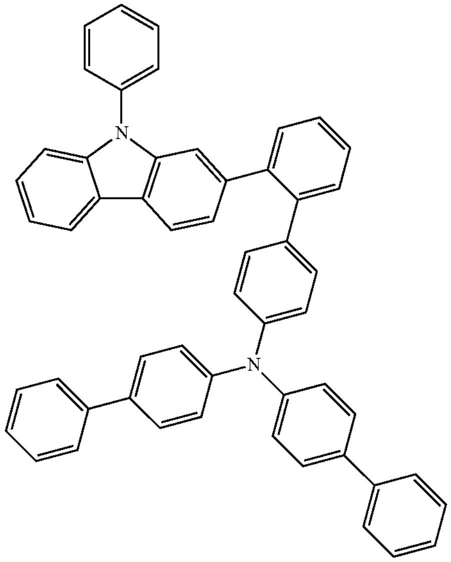
2-29
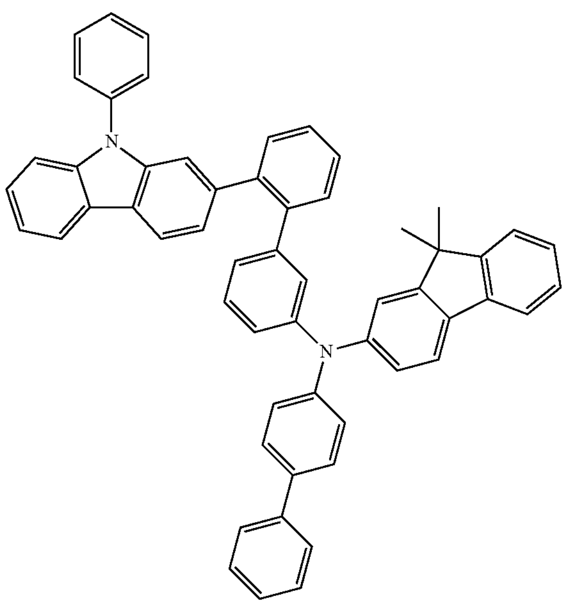
2-30
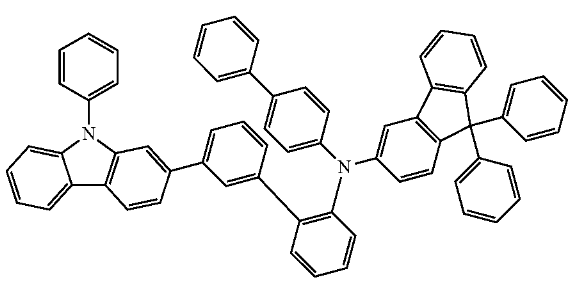
-continued
2-31
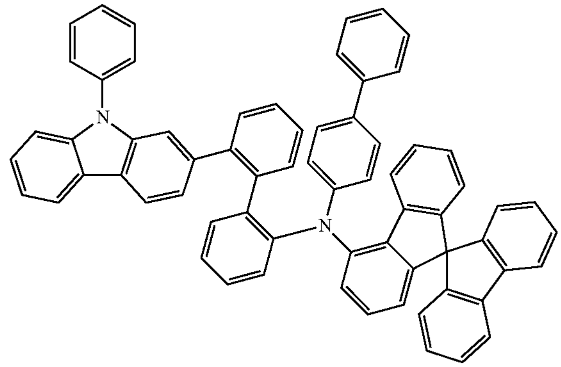
2-32
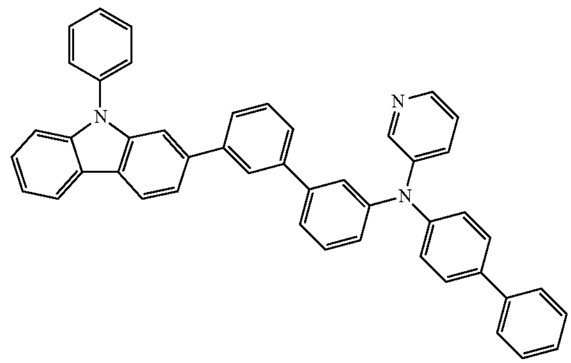
2-33
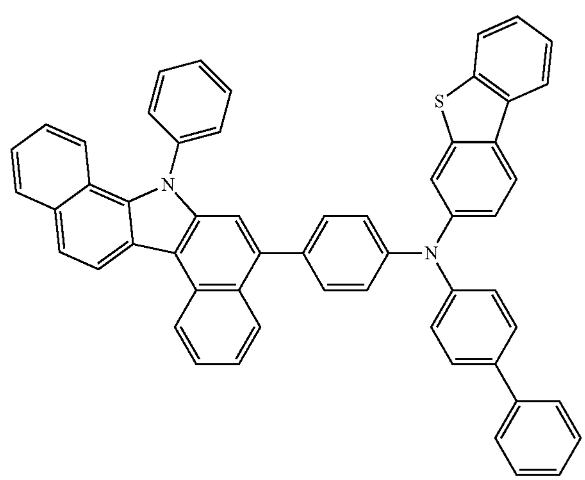

-continued
2-34
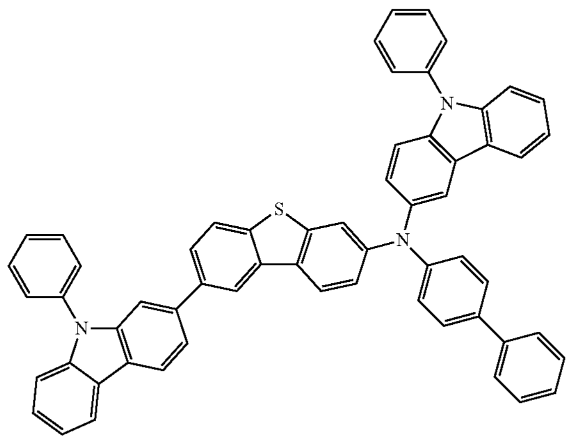
2-35
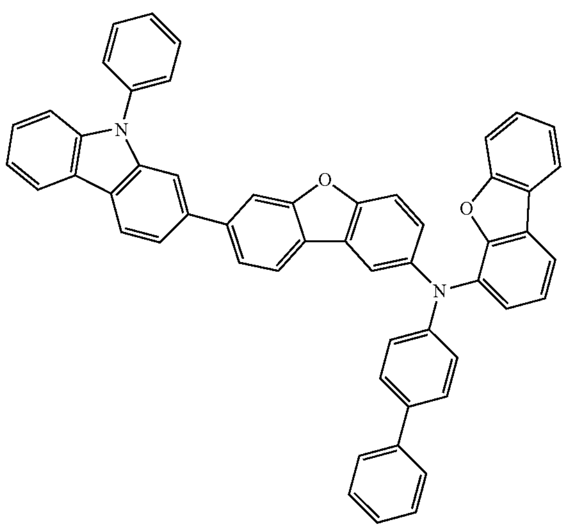
2-36
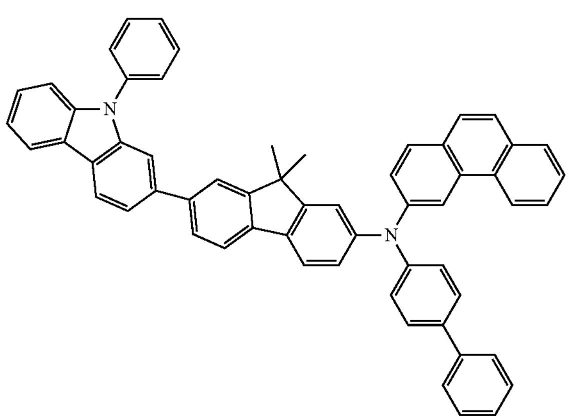
-continued
2-37
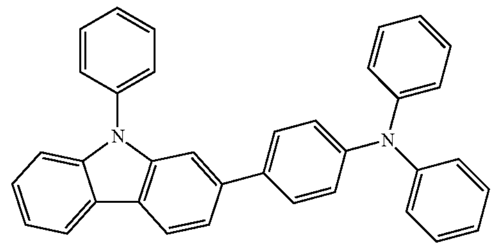
2-38
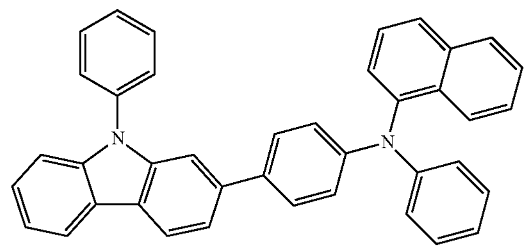
2-39
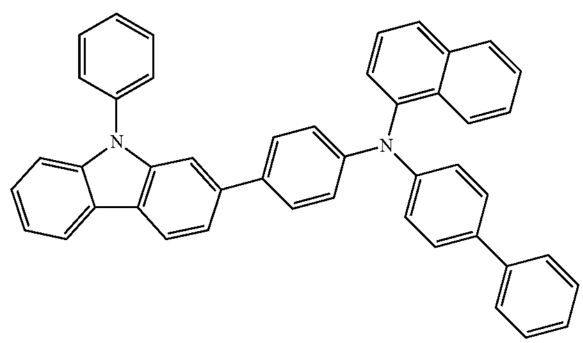
2-40
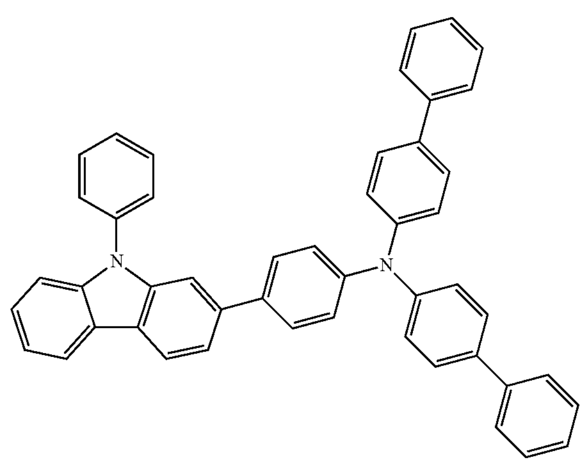

2-41
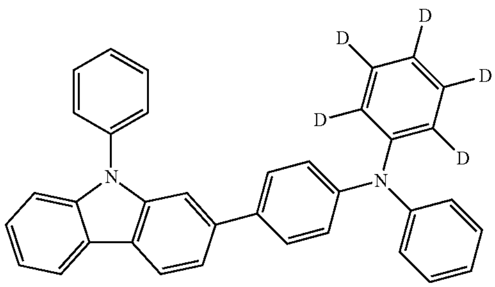
2-42
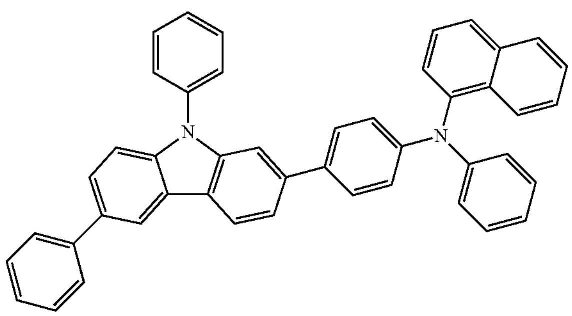
2-43
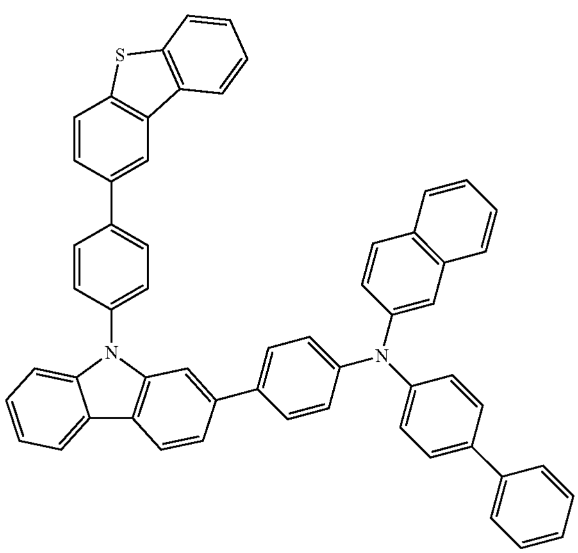
2-44
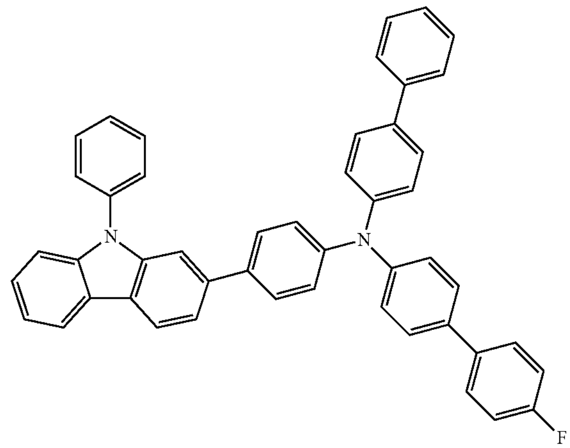
2-45
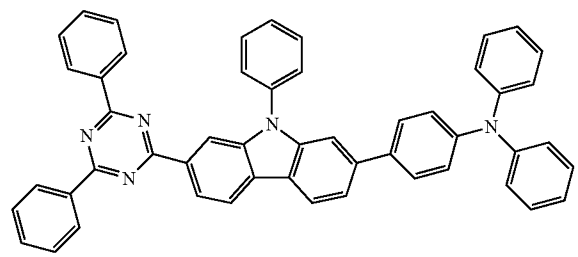
2-46
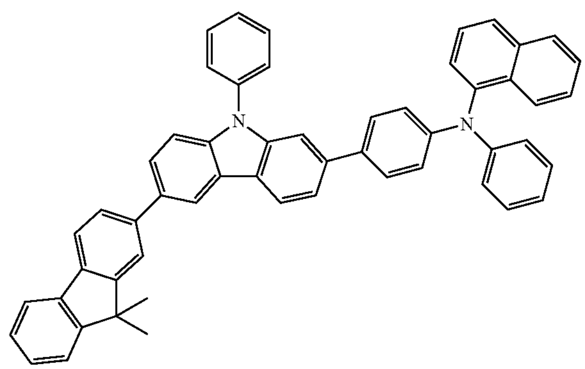
2-47
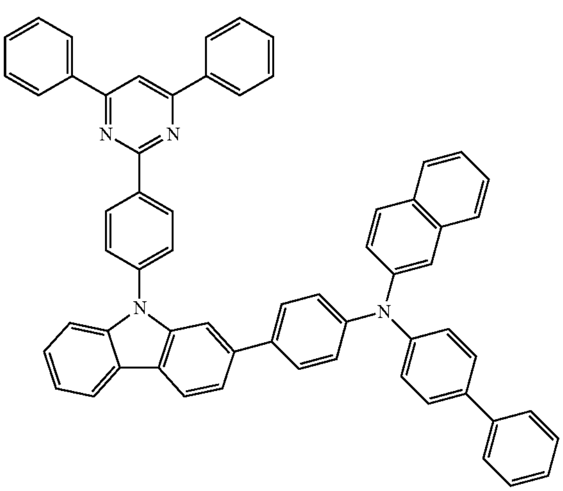

2-48
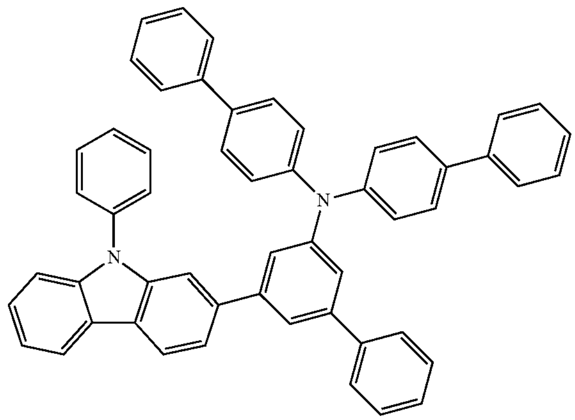
2-49
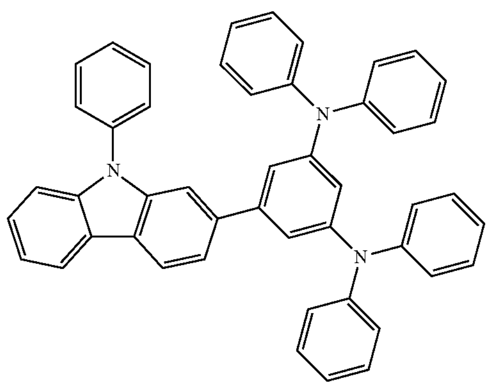
2-50
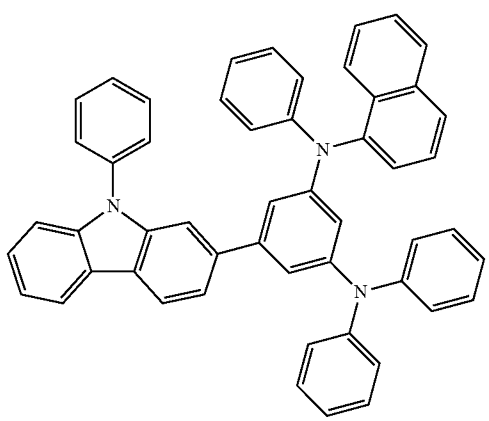
2-51
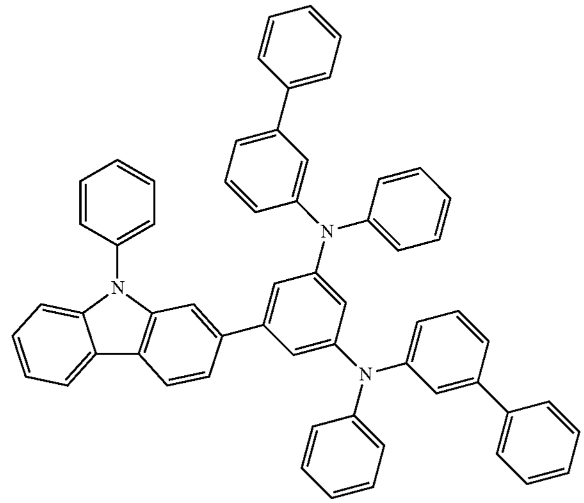
2-52
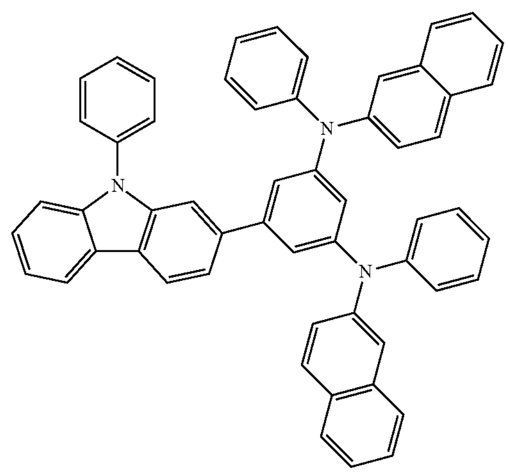
2-53
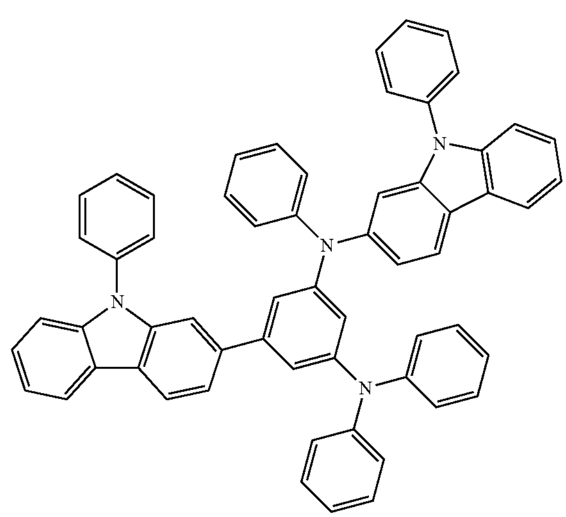

-continued
2-54
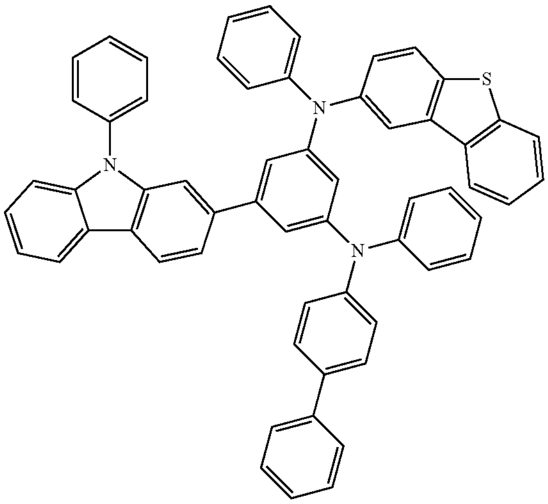
2-55
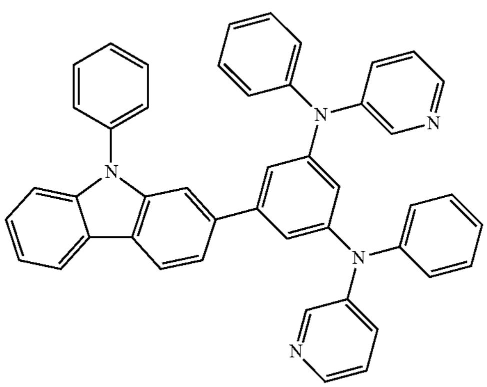
2-56
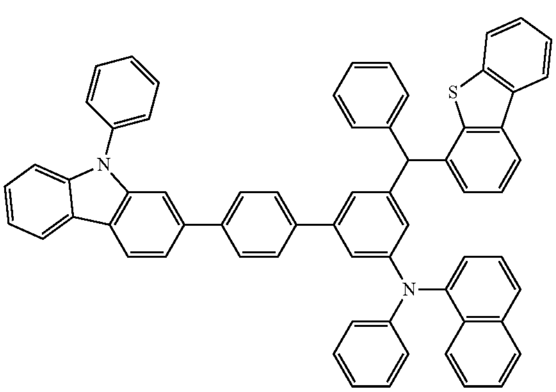
-continued
2-57
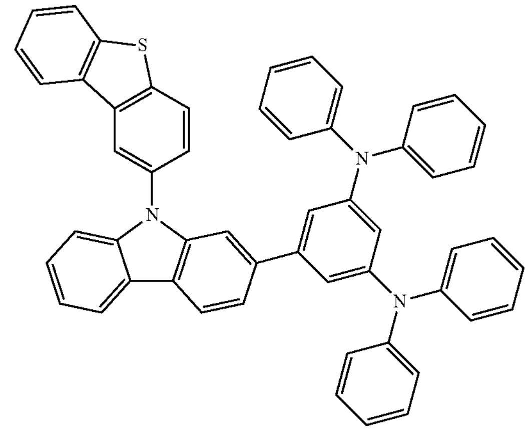
2-58
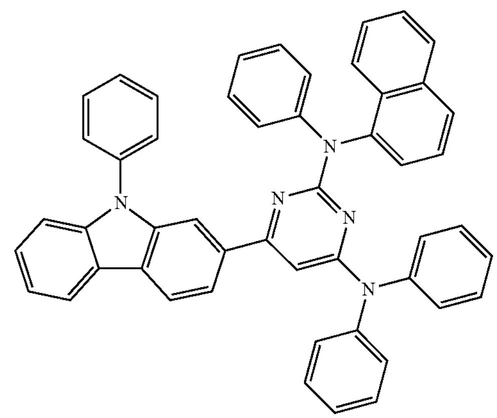
2-59
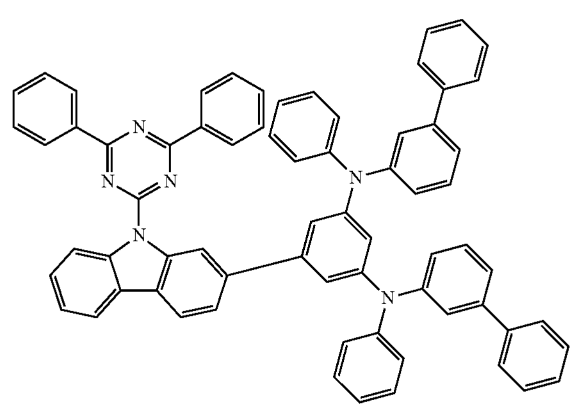

-continued
2-60
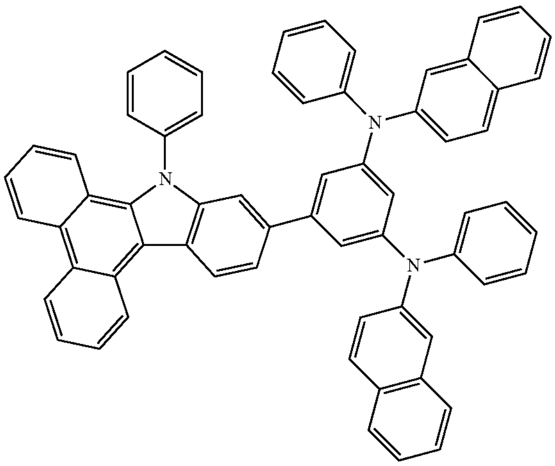
2-61
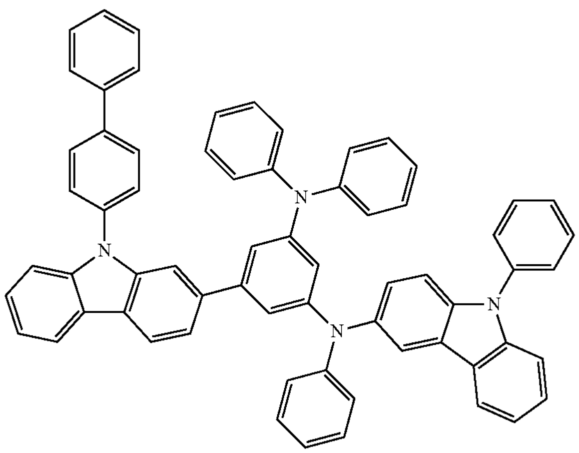
2-62
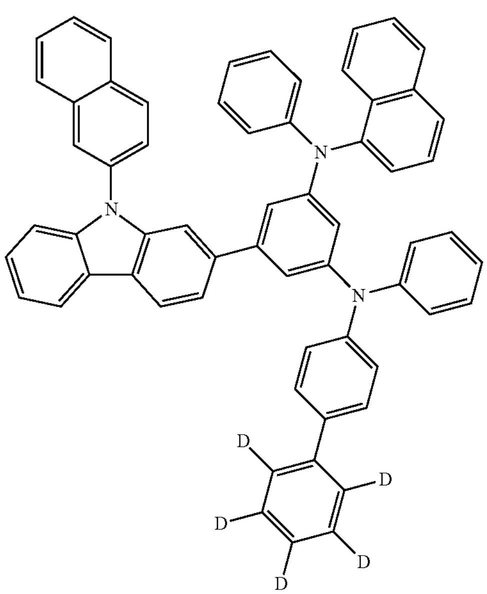
-continued
2-63
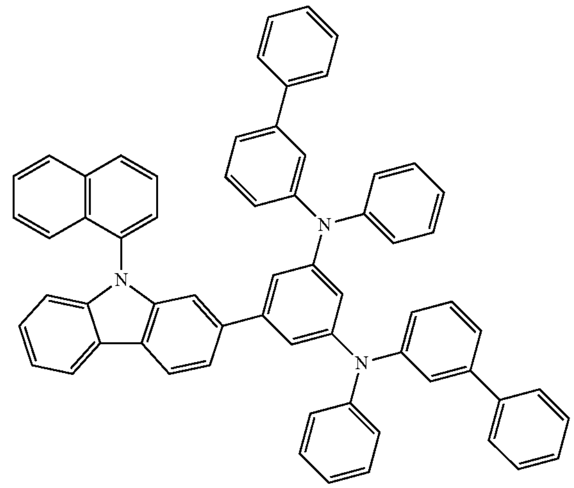
2-64
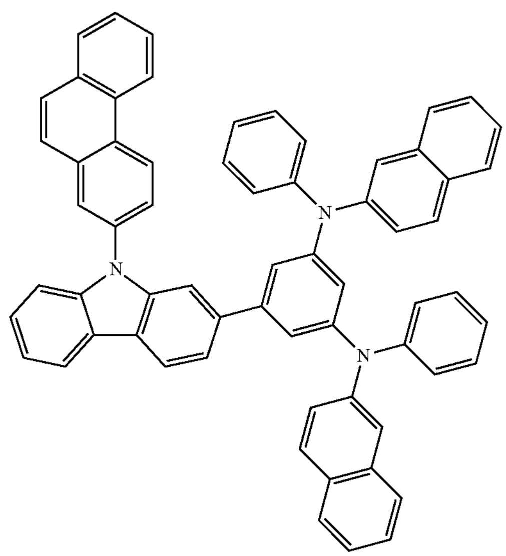
2-65
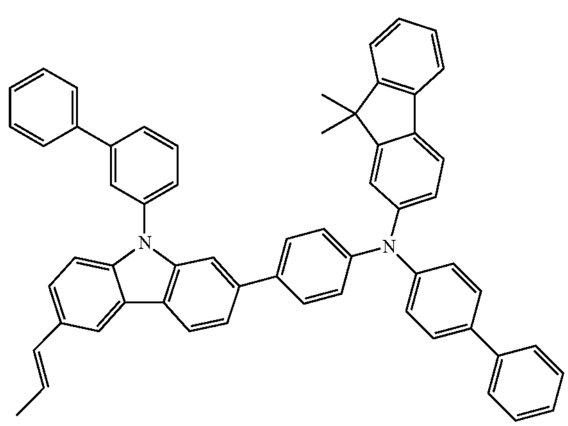

-continued
2-66
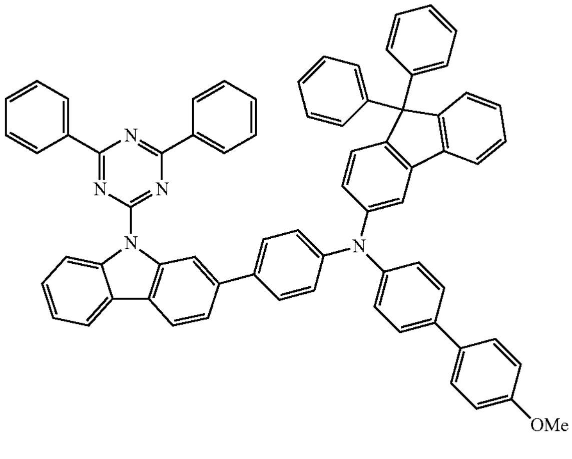
2-67
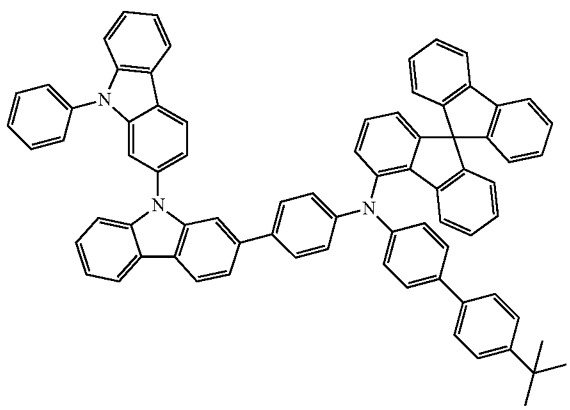
2-68
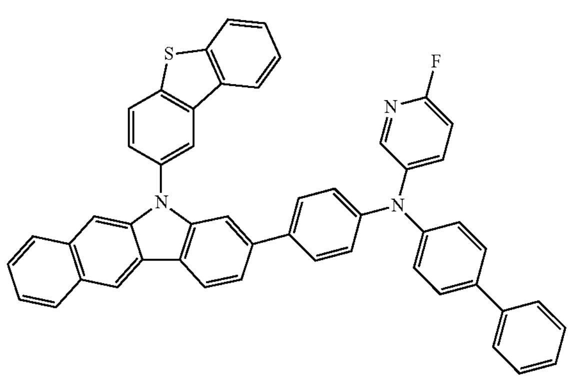
-continued
2-69
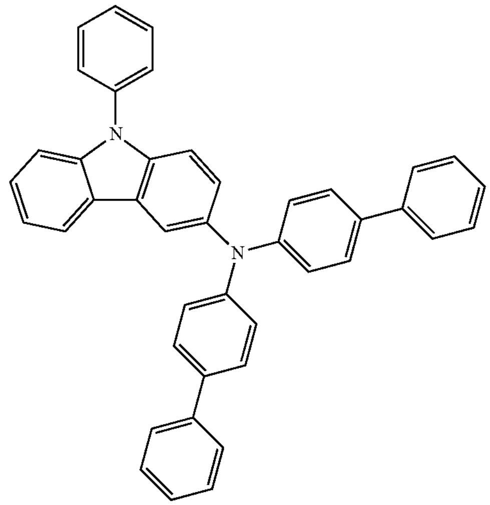
2-70
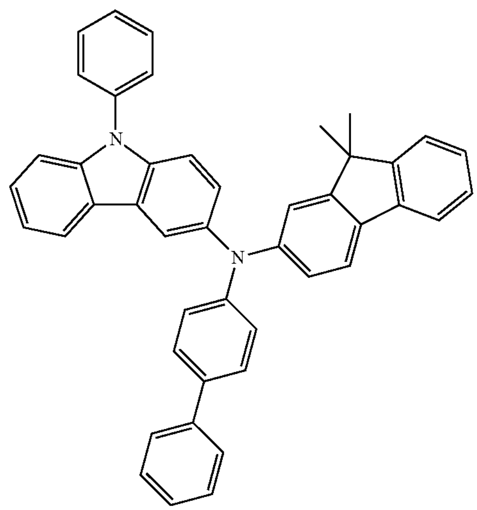
2-71
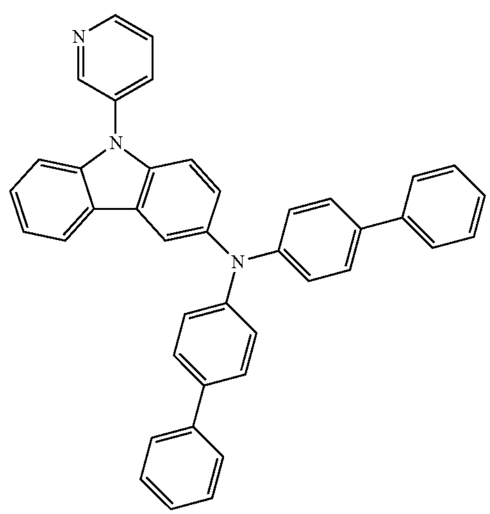

-continued
2-72
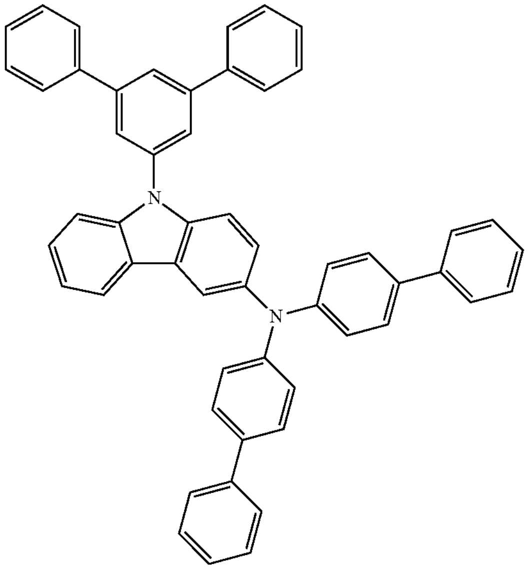
2-73
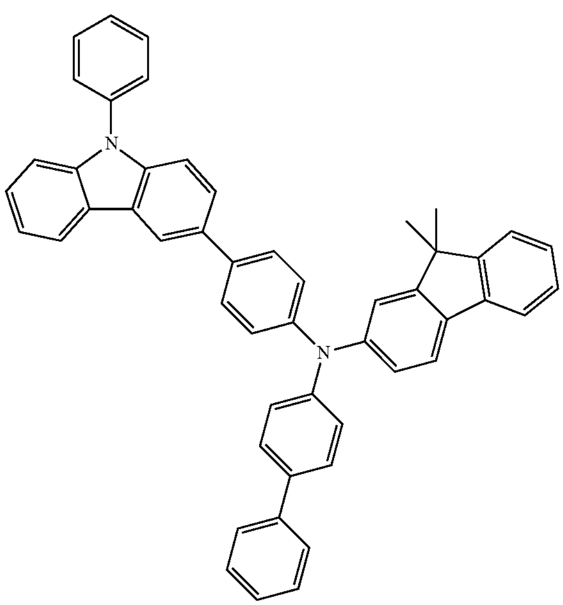
-continued
2-74
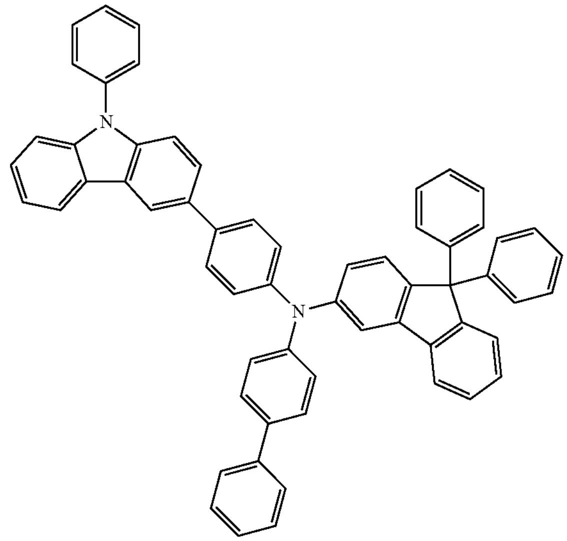
2-75
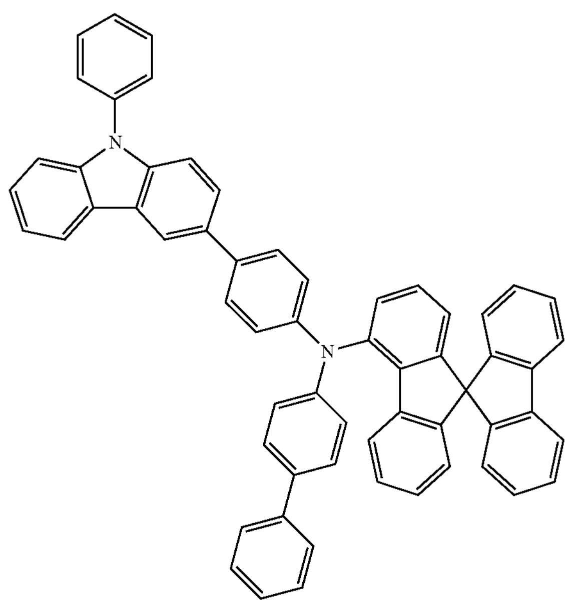

2-76
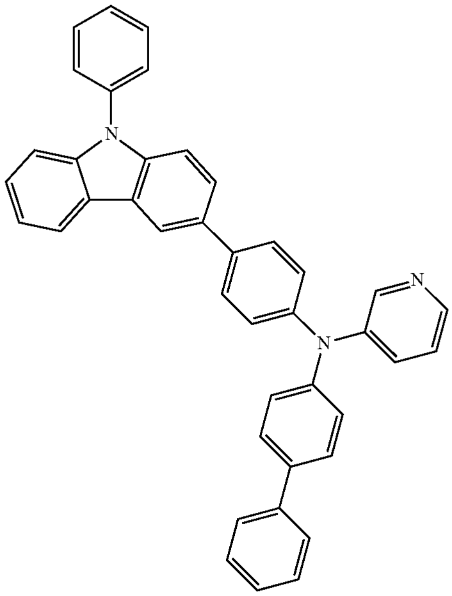
2-77
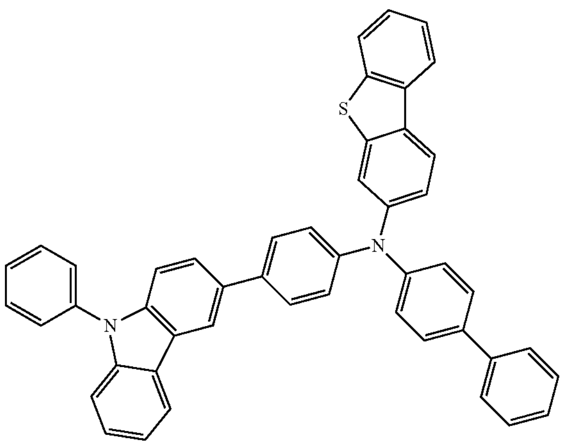
2-78
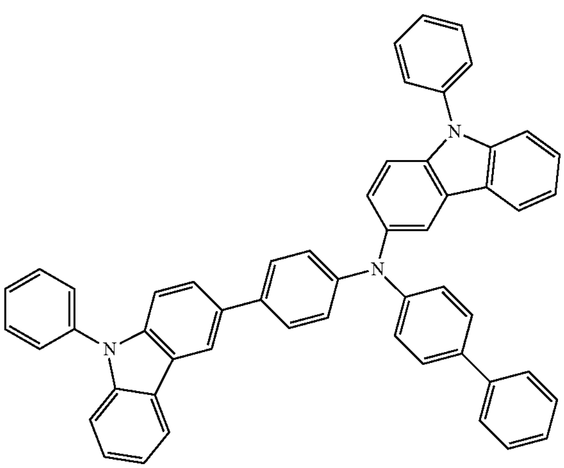
2-79
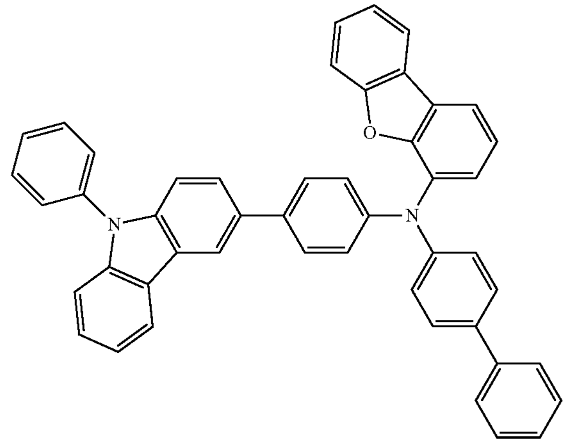
2-80
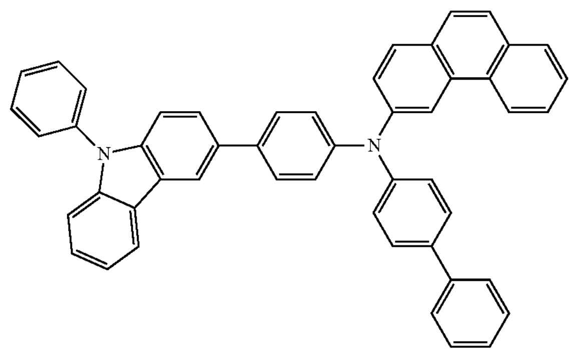
2-81
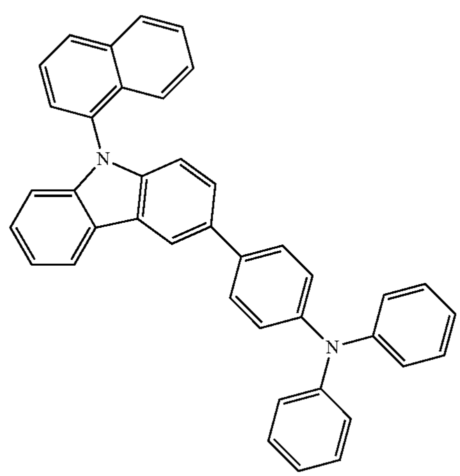

-continued
2-82
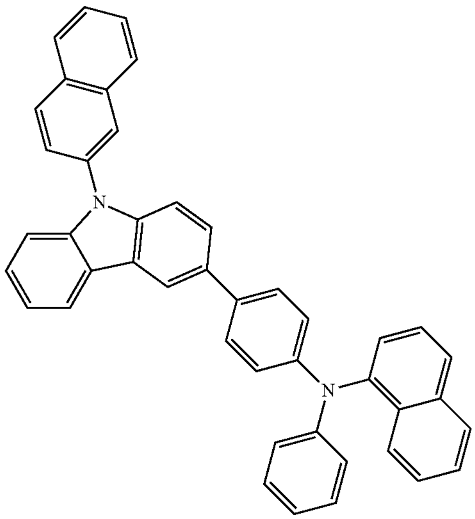
2-83
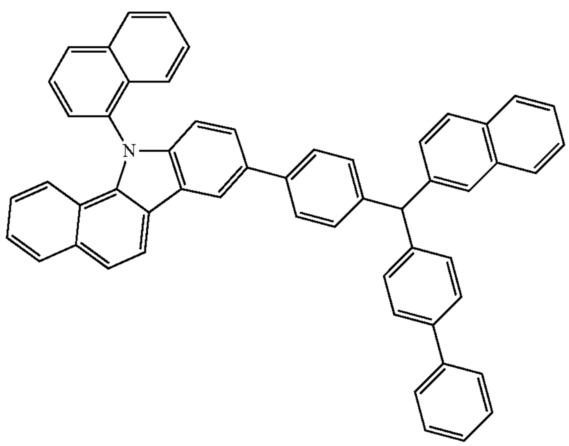
2-84
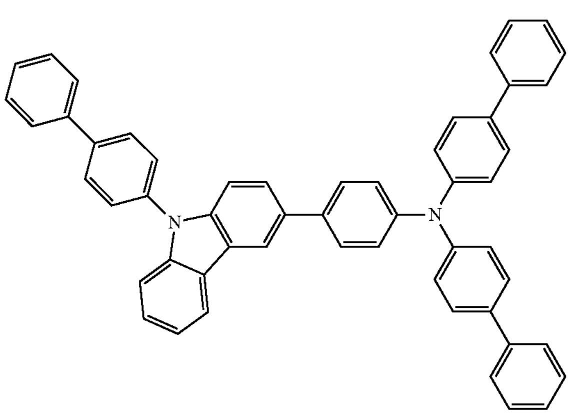
-continued
2-85
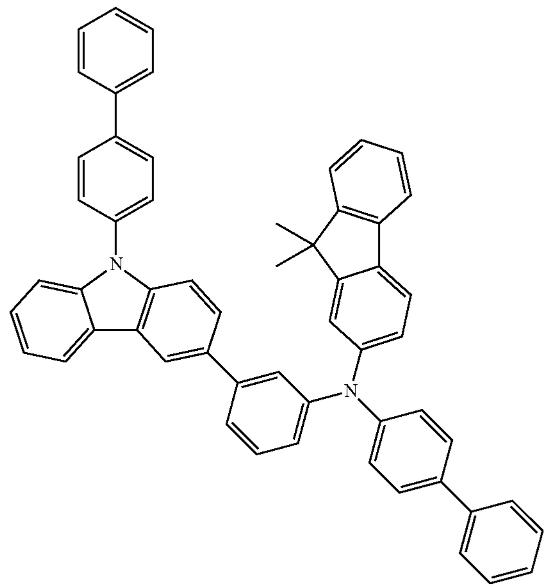
2-86
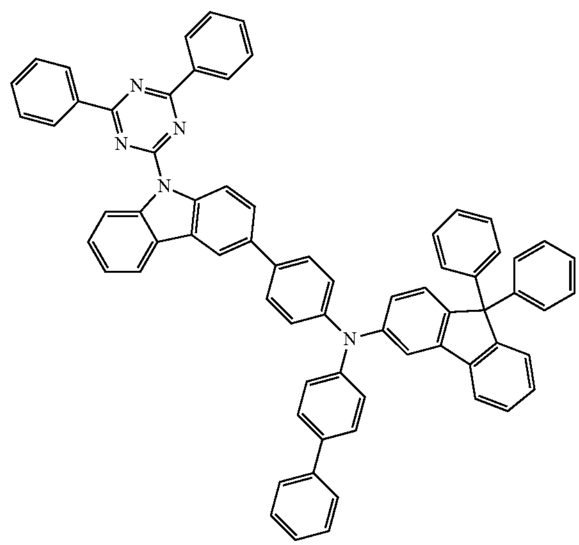
2-87
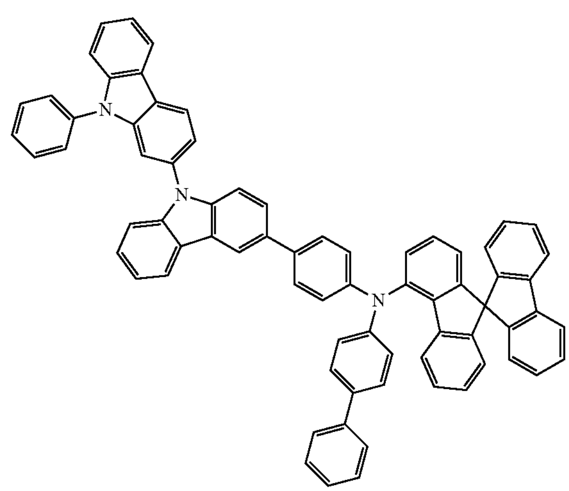

-continued
2-88
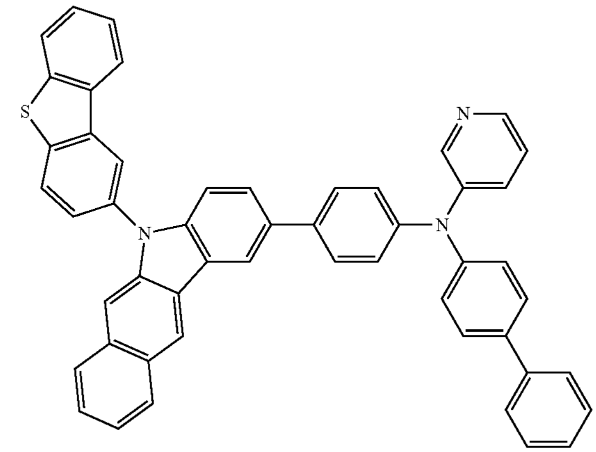
2-89
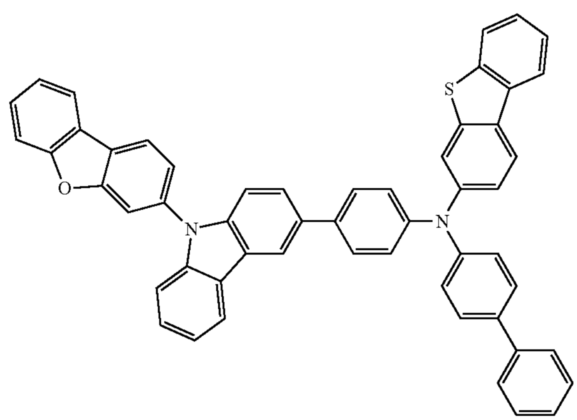
2-90
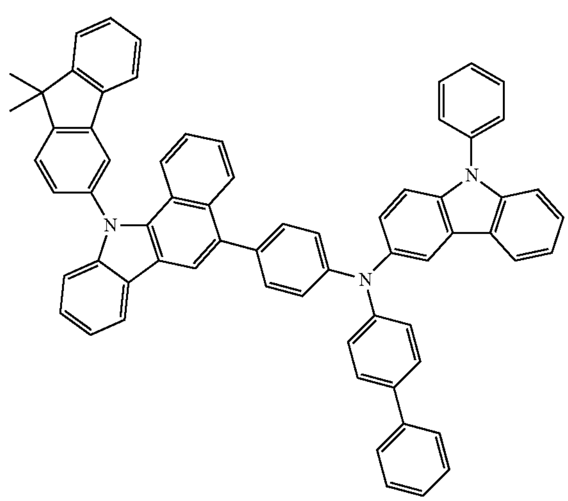
-continued
2-91
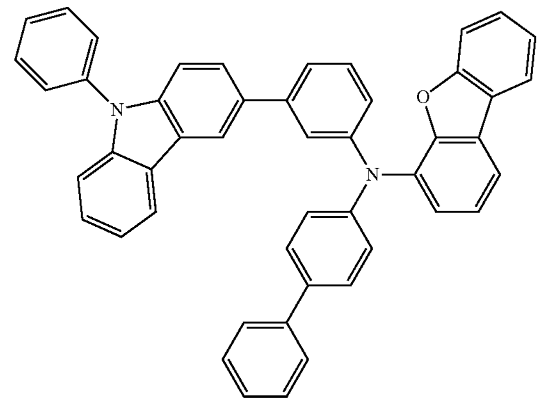
2-92
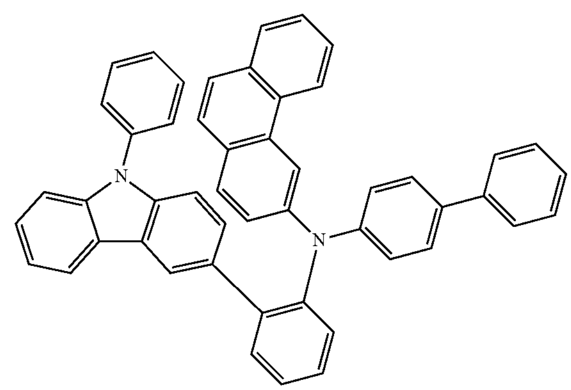
2-93
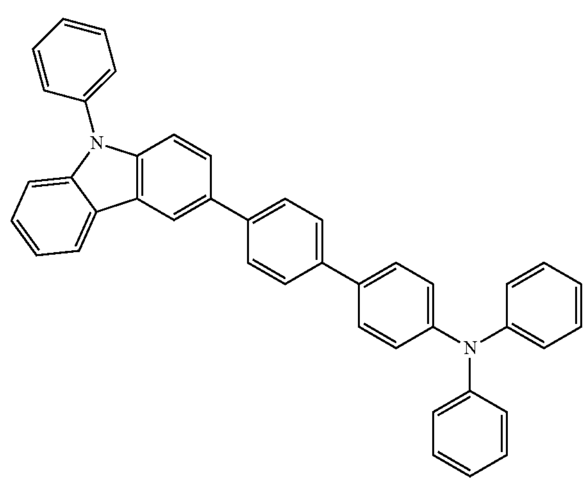

-continued
2-94
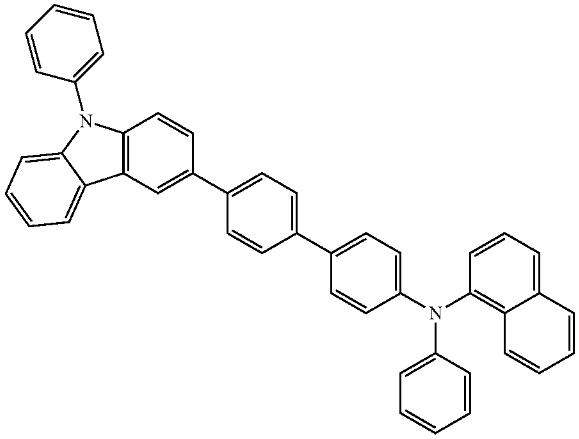
2-95
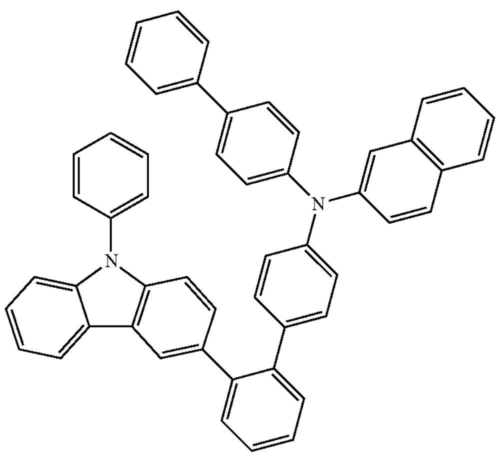
2-96
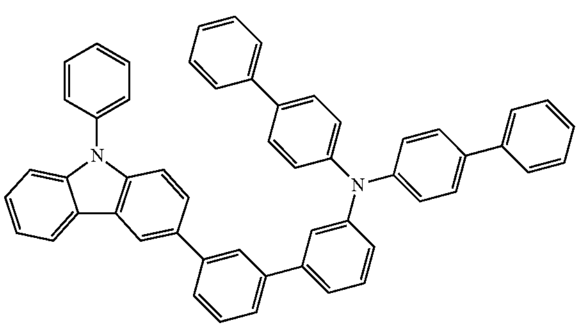
-continued
2-97
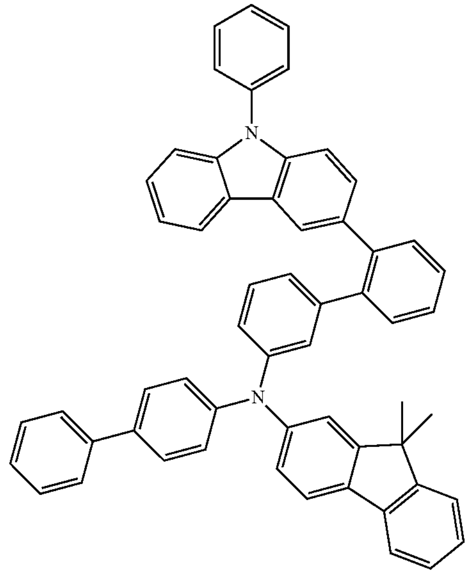
2-98
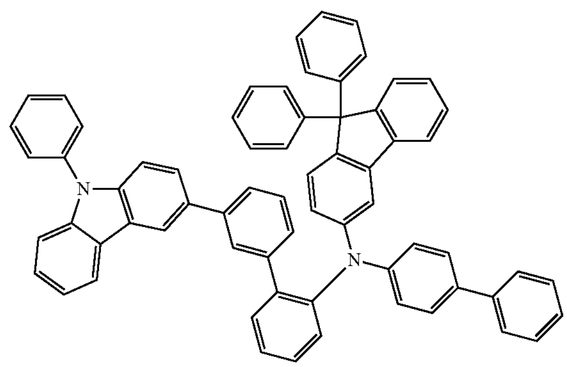
2-99
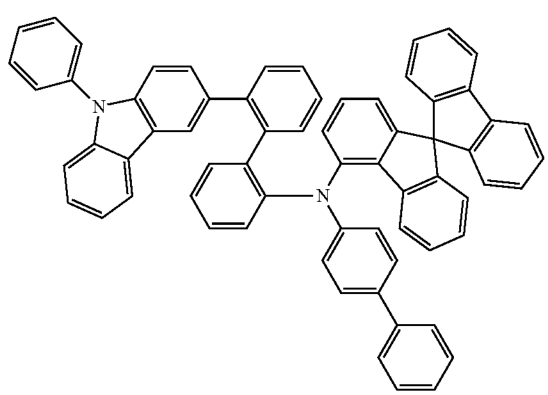

-continued
2-100
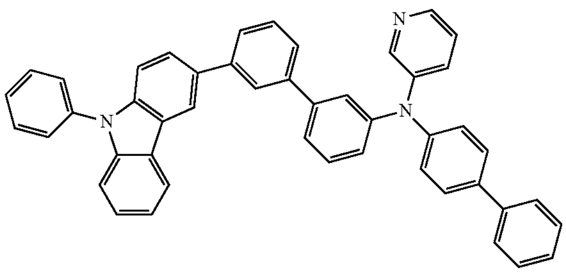
2-101
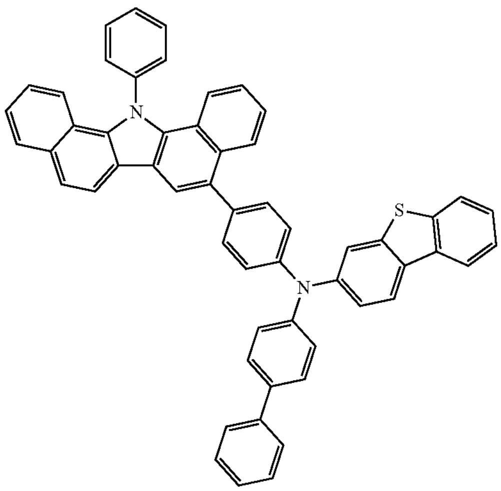
2-102
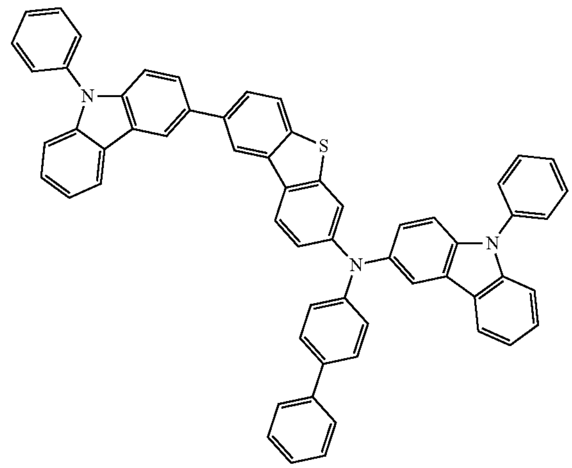
2-103
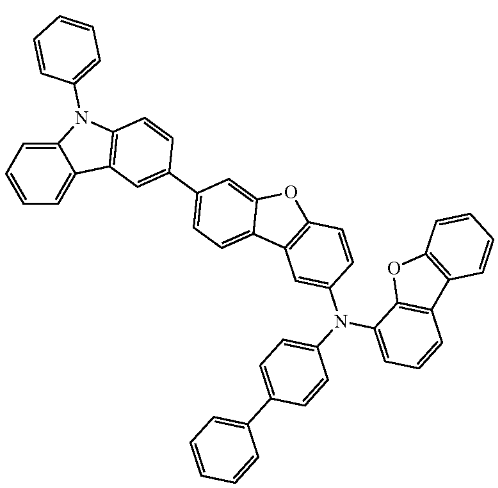
2-104
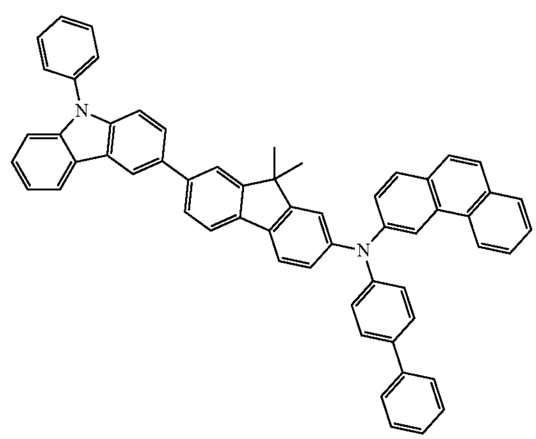

-continued
2-105
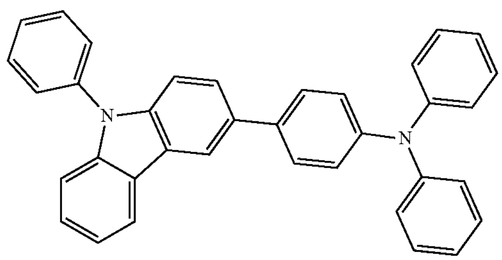
2-106
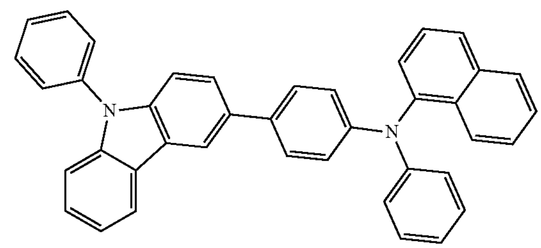
2-107
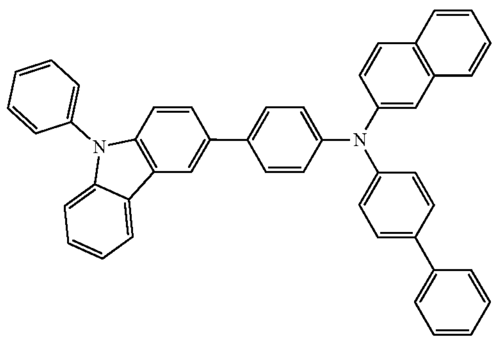
2-108
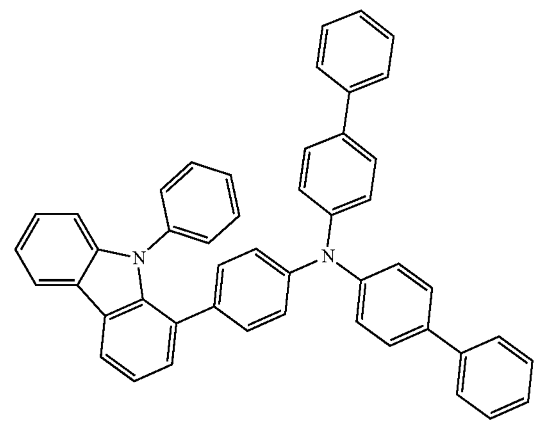
2-109
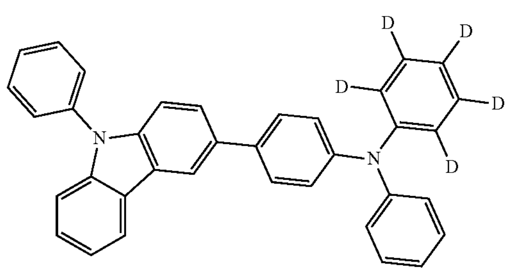
2-110
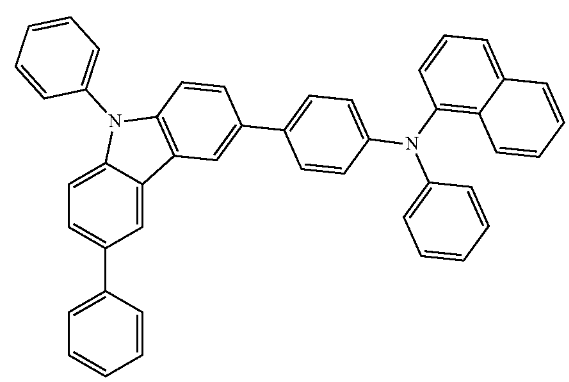
2-111
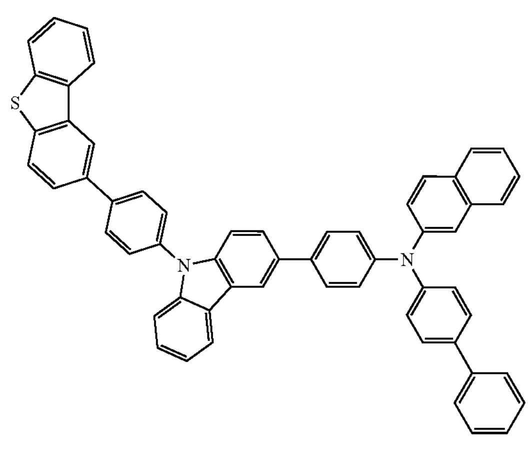
2-112
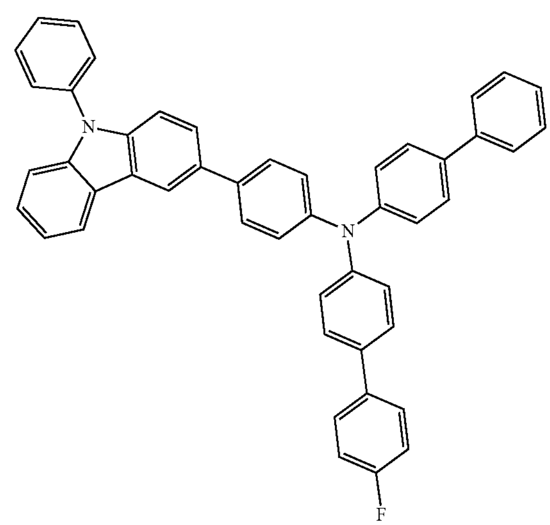

-continued
2-113
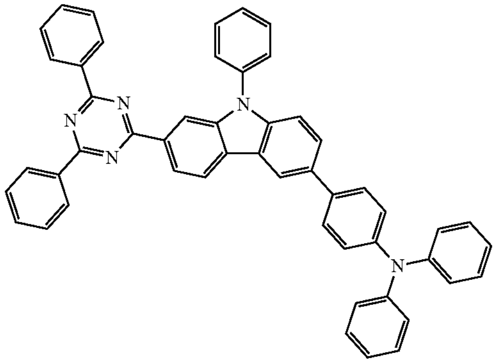
2-114
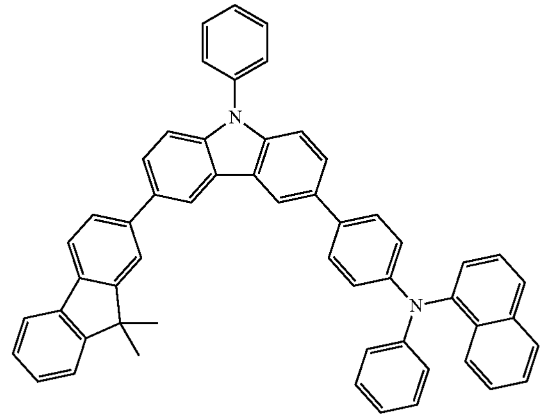
2-115
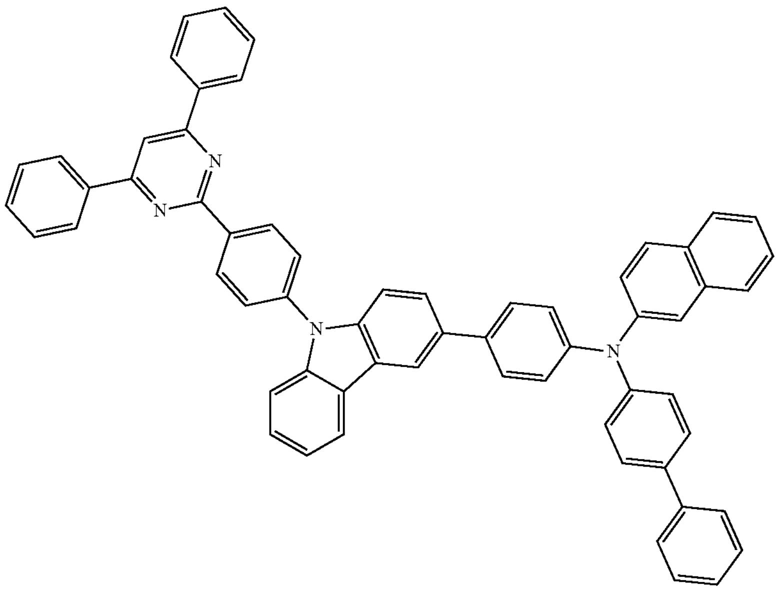
2-116
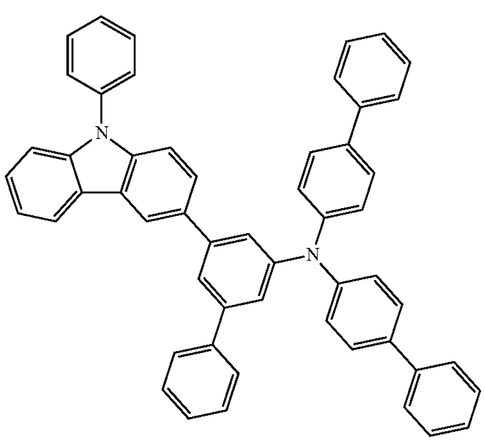
2-117
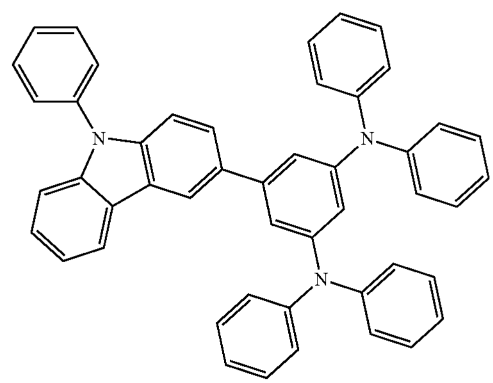

-continued
2-118
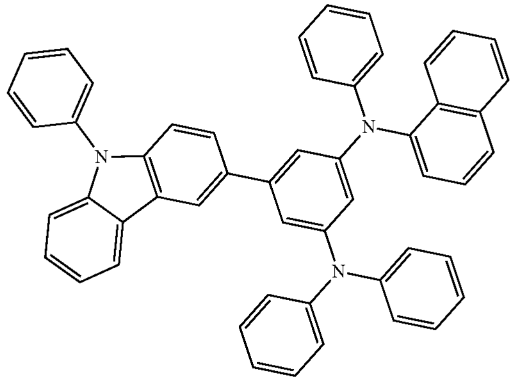
2-119
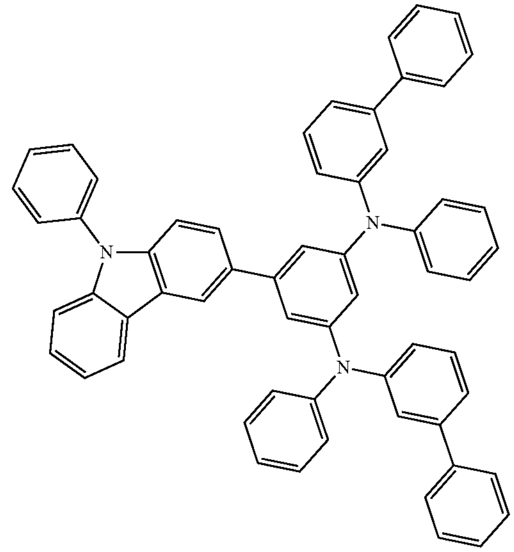
2-120
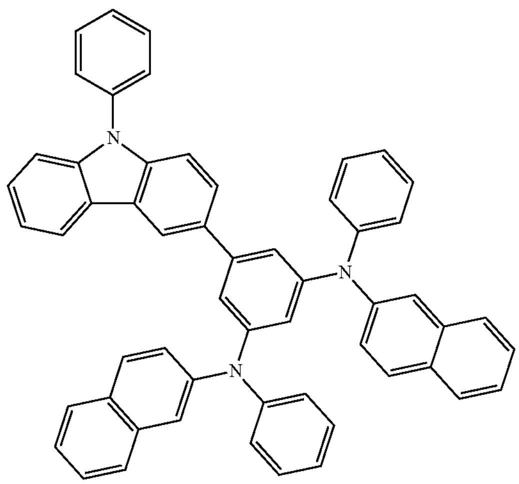
2-121
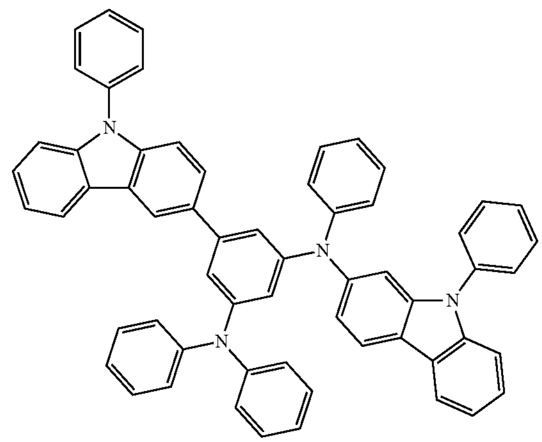
2-122
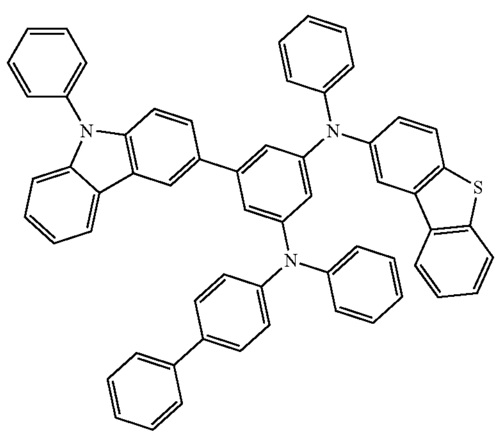
2-123
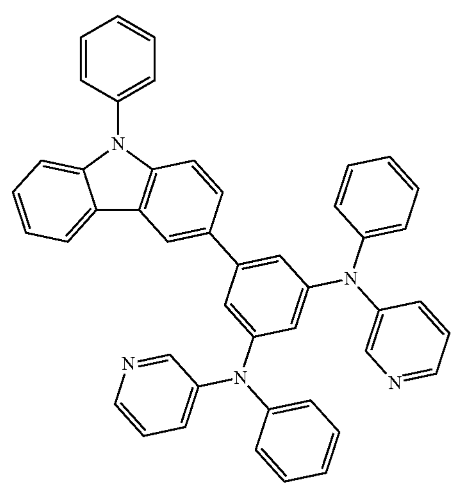

-continued
2-124
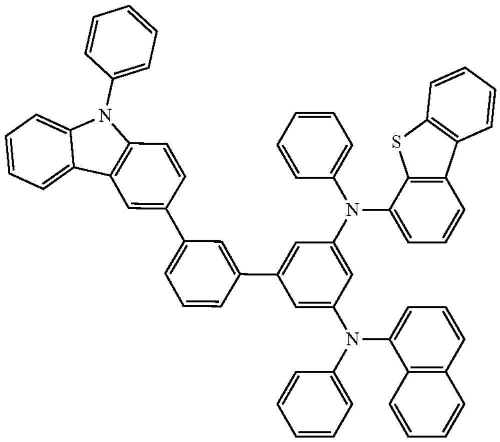
2-125
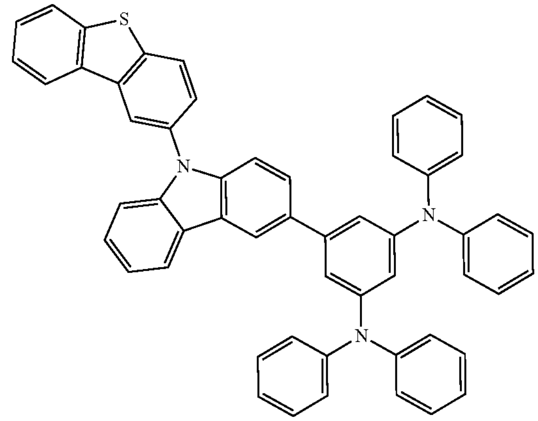
2-126
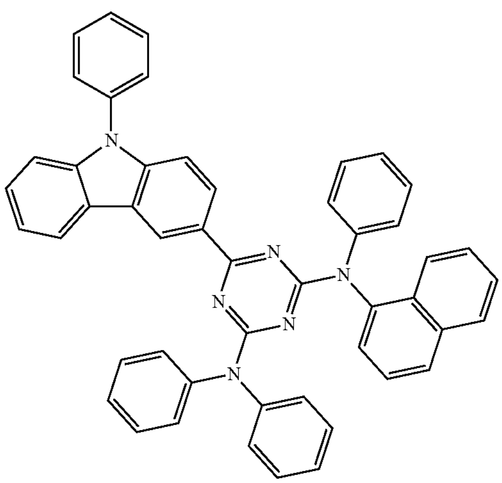
2-127
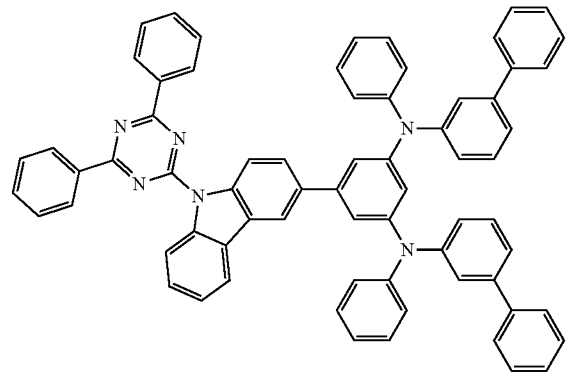
2-128
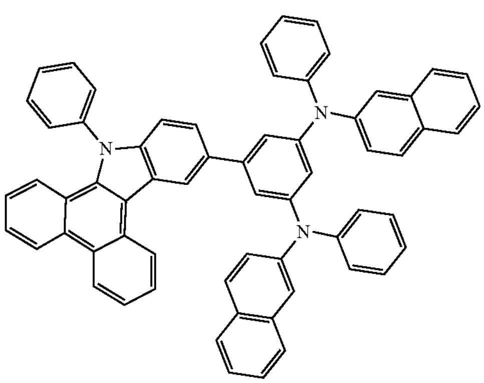
2-129
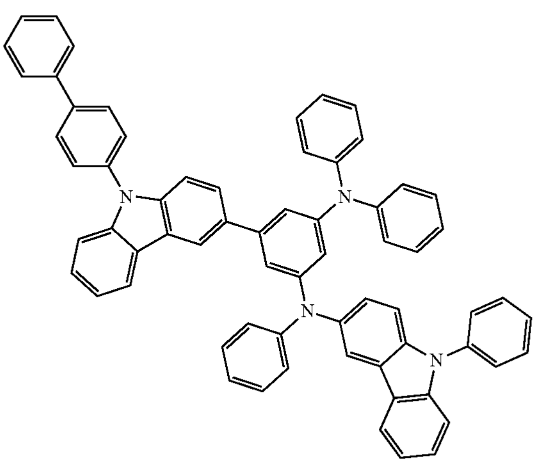

-continued
2-130
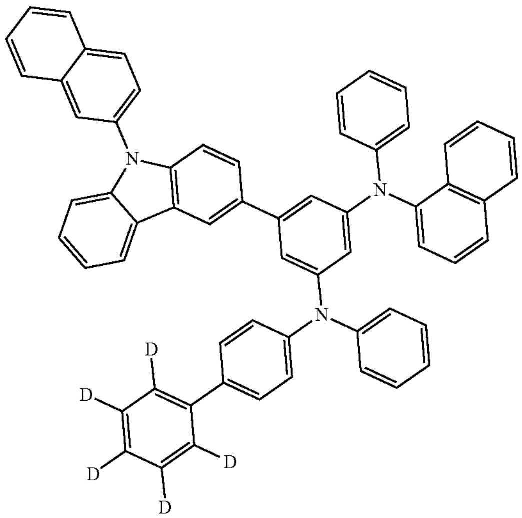
2-131
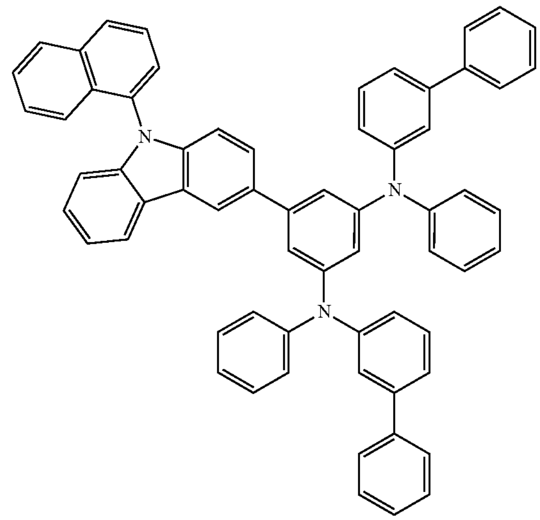
2-132
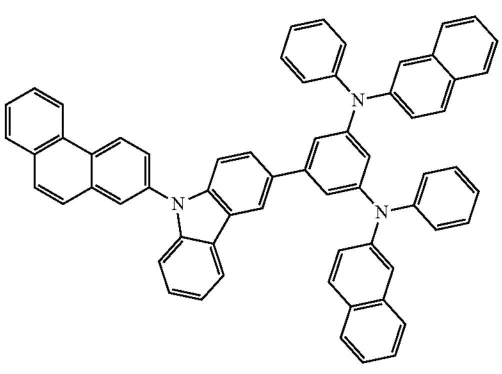
2-133
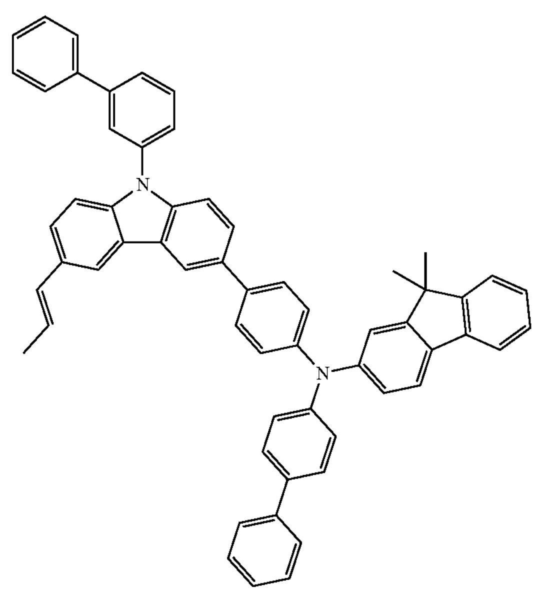

-continued 2-134

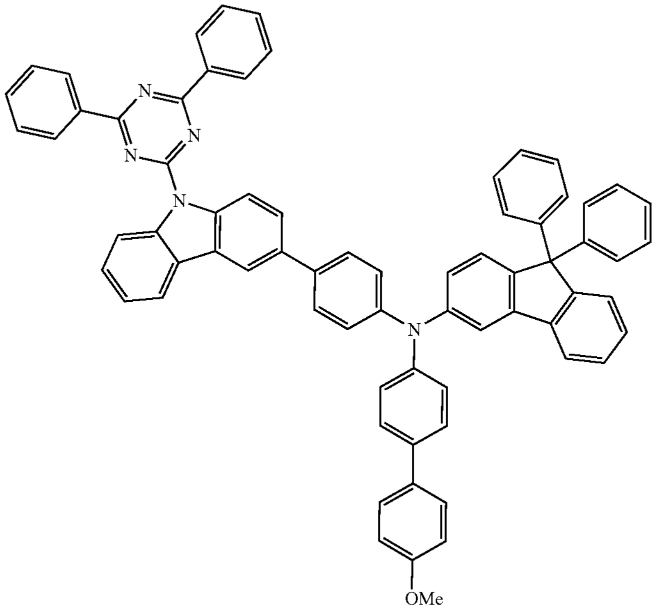

2-135

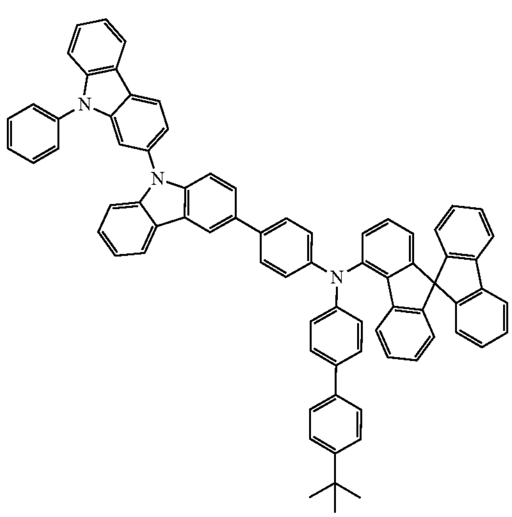

2-136

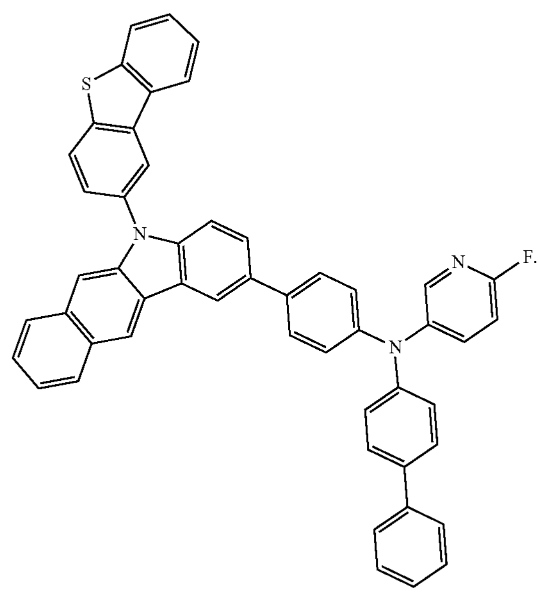

11. An electronic device comprising a display device and a control unit for driving the display device, wherein the display device comprises the organic electric element of claim 1.

12. The electronic device of claim 11, wherein the organic electric element is selected from the group consisting of an organic light emitting diode, an organic solar cell, an organic photo conductor, an organic transistor, an element for monochromatic illumination and a quantum dot display.

13. An organic electric element comprising a first electrode, a second electrode, and an organic material layer formed between the first electrode and the second electrode, wherein the organic material layer comprises a phosphorescent light emitting layer, and the phosphorescent light emitting layer consists of a dopant, a first host compound represented by Formula 1-G, and a second host compound represented by one of Formula 2-G to Formula 2-R:

-continued
<Formula 1-G>
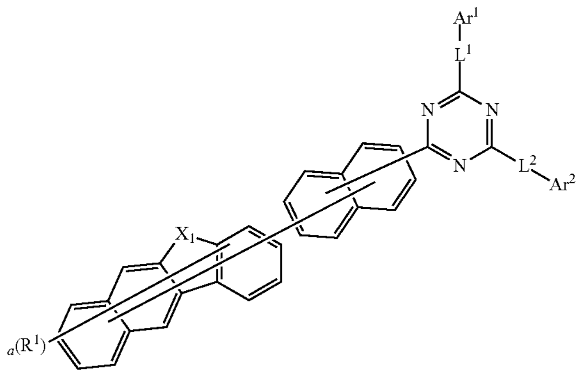
<Formula 2-G>
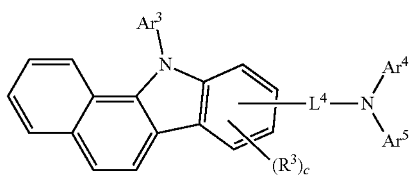
<Formula 2-H>
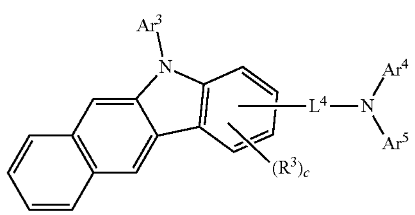
<Formula 2-I>
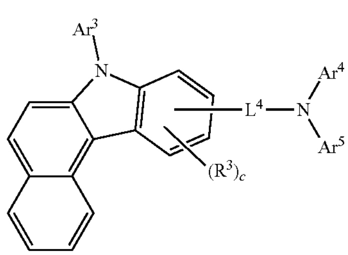
<Formula 2-J>
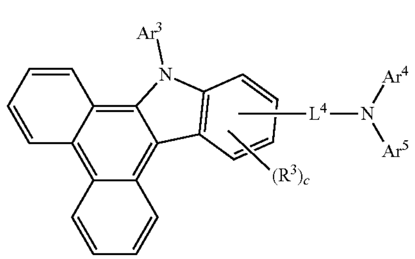
<Formula 2-K>
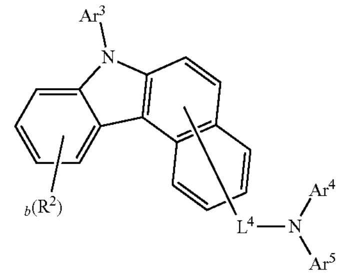
<Formula 2-L>
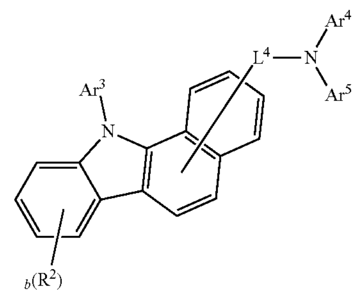
<Formula 2-M>
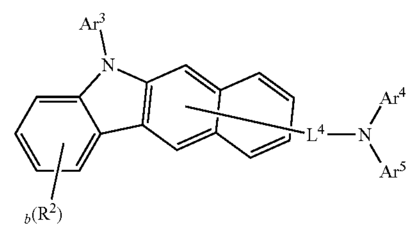
<Formula 2-N>
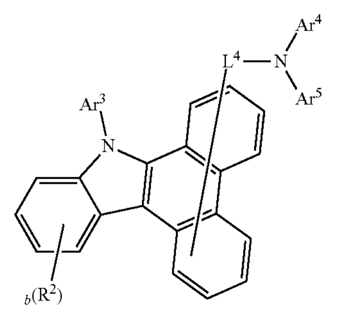
<Formula 2-O>
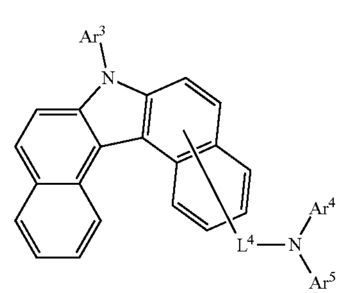

-continued

<Formula 2-P>

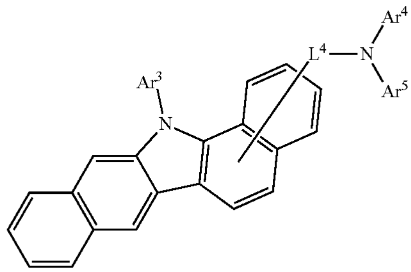

<Formula 2-Q>

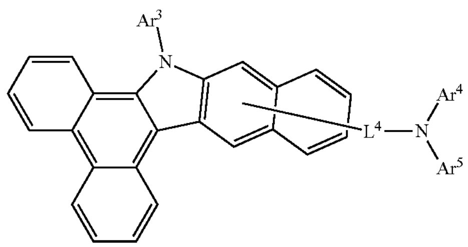

<Formula 2-R>

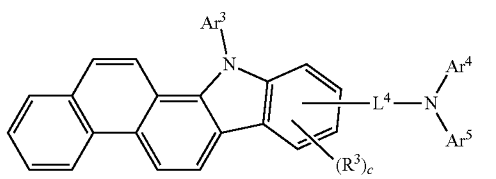

wherein:

$X_1$ is O or S, $Ar^1$ and $Ar^2$ are each a $C_6$-$C_{18}$ aryl group or a fluorenyl group, $Ar^3$ to $Ar^5$ are each independently selected from the group consisting of a $C_6$-$C_{60}$ aryl group, a fluorenyl group, a $C_2$-$C_{60}$ heterocyclic group comprising at least one heteroatom selected from the group consisting of O, N, S, Si and P, a $C_3$-$C_{60}$ aliphatic ring, a fused ring of a $C_3$-$C_{60}$ aliphatic ring with a $C_6$-$C_{60}$ aromatic ring, a $C_1$-$C_{50}$ alkyl group, a $C_2$-$C_{20}$ alkenyl group, a $C_2$-$C_{20}$ alkynyl group, a $C_1$-$C_{30}$ alkoxyl group and a $C_6$-$C_{30}$ aryloxy group, and $Ar^4$ and $Ar^5$ may be bonded to each other to form a ring, $L^1$ and $L^2$ are each independently selected from the group consisting of a single bond, a $C_6$-$C_{60}$ arylene group, and a fluorenylene group, $L^4$ is selected from the group consisting of a single bond, a $C_6$-$C_{60}$ arylene group, a fluorenylene group, a $C_2$-$C_{60}$ heterocyclic group comprising at least one heteroatom selected from the group consisting of O, N, S, Si and P, a $C_3$-$C_{60}$ aliphatic ring, and a fused ring of a $C_3$-$C_{60}$ aliphatic ring with a $C_6$-$C_{60}$ aromatic ring, $R^1$ to $R^3$ are each independently selected from the group consisting of hydrogen, deuterium, halogen, a cyano group, a $C_6$-$C_{60}$ aryl group, a fluorenyl group, a $C_2$-$C_{60}$ heterocyclic group comprising at least one heteroatom selected from the group consisting of O, N, S, Si and P, a $C_3$-$C_{60}$ aliphatic ring, a fused ring of a $C_3$-$C_{60}$ aliphatic ring with a $C_6$-$C_{60}$ aromatic ring, a $C_1$-$C_{60}$ alkyl group, a $C_2$-$C_{20}$ alkenyl group, a $C_2$-$C_{20}$ alkynyl group, a $C_1$-$C_{30}$ alkoxyl group, a $C_6$-$C_{30}$ aryloxy group and -L'-N($R_a$)($R_b$), and adjacent groups may be bonded to each other to form a ring, a is an integer of 0-9, b is an integer of 0-4, c is an integer of 0-3, and where each of these is an integer of 2 or more, each of a plurality of R's, each of a plurality of $R^2$s, and each of a plurality of $R^3$s are the same as or different from each other, L' is selected from the group consisting of a single bond, a $C_6$-$C_{60}$ arylene group, a fluorenylene group, a $C_2$-$C_{60}$ heterocyclic group comprising at least one heteroatom selected from the group consisting of O, N, S, Si and P, a $C_3$-$C_{60}$ aliphatic ring, and a fused ring of a $C_3$-$C_{60}$ aliphatic ring with a $C_6$-$C_{60}$ aromatic ring, and $R_a$ and $R_b$ are each independently selected from the group consisting of a $C_6$-$C_{60}$ aryl group, a fluorenyl group, a $C_2$-$C_{60}$ heterocyclic group comprising at least one heteroatom selected from the group consisting of O, N, S, Si and P, a $C_3$-$C_{60}$ aliphatic ring, and a fused ring of a $C_3$-$C_{60}$ aliphatic ring with a $C_6$-$C_{60}$ aromatic ring, wherein $Ar^3$ to $Ar^5$ and $L^4$, L', $R^1$ to $R^3$, $R_a$, $R_b$, and the ring formed by the adjacent groups may be optionally substituted with one or more substituents selected from the group consisting of deuterium, halogen, a silane group unsubstituted or substituted with a $C_1$-$C_{20}$ alkyl group or a $C_6$-$C_{20}$ aryl group, a siloxane group, a boron group, a germanium group, a cyano group, a nitro group, a $C_1$-$C_{20}$ alkylthio group, a $C_1$-$C_{20}$ alkoxy group, a $C_6$-$C_{20}$ aryloxy group, a $C_1$-$C_{20}$ alkyl group, a $C_2$-$C_{20}$ alkenyl group, a $C_2$-$C_{20}$ alkynyl group, a $C_6$-$C_{20}$ aryl group, a $C_6$-$C_{20}$ aryl group substituted with deuterium, a fluorenyl group, a $C_2$-$C_{20}$ heterocyclic group containing at least one heteroatom of O, N, S, Si, and P, a $C_3$-$C_{20}$ aliphatic ring group, a $C_7$-$C_{20}$ arylalkyl group, $C_8$-$C_{20}$ arylalkenyl group and -$L^a$-N($R^a$)($R^b$), and wherein $Ar^1$, $Ar^2$, $L^1$ and $L^2$ may be optionally substituted with one or more substituents selected from the group consisting of deuterium, halogen, a silane group unsubstituted or substituted with a $C_1$-$C_{20}$ alkyl group or a $C_6$-$C_{20}$ aryl group, a siloxane group, a boron group, a germanium group, a cyano group, a nitro group, a $C_1$-$C_{20}$ alkylthio group, a $C_1$-$C_{20}$ alkoxy group, a $C_6$-$C_{20}$ aryloxy group, a $C_1$-$C_{20}$ alkyl group, a $C_2$-$C_{20}$ alkenyl group, a $C_2$-$C_{20}$ alkynyl group, a $C_6$-$C_{20}$ aryl group, a $C_6$-$C_{20}$ aryl group substituted with deuterium, a fluorenyl group, a $C_3$-$C_{20}$ aliphatic ring group, a $C_7$-$C_{20}$ arylalkyl group, $C_8$-$C_{20}$ arylalkenyl group and -$L^a$-N($R^a$)($R^b$), wherein $L^a$ is selected from the group consisting of a single bond, a $C_6$-$C_{20}$ arylene group, a fluorenylene group, a $C_2$-$C_{20}$ heterocyclic group comprising at least one heteroatom selected from the group consisting of O, N, S, Si and P, a $C_3$-$C_{20}$ aliphatic ring, and a combination thereof, $R^a$ and $R^b$ are each independently selected from the group consisting of a $C_6$-$C_{20}$ aryl group, a fluorenyl group, a $C_2$-$C_{20}$ heterocyclic group comprising at least one heteroatom selected from the group consisting of O, N, S, Si and P, a $C_3$-$C_{20}$ aliphatic ring, and a combination thereof.

14. A compound represented by Formula 1-G:

<Formula 1-G>

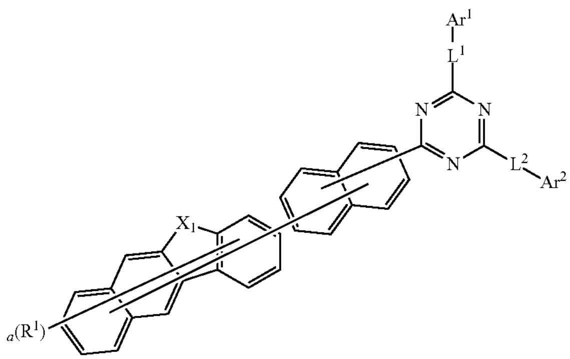

wherein:

$X_1$ is O or S, $Ar^1$ and $Ar^2$ are each a $C_6$-$C_{18}$ aryl group, or a fluorenyl group, $L^1$ and $L^2$ are each independently selected from the group consisting of a single bond, a $C_6$-$C_{60}$ arylene group, and a fluorenylene group, $R^1$ is selected from the group consisting of hydrogen, deuterium, halogen, a cyano group, a $C_6$-$C_{60}$ aryl group, a fluorenyl group, a $C_2$-$C_{60}$ heterocyclic group comprising at least one heteroatom selected from the group consisting of O, N, S, Si and P, a $C_3$-$C_{60}$ aliphatic ring, a fused ring of a $C_3$-$C_{60}$ aliphatic ring with a $C_6$-$C_{60}$ aromatic ring, a $C_1$-$C_{60}$ alkyl group, a $C_2$-$C_{20}$ alkenyl group, a $C_2$-$C_{20}$ alkynyl group, a $C_1$-$C_{30}$ alkoxyl group, a $C_6$-$C_{30}$ aryloxy group and -L'-N($R_a$)($R_b$), and adjacent groups may not be bonded to each other to form a ring, a is an integer of 0-9, L' is selected from the group consisting of a single bond, a $C_6$-$C_{60}$ arylene group, a fluorenylene group, a $C_2$-$C_{60}$ heterocyclic group comprising at least one heteroatom selected from the group consisting of O, N, S, Si and P, a $C_3$-$C_{60}$ aliphatic ring, and a fused ring of a $C_3$-$C_{60}$ aliphatic ring with a $C_6$-$C_{60}$ aromatic ring, and $R_a$ and $R_b$ are each independently selected from the group consisting of a $C_6$-$C_{60}$ aryl group, a fluorenyl group, a $C_2$-$C_{60}$ heterocyclic group comprising at least one heteroatom selected from the group consisting of O, N, S, Si and P, a $C_3$-$C_{60}$ aliphatic ring, and a fused ring of a $C_3$-$C_{60}$ aliphatic ring with a $C_6$-$C_{60}$ aromatic ring, wherein L', $R^1$, $R_a$, $R_b$, and the ring formed by the adjacent groups may be optionally substituted with one or more substituents selected from the group consisting of deuterium, halogen, a silane group unsubstituted or substituted with a $C_1$-$C_{20}$ alkyl group or a $C_6$-$C_{20}$ aryl group, a siloxane group, a boron group, a germanium group, a cyano group, a nitro group, a $C_1$-$C_{20}$ alkylthio group, a $C_1$-$C_{20}$ alkoxy group, a $C_6$-$C_{20}$ aryloxy group, a $C_1$-$C_{20}$ alkyl group, a $C_2$-$C_{20}$ alkenyl group, a $C_2$-$C_{20}$ alkynyl group, a $C_6$-$C_{20}$ aryl group, a $C_6$-$C_{20}$ aryl group substituted with deuterium, a fluorenyl group, a $C_2$-$C_{20}$ heterocyclic group containing at least one heteroatom of O, N, S, Si, and P, a $C_3$-$C_{20}$ aliphatic ring group, a $C_7$-$C_{20}$ arylalkyl group, $C_8$-$C_{20}$ arylalkenyl group and -$L^a$-N($R^a$)($R^b$), and wherein $Ar^1$, $Ar^2$, $L^1$ and $L^2$ may be optionally substituted with one or more substituents selected from the group consisting of deuterium, halogen, a silane group unsubstituted or substituted with a $C_1$-$C_{20}$ alkyl group or a $C_6$-$C_{20}$ aryl group, a siloxane group, a boron group, a germanium group, a cyano group, a nitro group, a $C_1$-$C_{20}$ alkylthio group, a $C_1$-$C_{20}$ alkoxy group, a $C_6$-$C_{20}$ aryloxy group, a $C_1$-$C_{20}$ alkyl group, a $C_2$-$C_{20}$ alkenyl group, a $C_2$-$C_{20}$ alkynyl group, a $C_6$-$C_{20}$ aryl group, a $C_6$-$C_{20}$ aryl group substituted with deuterium, a fluorenyl group, a $C_3$-$C_{20}$ aliphatic ring group, a $C_7$-$C_{20}$ arylalkyl group, $C_8$-$C_{20}$ arylalkenyl group and -$L^a$-N($R^a$)($R^b$), wherein $L^a$ is selected from the group consisting of a single bond, a $C_6$-$C_{20}$ arylene group, a fluorenylene group, a $C_2$-$C_{20}$ heterocyclic group comprising at least one heteroatom selected from the group consisting of O, N, S, Si and P, a $C_3$-$C_{20}$ aliphatic ring, and a combination thereof, and $R^a$ and $R^b$ are each independently selected from the group consisting of a $C_6$-$C_{20}$ aryl group, a fluorenyl group, a $C_2$-$C_{20}$ heterocyclic group comprising at least one heteroatom selected from the group consisting of O, N, S, Si and P, a $C_3$-$C_{20}$ aliphatic ring, and a combination thereof, and wherein $L^a$, $R^a$, and $R^b$ may be optionally substituted with one or more substituents selected from the group consisting of deuterium, halogen, a silane group unsubstituted or substituted with a $C_1$-$C_{20}$ alkyl group or a $C_6$-$C_{20}$ aryl group, a siloxane group, a boron group, a germanium group, a cyano group, a nitro group, a $C_1$-$C_{20}$ alkylthio group, a $C_1$-$C_{20}$ alkoxy group, a $C_6$-$C_{20}$ aryloxy group, a $C_1$-$C_{20}$ alkyl group, a $C_2$-$C_{20}$ alkenyl group, a $C_2$-$C_{20}$ alkynyl group, a $C_6$-$C_{20}$ aryl group, a $C_6$-$C_{20}$ aryl group substituted with deuterium, a fluorenyl group, a $C_2$-$C_{20}$ heterocyclic group containing at least one heteroatom of O, N, S, Si, and P, a $C_3$-$C_{20}$ aliphatic ring group, a $C_7$-$C_{20}$ arylalkyl group, and $C_8$-$C_{20}$ arylalkenyl group.

15. The compound of claim 14, wherein Formula 1-G is represented by one of Formula 1-G-1 to Formula 1-G-5:

<Formula 1-G-1>

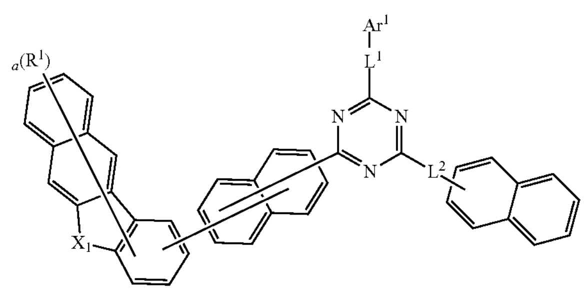

<Formula 1-G-2>

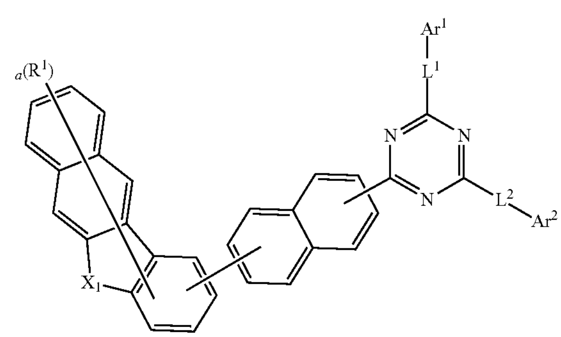

-continued

<Fomrula 1-G-3>

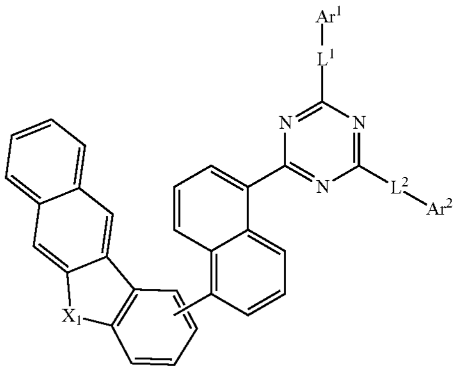

<Fomrula 1-G-4>

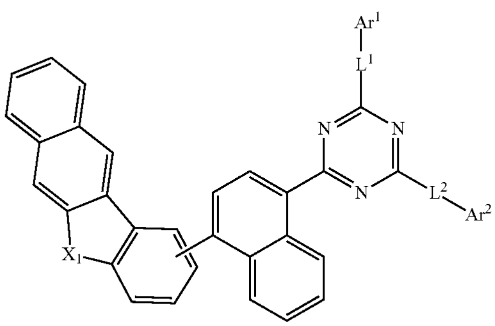

-continued

<Formula 1-G-5>

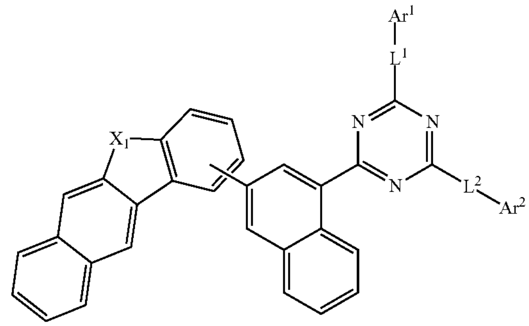

wherein $X_1$, $Ar^1$, $Ar^2$, $L^1$, $L^2$, $R^1$ and a are the same as defined in claim 14.

16. The compound of claim 14, wherein $Ar^1$ and $Ar^2$ are different from each other.

17. The compound of claim 14, wherein both $Ar^1$ and $Ar^2$ are a $C_6$-$C_{18}$ aryl group.

18. The compound of claim 14, wherein $Ar^1$ or $Ar^2$ is a naphthyl group.

19. An organic electric element comprising a first electrode, a second electrode, and an organic material layer formed between the first electrode and the second electrode, wherein the organic material layer comprises a compound represented by Formula 1-G of claim 14.

20. The organic electric element of claim 19, wherein the organic material layer comprises a light emitting layer, and the compound is comprised in the light emitting layer.

21. An electronic device comprising a display device and a control unit for driving the display device, wherein the display device comprises the organic electric element of claim 19.

22. The electronic device of claim 21, wherein the organic electric element is selected from the group consisting of an organic light emitting diode, an organic solar cell, an organic photo conductor, an organic transistor, an element for monochromatic illumination and a quantum dot display.

* * * * *